US011798992B2

(12) United States Patent
Pidin

(10) Patent No.: US 11,798,992 B2
(45) Date of Patent: Oct. 24, 2023

(54) SEMICONDUCTOR DEVICE AND METHOD OF PRODUCING THE SAME

(71) Applicant: SOCIONEXT INC., Kanagawa (JP)

(72) Inventor: Sergey Pidin, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 347 days.

(21) Appl. No.: 17/208,971

(22) Filed: Mar. 22, 2021

(65) Prior Publication Data

US 2021/0210601 A1 Jul. 8, 2021

Related U.S. Application Data

(63) Continuation of application No. PCT/JP2018/035481, filed on Sep. 25, 2018.

(51) Int. Cl.
*H01L 29/08* (2006.01)
*H01L 27/12* (2006.01)
(Continued)

(52) U.S. Cl.
CPC ...... *H01L 29/0847* (2013.01); *H01L 27/1203* (2013.01); *H01L 29/0669* (2013.01); *H10B 10/12* (2023.02)

(58) Field of Classification Search
CPC ............. H01L 29/0847; H01L 27/1203; H01L 29/0653; H01L 21/8221; H01L 27/0688;
(Continued)

(56) References Cited

U.S. PATENT DOCUMENTS 8,216,902 B2 7/2012 Chang et al.
9,129,829 B2 9/2015 Kuhn et al.
(Continued)

FOREIGN PATENT DOCUMENTS

JP 2003152191 A 5/2003
JP 2013037743 A 2/2013
(Continued)

OTHER PUBLICATIONS

Notice of Reasons for Refusal dated Mar. 22, 2023 issued in the corresponding Japanese Patent Application No. 2020-547042, with English translation.
Ryckaert J. et al., "The Complementary FET (CFET) for CMOS scaling beyond N3", 2018 Symposium on VLSI Technology Digest of Technical Papers, pp. 141-142.
Munteanu D. et al., "Transient Response of 3-D Multi-Channel Nariowire MOSFETs Submitted to Heavy Ion Irradiation: a 3-0 Simulation Study", IEEE Transactions on Nuclear Science, vol. 56, No. 4, Aug. 2009.
(Continued)

*Primary Examiner* — Changhyun Yi
(74) *Attorney, Agent, or Firm* — McDermott Will & Emery LLP

(57) ABSTRACT

A semiconductor device includes a substrate; a first transistor formed over the substrate; a second transistor formed over the first transistor; a third transistor formed over the substrate; and a fourth transistor formed over the third transistor. The first, second, third, and fourth transistor include first, second, third, and fourth gate electrodes, respectively, and include first, second, third, and fourth source regions and first, second, third, and fourth drain region of first, second, third, and fourth conductivity types, respectively. The first conductivity type is different from the second conductivity type. The third conductivity type is the same as the fourth conductivity type. The first and second gate electrodes are integrated, and the third and fourth gate electrode are integrated.

10 Claims, 115 Drawing Sheets

(51) Int. Cl.
*H01L 29/06* (2006.01)
*H10B 10/00* (2023.01)

(58) Field of Classification Search
CPC ........ H01L 29/42392; H01L 29/78696; H10B 10/12
See application file for complete search history.

(56) References Cited

U.S. PATENT DOCUMENTS

| | | | |
|---|---|---|---|
| 9,431,388 B1 | 8/2016 | Gauthier, Jr. et al. | |
| 9,837,414 B1 | 12/2017 | Balakrishnan et al. | |
| 2003/0141504 A1 | 7/2003 | Kuwabara et al. | |
| 2008/0090344 A1 | 4/2008 | Kuwabara et al. | |
| 2013/0039120 A1 | 2/2013 | Moriwaki | |
| 2013/0240828 A1 | 9/2013 | Ota et al. | |
| 2017/0040321 A1 | 2/2017 | Mitard | |
| 2018/0240802 A1* | 8/2018 | Smith | H01L 27/0688 |

FOREIGN PATENT DOCUMENTS

| | | |
|---|---|---|
| JP | 2013-191698 A | 9/2013 |
| JP | 2018026565 A | 2/2018 |

OTHER PUBLICATIONS

Notice of Reasons for Refusal dated Oct. 18, 2022 issued in the corresponding Japanese Patent Application No. 2020-547642, with English translation.

Ryckaert J. et al., "The Complementary FET (CFET) for CMOS scaling beyond N3" 2018 Symposium on VLSI Technology Digest of Technical Papers, p. 141.

A. Mocuta et al., "Enabling CMOS Scaling Towards 3nm and Beyond" 2018 Symposium on VLSI Technology Digest of Technical Papers p. 147.

International Search Report dated Nov. 20, 2018 in International Application. No. PCT/JP2018/035481.

Written Opinion of The International Searching Authority dated Nov. 20, 2018 in International Application. No. PCT/JP2018/035481, with English Translation.

Notice of Reasons for Refusal dated Mar. 22, 2022 issued in the corresponding Japanese Patent Application No. 2020-547642, with English translation.

Munteanu D. et al., "Transient Response of 3-D Multi-Channel Nanowire MOSFETs Submitted to Heavy Ion Irradiation: a 3-D Simulation Study", IEEE Transactions On Nuclear Science, vol. 56, No. 4, Aug. 2009.

* cited by examiner

SEMICONDUCTOR DEVICE AND METHOD OF PRODUCING THE SAME

CROSS-REFERENCE TO RELATED APPLICATIONS

The present application is a continuation application of International Application PCT/JP2018/035481 filed on Sep. 25, 2018, and designated the U.S., the entire contents of which are incorporated herein by reference.

FIELD

The present disclosure relates to a semiconductor device and a method of producing the same.

BACKGROUND

An element called a complementary field effect transistor (CFET) has been known. In a CFET, an n-channel FET and a p-channel FET are stacked over a substrate. The CFET is suitable for finer microfabrication of semiconductor devices (see, for example, the following documents).

DOCUMENTS

[Patent Document 1] U.S. Pat. No. 8,216,902
[Patent Document 2] U.S. Patent Application Publication No. 2017/0040321
[Patent Document 3] U.S. Pat. No. 9,837,414
[Patent Document 4] U.S. Pat. No. 9,129,829
[Patent Document 5] Japanese Laid-Open Patent Application No. 2018-26565
[Patent Document 6] Japanese Laid-Open Patent Application No. 2013-37743
[Non-Patent Document 1] Ryckaert J. et al., 2018 Symposium on VLSI Technology Digest of Technical Papers, p. 141
[Non-Patent Document 2] A. Mocuta et al. 2018 Symposium on VLSI Technology Digest of Technical Papers, p. 147

However, the CFET alone might not sufficiently meet recent demand for further finer semiconductor devices in recent years.

SUMMARY

According to the disclosed techniques, a semiconductor device includes a substrate; a first transistor formed over the substrate; a second transistor formed over the first transistor; a third transistor formed over the substrate; and a fourth transistor formed over the third transistor. The first transistor includes a first gate electrode, a first source region of a first conductivity type, and a first drain region of the first conductivity type. The second transistor includes a second gate electrode, a second source region of a second conductivity type, and a second drain region of the second conductivity type. The third transistor includes a third gate electrode, a third source region of a third conductivity type, and a third drain region of the third conductivity type. The fourth transistor includes a fourth gate electrode, a fourth source region of a fourth conductivity type, and a fourth drain region of the fourth conductivity type. The first conductivity type is different from the second conductivity type. The third conductivity type is the same as the fourth conductivity type. The first gate electrode is integrated with the second gate electrode, and the third gate electrode is integrated with the fourth gate electrode.

The object and advantages in the present embodiments will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

Figure 1A:
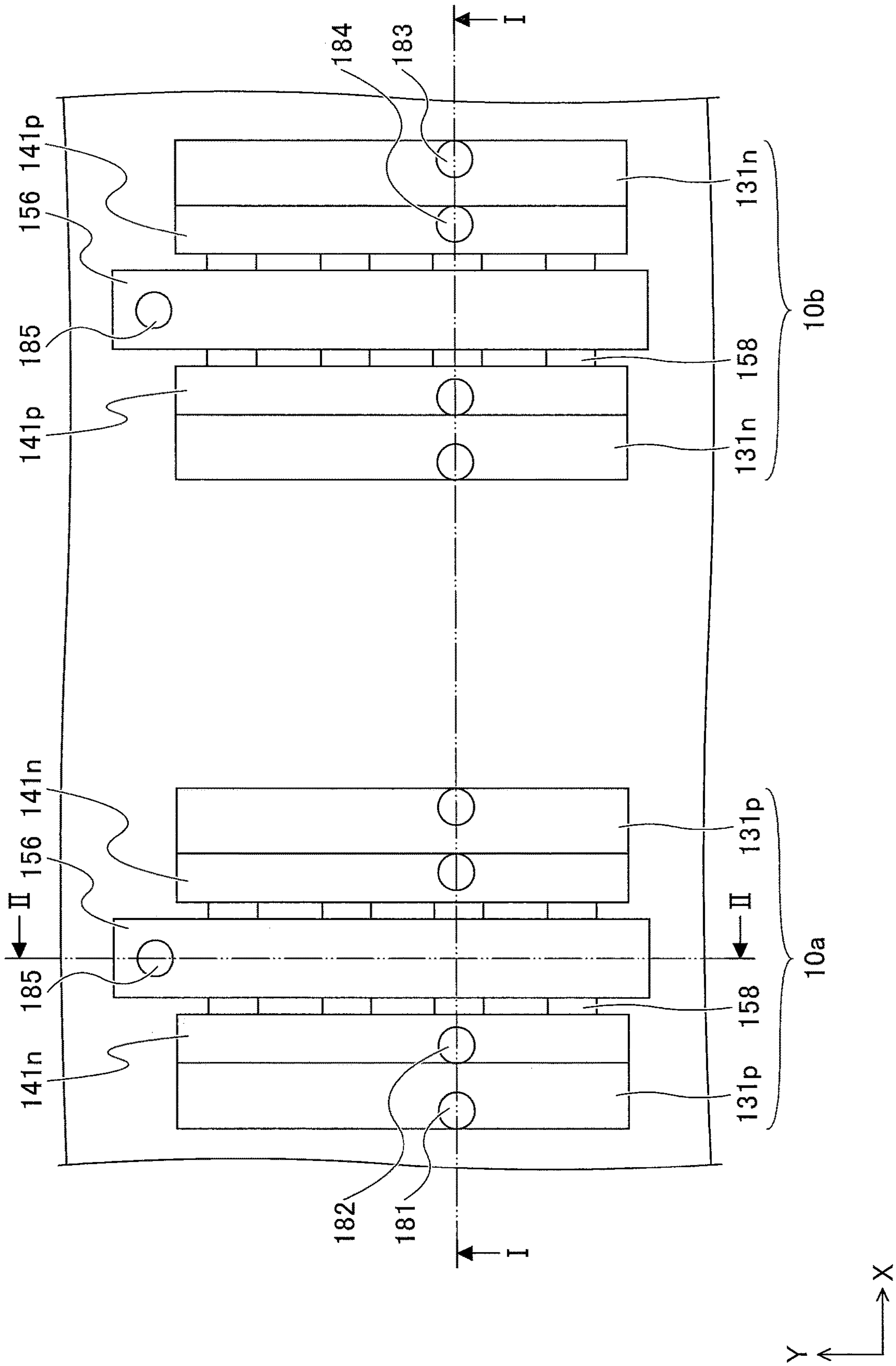
FIG. 1A is a schematic diagram (part 1) illustrating a layout of electrodes and semiconductor layers in a semiconductor device according to a first embodiment.

According to the techniques in the present disclosure, a semiconductor device can be made further finer.

In the following, embodiments will be described in detail with reference to the accompanying drawings. Note that in the present specification and drawings, components having substantially the same functional configurations may be assigned the same reference numerals, to omit duplicated description. Also, an n-channel field effect transistor may be referred to as an nFET, and a p-channel field effect transistor may be referred to as a pFET. Also, in the following description, two directions orthogonal to each other and parallel to a surface of a substrate are defined as the X direction and the Y direction, and a direction perpendicular to the surface of the substrate is defined as the Z direction.

First Embodiment

Figure 1B:
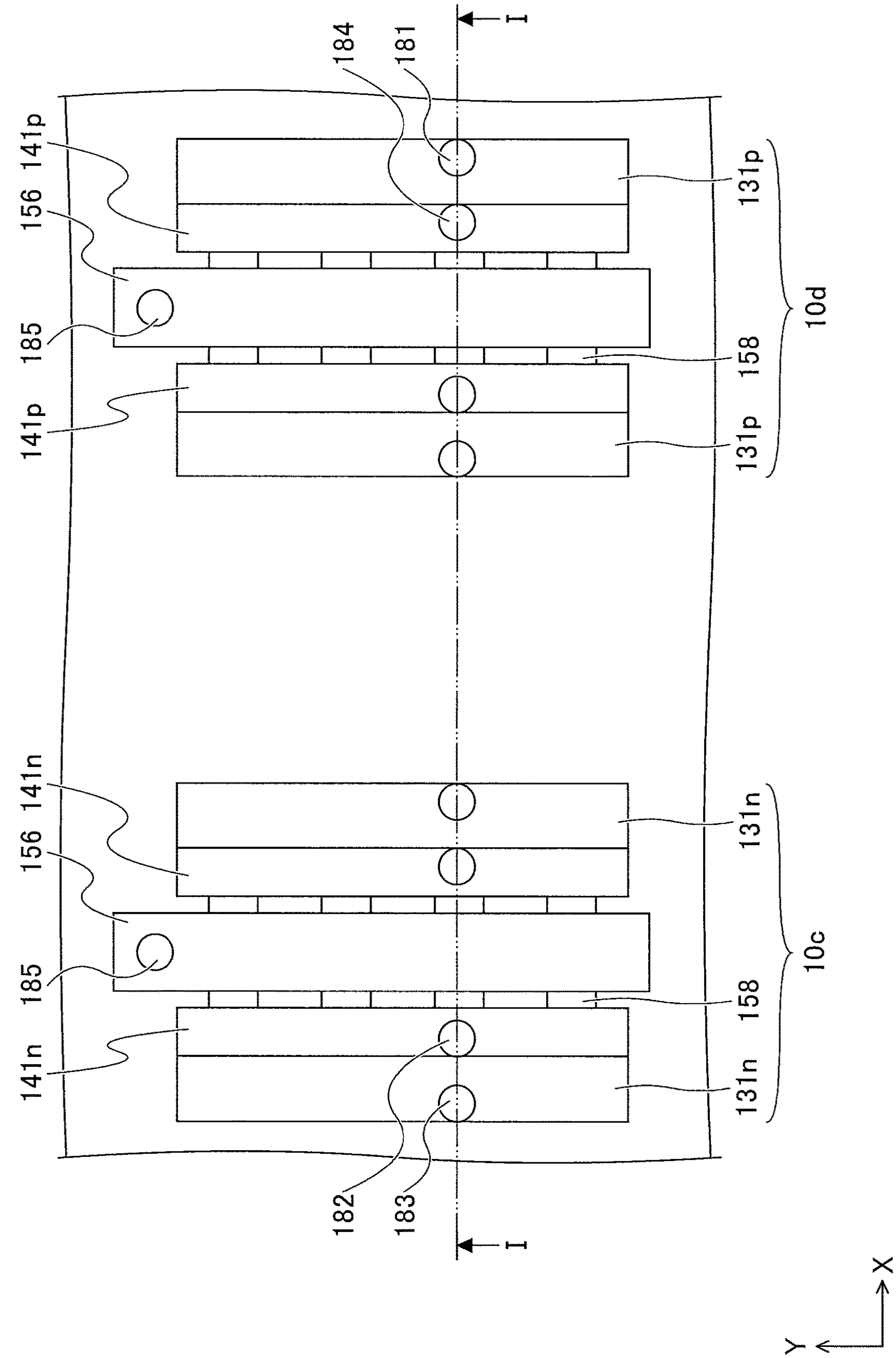
FIG. 1B is a schematic diagram (part 2) illustrating a layout of electrodes and semiconductor layers in a semiconductor device according to the first embodiment.
Figure 2A:
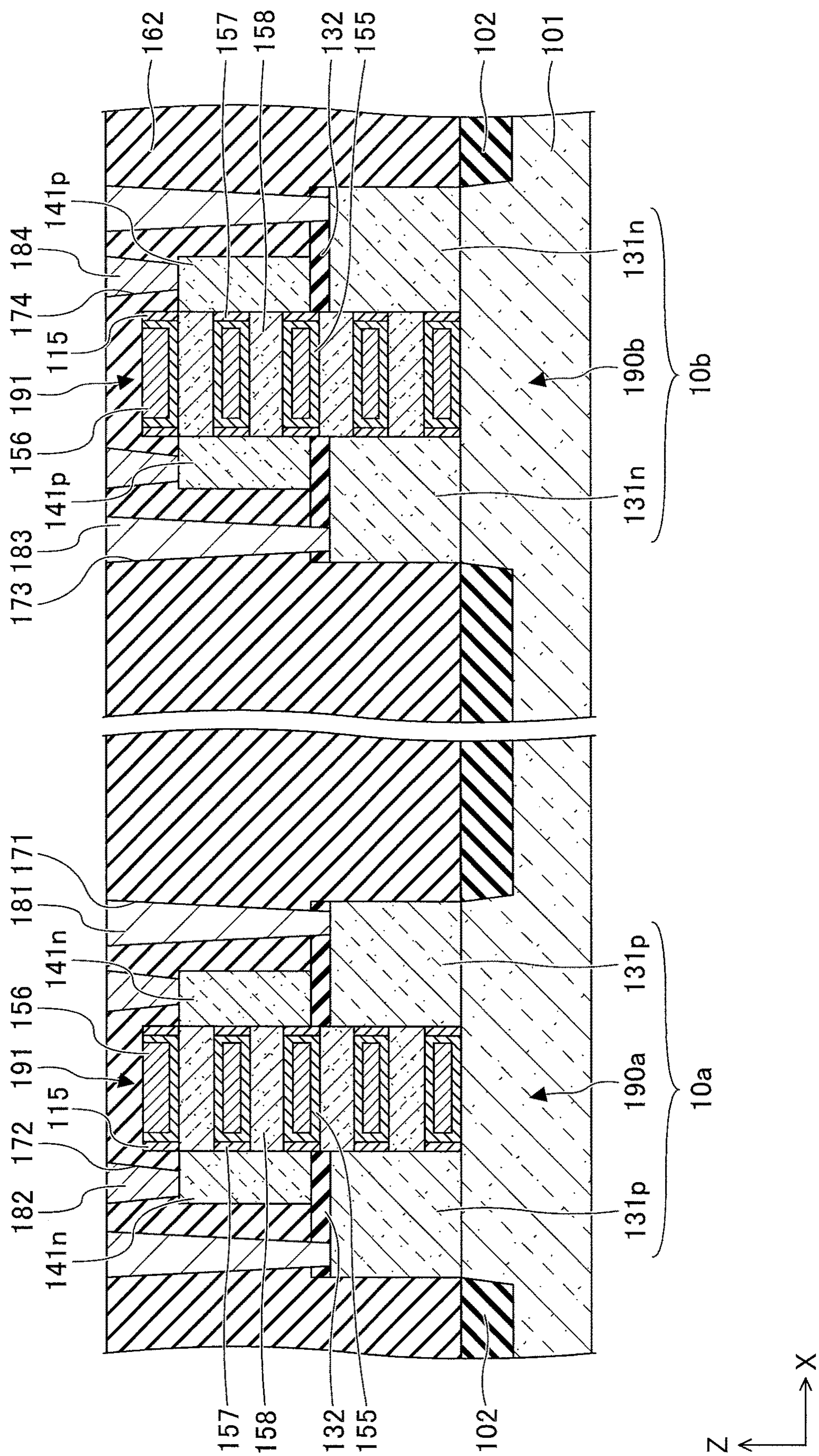
FIG. 2A is a cross sectional view (part 1) illustrating a configuration of a semiconductor device according to the first embodiment.
Figure 2B:
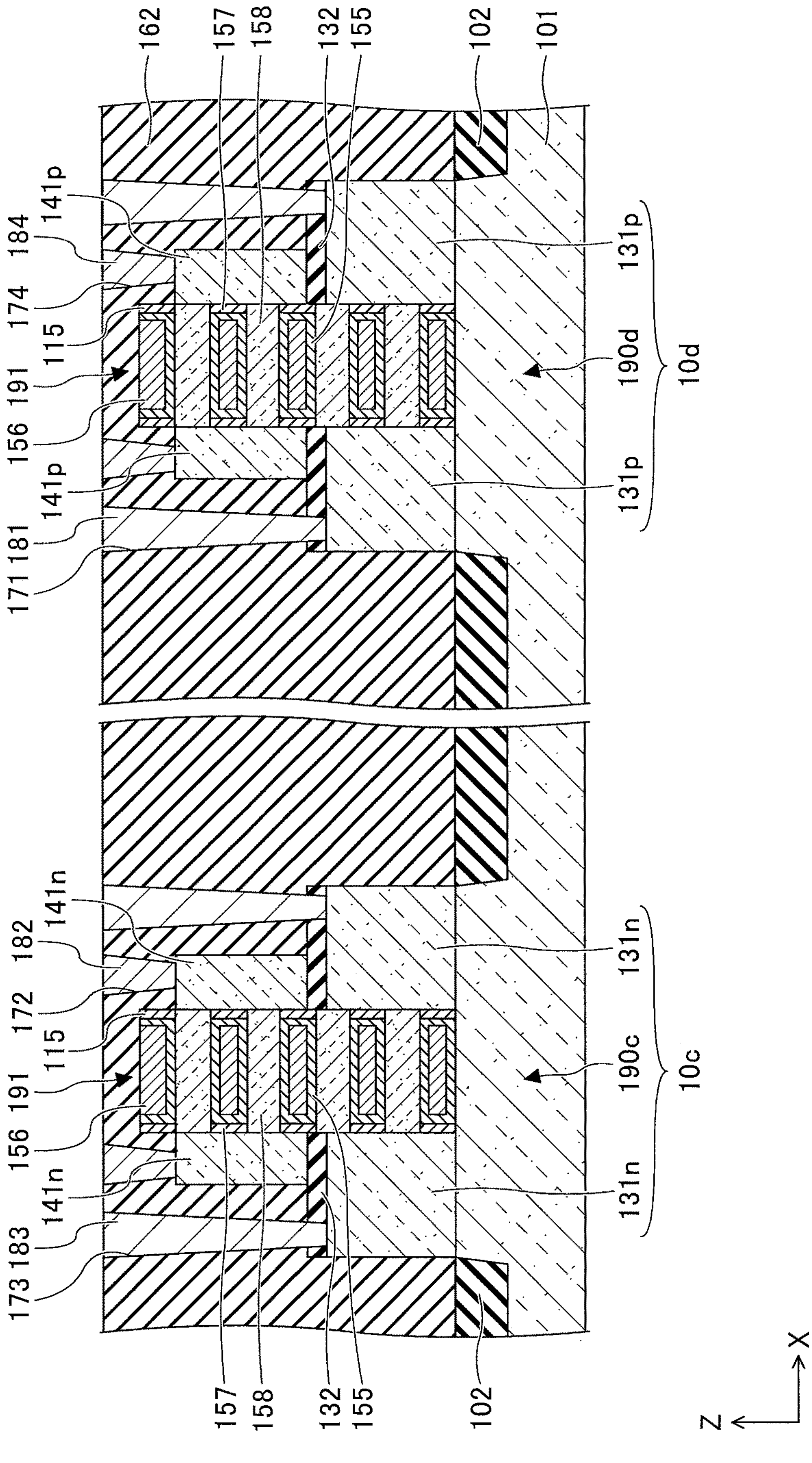
FIG. 2B is a cross sectional view (part 2) illustrating a configuration of a semiconductor device according to the first embodiment.
Figure 3:
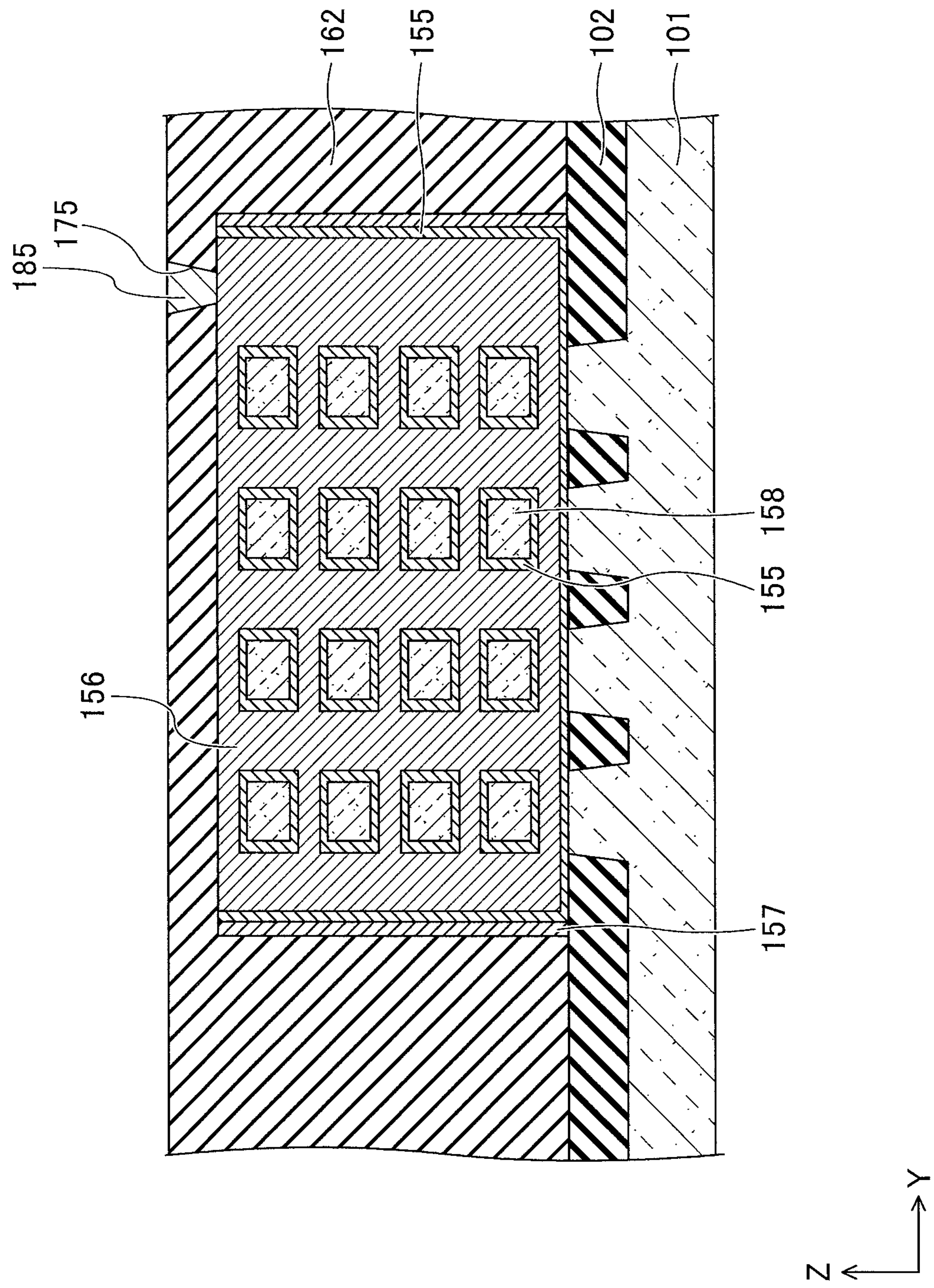
FIG. 3 is a cross sectional view illustrating a configuration of a semiconductor device according to the first embodiment.

At the outset, a semiconductor device according to a first embodiment will be described. FIGS. 1A and 1B are schematic diagrams illustrating a layout of electrodes and semiconductor layers in a semiconductor device according to the first embodiment. FIGS. 2A and 2B are cross sectional views illustrating a configuration of the semiconductor device according to the first embodiment. FIG. 3 is a cross sectional view illustrating a configuration of the semiconductor device according to the first embodiment. FIG. 2A corresponds to a cross sectional view along a line I-I in FIG. 1A, and FIG. 2B corresponds to a cross sectional view along a line I-I in FIG. 1B. FIG. 3 corresponds to a cross sectional view along a line II-II in FIG. 1A.

As illustrated in FIGS. 1A, 1B, 2A, 2B, and 3, in a semiconductor device according to the first embodiment, element separating regions 102 are formed over a surface of a semiconductor substrate 101 such as a silicon (Si) substrate or the like. The element separating regions 102 demarcate, for example, four element active regions 10*a*, 10*b*, 10*c*, and 10*d*.

In the element active region 10*a*, a stacked transistor structure 190*a* is formed over the semiconductor substrate 101. The stacked transistor structure 190*a* includes a gate structure 191 formed over the semiconductor substrate 101. The gate structure 191 includes, for example, a gate electrode 156, multiple nanowires 158, gate insulation films 155, spacers 157, and sidewalls 115. The gate electrode 156 extends in the Y direction and stands up in the Z direction. The nanowires 158 penetrate the gate electrode 156 in the X direction, and are arrayed in the Y direction and in the Z direction. The gate insulation films 155 are formed between the gate electrode 156 and the nanowires 158. In the X direction, the gate electrode 156 and the gate insulation films 155 are formed to be receded from both ends of the nanowires 158, and the spacers 157 are formed in the receded portions. The sidewalls 115 are formed on the side surfaces of the gate electrode 156 via the gate insulation films 155.

For example, for the gate electrode 156, titanium, titanium nitride, polycrystalline silicon, or the like may be used. For example, for the gate insulation films 155, a high dielectric constant material such as hafnium oxide, aluminum oxide, oxide of hafnium and aluminum, or the like may be used. For example, for the nanowires 158, silicon or the like may be used. For example, for the spacers 157 and the sidewalls 115, silicon oxide, silicon nitride, or the like may be used.

For example, the number of layers of the nanowires 158 arrayed in the Z-direction is four, and in the element active region 10*a*, two p-type semiconductor layers 131*p* that contact the ends of two layers of the nanowires 158 on the semiconductor substrate 101 side, are formed so as to sandwich the gate structure 191 in-between in the X direction. Also, two n-type semiconductor layers 141*n* that contact the ends of two layers of the nanowires 158 on the side apart from the semiconductor substrate 101, are formed so as to sandwich the gate structure 191 in-between in the X direction. In the X direction, the n-type semiconductor layers 141*n* are shorter than the p-type semiconductor layers 131*p*. Insulation films 132 are formed between the p-type semiconductor layers 131*p* and the n-type semiconductor layers 141*n*. For example, the p-type semiconductor layer 131*p* is a p-type SiGe layer, and the n-type semiconductor layer 141*n* is an n-type Si layer. For example, for the insulation films 132, silicon oxide, silicon nitride, or the like may be used.

For example, as illustrated in FIGS. 1A and 3, four groups of nanowires 158 each having four layers stacked in the Z direction are arrayed along the Y direction. Each of the groups of nanowires 158 is placed over a portion of the top surface of the semiconductor substrate 101 exposed between the element separating regions 102. The element separating regions 102 are formed between the exposed portions of the semiconductor substrate 101. Note that the number of groups of nanowires 158 arrayed in the Y direction is not limited to four, and, for example, may be one to three, or may be five or more. Also, the number of layers of the nanowires 158 arrayed in the Z-direction is not limited to four; for example, one, three, or more layers of nanowires 158 may be stacked between the p-type semiconductor layers 131*p*, and one, three, or more layers of nanowires 158 may be stacked between the n-type semiconductor layers 141*n*. Also, the number of layers of the nanowires 158 stacked between the p-type semiconductor layers 131*p* may be different from that stacked between the n-type semiconductor layers 141*n*. Such changes in the layout of the nanowires 158 may be applied not only to the element active region 10*a*, but also to the element active regions 10*b* to 10*d*, and may also be applied to the other embodiments.

In this way, the stacked transistor structure 190*a* has a pFET that includes the gate electrode 156, the nanowires

158, the gate insulation films 155, and the p-type semiconductor layers 131*p*. In this pFET, one of the p-type semiconductor layers 131*p* functions as a source region, the other p-type semiconductor layer 131*p* functions as a drain region, and the nanowires 158 collectively function as a channel. The stacked transistor structure 190*a* also has an nFET that includes the gate electrode 156, the nanowires 158, the gate insulation films 155, and the n-type semiconductor layers 141*n*. In this nFET, one of the n-type semiconductor layers 141*n* functions as a source region, the other n-type semiconductor layer 141*n* functions as a drain region, and the nanowires 158 collectively function as a channel.

In the element active region 10*b*, a stacked transistor structure 190*b* is formed over the semiconductor substrate 101. The stacked transistor structure 190*b*, like the stacked transistor structure 190*a*, includes a gate structure 191. Also, in the element active region 10*b*, two n-type semiconductor layers 131*n* that contact the ends of two layers of the nanowires 158 on the semiconductor substrate 101 side, are formed so as to sandwich the gate structure 191 in-between in the X direction. Also, two p-type semiconductor layers 141*p* that contact the ends of two layers of the nanowires 158 on the side apart from the semiconductor substrate 101, are formed so as to sandwich the gate structure 191 in-between in the X direction. In the X direction, the p-type semiconductor layers 141*p* are shorter than the n-type semiconductor layers 131*n*. Insulation films 132 are formed between the n-type semiconductor layers 131*n* and the p-type semiconductor layers 141*p*. For example, the n-type semiconductor layers 131*n* are n-type Si layers, and the p-type semiconductor layers 141*p* are p-type SiGe layers.

In this way, the stacked transistor structure 190*b* has an nFET that includes the gate electrode 156, the nanowires 158, the gate insulation films 155, and the n-type semiconductor layers 131*n*. In this nFET, one of the n-type semiconductor layers 131*n* functions as a source region, the other n-type semiconductor layer 131*n* functions as a drain region, and the nanowires 158 collectively function as a channel. The stacked transistor structure 190*b* also has a pFET that includes the gate electrode 156, the nanowires 158, the gate insulation films 155, and the p-type semiconductor layers 141*p*. In this pFET, one of the p-type semiconductor layers 141*p* functions as a source region, the other p-type semiconductor layer 141*p* functions as a drain region, and the nanowires 158 collectively function as a channel.

In the element active region 10*c*, a stacked transistor structure 190*c* is formed over the semiconductor substrate 101. The stacked transistor structure 190*c*, like the stacked transistor structure 190*a*, includes a gate structure 191. Also, in the element active region 10*c*, two n-type semiconductor layers 131*n* that contact the ends of two layers of the nanowires 158 on the semiconductor substrate 101 side, are formed so as to sandwich the gate structure 191 in-between in the X direction. Also, two n-type semiconductor layers 141*n* that contact the ends of two layers of the nanowires 158 on the side apart from the semiconductor substrate 101, are formed so as to sandwich the gate structure 191 in-between in the X direction. In the X direction, the n-type semiconductor layers 141*n* are shorter than the n-type semiconductor layers 131*n*. Insulation films 132 are formed between the n-type semiconductor layers 131*n* and the n-type semiconductor layers 141*n*.

In this way, the stacked transistor structure 190*c* has an nFET that includes the gate electrode 156, the nanowires 158, the gate insulation films 155, and the n-type semiconductor layers 131*n*. In this nFET, one of the n-type semiconductor layers 131*n* functions as a source region, the other n-type semiconductor layer 131*n* functions as a drain region, and the nanowires 158 collectively function as a channel. The stacked transistor structure 190*c* also has an nFET that includes the gate electrode 156, the nanowires 158, the gate insulation films 155, and the n-type semiconductor layers 141*n*. In this nFET, one of the n-type semiconductor layers 141*n* functions as a source region, the other n-type semiconductor layer 141*n* functions as a drain region, and the nanowires 158 collectively function as a channel.

In the element active region 10*d*, a stacked transistor structure 190*d* is formed over the semiconductor substrate 101. The stacked transistor structure 190*d*, like the stacked transistor structure 190*a*, includes a gate structure 191. Also, in the element active region 10*d*, two p-type semiconductor layers 131*p* that contact the ends of two layers of the nanowires 158 on the semiconductor substrate 101 side, are formed so as to sandwich the gate structure 191 in-between in the X direction. Also, two p-type semiconductor layers 141*p* that contact the ends of two layers of the nanowires 158 on the side apart from the semiconductor substrate 101, are formed so as to sandwich the gate structure 191 in-between in the X direction. In the X direction, the p-type semiconductor layers 141*p* are shorter than the p-type semiconductor layers 131*p*. Insulation films 132 are formed between the p-type semiconductor layers 131*p* and the p-type semiconductor layers 141*p*.

In this way, the stacked transistor structure 190*d* has a pFET that includes the gate electrode 156, the nanowires 158, the gate insulation films 155, and the p-type semiconductor layers 131*p*. In this pFET, one of the p-type semiconductor layers 131*p* functions as a source region, the other p-type semiconductor layer 131*p* functions as a drain region, and the nanowires 158 collectively function as a channel. The stacked transistor structure 190*d* also has a pFET that includes the gate electrode 156, the nanowires 158, the gate insulation films 155, and the p-type semiconductor layers 141*p*. In this pFET, one of the p-type semiconductor layers 141*p* functions as a source region, the other p-type semiconductor layer 141*p* functions as a drain region, and the nanowires 158 collectively function as a channel. Note that as the material of the semiconductor layers in the stacked transistor structures 190*a* to 190*d*, an SiGe layer may be used instead of an Si layer. Also, an Si layer may be used instead of an SiGe layer. These are also applicable to the other embodiments.

The semiconductor device according to the first embodiment includes an interlayer insulation film 162 that covers these stacked transistor structures 190*a* to 190*d*. The interlayer insulation film 162 may be formed by layering multiple insulation films. In the element active region 10*a*, openings 171 that reach the respective p-type semiconductor layers 131*p* are formed in the interlayer insulation film 162 and in the insulation films 132, and openings 172 that reach the respective n-type semiconductor layers 141*n* are formed in the interlayer insulation film 162. In the element active region 10*b*, openings 173 that reach the respective n-type semiconductor layers 131*n* are formed in the interlayer insulation film 162 and in the insulation films 132, and openings 174 that reach the respective p-type semiconductor layers 141*p* are formed in the interlayer insulation film 162. In the element active region 10*c*, openings 173 that reach the respective n-type semiconductor layers 131*n* are formed in the interlayer insulation film 162 and in the insulation films 132, and openings 172 that reach the respective n-type semiconductor layers 141*n* are formed in the interlayer insulation film 162. In the element active region 10*d*, openings 171 that reach the respective p-type semiconductor layers 131*p* are formed in the interlayer insulation film 162 and in the insulation films 132, and openings 174 that reach the respective p-type semiconductor layers 141*p* are formed in the interlayer insulation film 162. A conductive film 181 is formed in each of the openings 171; a conductive film 182 is formed in each of the openings 172; a conductive film 183 is formed in each of the openings 173; and a conductive film 184 is formed in each of the openings 174.

Also, in each of the element active regions 10*a* to 10*d*, an opening 175 that reaches the gate electrode 156 is formed in the interlayer insulation film 162, and a conductive film 185 is formed in the opening 175.

For example, for the interlayer insulation film 162, silicon oxide, silicon nitride, silicon carbide, silicon oxynitride, or the like may be used. For example, for the conductive films 181 to 185, tungsten, cobalt, ruthenium, or the like may be used. In the case of using tungsten, it is favorable to form a conductive underlayer film, whereas in the case of using cobalt or ruthenium, it is not necessary to form an underlayer film.

In the semiconductor device according to the first embodiment, the stacked transistor structure 190*a* includes a pFET and an nFET thereover, and the stacked transistor structure 190*b* includes an nFET and a pFET thereover; these are examples of CFETs. Other than these CFETs, the semiconductor device according to the first embodiment includes the stacked transistor structure 190*c* that includes an nFET and an nFET thereover, and the stacked transistor structure 190*d* that includes a pFET and a pFET thereover. Therefore, according to the first embodiment, two transistors of the same conductivity type that have been conventionally provided at different positions in plan view, can be overlapped in plan view, and thereby, the semiconductor device can be made finer.

Second Embodiment

Figure 4A:
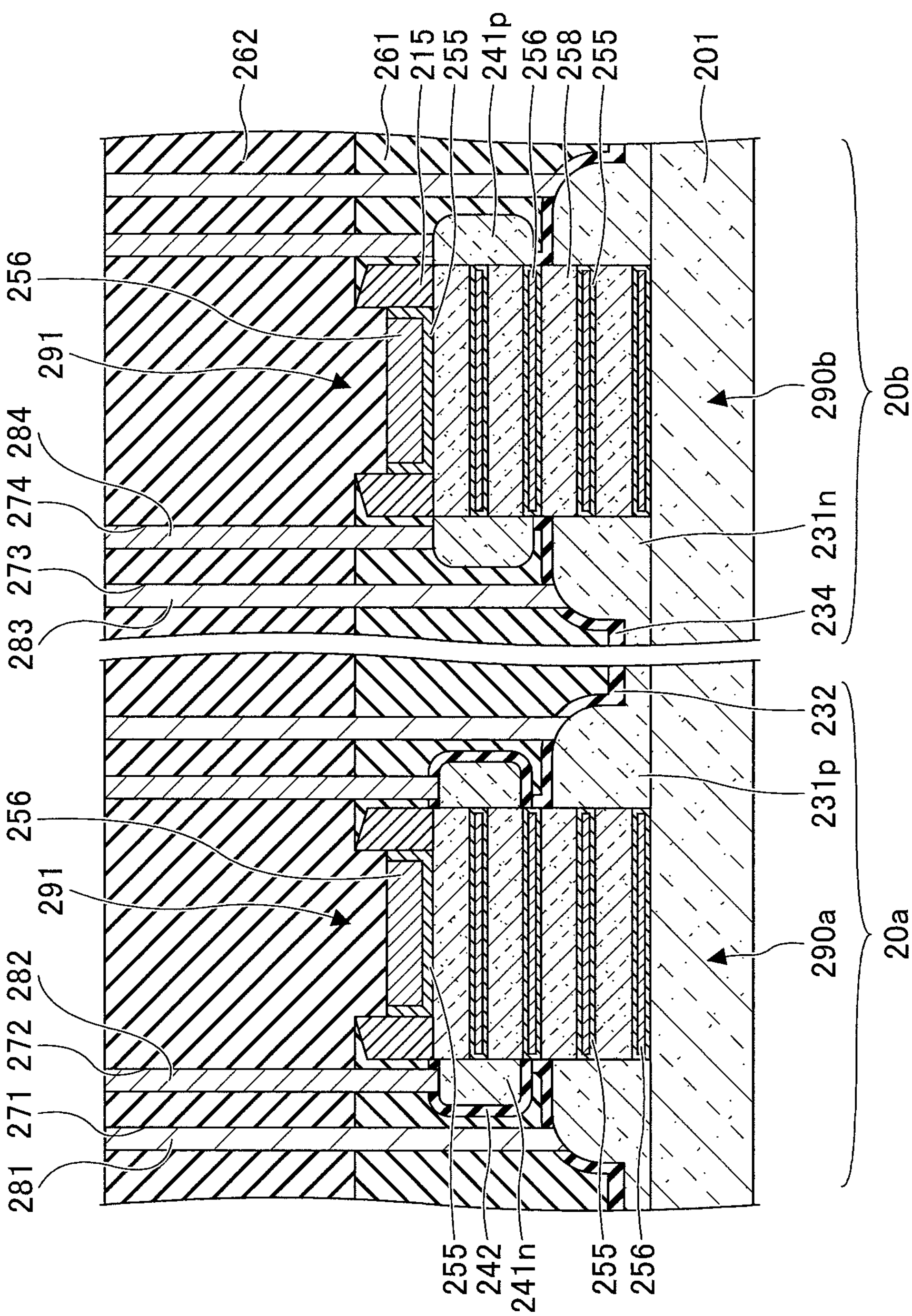
FIG. 4A is a cross sectional view (part 1) illustrating a configuration of a semiconductor device according to a second embodiment.
Figure 4B:
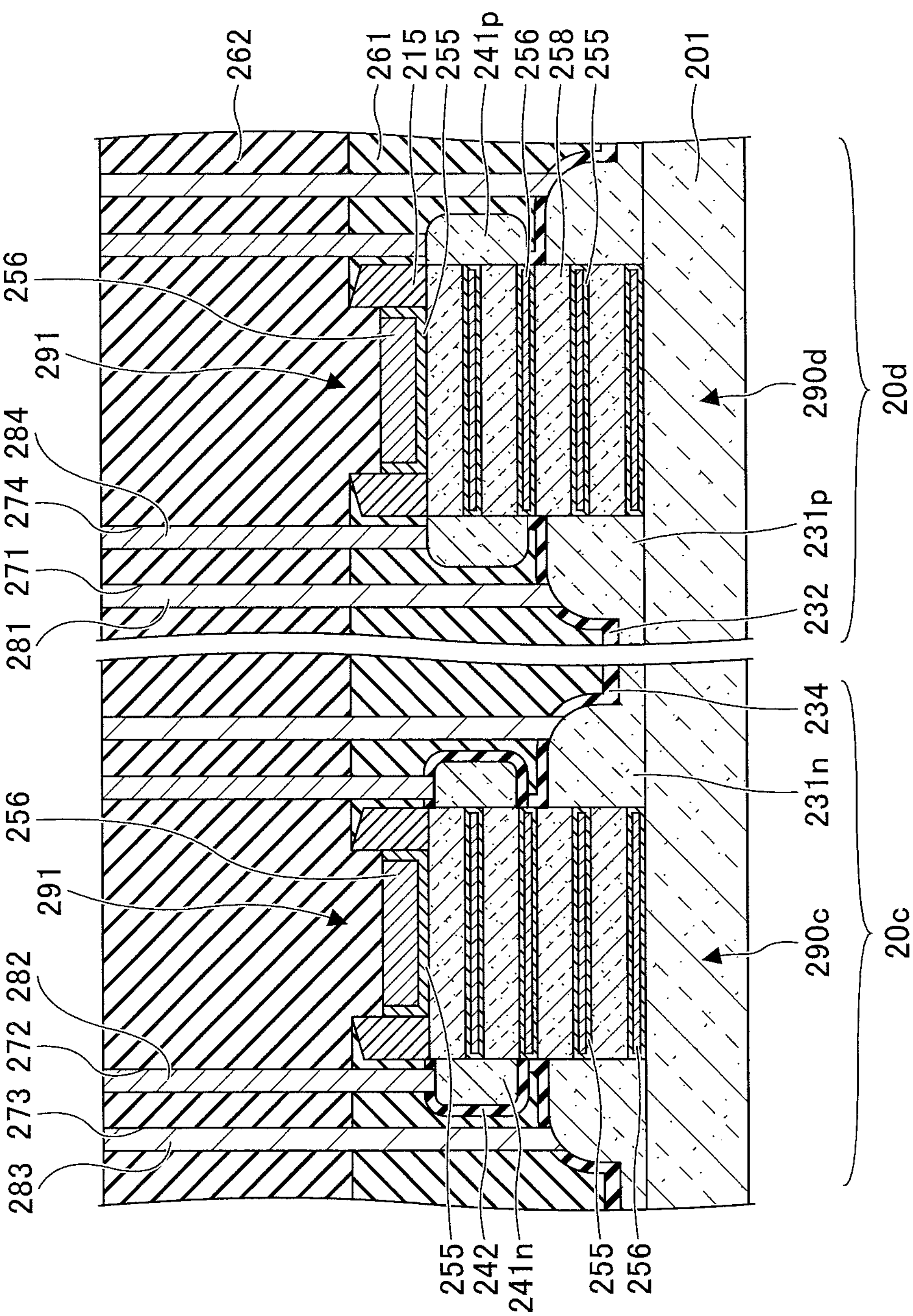
FIG. 4B is a cross sectional view (part 2) illustrating a configuration of a semiconductor device according to the second embodiment.

Next, a semiconductor device according to a second embodiment will be described. As in the first embodiment, the second embodiment includes an element active region in which an nFET is formed over a pFET, an element active region in which a pFET is formed over an nFET, an element active region in which an nFET is formed over an nFET, and an element active region in which a pFET is formed over a pFET. FIGS. 4A and 4B are cross sectional views illustrating a configuration of the semiconductor device according to the second embodiment.

As illustrated in FIGS. 4A and 4B, in the semiconductor device according to the second embodiment, element separating regions (not illustrated) are formed over the surface of a semiconductor substrate 201 such as a silicon (Si) substrate or the like, and the element separating regions demarcate, for example, four element active regions 20*a*, 20*b*, 20*c*, and 20*d*.

In the element active region 20*a*, a stacked transistor structure 290*a* is formed over the semiconductor substrate 201. The stacked transistor structure 290*a* includes a gate structure 291 formed over the semiconductor substrate 201. The gate structure 291 includes a gate electrode 256, multiple nanowires 258, gate insulation films 255, and sidewalls 215. The gate electrode 256 extends in the Y direction and stands up in the Z direction. The nanowires 258 penetrate the gate electrode 256 in the X direction, and are arrayed in the Y direction and in the Z direction. The gate insulation films 255 are formed between the gate electrode 256 and the nanowires 258. The sidewalls 215 are formed on the side surfaces of the gate electrode 256 via the gate insulation films 255.

For example, for the gate electrode 256, titanium, titanium nitride, polycrystalline silicon, or the like may be used. For example, for the gate insulation films 255, a high dielectric constant material such as hafnium oxide, aluminum oxide, oxide of hafnium and aluminum, or the like may be used. For example, for the nanowires 258, silicon or the like may be used. For example, for the sidewalls 215, silicon oxide, silicon nitride, or the like may be used.

For example, the number of layers of the nanowires 258 arrayed in the Z-direction is four, and in the element active region 20*a*, two p-type SiGe layers 231*p* that contact the ends of two layers of the nanowires 258 on the semiconductor substrate 201 side, are formed so as to sandwich the gate structure 291 in-between in the X direction. An oxide film 232 is formed over the surface of each of the p-type SiGe layers 231*p*. Also, two n-type Si layers 241*n* that contact the ends of two layers of the nanowires 258 on the side apart from the semiconductor substrate 201, are formed so as to sandwich the gate structure 291 in-between in the X direction. An oxide film 242 is formed over the surface of each of the n-type Si layers 241*n*. In the X direction, the n-type Si layers 241*n* are shorter than the p-type SiGe layers 231*p*.

In this way, the stacked transistor structure 290*a* has a pFET that includes the gate electrode 256, the nanowires 258, the gate insulation films 255, and the p-type SiGe layers 231*p*. In this pFET, one of the p-type SiGe layers 231*p* functions as a source region, the other p-type SiGe layer 231*p* functions as a drain region, and the nanowires 258 collectively function as a channel. The stacked transistor structure 290*a* also has an nFET that includes the gate electrode 256, the nanowires 258, the gate insulation films 255, and the n-type Si layers 241*n*. In this nFET, one of the n-type Si layers 241*n* functions as a source region, the other n-type Si layer 241*n* functions as a drain region, and the nanowires 258 collectively function as a channel.

In the element active region 20*b*, a stacked transistor structure 290*b* is formed over the semiconductor substrate 201. The stacked transistor structure 290*b*, like the stacked transistor structure 290*a*, includes a gate structure 291. Also, in the element active region 20*b*, two n-type Si layers 231*n* that contact the ends of two layers of the nanowires 158 on the semiconductor substrate 201 side, are formed so as to sandwich the gate structure 291 in-between in the X direction. An oxide film 234 is formed over the surface of each of the n-type Si layers 231*n*. Also, two p-type SiGe layers 241*p* that contact the ends of two layers of the nanowires 258 on the side apart from the semiconductor substrate 201, are formed so as to sandwich the gate structure 291 in-between in the X direction. In the X direction, the p-type SiGe layers 241*p* are shorter than the n-type Si layers 231*n*.

In this way, the stacked transistor structure 290*b* has an nFET that includes the gate electrode 256, the nanowires 258, the gate insulation films 255, and the n-type Si layers 231*n*. In this nFET, one of the n-type Si layers 231*n* functions as a source region, the other n-type Si layer 231*n* functions as a drain region, and the nanowires 258 collectively function as a channel. The stacked transistor structure 290*b* also has a pFET that includes the gate electrode 256, the nanowires 258, the gate insulation films 255, and the p-type SiGe layers 241*p*. In this pFET, one of the p-type SiGe layers 241*p* functions as a source region, the other p-type SiGe layer 241*p* functions as a drain region, and the nanowires 258 collectively function as a channel.

In the element active region 20$c$, a stacked transistor structure 290$c$ is formed over the semiconductor substrate 201. The stacked transistor structure 290$c$, like the stacked transistor structure 290$a$, includes a gate structure 291. Also, in the element active region 20$c$, two n-type Si layers 231$n$ that contact the ends of two layers of the nanowires 158 on the semiconductor substrate 201 side, are formed so as to sandwich the gate structure 291 in-between in the X direction. An oxide film 234 is formed over the surface of each of the n-type Si layers 231$n$. Also, two n-type Si layers 241$n$ that contact the ends of two layers of the nanowires 258 on the side apart from the semiconductor substrate 201, are formed so as to sandwich the gate structure 291 in-between in the X direction. An oxide film 242 is formed over the surface of each of the n-type Si layers 241$n$. In the X direction, the n-type Si layers 241$n$ are shorter than the n-type Si layers 231$n$.

In this way, the stacked transistor structure 290$c$ has an nFET that includes the gate electrode 256, the nanowires 258, the gate insulation films 255, and the n-type Si layers 231$n$. In this nFET, one of the n-type Si layers 231$n$ functions as a source region, the other n-type Si layer 231$n$ functions as a drain region, and the nanowires 258 collectively function as a channel. The stacked transistor structure 290$c$ also has an nFET that includes the gate electrode 256, the nanowires 258, the gate insulation films 255, and the n-type Si layers 241$n$. In this nFET, one of the n-type Si layers 241$n$ functions as a source region, the other n-type Si layer 241$n$ functions as a drain region, and the nanowires 258 collectively function as a channel.

In the element active region 20$d$, a stacked transistor structure 290$d$ is formed over the semiconductor substrate 201. The stacked transistor structure 290$d$, like the stacked transistor structure 290$a$, includes a gate structure 291. Also, in the element active region 20$d$, two p-type SiGe layers 231$p$ that contact the ends of two layers of the nanowires 158 on the semiconductor substrate 201 side, are formed so as to sandwich the gate structure 291 in-between in the X direction. An oxide film 232 is formed over the surface of each of the p-type SiGe layers 231$p$. Also, two p-type SiGe layers 241$p$ that contact the ends of two layers of the nanowires 258 on the side apart from the semiconductor substrate 201, are formed so as to sandwich the gate structure 291 in-between in the X direction. In the X direction, the p-type SiGe layers 241$p$ are shorter than the p-type SiGe layers 231$p$.

In this way, the stacked transistor structure 290$d$ has a pFET that includes the gate electrode 256, the nanowires 258, the gate insulation films 255, and the p-type SiGe layers 231$p$. In this pFET, one of the p-type SiGe layers 231$p$ functions as a source region, the other p-type SiGe layer 231$p$ functions as a drain region, and the nanowires 258 collectively function as a channel. The stacked transistor structure 290$d$ also has a pFET that includes the gate electrode 256, the nanowires 258, the gate insulation films 255, and the p-type SiGe layers 241$p$. In this pFET, one of the p-type SiGe layers 241$p$ functions as a source region, the other p-type SiGe layer 241$p$ functions as a drain region, and the nanowires 258 collectively function as a channel.

An interlayer insulation film 261 is formed between the stacked transistor structures 290$a$ to 290$d$. Also, an interlayer insulation film 262 that covers the stacked transistor structures 290$a$ to 290$d$ is formed over the interlayer insulation film 261. Openings 271 to 274 are formed in the interlayer insulation film 262, the interlayer insulation film 261, and the oxide films 232, 234, and 242. The openings 271 reach the respective p-type SiGe layers 231$p$; the openings 272 reach the respective n-type Si layers 241$n$; the openings 273 reach the respective n-type Si layers 231$n$; and the openings 274 reach the respective p-type SiGe layers 241$p$. A conductive film 281 is formed in each of the openings 271; a conductive film 282 is formed in each of the openings 272; a conductive film 283 is formed in each of the openings 273; and a conductive film 284 is formed in each of the openings 274.

Also, in each of the element active regions 20$a$ to 20$d$, an opening (not illustrated) that reaches the gate electrode 256 is formed in the interlayer insulation film 262, and a conductive film is formed in the opening.

For example, for the interlayer insulation films 261 and 262, silicon oxide, silicon nitride, silicon carbide, silicon oxynitride, or the like may be used. For example, for the conductive films 281 to 284, tungsten, cobalt, ruthenium, or the like may be used. In the case of using tungsten, it is favorable to form a conductive underlayer film, whereas in the case of using cobalt or ruthenium, it is not necessary to form an underlayer film.

In the semiconductor device according to the second embodiment, the stacked transistor structure 290$a$ includes a pFET and an nFET thereover, and the stacked transistor structure 290$b$ includes an nFET and a pFET thereover; these are examples of CFETs. Other than these CFETs, the semiconductor device according to the second embodiment includes the stacked transistor structure 290$c$ that includes an nFET and an nFET thereover, and the stacked transistor structure 290$d$ that includes a pFET and a pFET thereover. Therefore, according to the second embodiment, two transistors of the same conductivity type that have been conventionally provided at different positions in plan view, can be overlapped in plan view, and thereby, the semiconductor device can be made finer.

Next, a method of producing a semiconductor device according to the second embodiment will be described. FIGS. 5A and 5B to 30A and 30B are cross sectional views illustrating a method of producing a semiconductor device according to the second embodiment. FIG. 31 is a perspective view illustrating a process during the course of producing a semiconductor device according to the second embodiment.

Figure 5A:
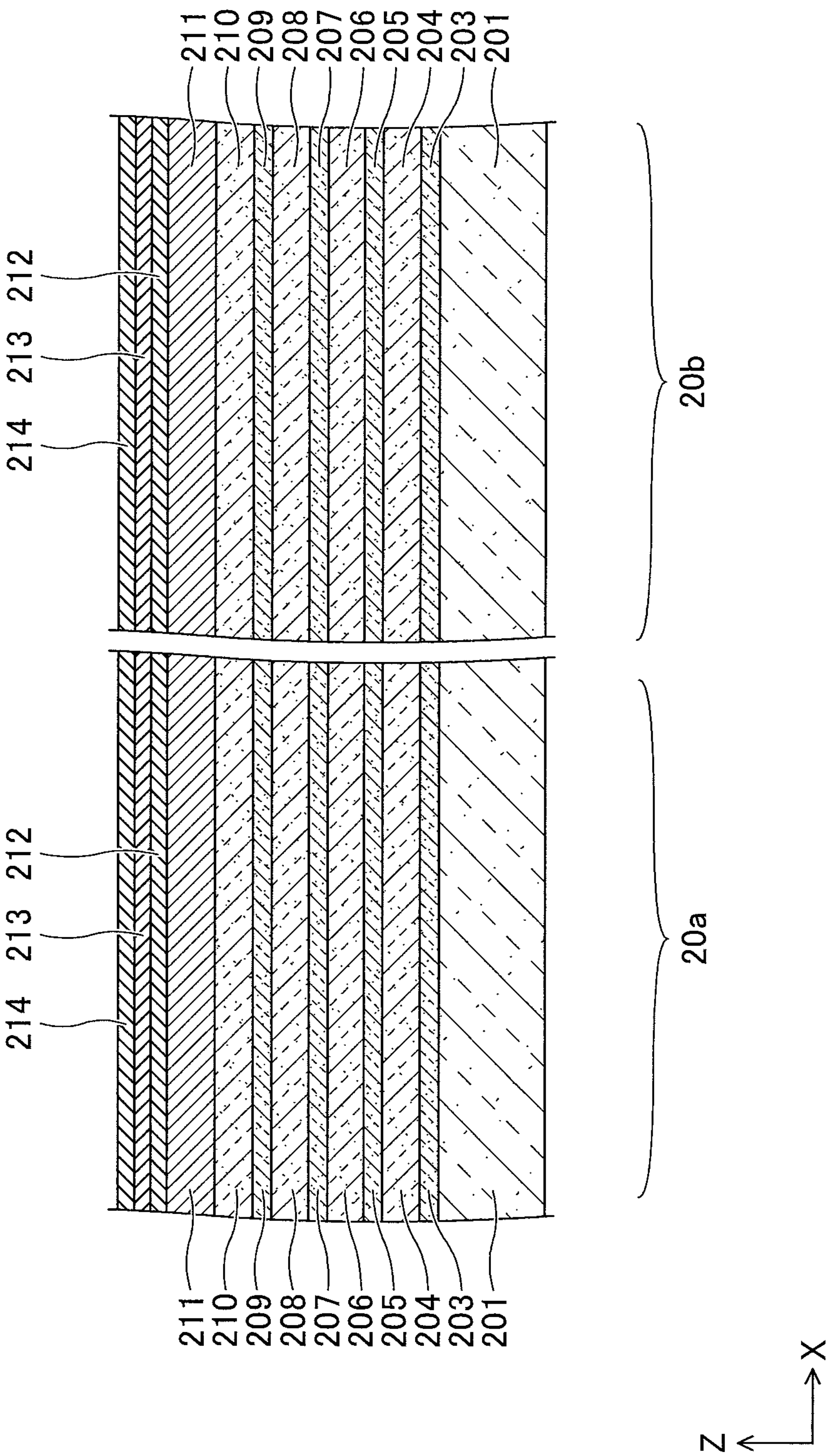
FIG. 5A is a cross sectional view (part 1) illustrating a method of producing a semiconductor device according to the second embodiment.
Figure 5B:
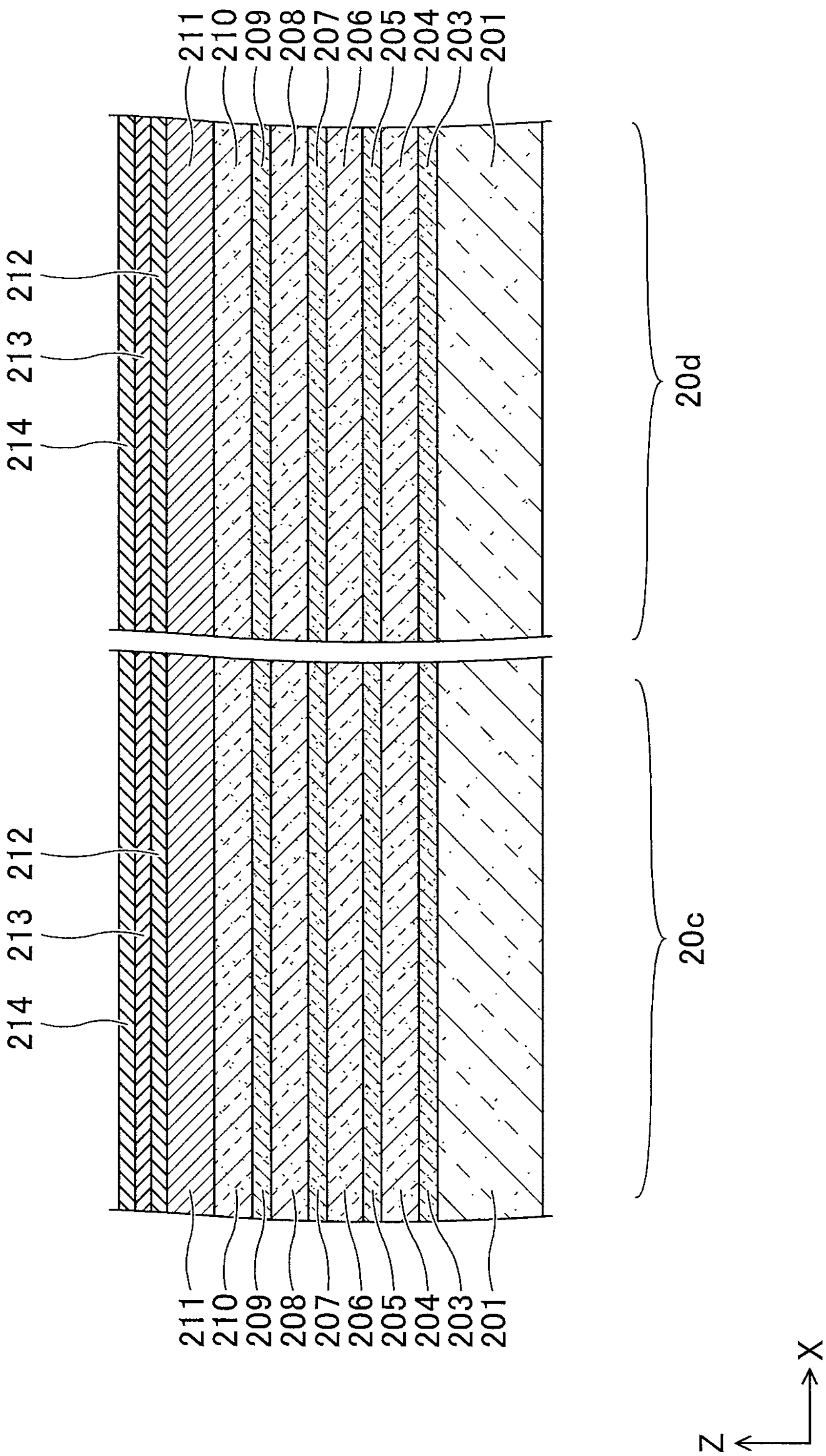
FIG. 5B is a cross sectional view (part 2) illustrating a method of producing a semiconductor device according to the second embodiment.

At the outset, element separating regions 202 are formed over a surface of a semiconductor substrate 201 (see FIG. 31). Next, as illustrated in FIGS. 5A and 5B, an SiGe film 203, an Si film 204, an SiGe film 205, an Si film 206, an SiGe film 207, an Si film 208, an SiGe film 209, and an Si film 210 are formed over the semiconductor substrate 201. Each of the SiGe films and Si films is formed, for example, by epitaxial growth. Next, the laminate of the SiGe films and Si films are etched and patterned into plates protruding from the semiconductor substrate 201. Thereafter, a sacrifice film 211, a silicon oxide film 212, a silicon nitride film 213, and a silicon oxide film 214 are formed over the Si film 210. These films can be formed, for example, by chemical vapor deposition (CVD). The sacrifice film 211 is, for example, a polycrystalline silicon film. Note that after the formation of the sacrifice film 211 and before the formation of the silicon oxide film 212, a flattening process may be applied to the top surface of the sacrifice film 211.

Figure 6A:
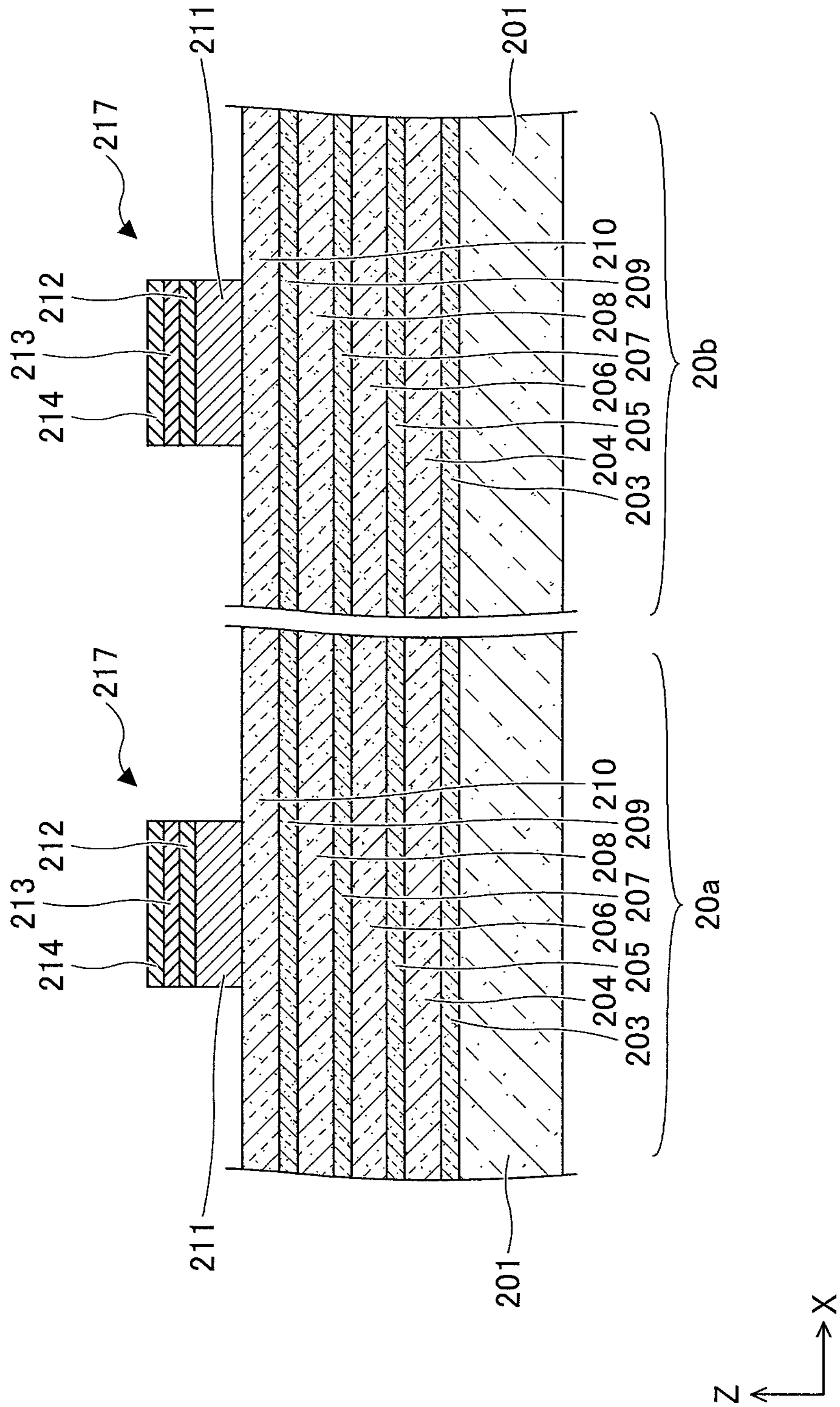
FIG. 6A is a cross sectional view (part 3) illustrating a method of producing a semiconductor device according to the second embodiment.
Figure 6B:
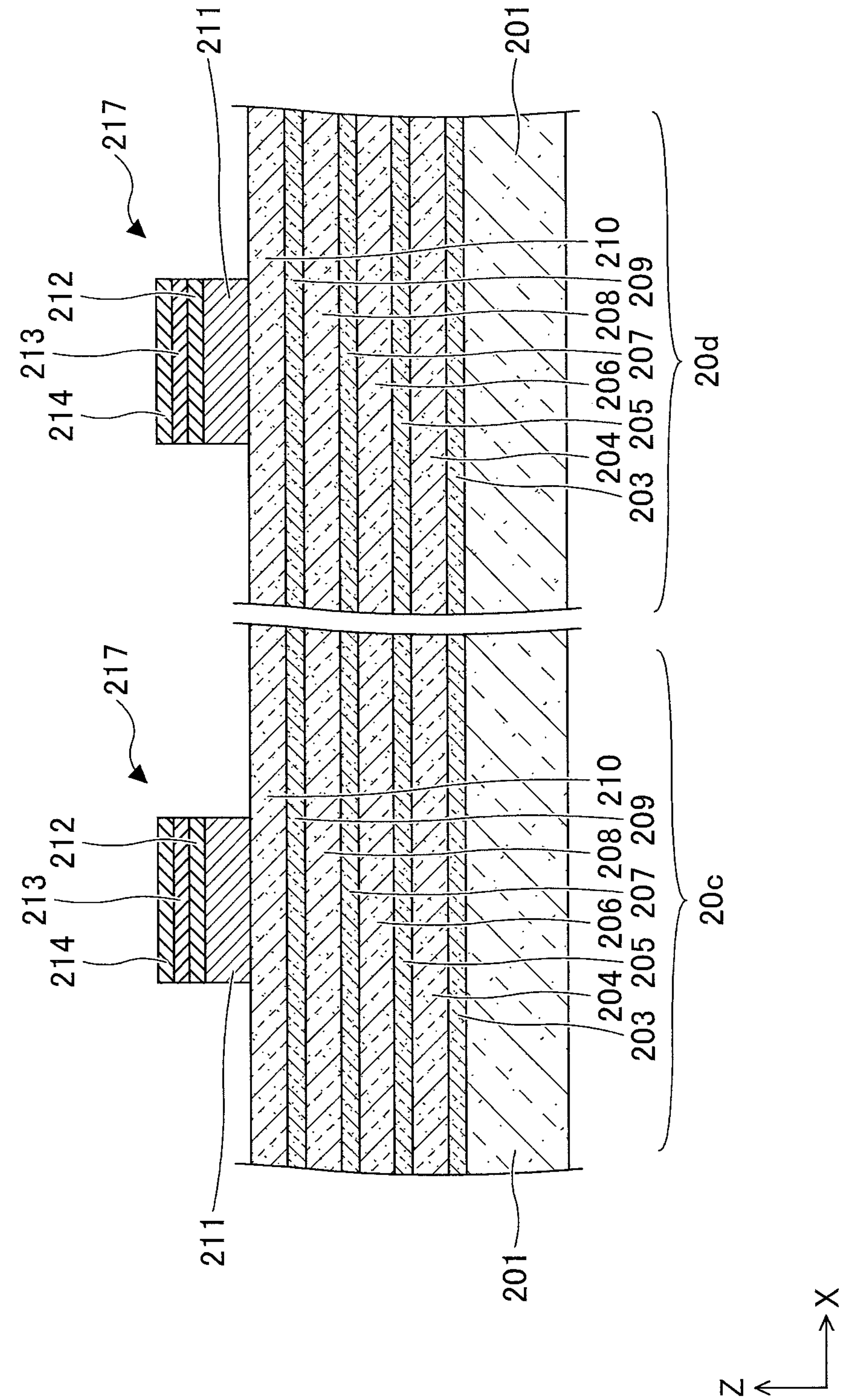
FIG. 6B is a cross sectional view (part 4) illustrating a method of producing a semiconductor device according to the second embodiment.

Next, as illustrated in FIGS. 6A and 6B, by photolithography and etching, in each of the element active regions 20$a$ to 20$d$, the silicon oxide film 214, the silicon nitride film 213, and the silicon oxide film 212 are patterned to form a dummy gate structure 217.

Figure 7A:
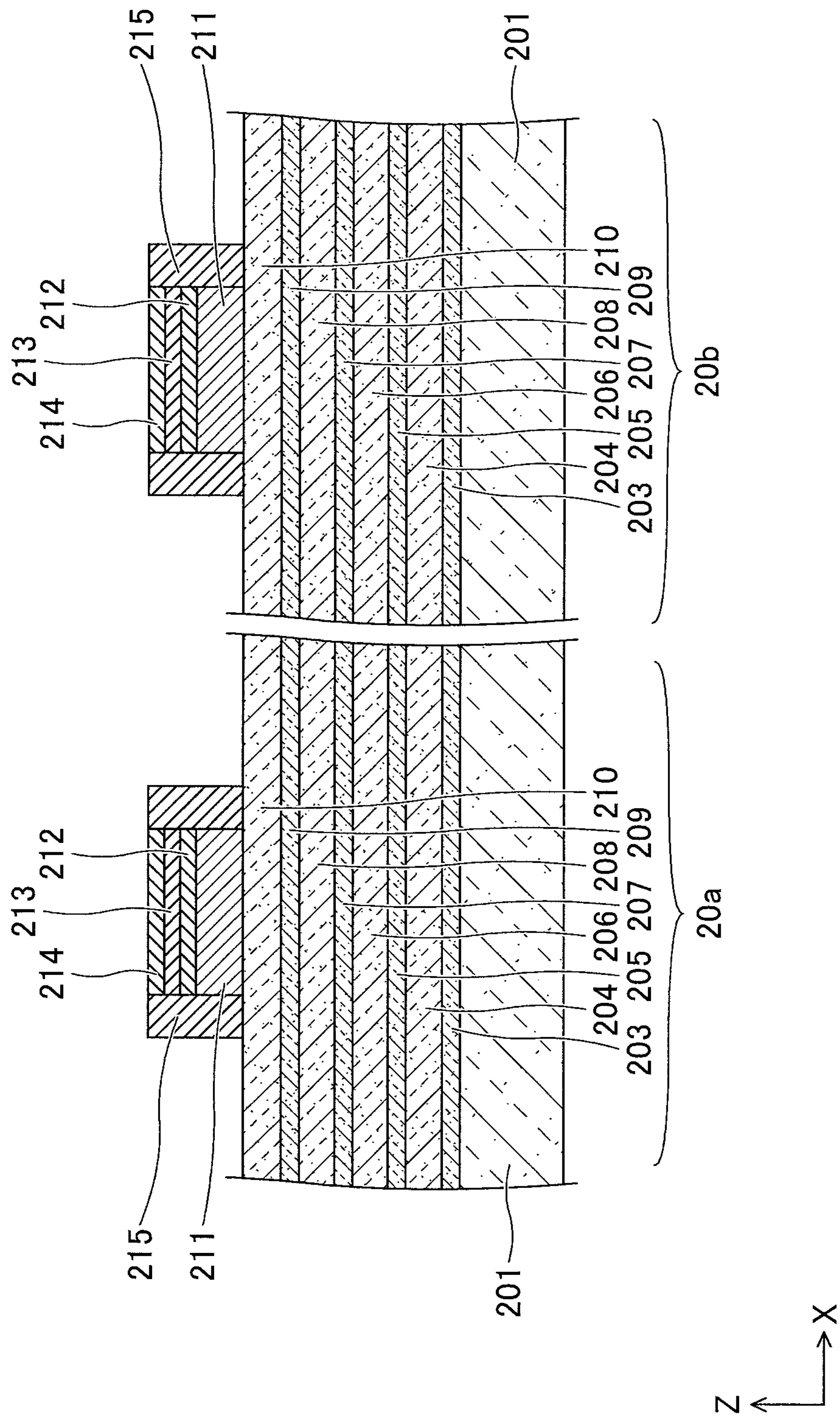
FIG. 7A is a cross sectional view (part 5) illustrating a method of producing a semiconductor device according to the second embodiment.
Figure 7B:
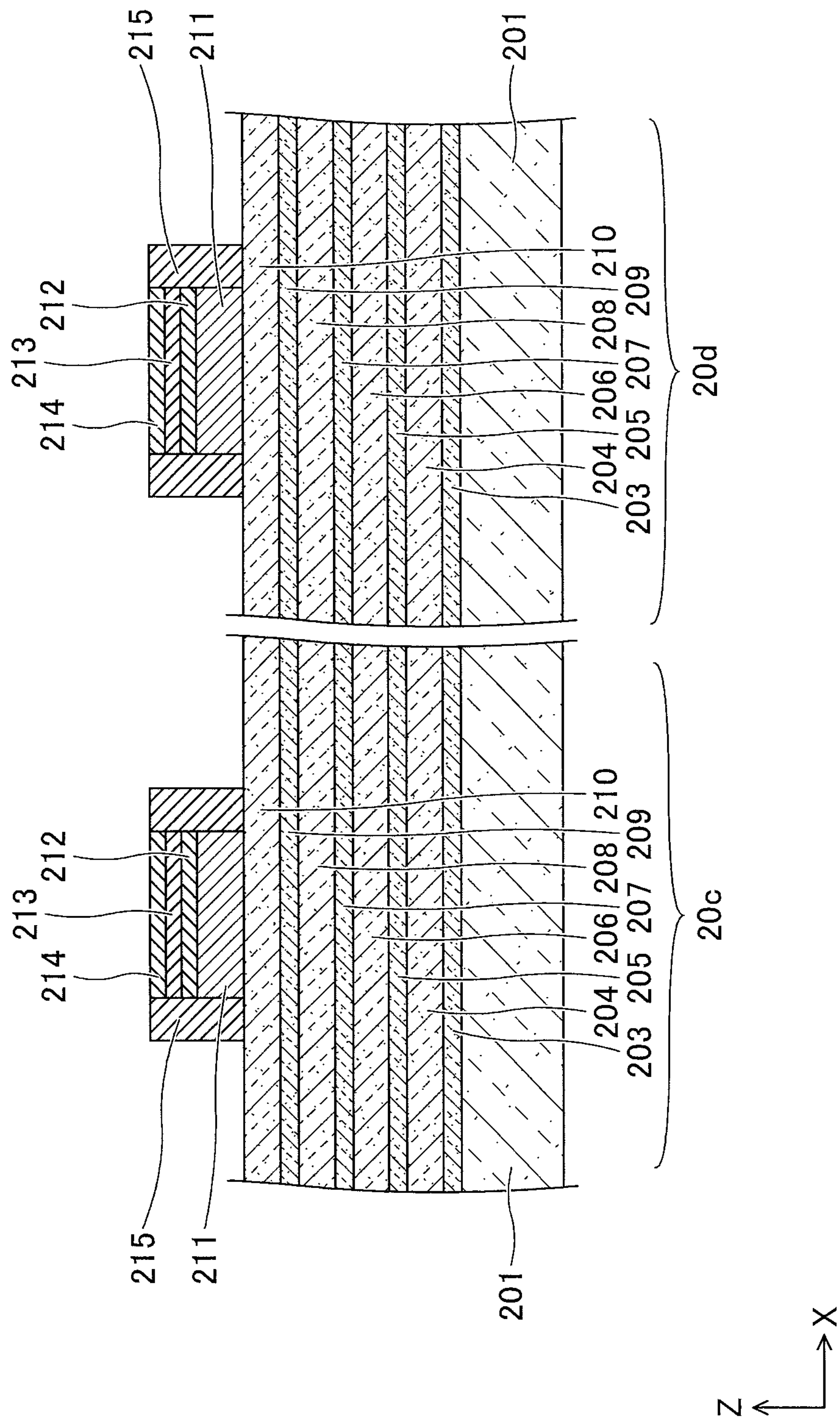
FIG. 7B is a cross sectional view (part 6) illustrating a method of producing a semiconductor device according to the second embodiment.

Next, as illustrated in FIGS. 7A and 7B, sidewalls 215 are formed on the side surfaces of the dummy gate structure

217. The sidewalls 215 can be formed, for example, by forming and etching back the silicon nitride film.

Figure 8A:
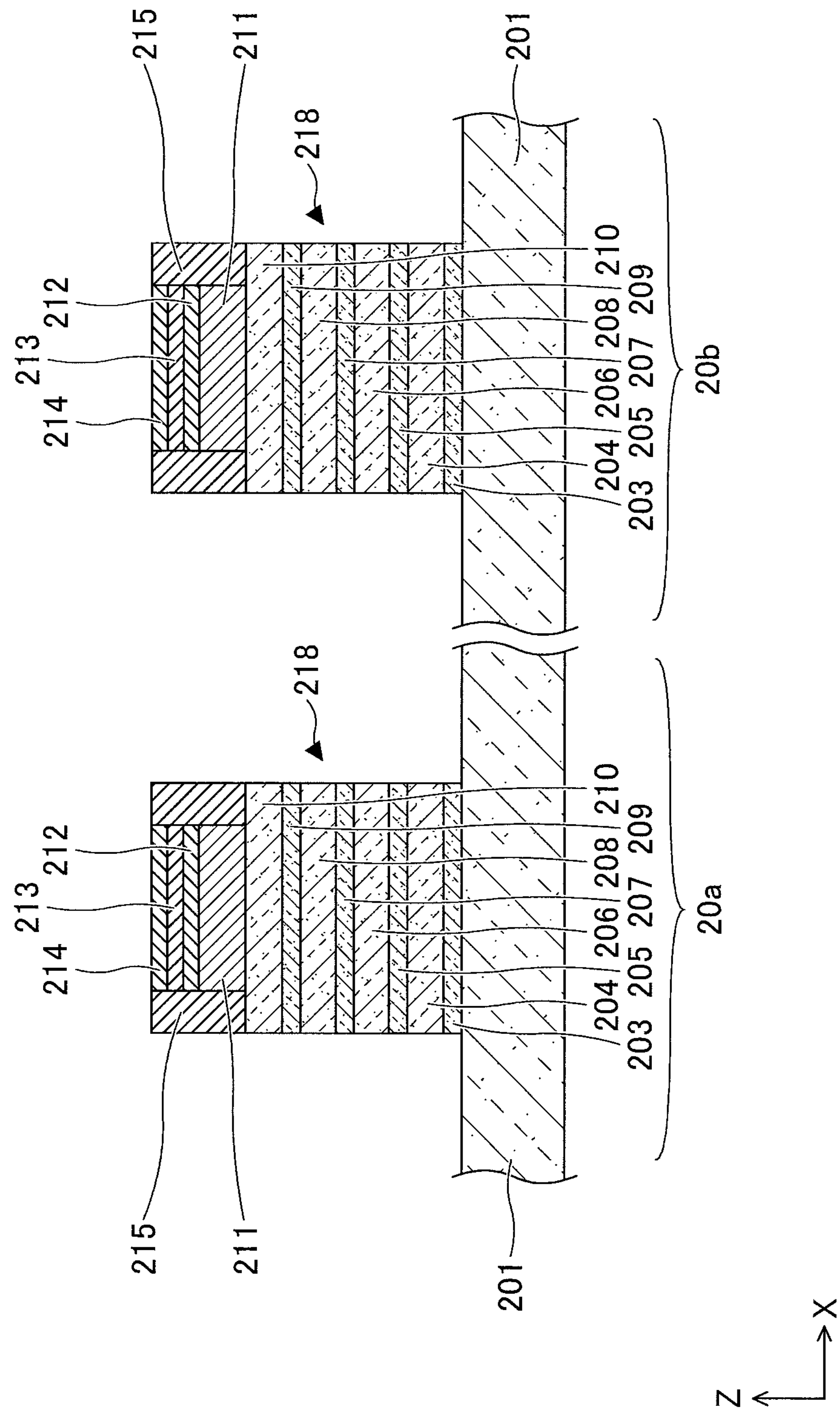
FIG. 8A is a cross sectional view (part 7) illustrating a method of producing a semiconductor device according to the second embodiment.
Figure 8B:
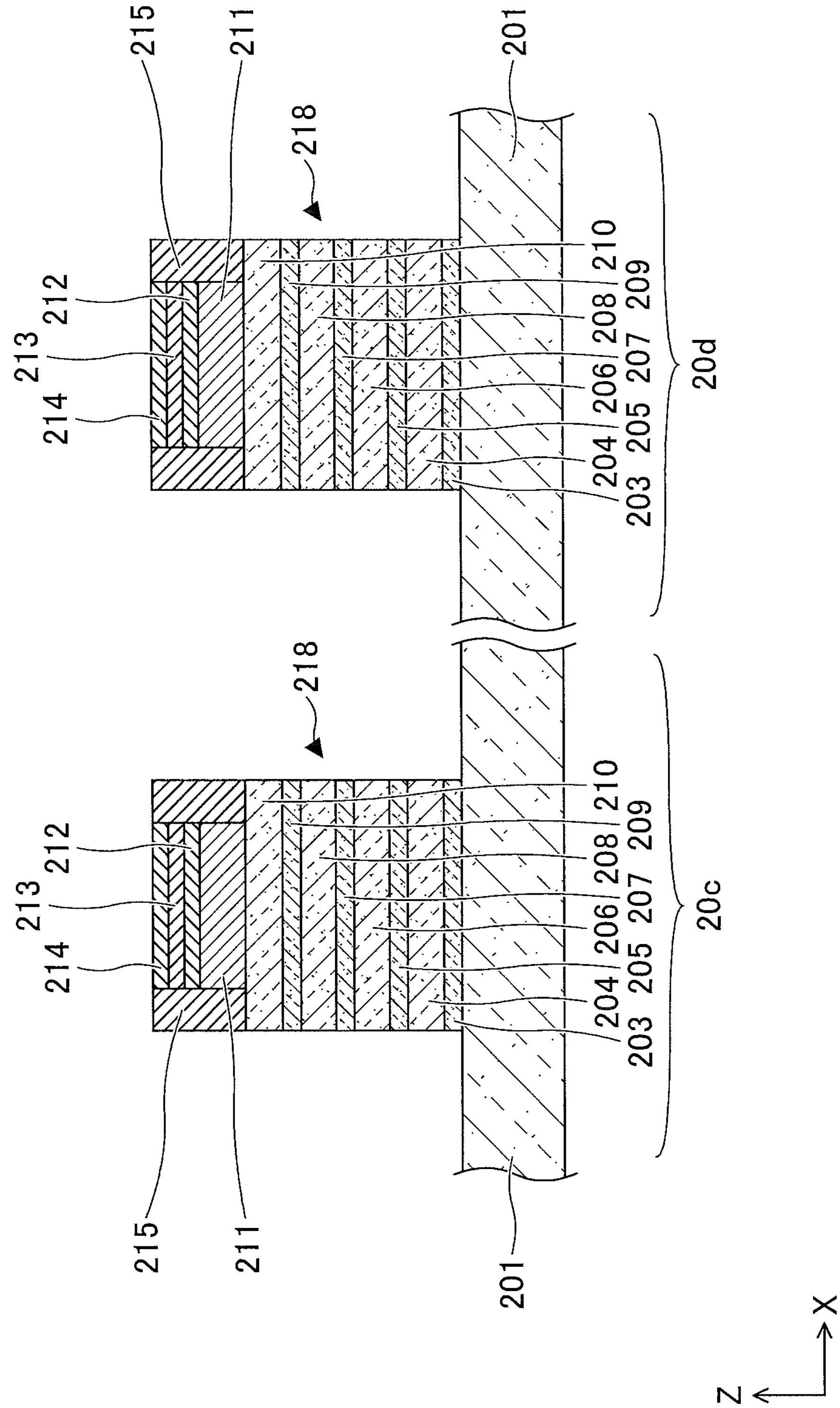
FIG. 8B is a cross sectional view (part 8) illustrating a method of producing a semiconductor device according to the second embodiment.

Thereafter, as illustrated in FIGS. 8A and 8B, by etching using the silicon oxide film 214 and the sidewalls 215 as the mask, the Si film 210, the SiGe film 209, the Si film 208, the SiGe film 207, the Si film 206, the SiGe film 205, the Si film 204, and the SiGe film 203 are patterned to form a semiconductor stacked structure 218. A section designated by double dashed lines in FIG. 31 corresponds to a cross sectional view of the element active region 20*a* in FIG. 8A.

Figure 9A:
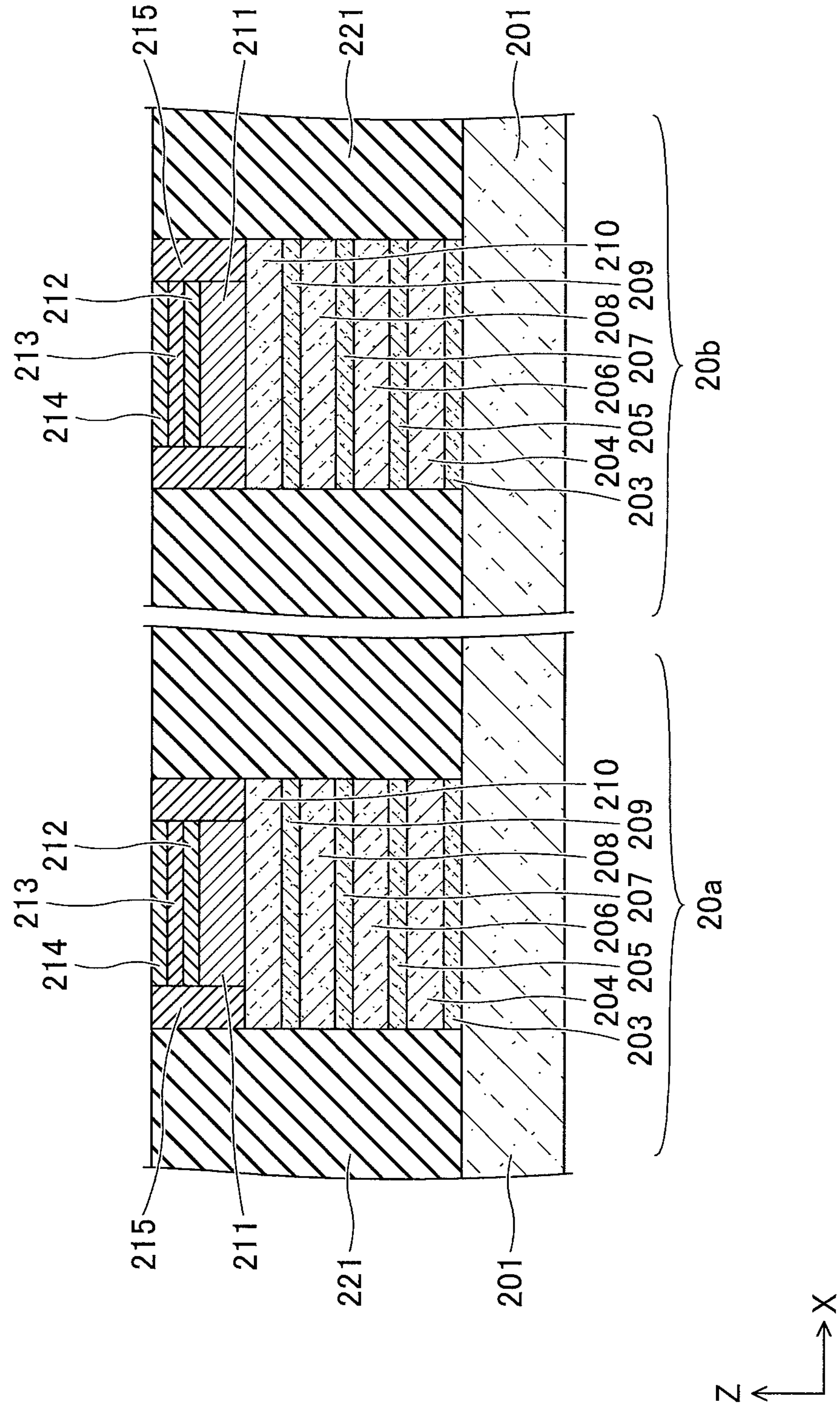
FIG. 9A is a cross sectional view (part 9) illustrating a method of producing a semiconductor device according to the second embodiment.
Figure 9B:
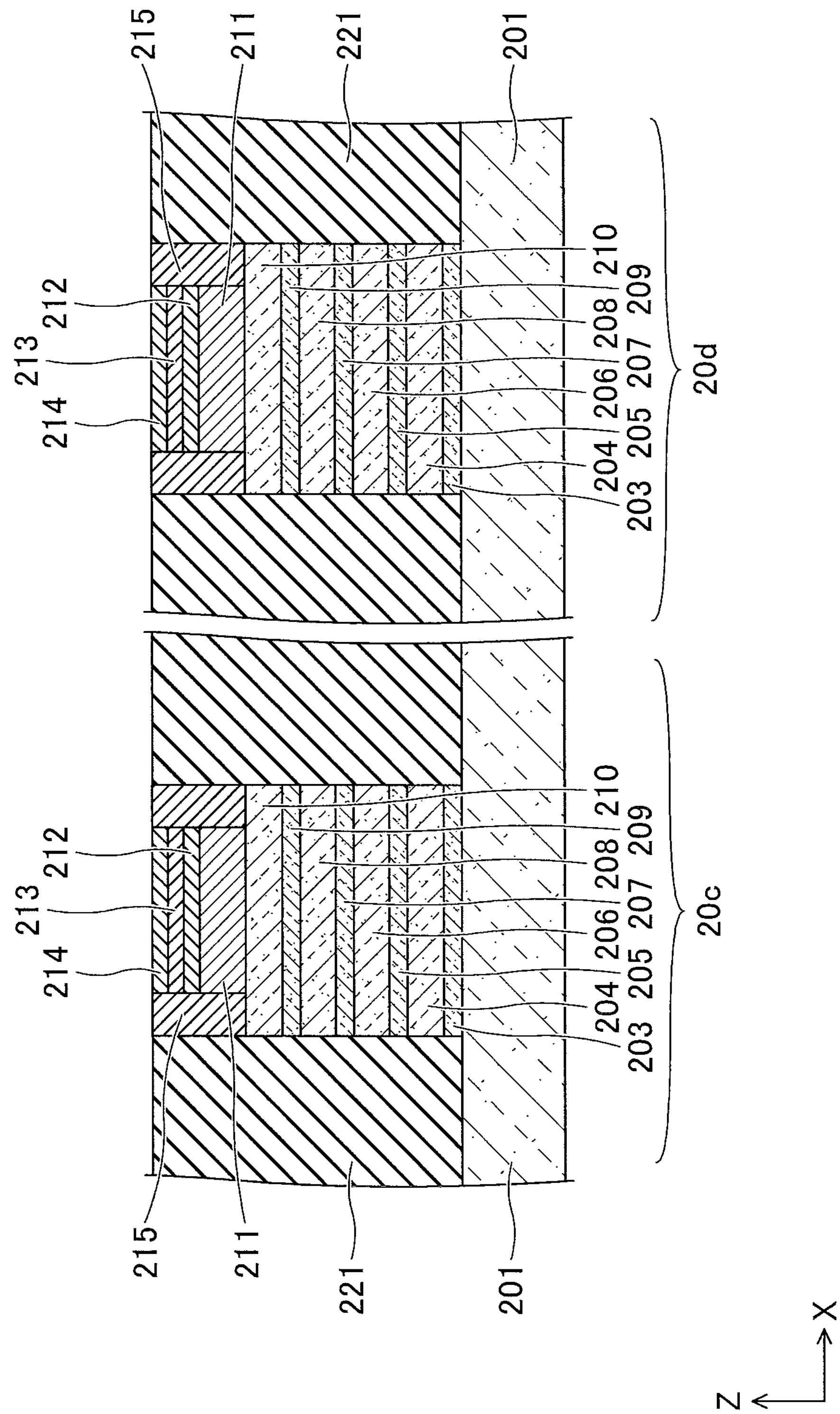
FIG. 9B is a cross sectional view (part 10) illustrating a method of producing a semiconductor device according to the second embodiment.

Next, a silicon oxide film 221 is formed to cover the stacked structures illustrated in FIGS. 8A and 8B, and the silicon oxide film 221 is polished until the sidewalls 215 are exposed, for example, by chemical mechanical polishing (CMP). As a result, as illustrated in FIGS. 9A and 9B, the flattened silicon oxide film 221 fills the space between the stacked structures illustrated in FIGS. 8A and 8B. The silicon oxide film 221 can be formed, for example, by CVD.

Figure 10A:
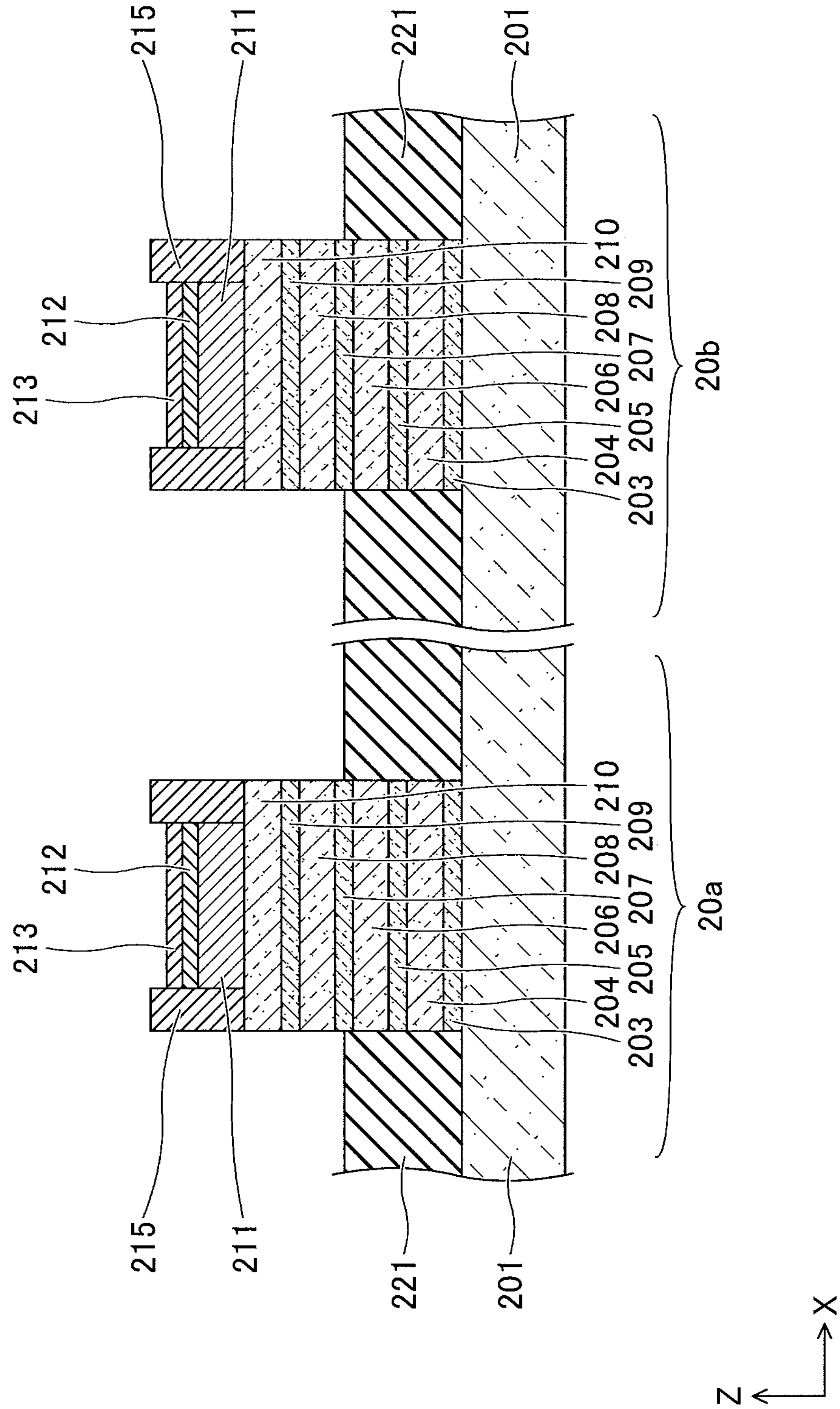
FIG. 10A is a cross sectional view (part 11) illustrating a method of producing a semiconductor device according to the second embodiment.
Figure 10B:
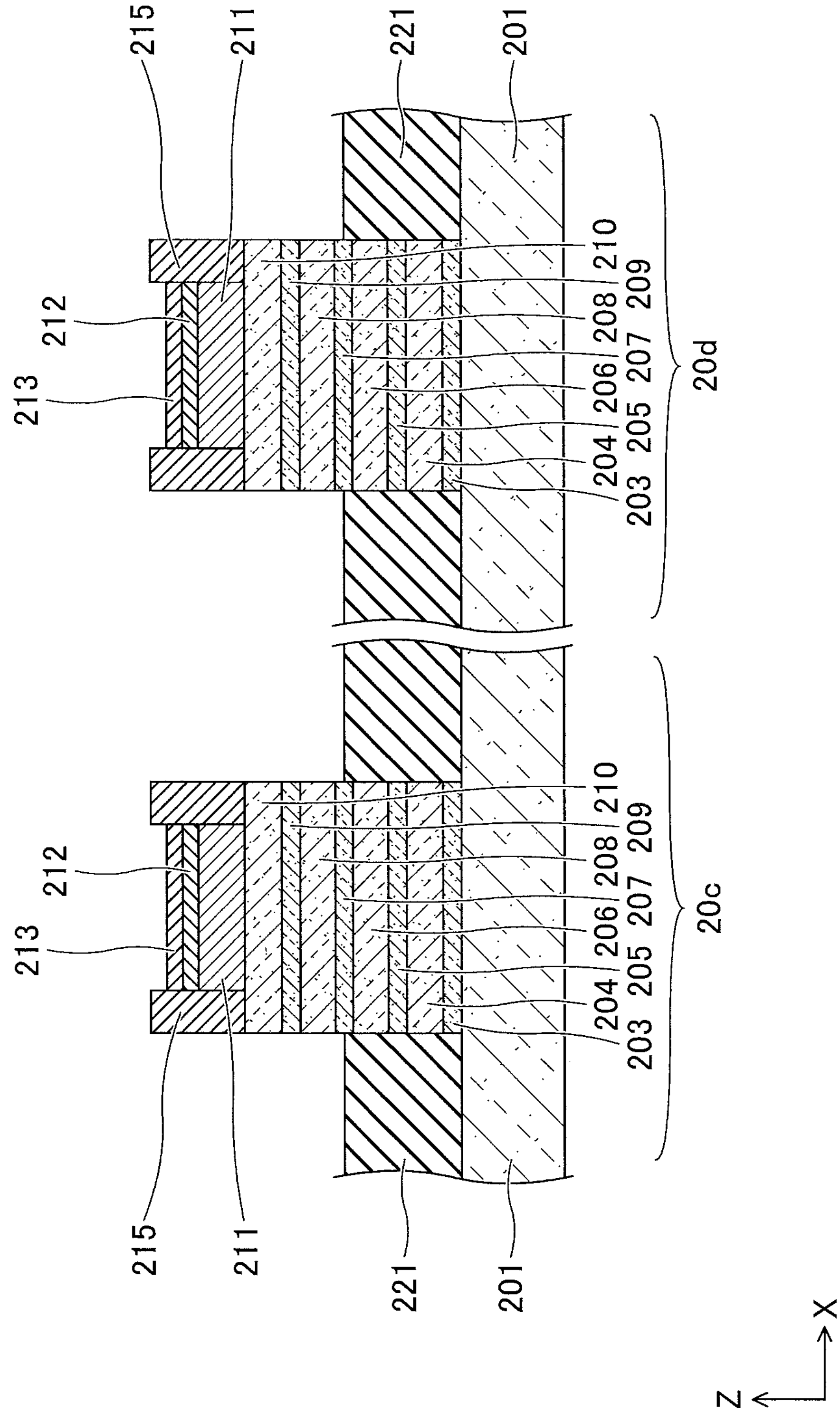
FIG. 10B is a cross sectional view (part 12) illustrating a method of producing a semiconductor device according to the second embodiment.

Next, as illustrated in FIGS. 10A and 10B, for example, the silicon oxide film 221 is processed to be thinner by reactive ion etching (RIE). For example, the top surface of the silicon oxide film 221 is positioned between the top surfaces and the bottom surfaces of the SiGe films 207. When thinning the silicon oxide film 221, the silicon oxide films 214 are removed.

Figure 11A:
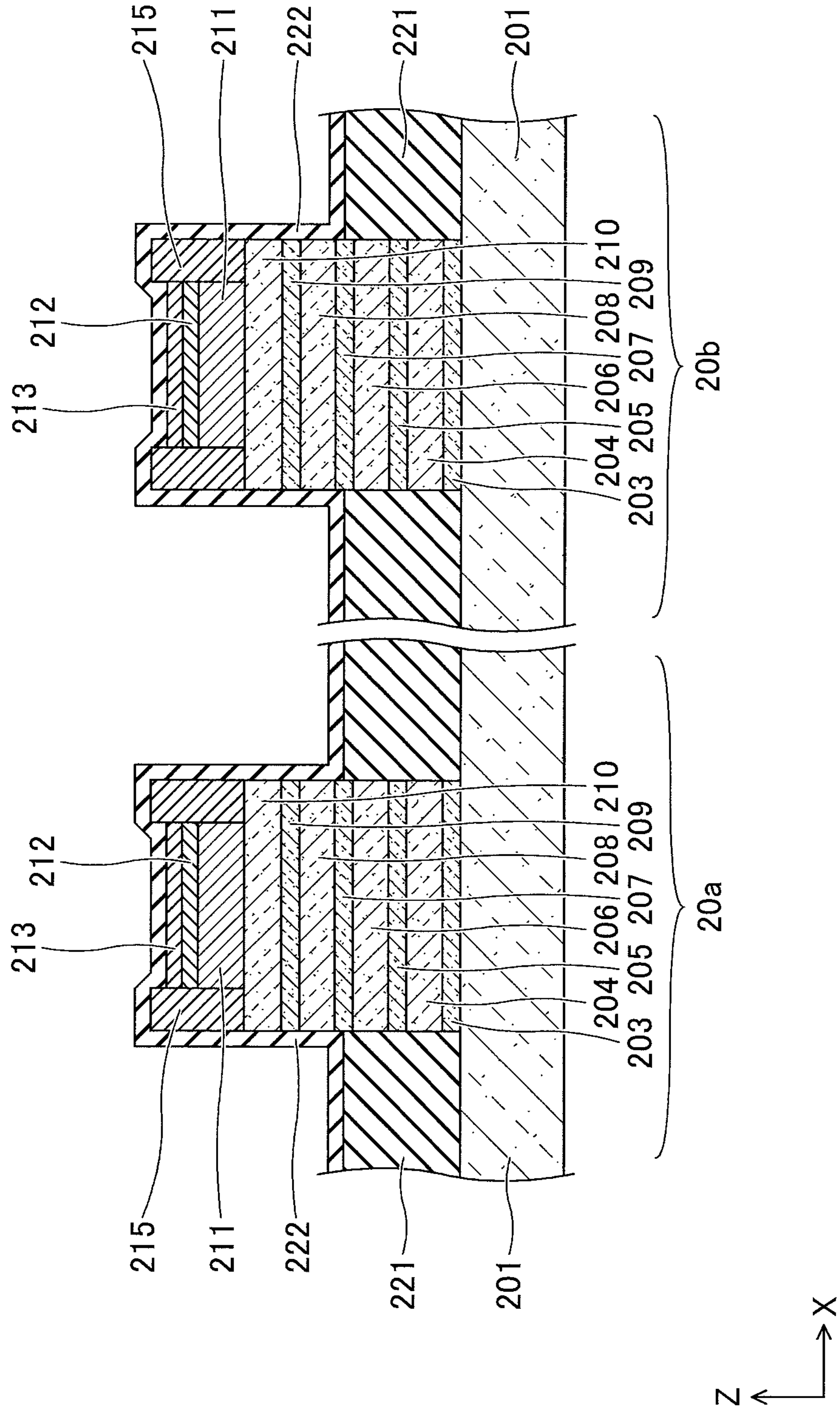
FIG. 11A is a cross sectional view (part 13) illustrating a method of producing a semiconductor device according to the second embodiment.
Figure 11B:
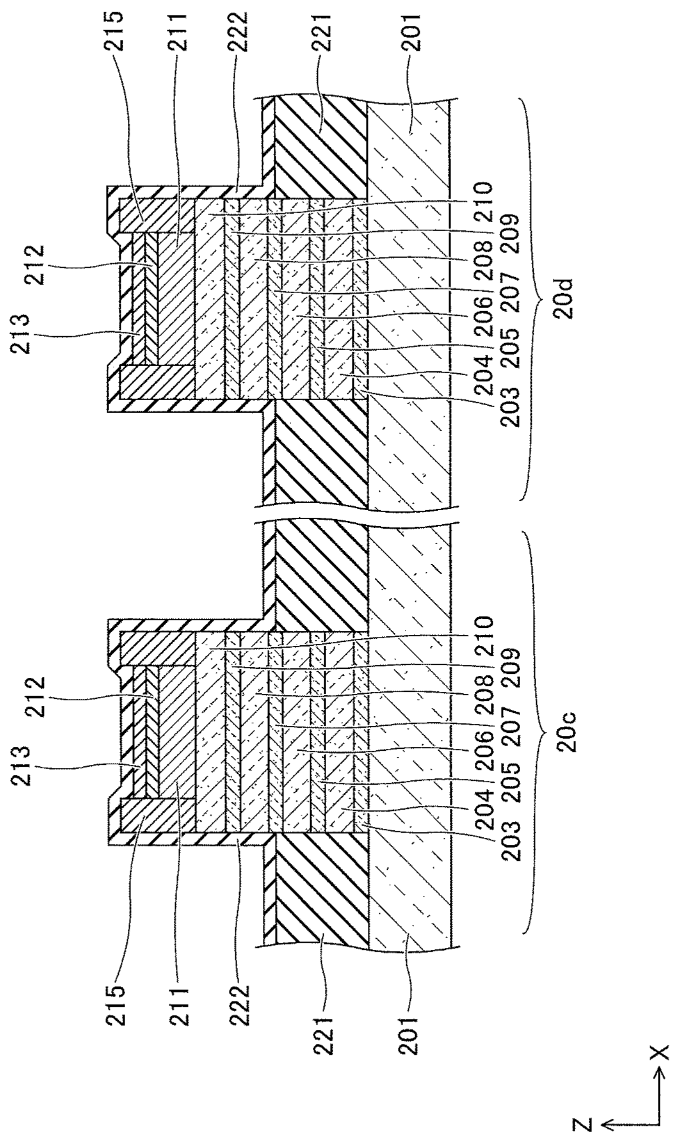
FIG. 11B is a cross sectional view (part 14) illustrating a method of producing a semiconductor device according to the second embodiment.

Thereafter, as illustrated in FIGS. 11A and 11B, a silicon nitride film 222 is formed on the top and side surfaces of the stacked structures and on the top surface of the silicon oxide film 221. The silicon nitride film 222 can be formed, for example, by CVD.

Figure 12A:
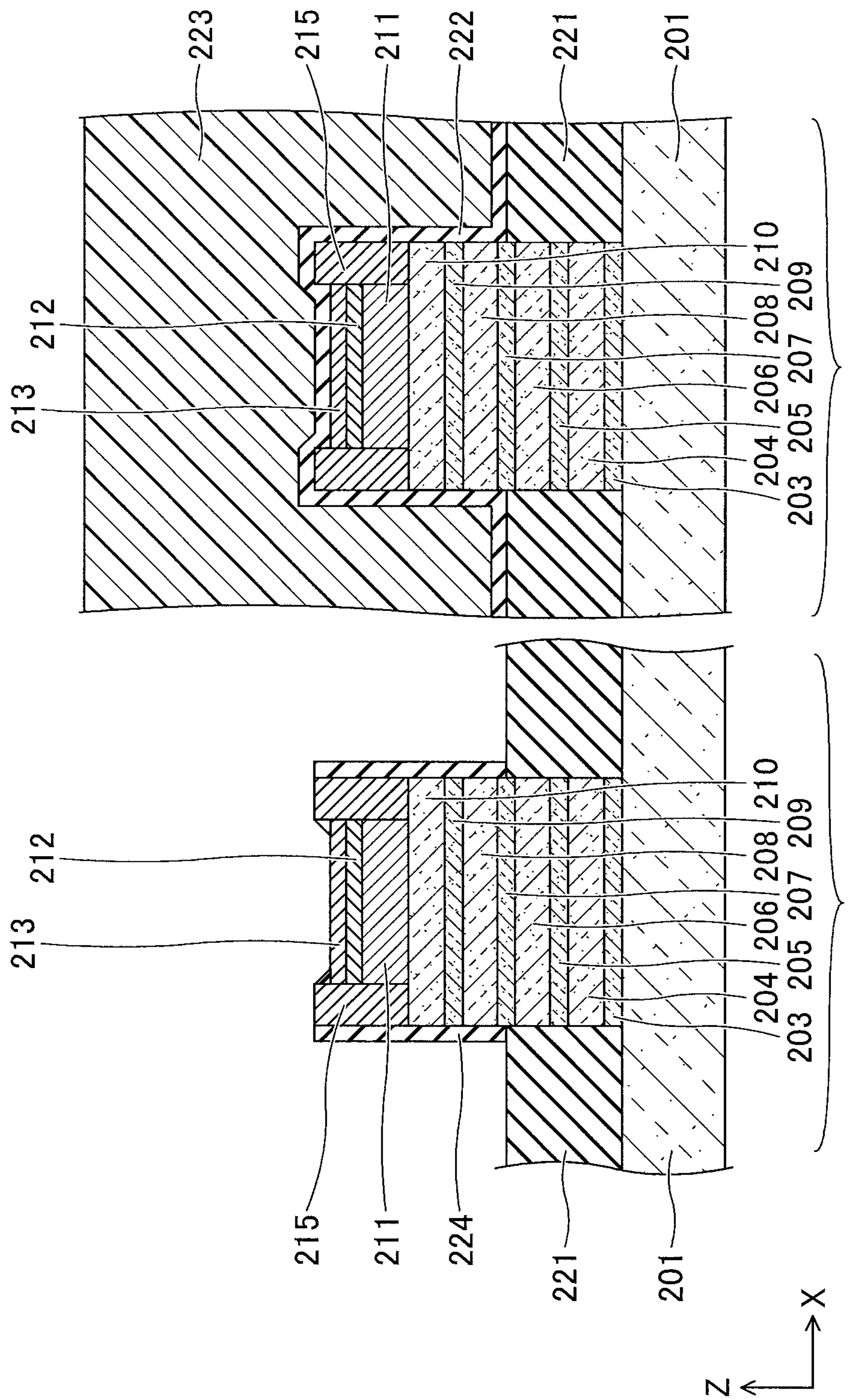
FIG. 12A is a cross sectional view (part 15) illustrating a method of producing a semiconductor device according to the second embodiment.
Figure 12B:
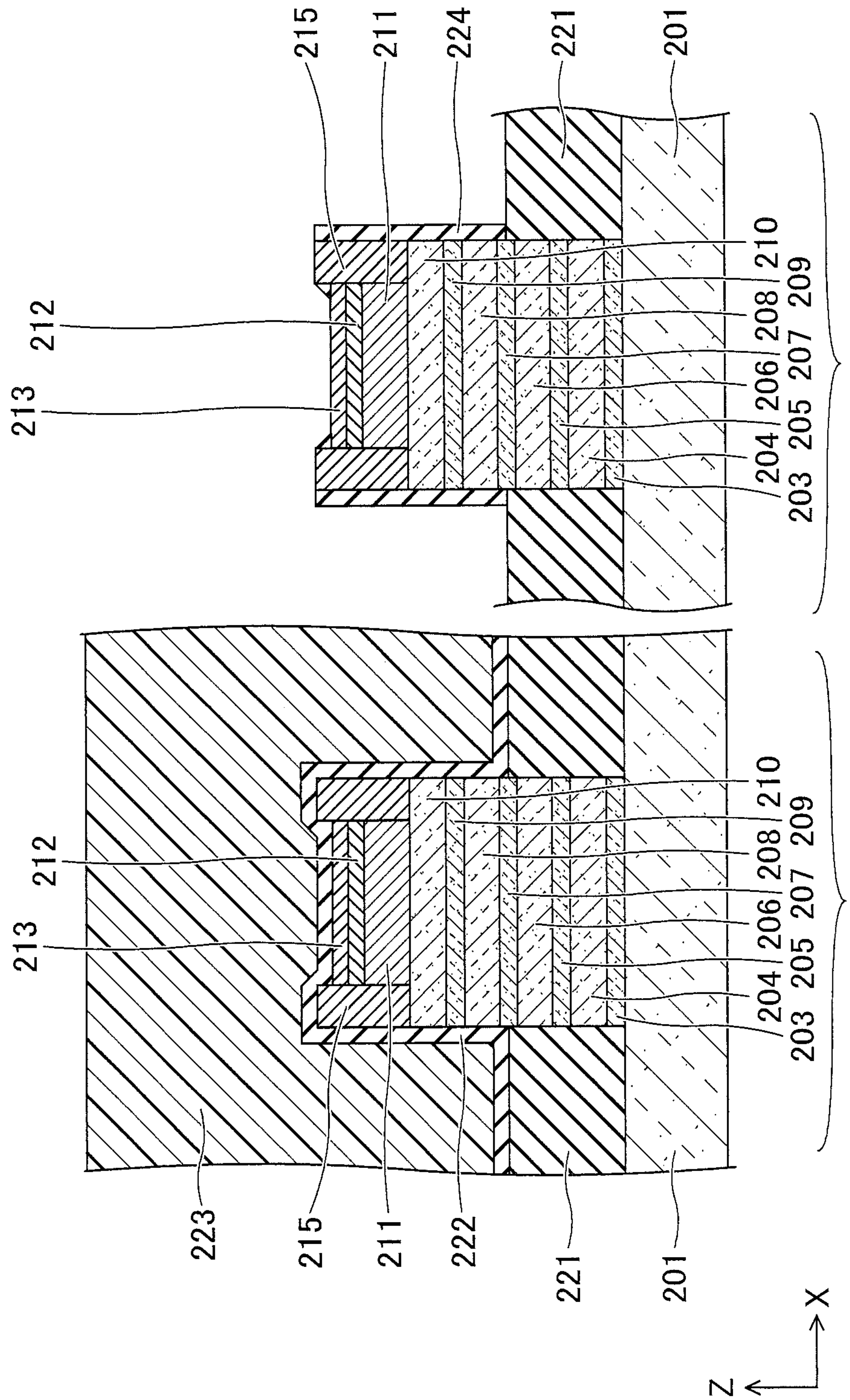
FIG. 12B is a cross sectional view (part 16) illustrating a method of producing a semiconductor device according to the second embodiment.

Next, as illustrated in FIGS. 12A and 12B, a resist mask 223 is formed on the element active regions 20*b* and 20*c*, and the silicon nitride film 222 is etched back in the element active regions 20*a* and 20*d*. As a result, in the element active regions 20*a* and 20*d*, sidewalls 224 are formed on the side surfaces of the stacked structures.

Figure 13A:
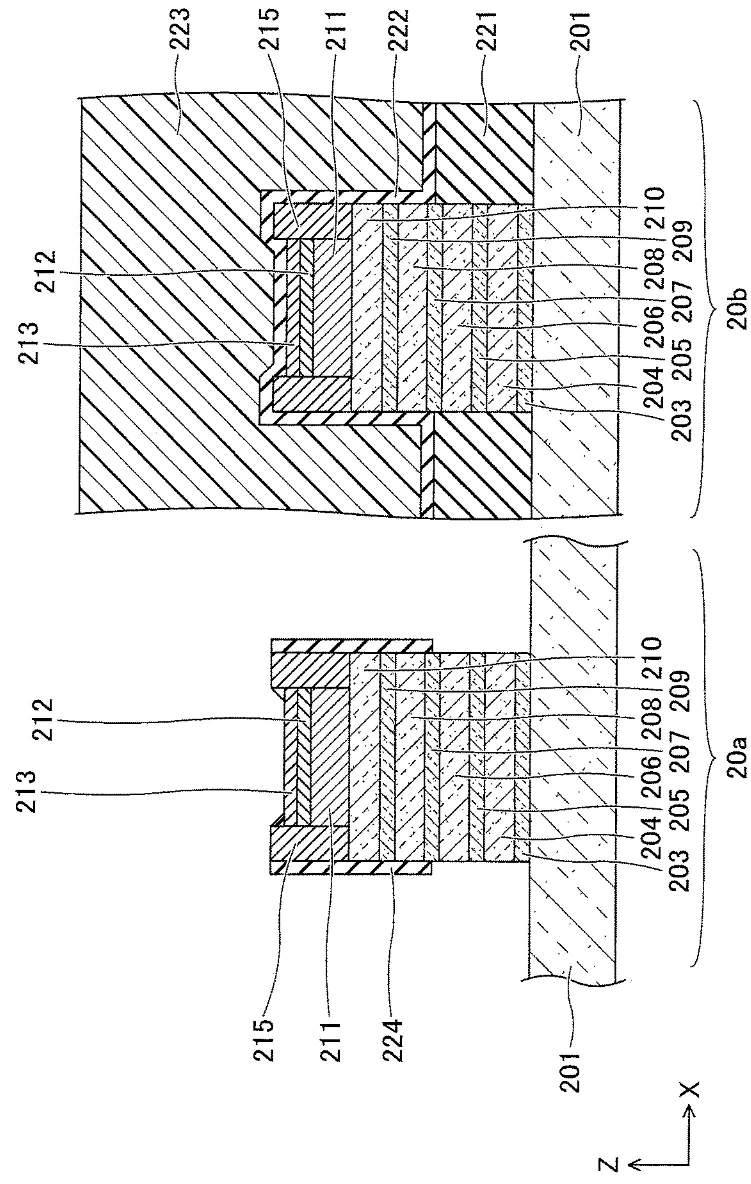
FIG. 13A is a cross sectional view (part 17) illustrating a method of producing a semiconductor device according to the second embodiment.
Figure 13B:
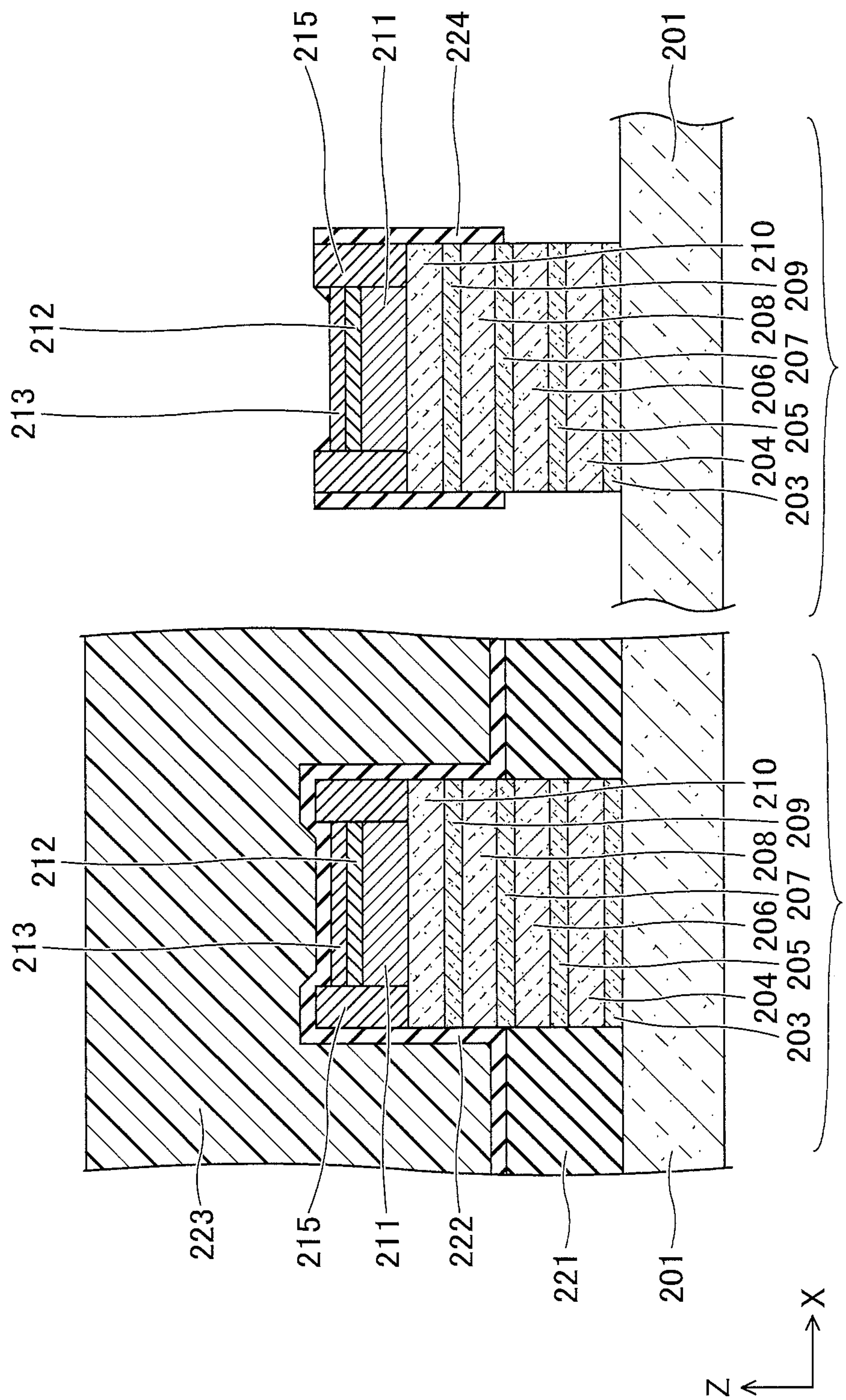
FIG. 13B is a cross sectional view (part 18) illustrating a method of producing a semiconductor device according to the second embodiment.

Next, as illustrated in FIGS. 13A and 13B, around the element active regions 20*a* and 20*d*, the silicon oxide film 221 is removed.

Figure 14A:
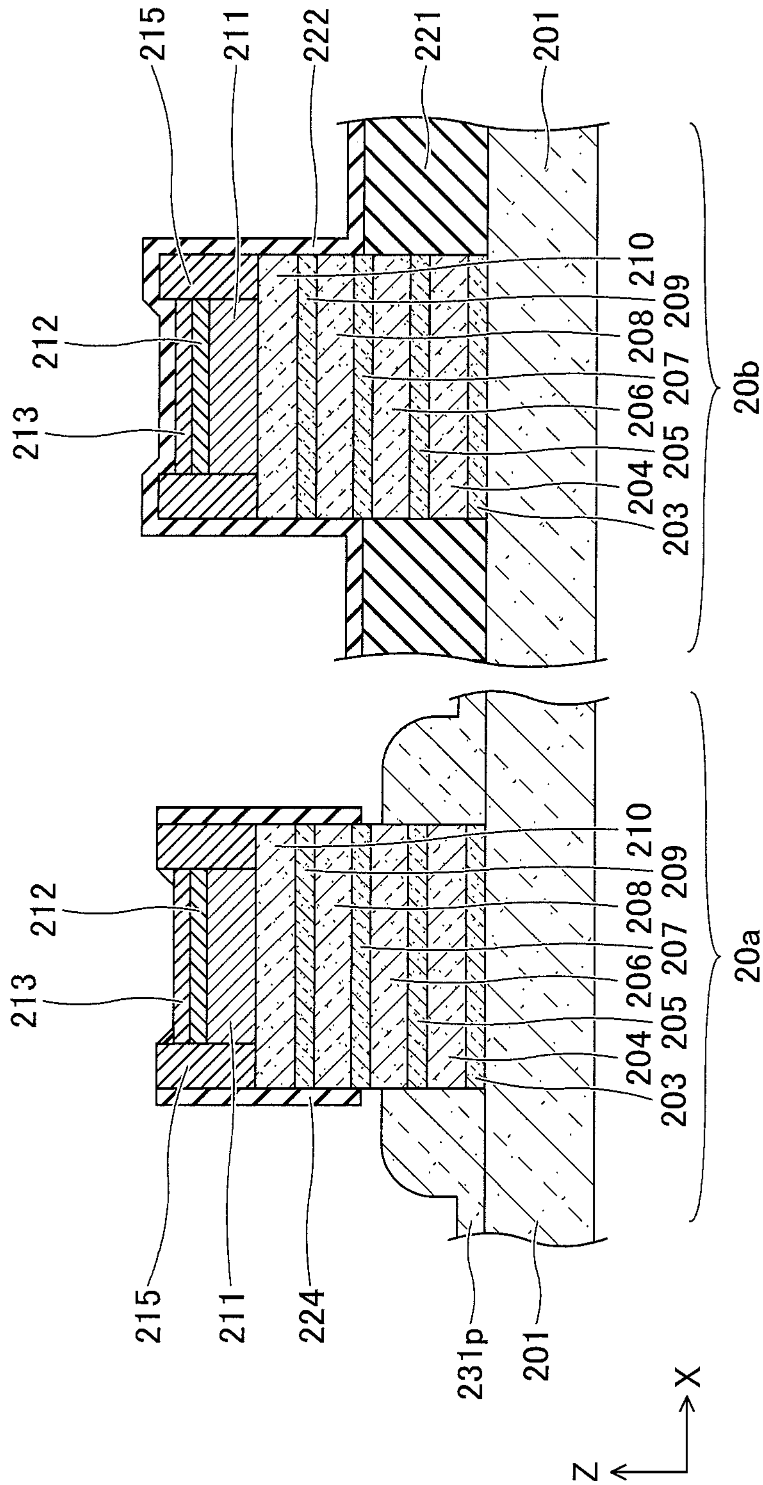
FIG. 14A is a cross sectional view (part 19) illustrating a method of producing a semiconductor device according to the second embodiment.
Figure 14B:
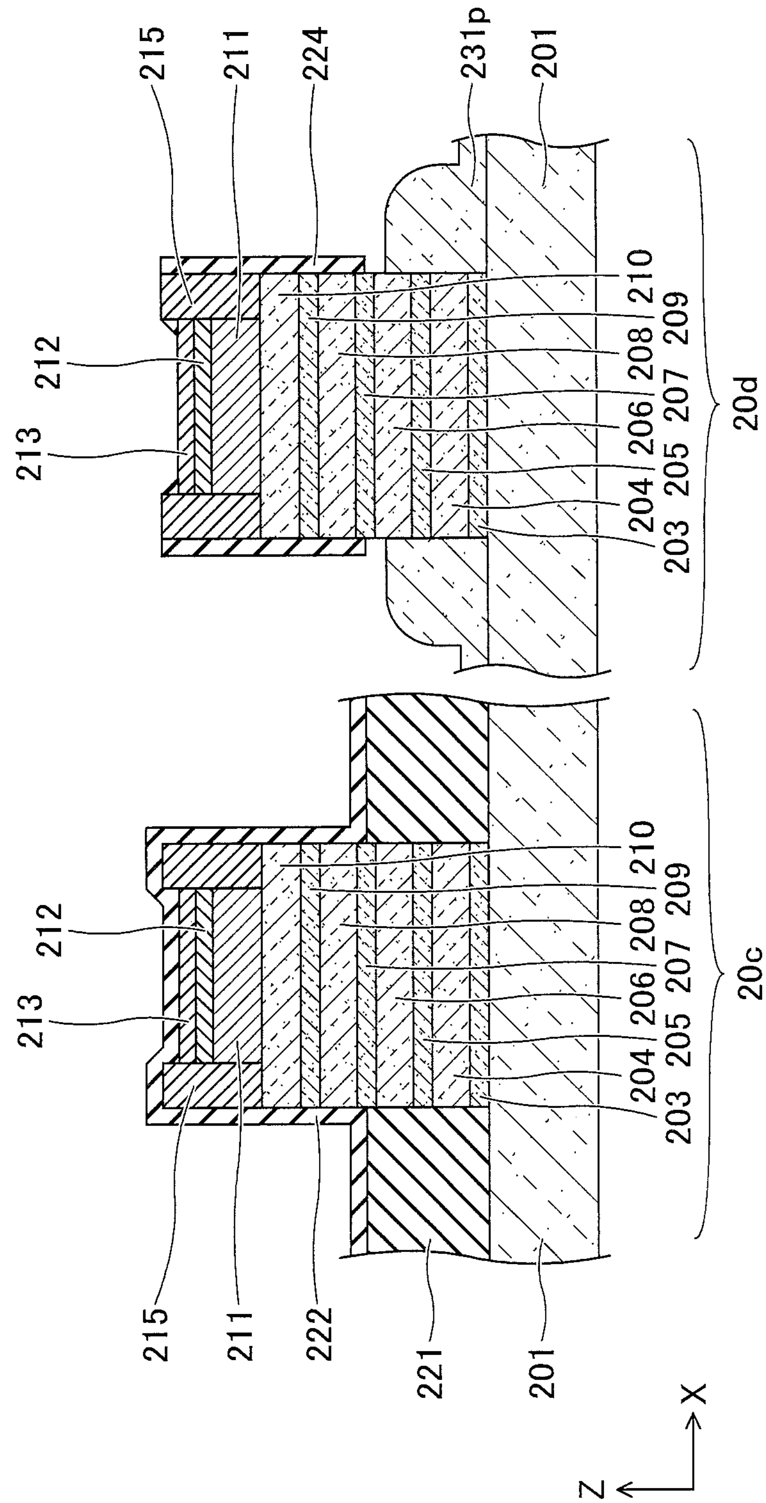
FIG. 14B is a cross sectional view (part 20) illustrating a method of producing a semiconductor device according to the second embodiment.

Thereafter, as illustrated in FIGS. 14A and 14B, the resist mask 223 is removed, and on the element active regions 20*a* and 20*d*, p-type SiGe layers 231*p* are selectively grown on the side surfaces of the SiGe films 203, the Si films 204, the SiGe films 205, and the Si films 206. The p-type SiGe layers 231*p* can be formed, for example, by epitaxial growth. For example, into the p-type SiGe layers 231*p*, boron (B) is introduced as a p-type impurity by using diborane ($B_2H_6$).

Figure 15A:
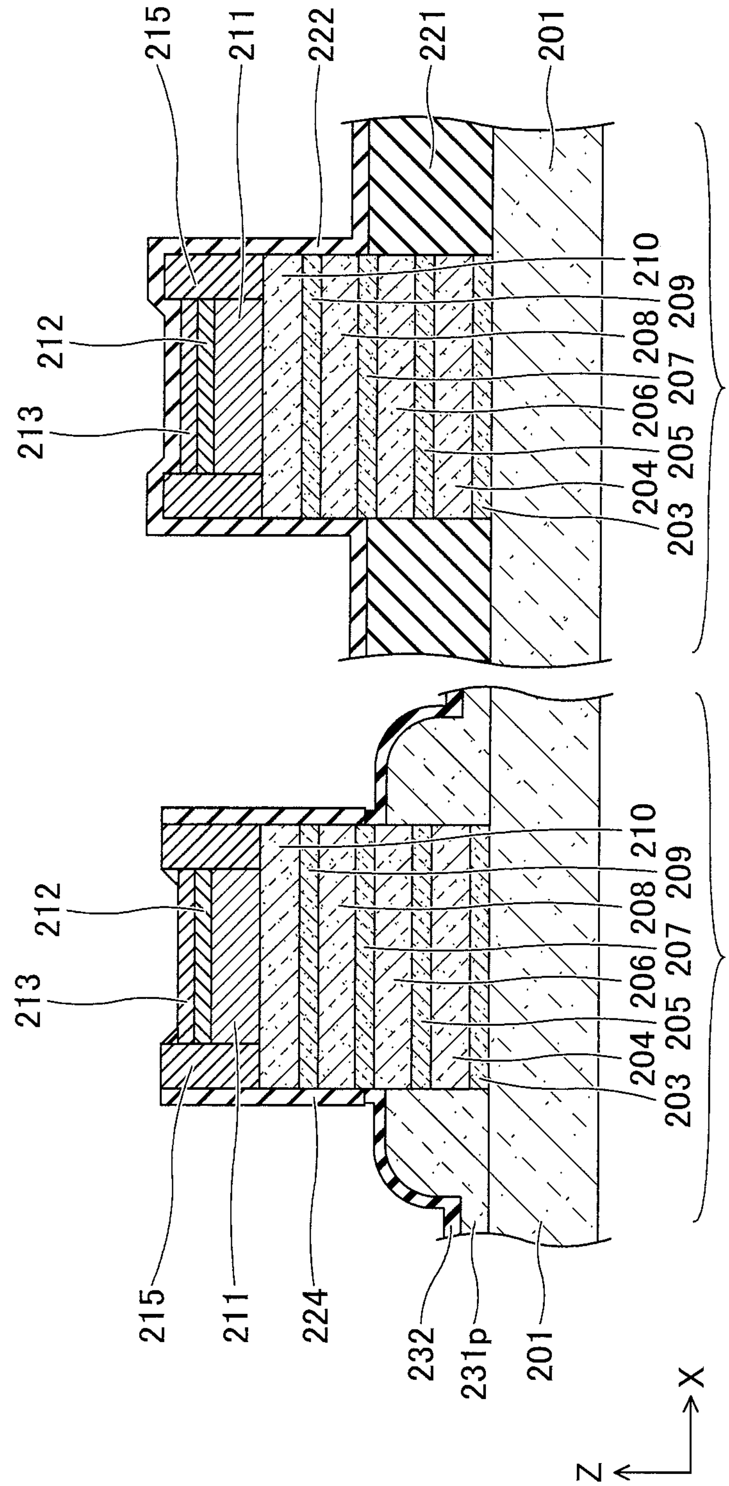
FIG. 15A is a cross sectional view (part 21) illustrating a method of producing a semiconductor device according to the second embodiment.
Figure 15B:
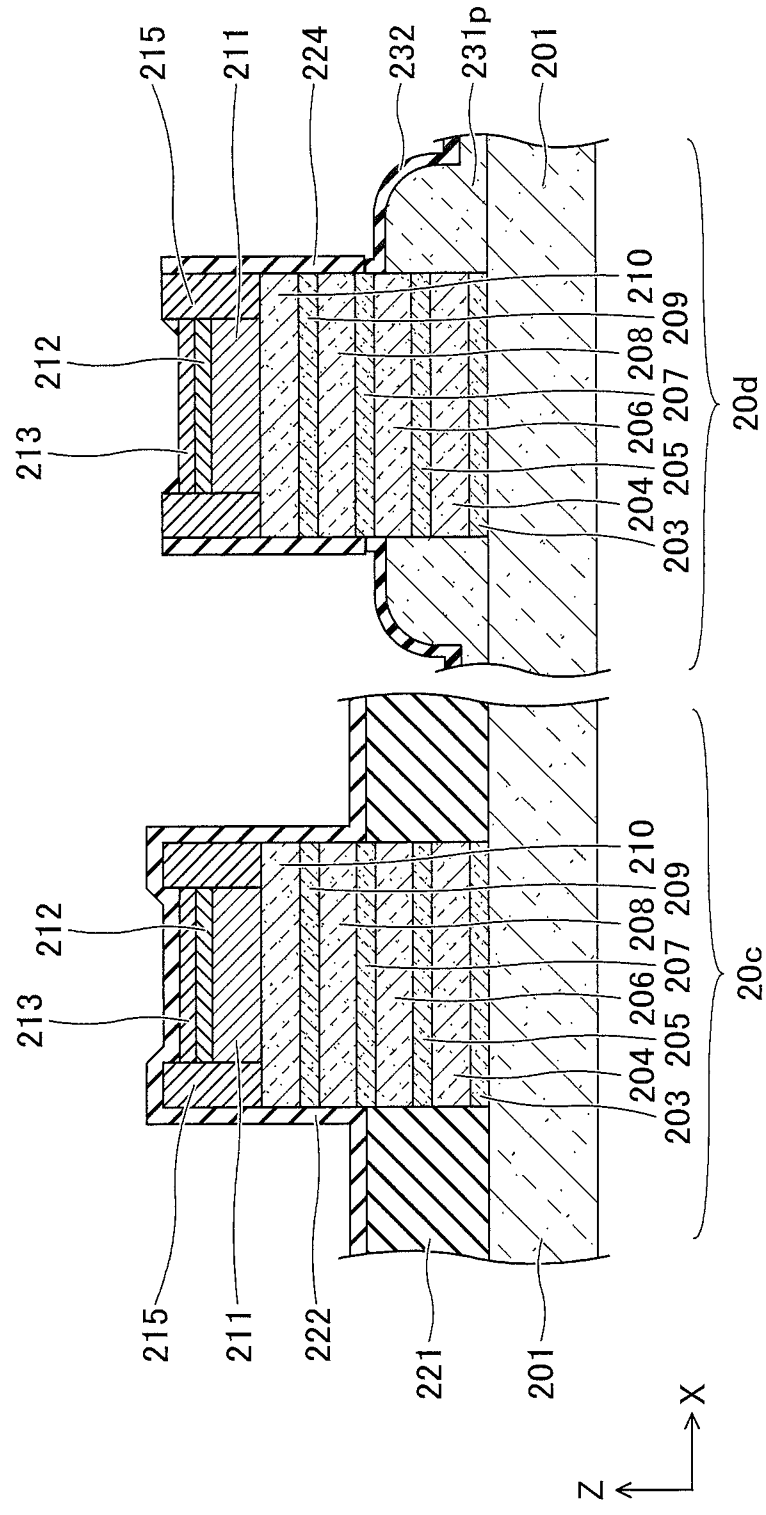
FIG. 15B is a cross sectional view (part 22) illustrating a method of producing a semiconductor device according to the second embodiment.

Next, as illustrated in FIGS. 15A and 15B, the surfaces of the p-type SiGe layers 231*p* are oxidized to form oxide films 232 on the surfaces of the p-type SiGe layers 231*p*.

Figure 16A:
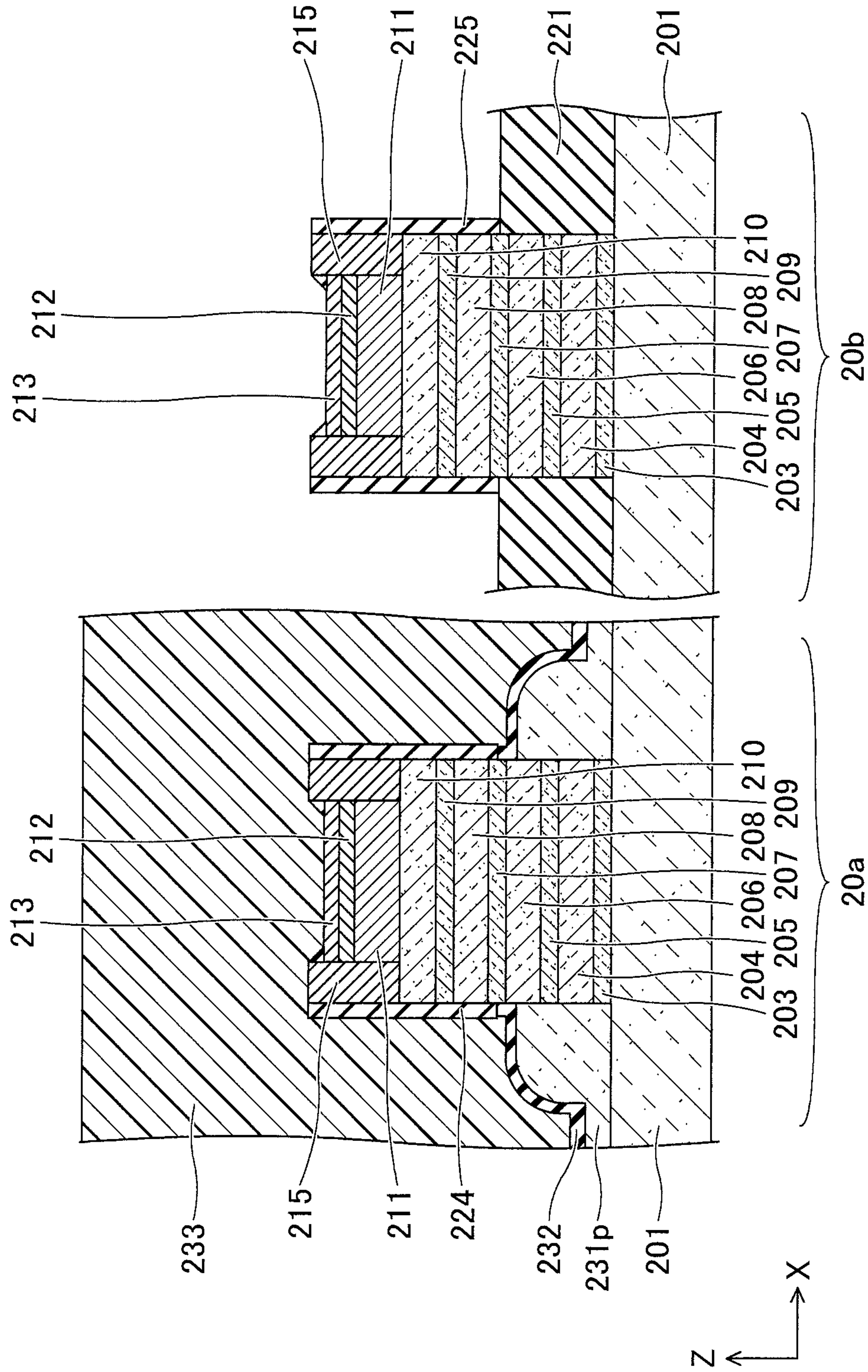
FIG. 16A is a cross sectional view (part 23) illustrating a method of producing a semiconductor device according to the second embodiment.
Figure 16B:
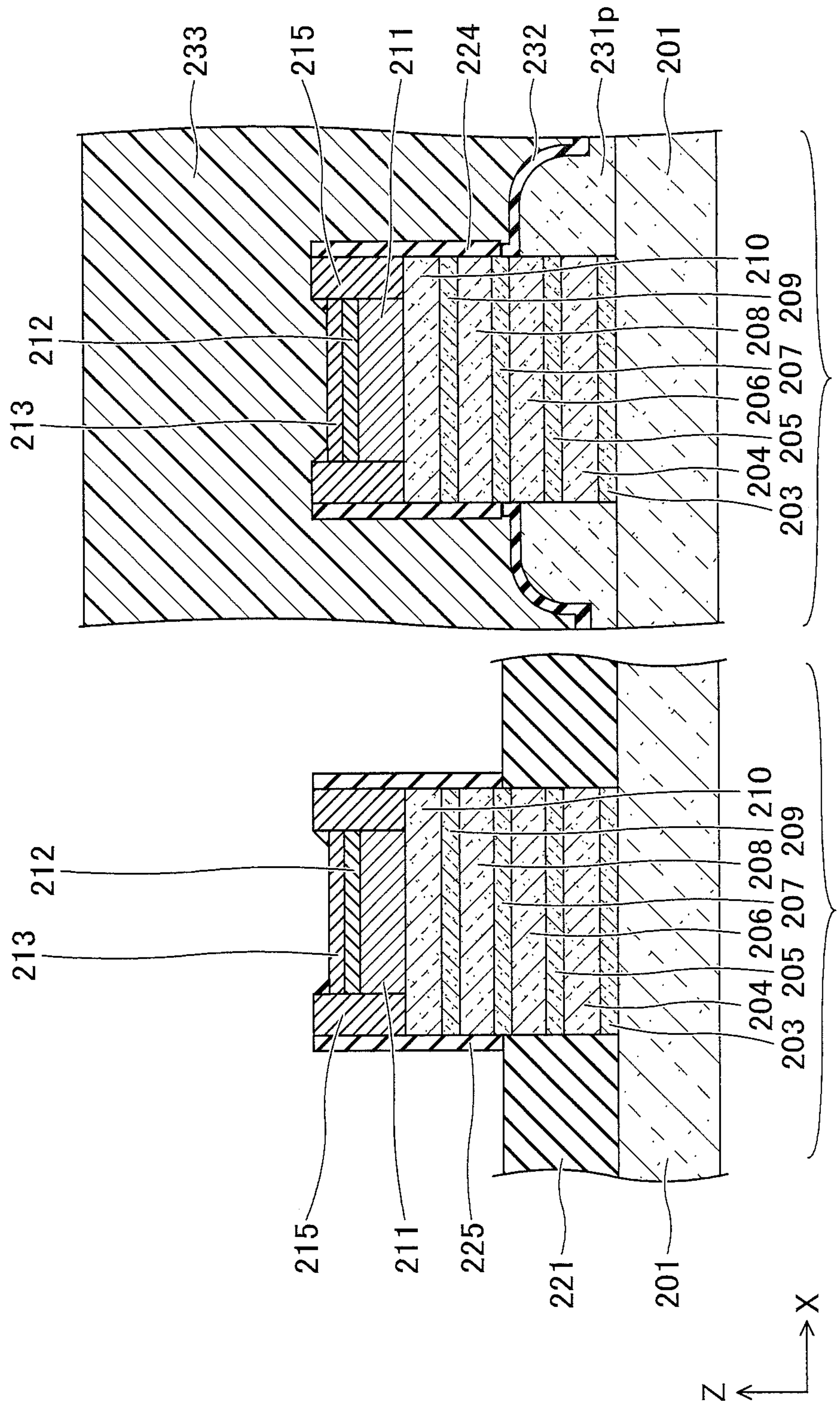
FIG. 16B is a cross sectional view (part 24) illustrating a method of producing a semiconductor device according to the second embodiment.

Next, as illustrated in FIGS. 16A and 16B, a resist mask 233 is formed on the element active regions 20*a* and 20*d*, and the silicon nitride film 222 is etched back in the element active regions 20*b* and 20*c*. As a result, in the element active regions 20*b* and 20*c*, sidewalls 225 are formed on the side surfaces of the stacked structures.

Figure 17A:
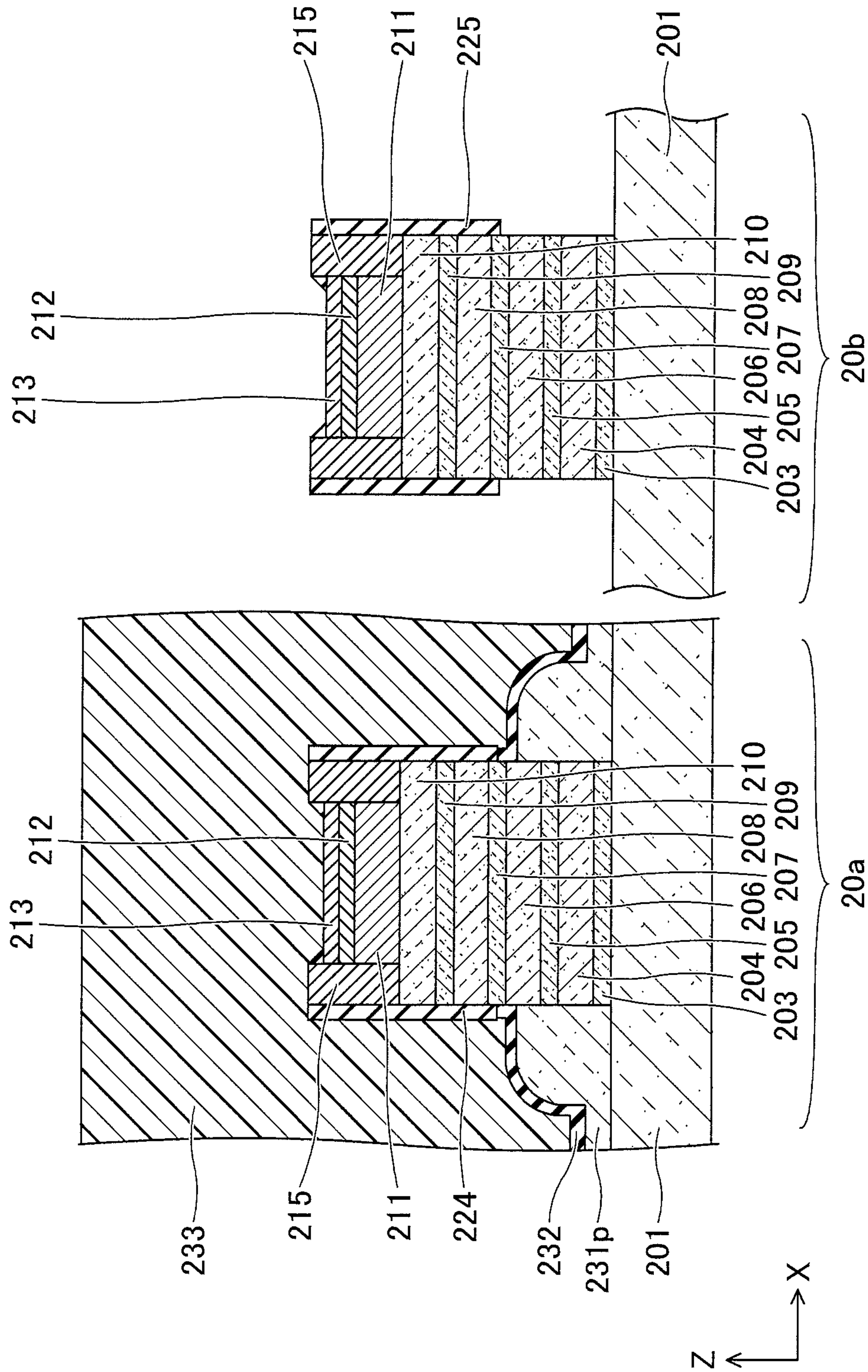
FIG. 17A is a cross sectional view (part 25) illustrating a method of producing a semiconductor device according to the second embodiment.
Figure 17B:
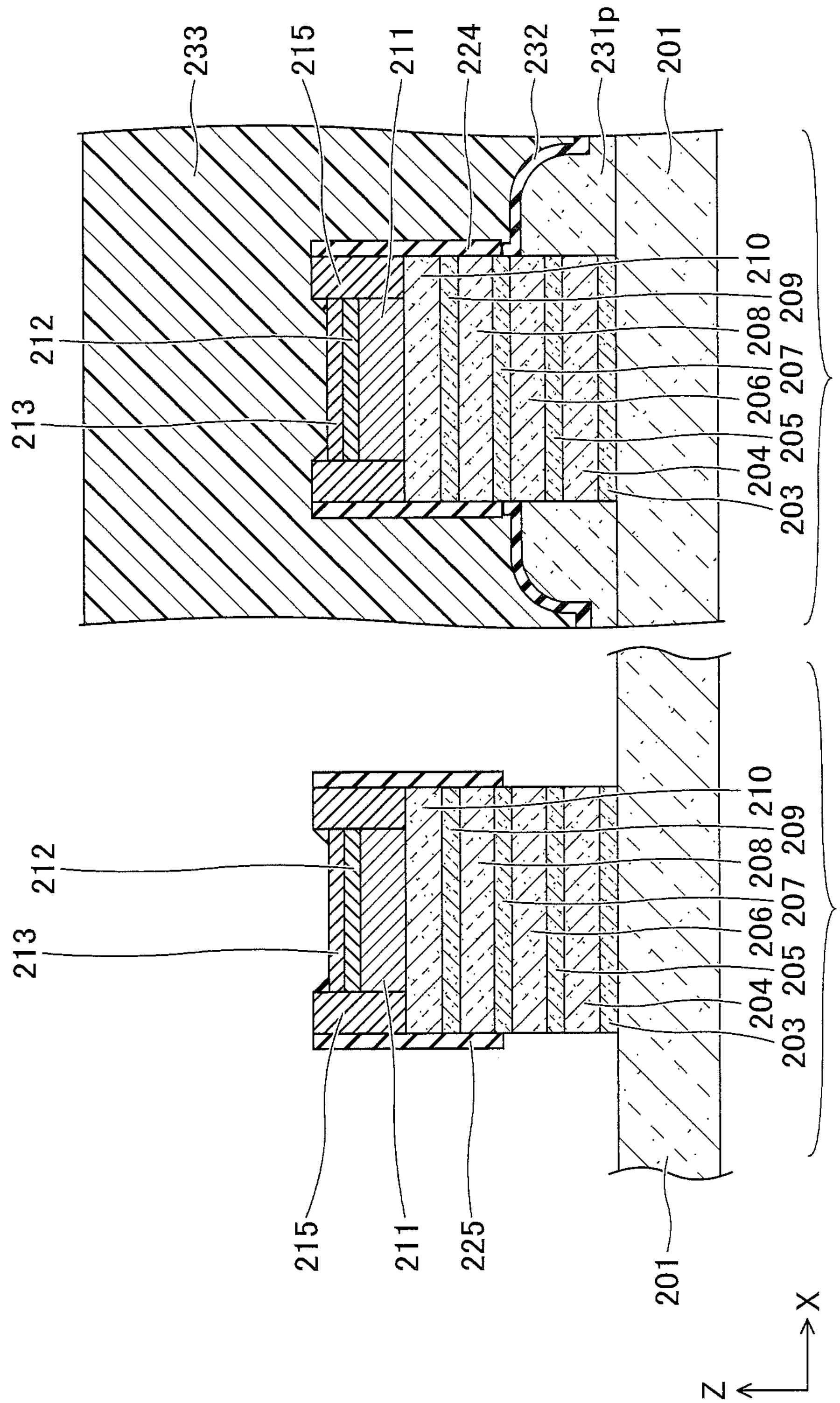
FIG. 17B is a cross sectional view (part 26) illustrating a method of producing a semiconductor device according to the second embodiment.

Thereafter, as illustrated in FIGS. 17A and 17B, around the element active regions 20*b* and 20*c*, the silicon oxide film 221 is removed.

Figure 18A:
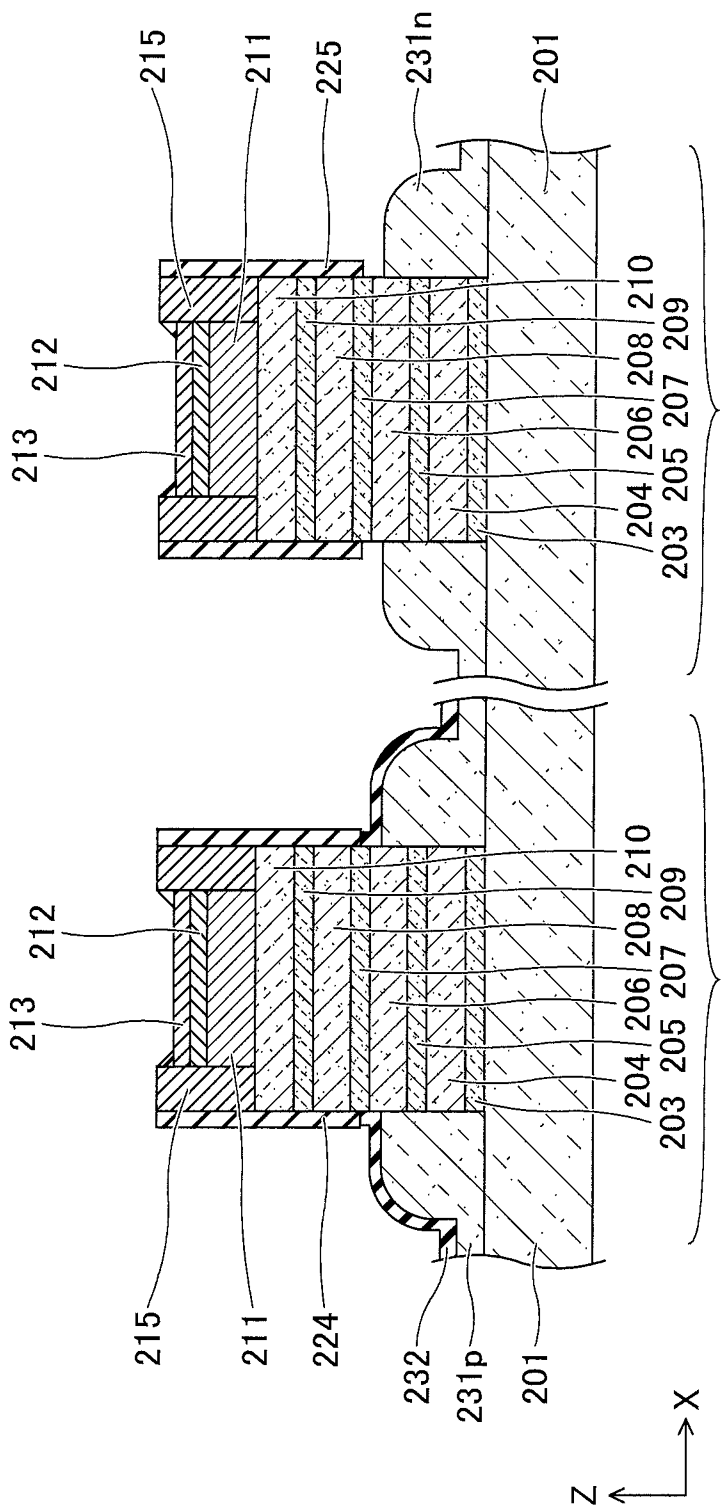
FIG. 18A is a cross sectional view (part 27) illustrating a method of producing a semiconductor device according to the second embodiment.
Figure 18B:
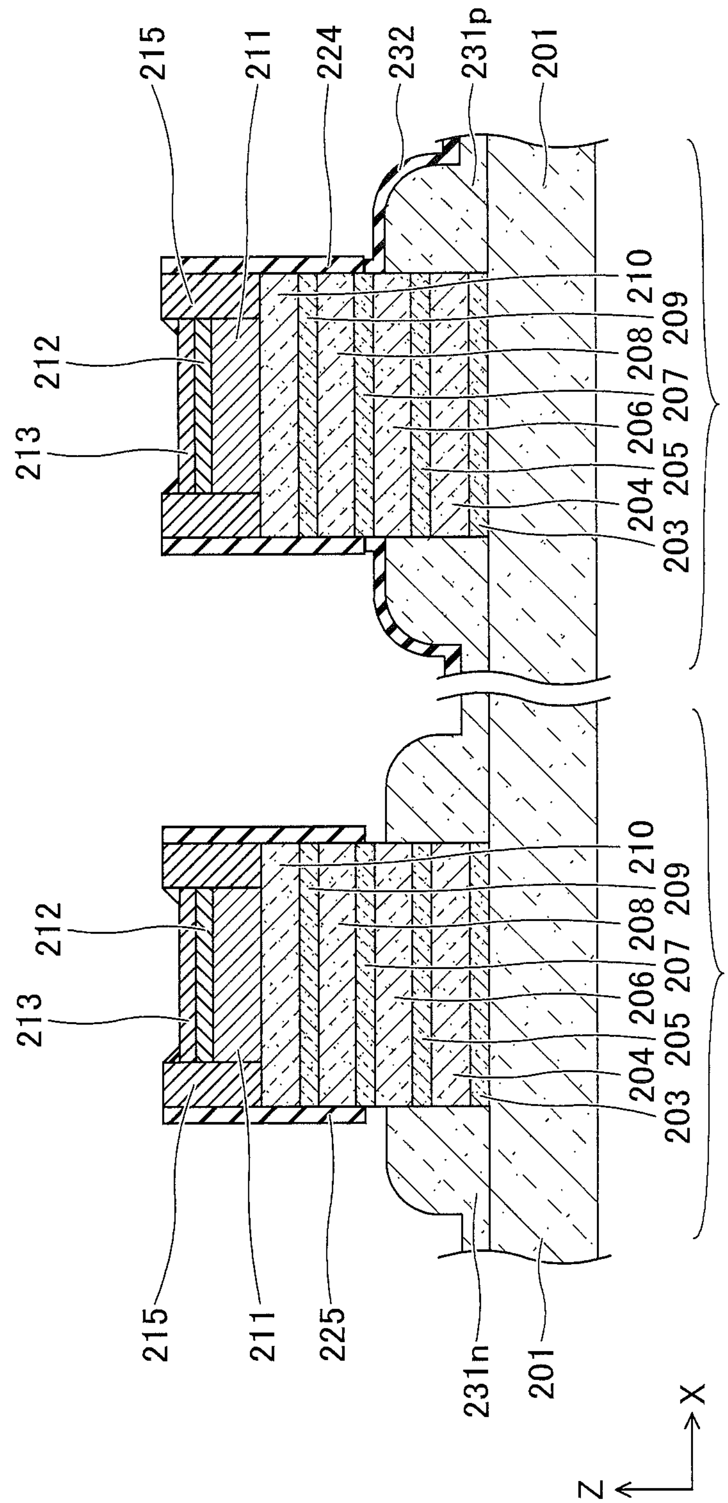
FIG. 18B is a cross sectional view (part 28) illustrating a method of producing a semiconductor device according to the second embodiment.

Next, as illustrated in FIGS. 18A and 18B, the resist mask 233 is removed, and on the element active regions 20*b* and 20*c*, n-type Si layers 231*n* are selectively grown on the side surfaces of the SiGe films 203, the Si films 204, the SiGe films 205, and the Si films 206. The n-type Si layers 231*n* can be formed, for example, by epitaxial growth. For example, into the n-type Si layers 231*n*, phosphorus (P) is introduced as an n-type impurity by using phosphine ($PH_3$).

Figure 19A:
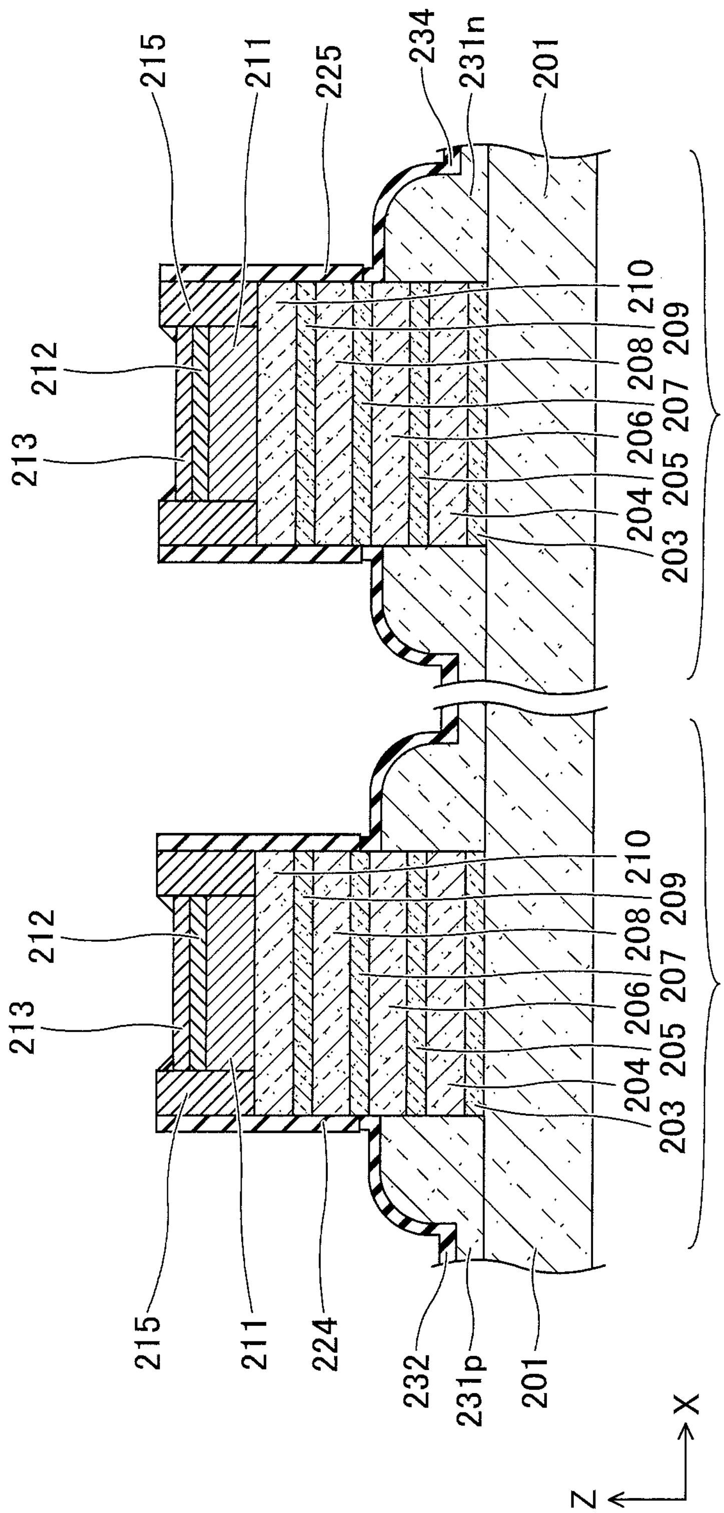
FIG. 19A is a cross sectional view (part 29) illustrating a method of producing a semiconductor device according to the second embodiment.
Figure 19B:
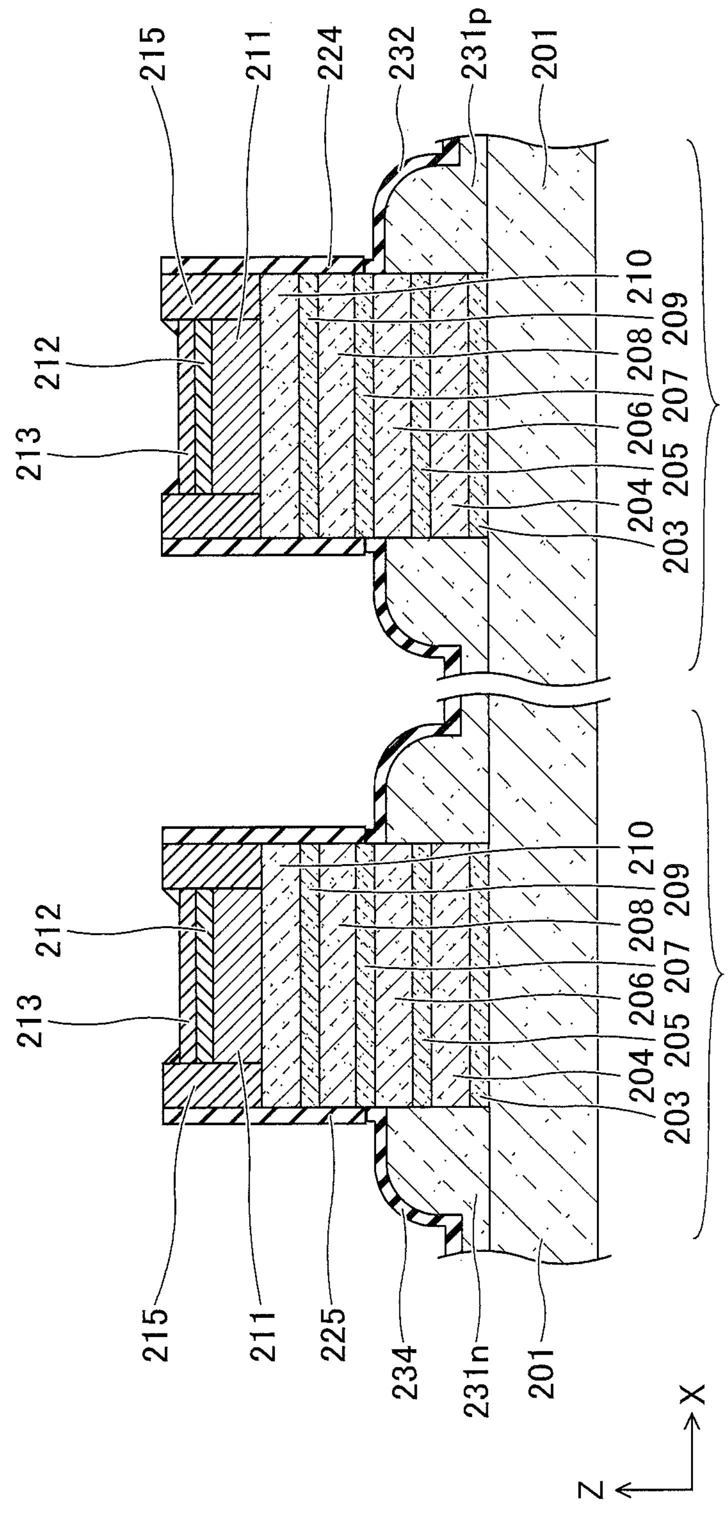
FIG. 19B is a cross sectional view (part 30) illustrating a method of producing a semiconductor device according to the second embodiment.

Next, as illustrated in FIGS. 19A and 19B, the surfaces of the n-type Si layers 231*n* are oxidized to form oxide films 234 on the surfaces of the n-type Si layers 231*n*.

Figure 20A:
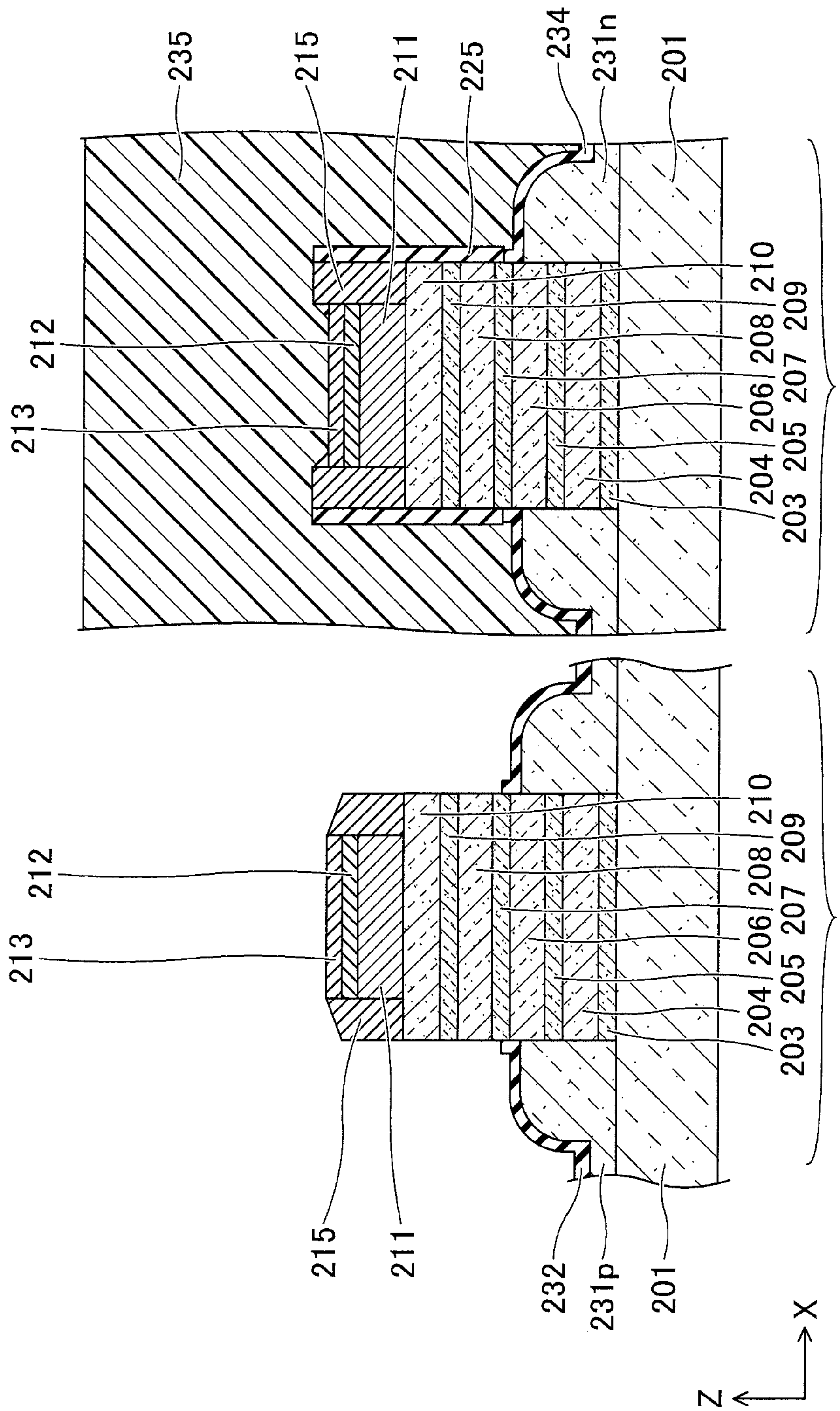
FIG. 20A is a cross sectional view (part 31) illustrating a method of producing a semiconductor device according to the second embodiment.
Figure 20B:
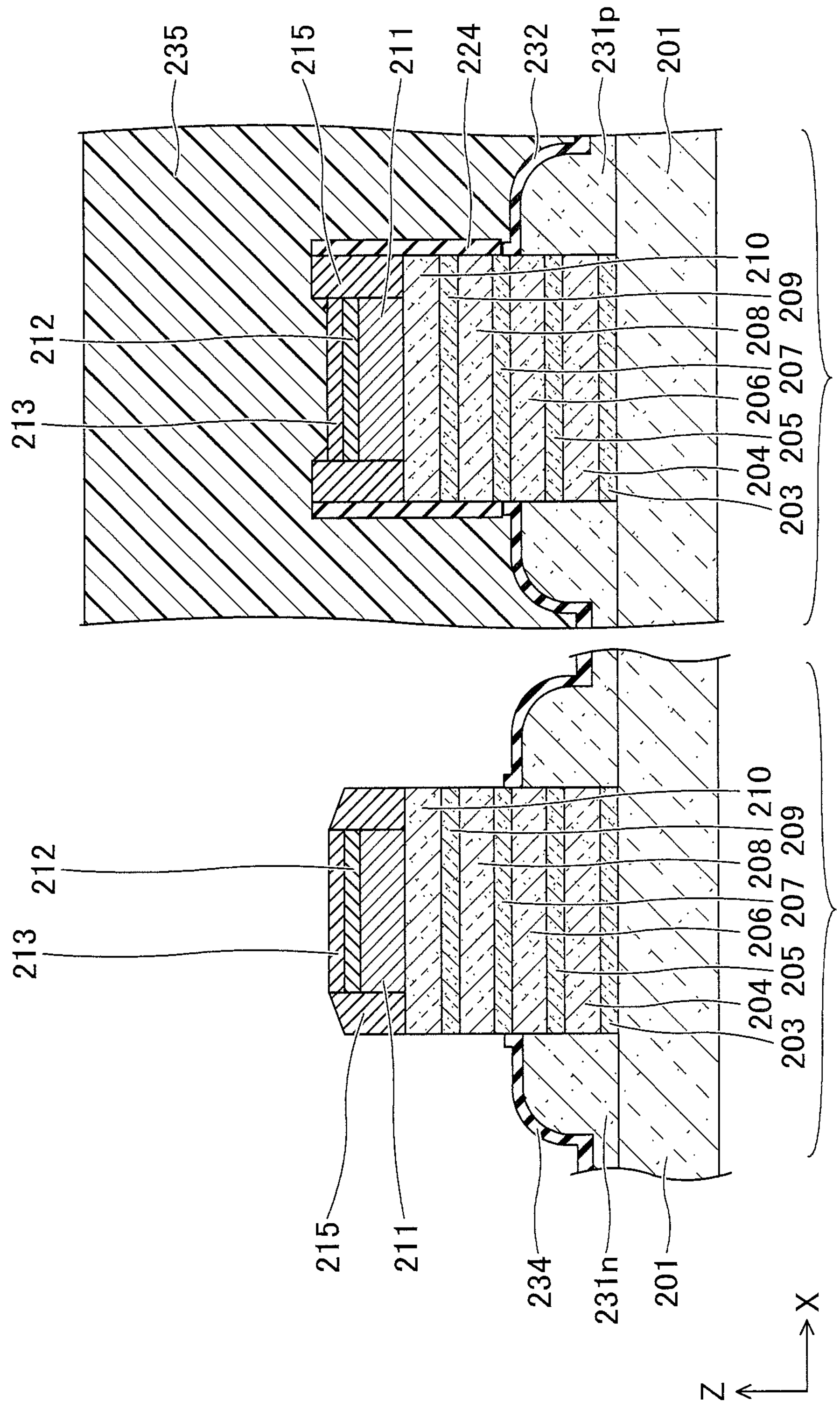
FIG. 20B is a cross sectional view (part 32) illustrating a method of producing a semiconductor device according to the second embodiment.

Thereafter, as illustrated in FIGS. 20A and 20B, a resist mask 235 is formed on the element active regions 20*b* and 20*d*, and by etching, the sidewalls 224 around the element active region 20*a* and the sidewalls 225 around the element active region 20*c* are removed. In this etching, for example, the etching amount is approximately 1.1 times the thickness of the silicon nitride film 222.

Figure 21A:
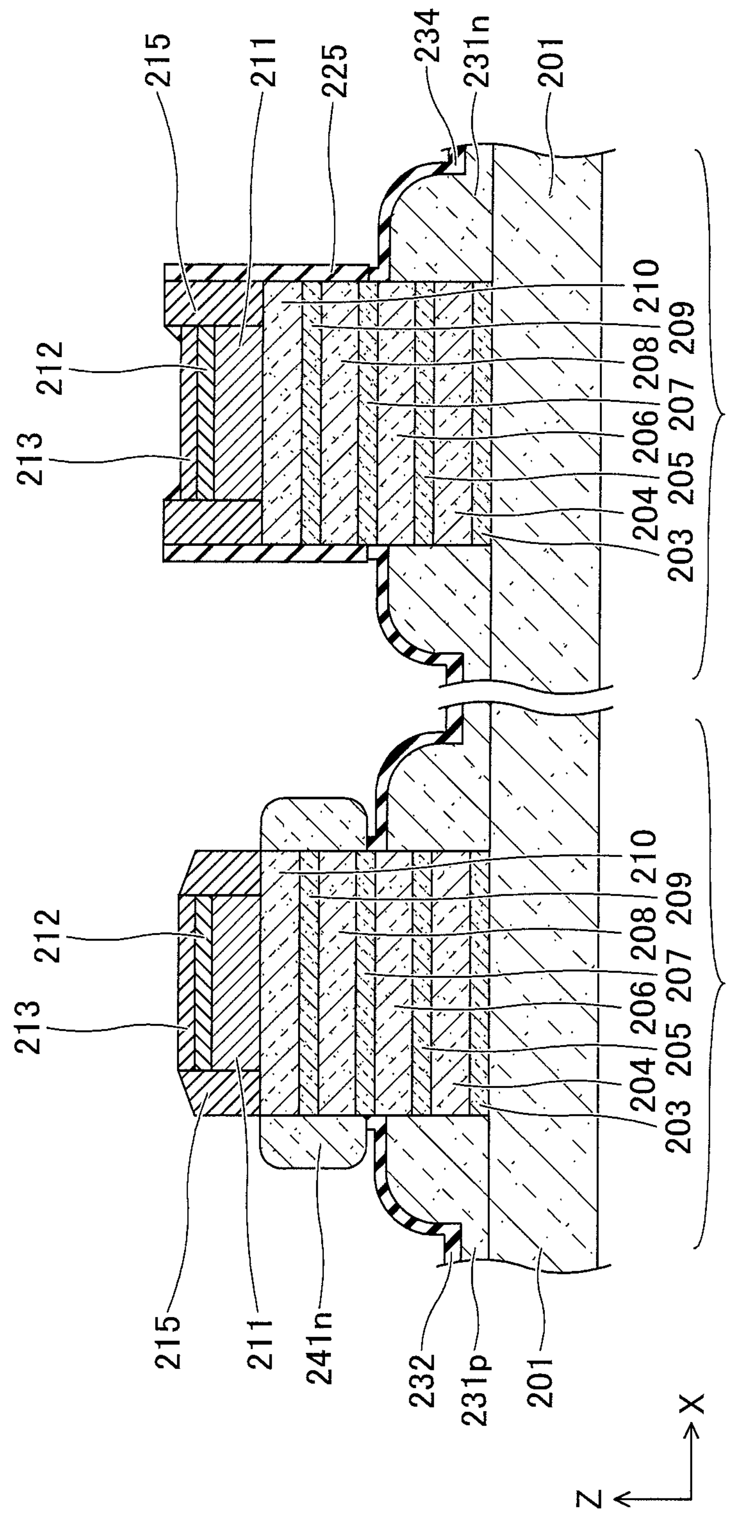
FIG. 21A is a cross sectional view (part 33) illustrating a method of producing a semiconductor device according to the second embodiment.
Figure 21B:
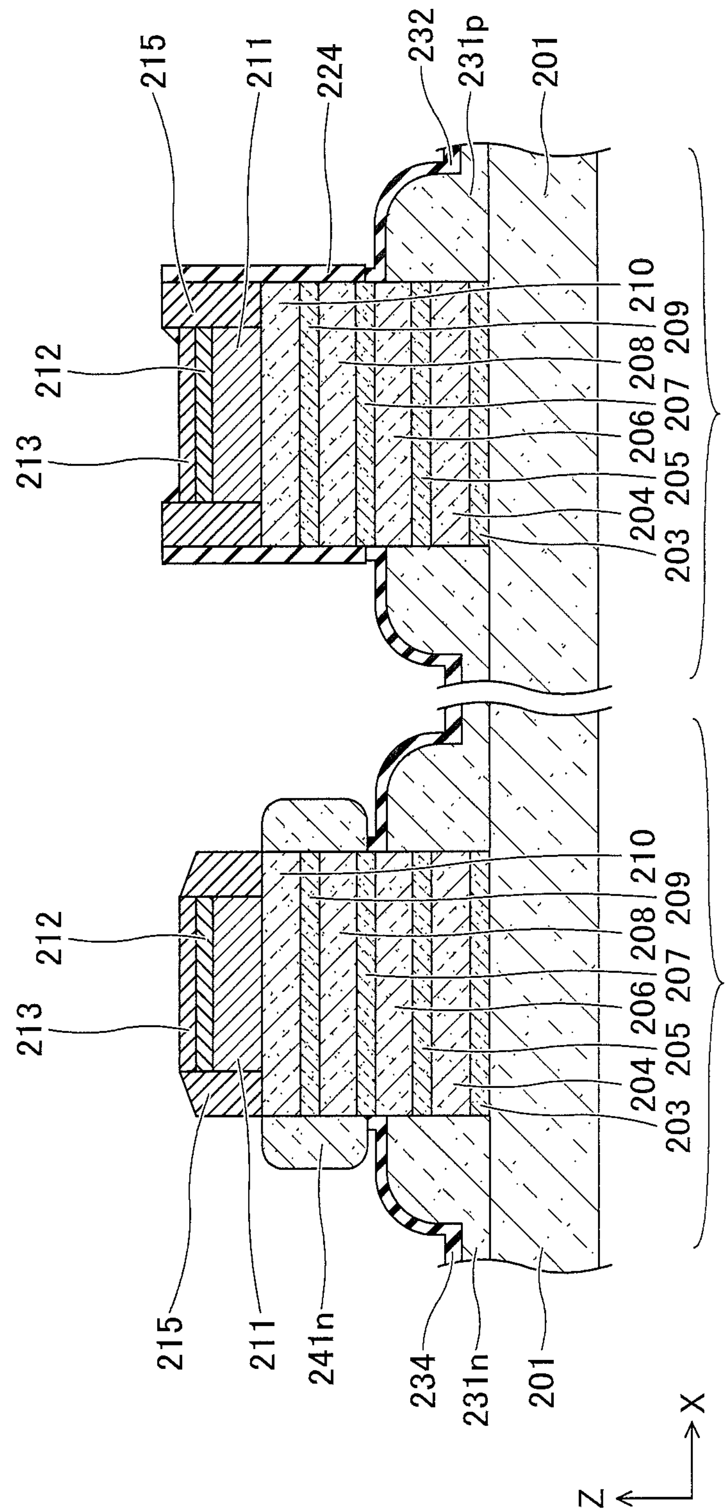
FIG. 21B is a cross sectional view (part 34) illustrating a method of producing a semiconductor device according to the second embodiment.

Next, as illustrated in FIGS. 21A and 21B, the resist mask 235 is removed, and on the element active regions 20*a* and 20*c*, n-type Si layers 241*n* are selectively grown on the side surfaces of the SiGe films 207, the Si films 208, the SiGe films 209, and the Si films 210. The n-type Si layers 241*n* can be formed, for example, by epitaxial growth. For example, into the n-type Si layers 241*n*, phosphorus is introduced as an n-type impurity by using phosphine.

Figure 22A:
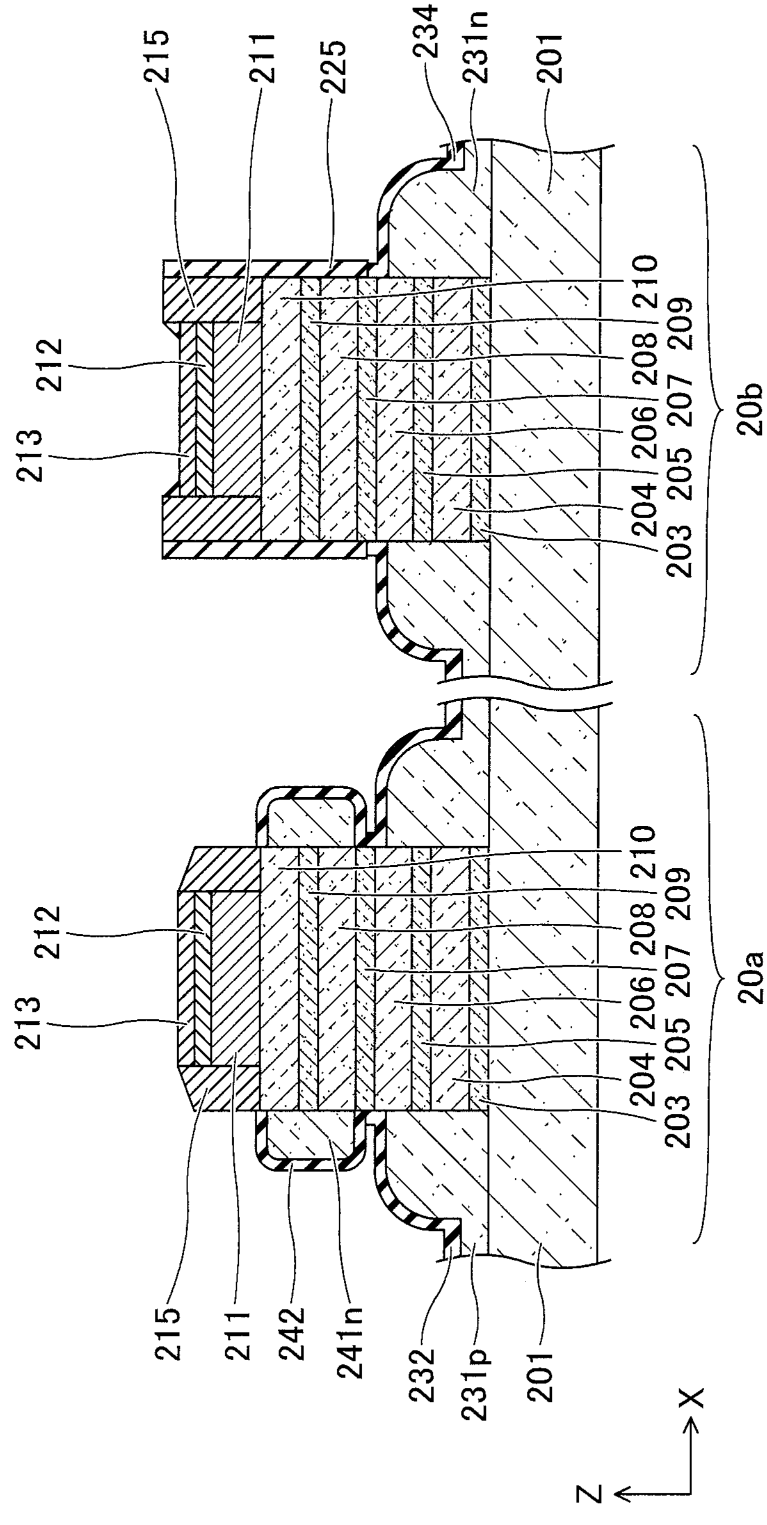
FIG. 22A is a cross sectional view (part 35) illustrating a method of producing a semiconductor device according to the second embodiment.
Figure 22B:
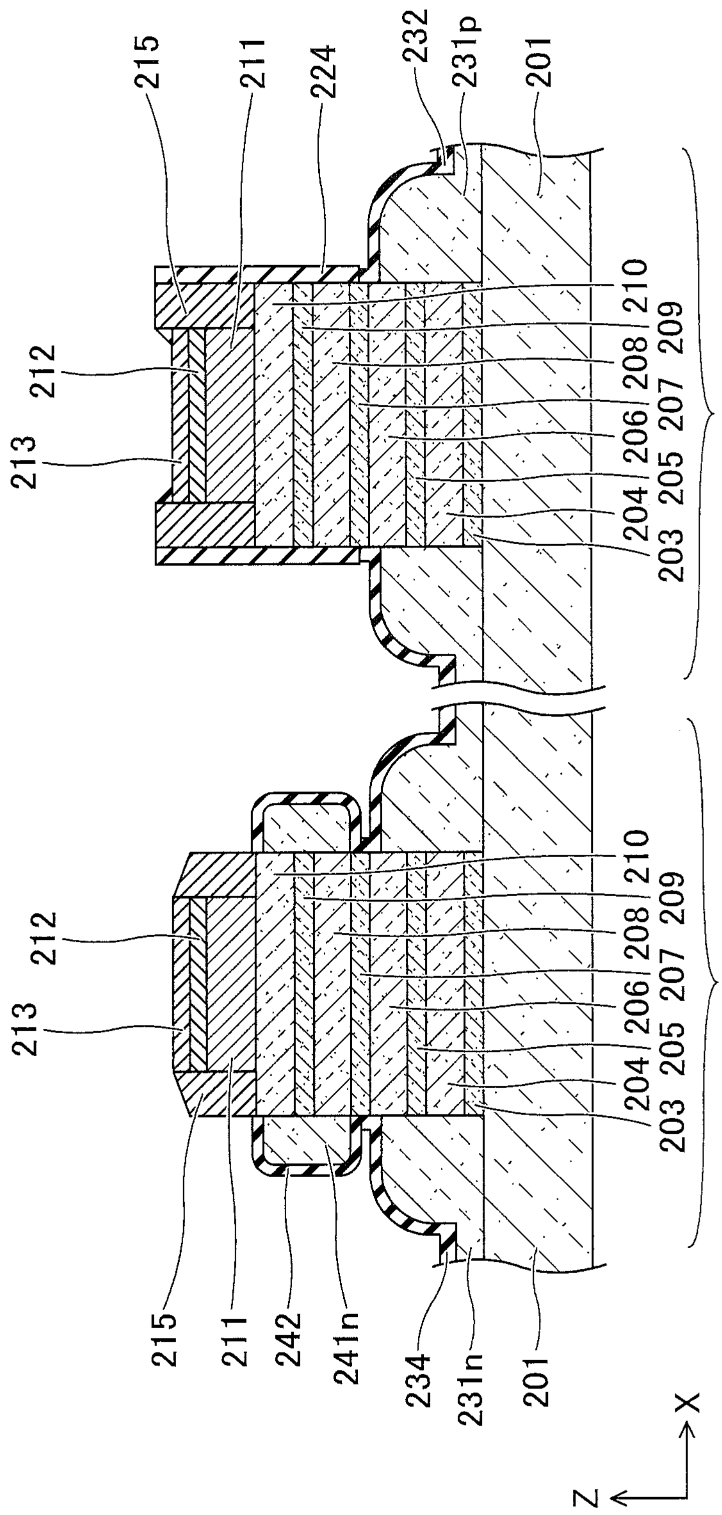
FIG. 22B is a cross sectional view (part 36) illustrating a method of producing a semiconductor device according to the second embodiment.

Next, as illustrated in FIGS. 22A and 22B, the surfaces of the n-type Si layers 241*n* are oxidized to form oxide films 242 on the surfaces of the n-type Si layers 241*n*.

Figure 23A:
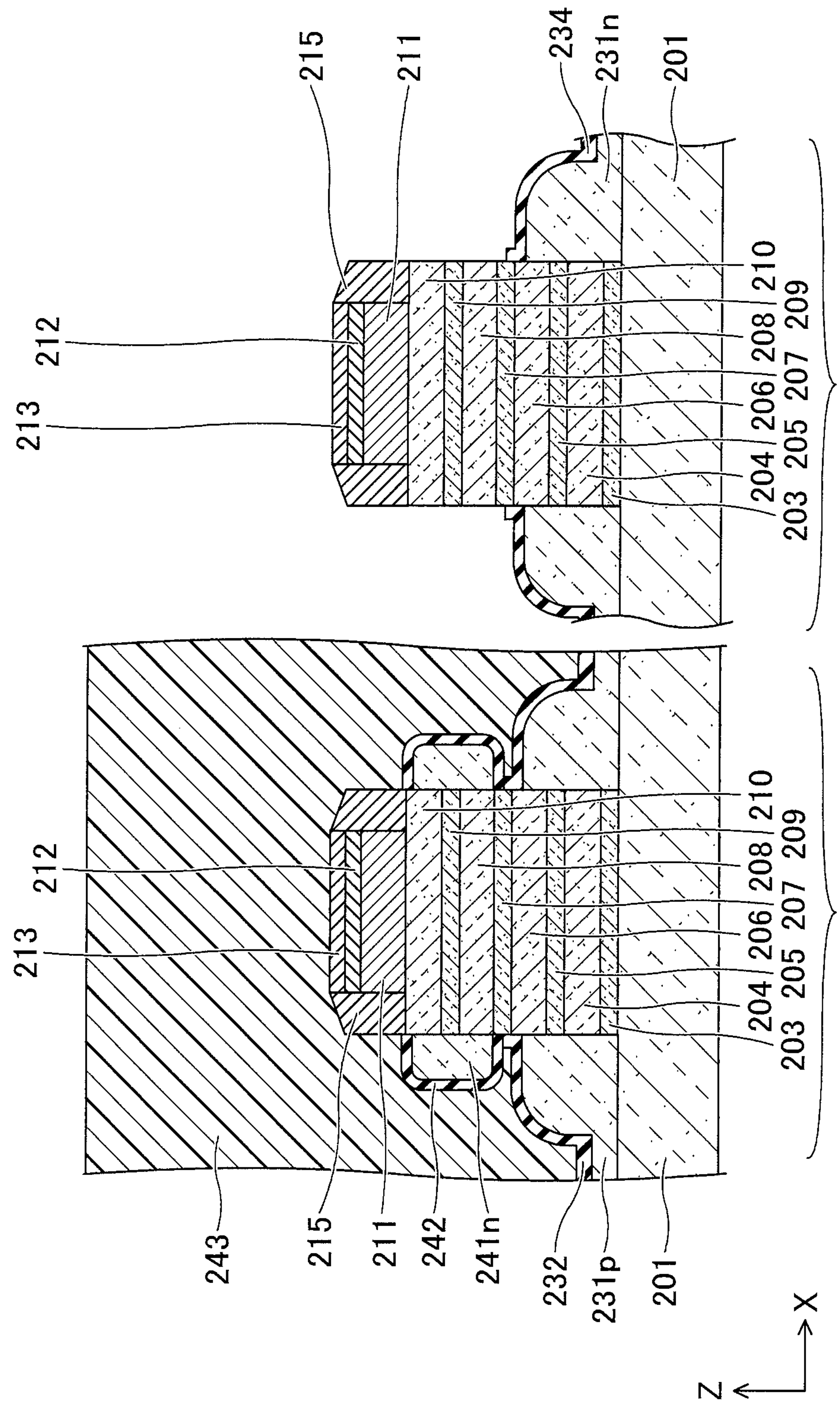
FIG. 23A is a cross sectional view (part 37) illustrating a method of producing a semiconductor device according to the second embodiment.
Figure 23B:
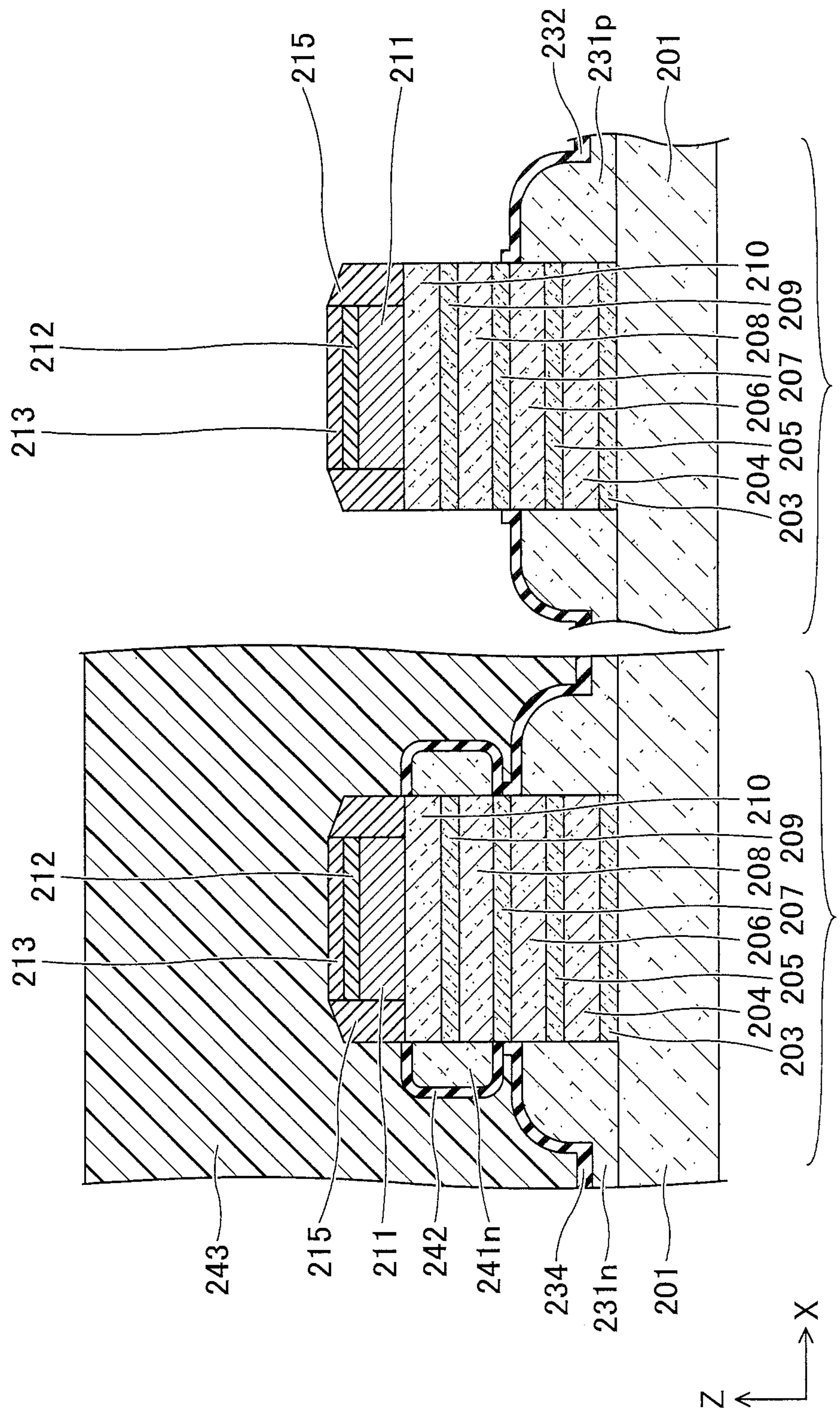
FIG. 23B is a cross sectional view (part 38) illustrating a method of producing a semiconductor device according to the second embodiment.

Thereafter, as illustrated in FIGS. 23A and 23B, a resist mask 243 is formed on the element active regions 20*a* and 20*c*, and by etching, the sidewalls 225 around the element active region 20*b* and the sidewalls 224 around the element active region 20*d* are removed. In this etching, for example, the etching amount is approximately 1.1 times the thickness of the silicon nitride film 222.

Figure 24A:
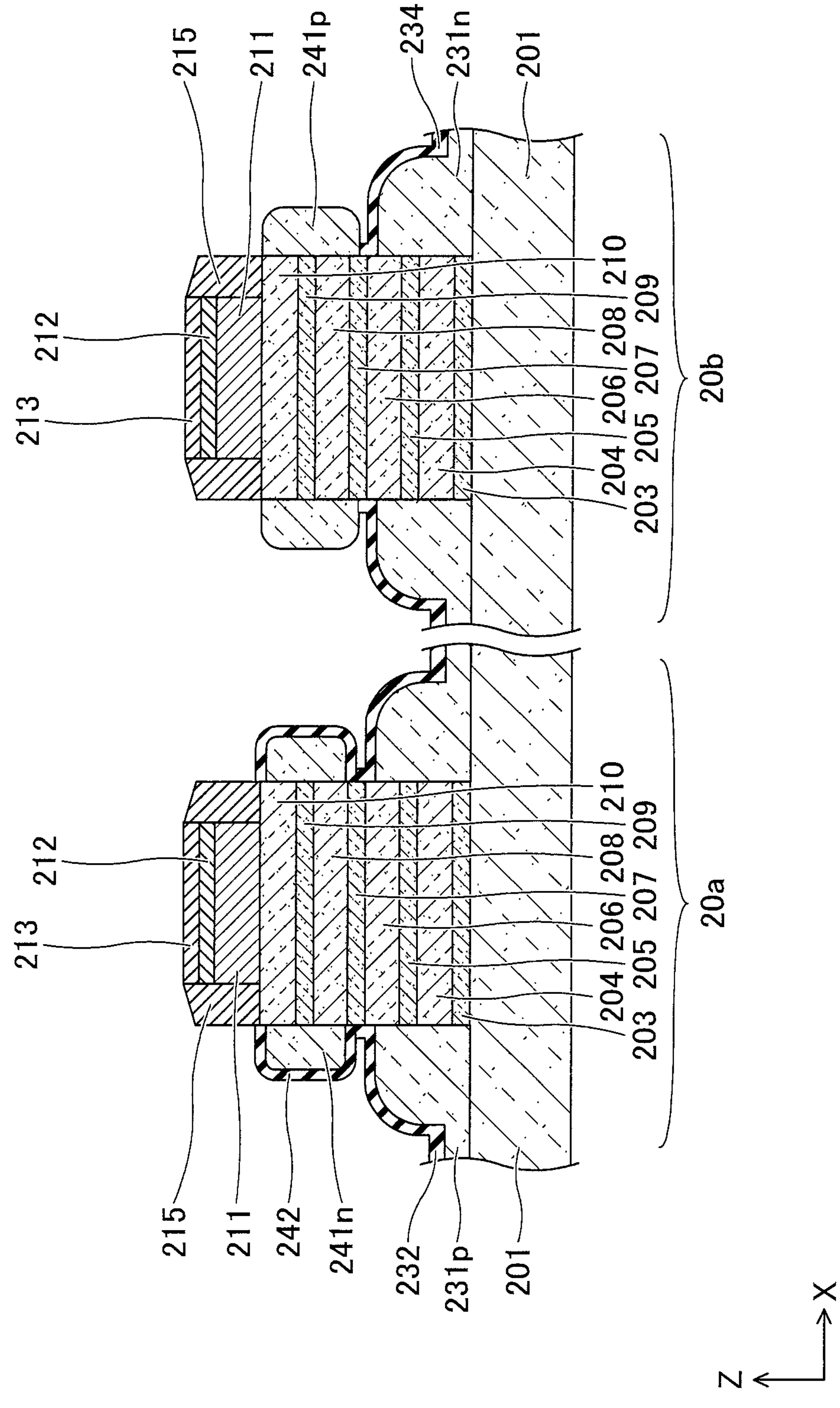
FIG. 24A is a cross sectional view (part 39) illustrating a method of producing a semiconductor device according to the second embodiment.
Figure 24B:
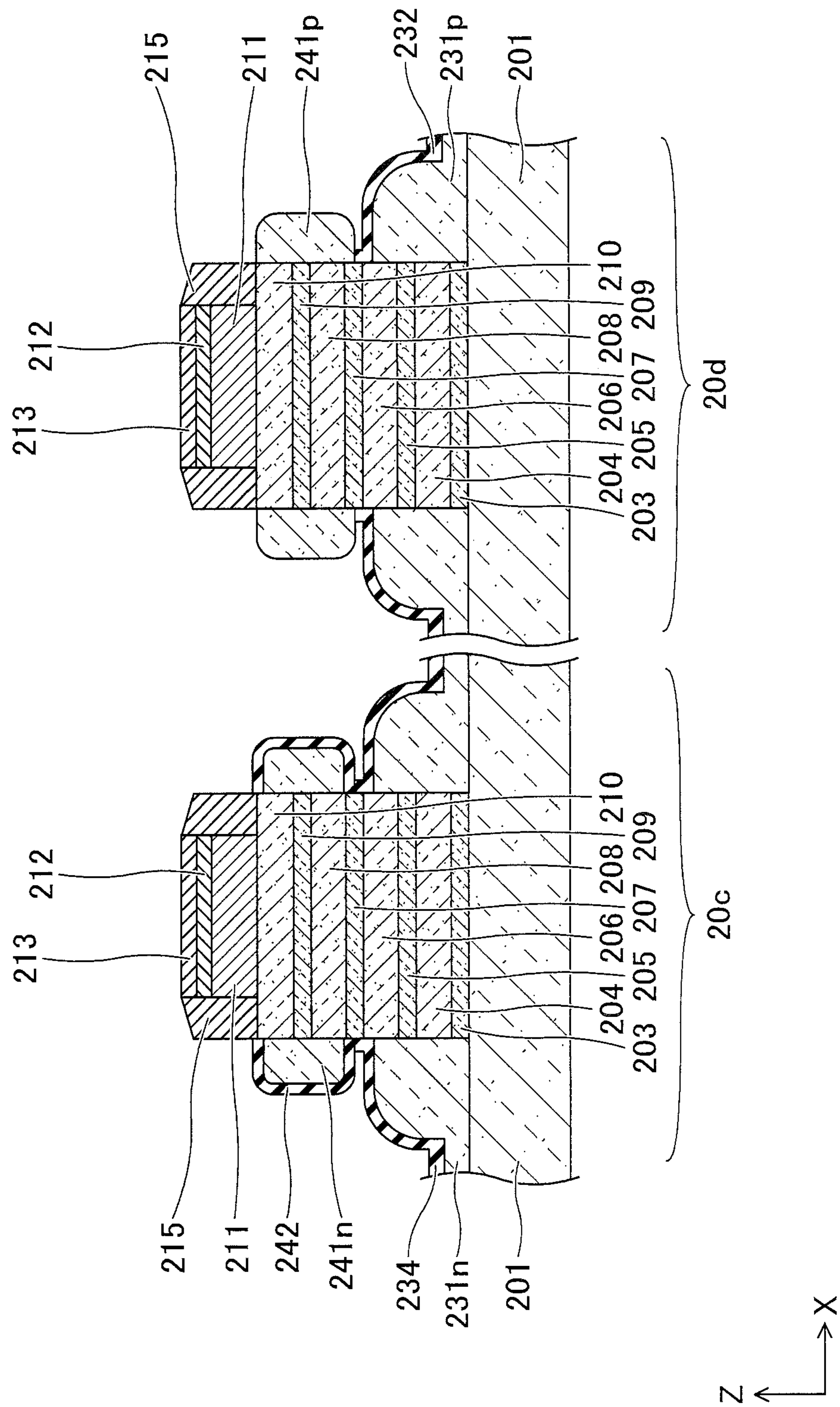
FIG. 24B is a cross sectional view (part 40) illustrating a method of producing a semiconductor device according to the second embodiment.

Next, as illustrated in FIGS. 24A and 24B, the resist mask 243 is removed, and on the element active regions 20*b* and 20*d*, p-type SiGe layers 241*p* are selectively grown on the side surfaces of the SiGe films 207, the Si films 208, the SiGe films 209, and the Si films 210. The p-type SiGe layers 241*p* can be formed, for example, by epitaxial growth. For example, into the p-type SiGe layers 241*p*, boron is introduced as a p-type impurity by using diborane.

Figure 25A:
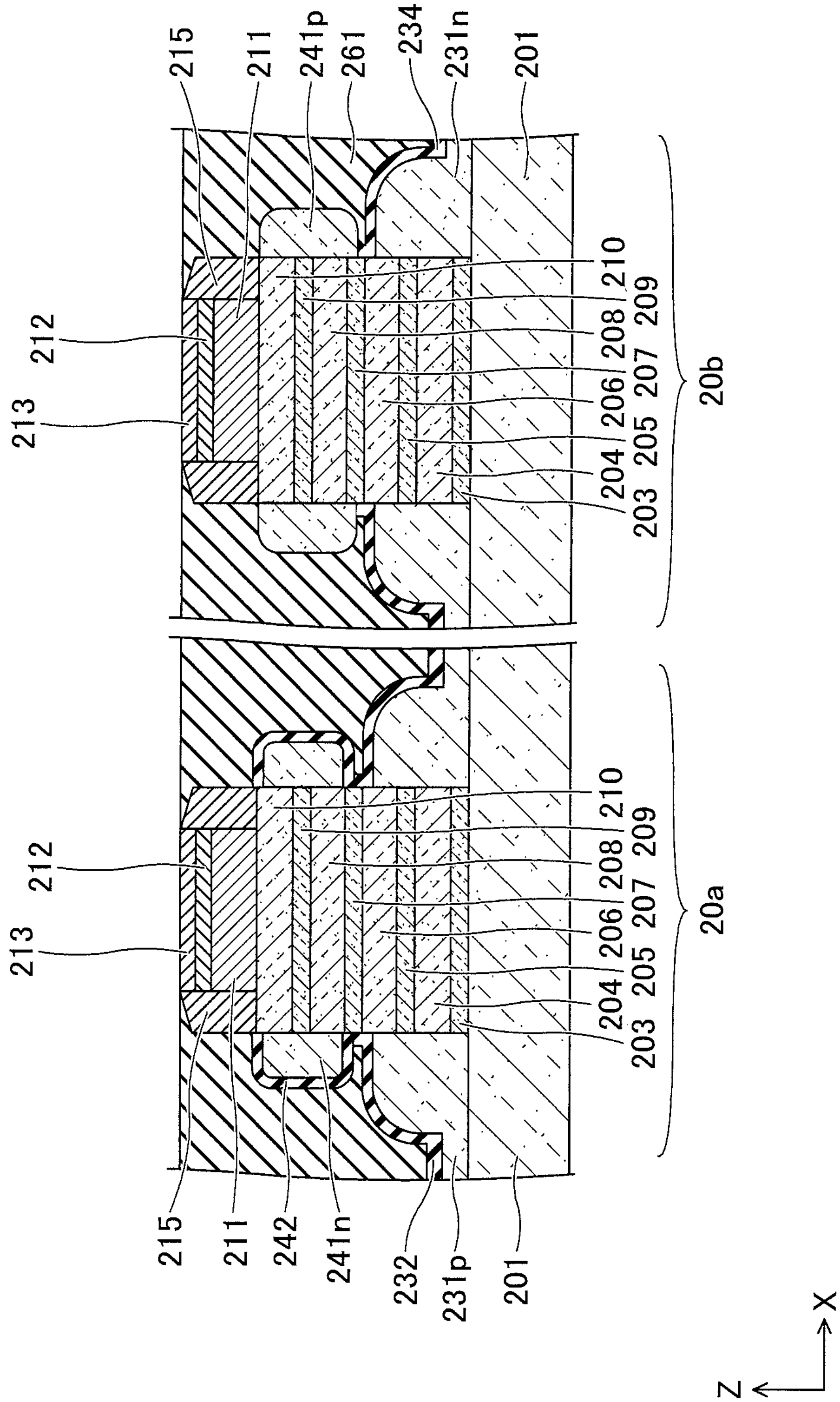
FIG. 25A is a cross sectional view (part 41) illustrating a method of producing a semiconductor device according to the second embodiment.
Figure 25B:
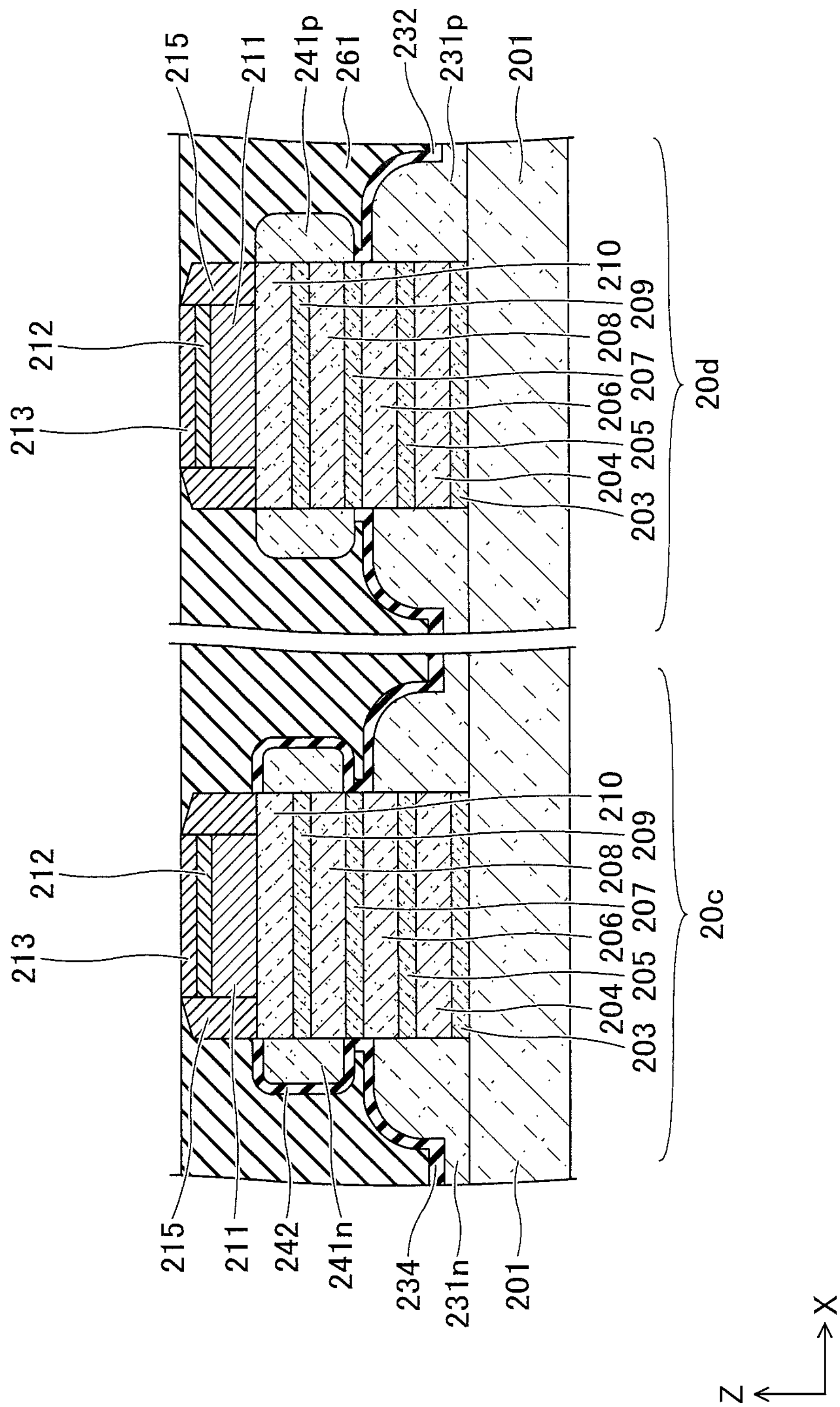
FIG. 25B is a cross sectional view (part 42) illustrating a method of producing a semiconductor device according to the second embodiment.

Next, an interlayer insulation film 261 is formed to cover the stacked structures illustrated in FIGS. 24A and 24B, and the interlayer insulation film 261 is polished, for example, by CMP, until the sidewalls 215 are exposed. As a result, as illustrated in FIGS. 25A and 25B, the flattened interlayer insulation film 261 fills the space between the stacked structures illustrated in FIGS. 24A and 24B. The interlayer insulation film 261 can be formed, for example, by CVD.

Figure 26A:
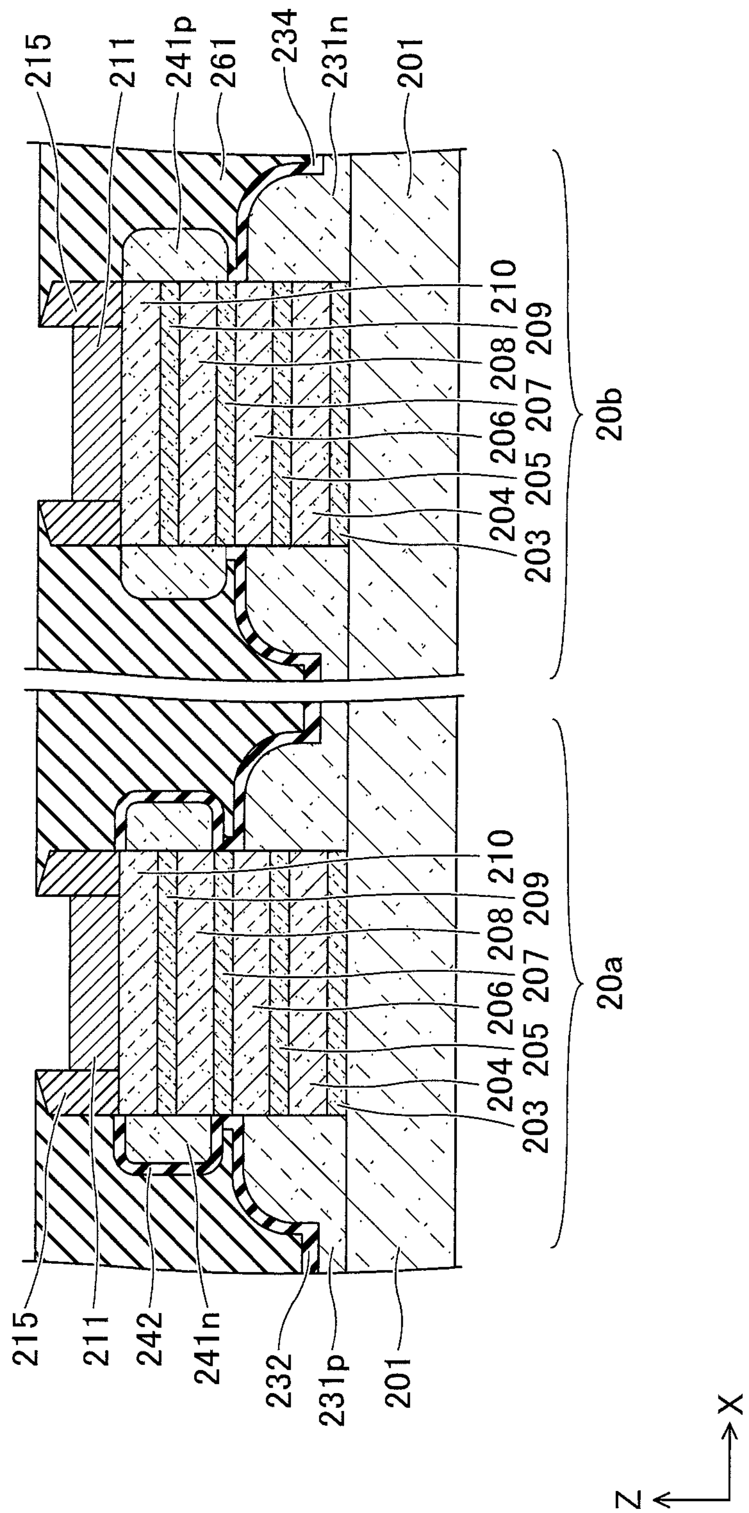
FIG. 26A is a cross sectional view (part 43) illustrating a method of producing a semiconductor device according to the second embodiment.
Figure 26B:
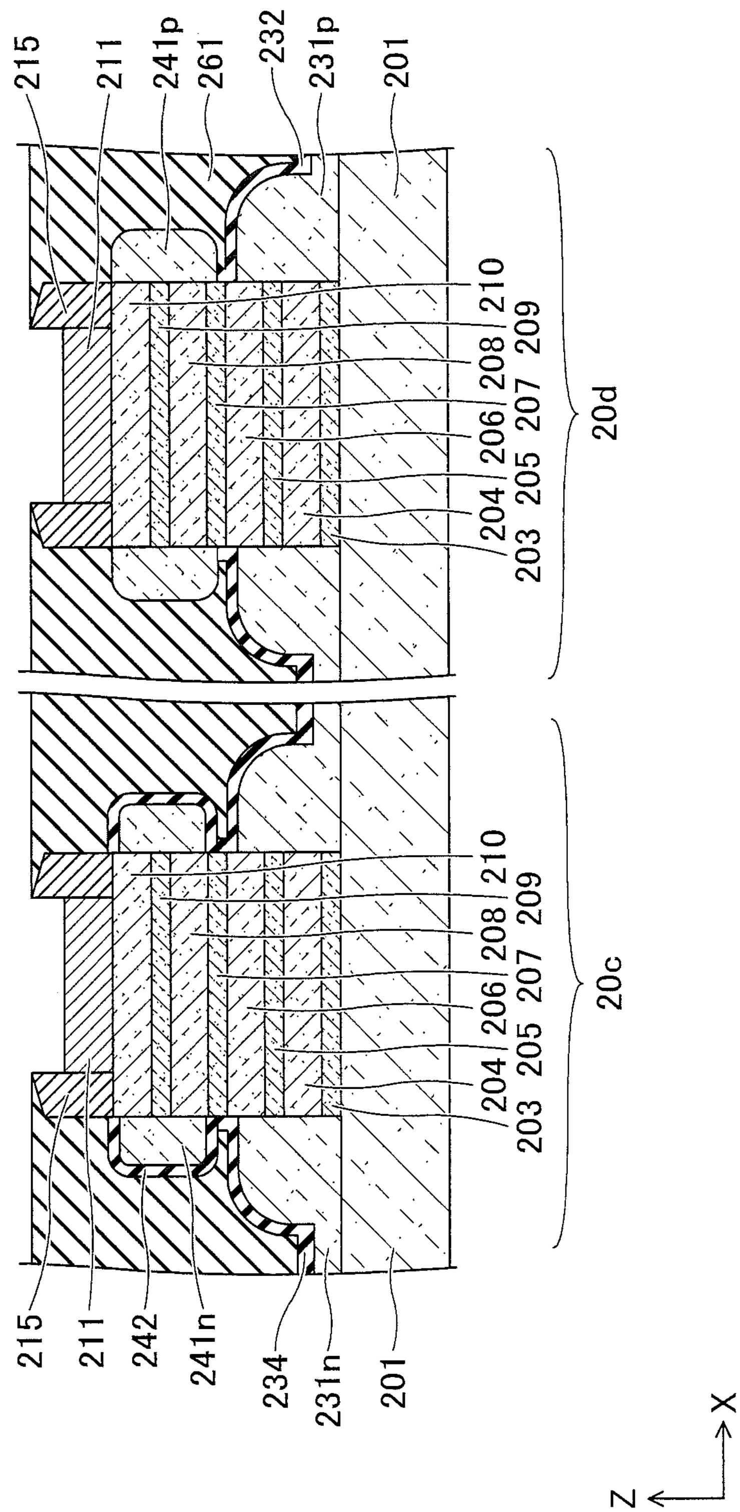
FIG. 26B is a cross sectional view (part 44) illustrating a method of producing a semiconductor device according to the second embodiment.

Thereafter, as illustrated in FIGS. 26A and 26B, the silicon nitride films 213 and the silicon oxide films 212 are removed. As a result, the sacrifice films 211 are exposed.

Figure 27A:
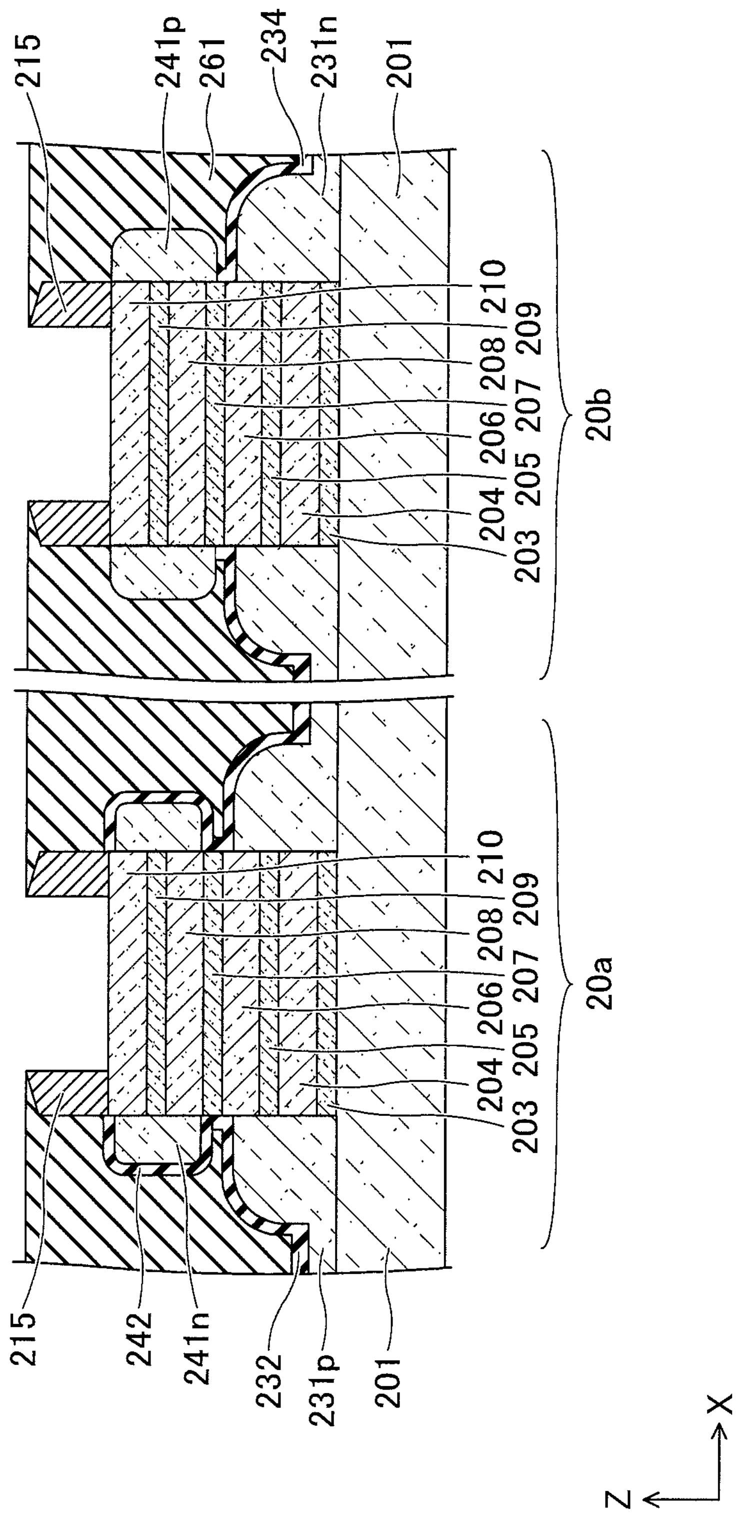
FIG. 27A is a cross sectional view (part 45) illustrating a method of producing a semiconductor device according to the second embodiment.
Figure 27B:
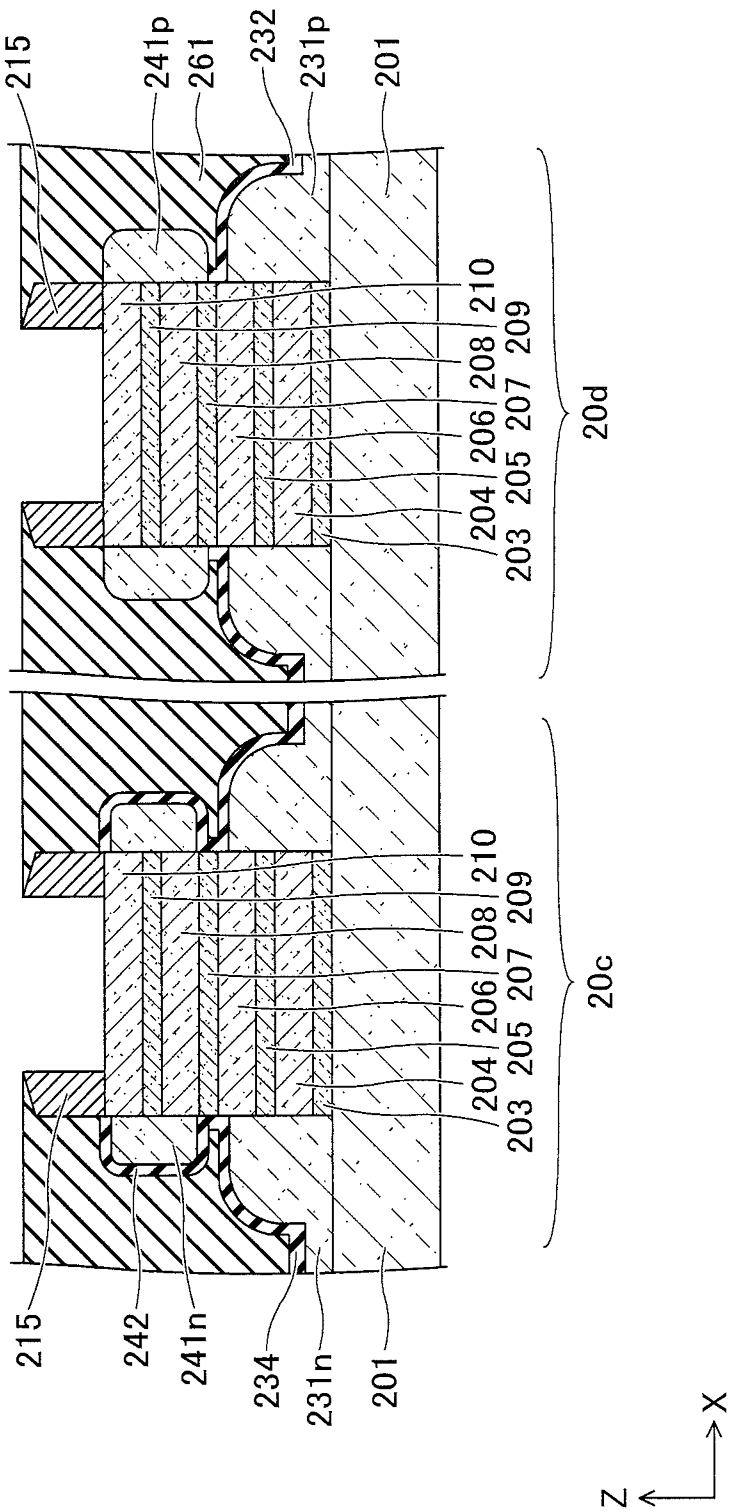
FIG. 27B is a cross sectional view (part 46) illustrating a method of producing a semiconductor device according to the second embodiment.

Next, as illustrated in FIGS. 27A and 27B, the sacrifice films 211 are removed. As a result, in the element active regions 20*a* to 20*d*, the sidewalls orthogonal to the Y direction of the semiconductor stacked structures 218 are exposed.

Figure 28A:
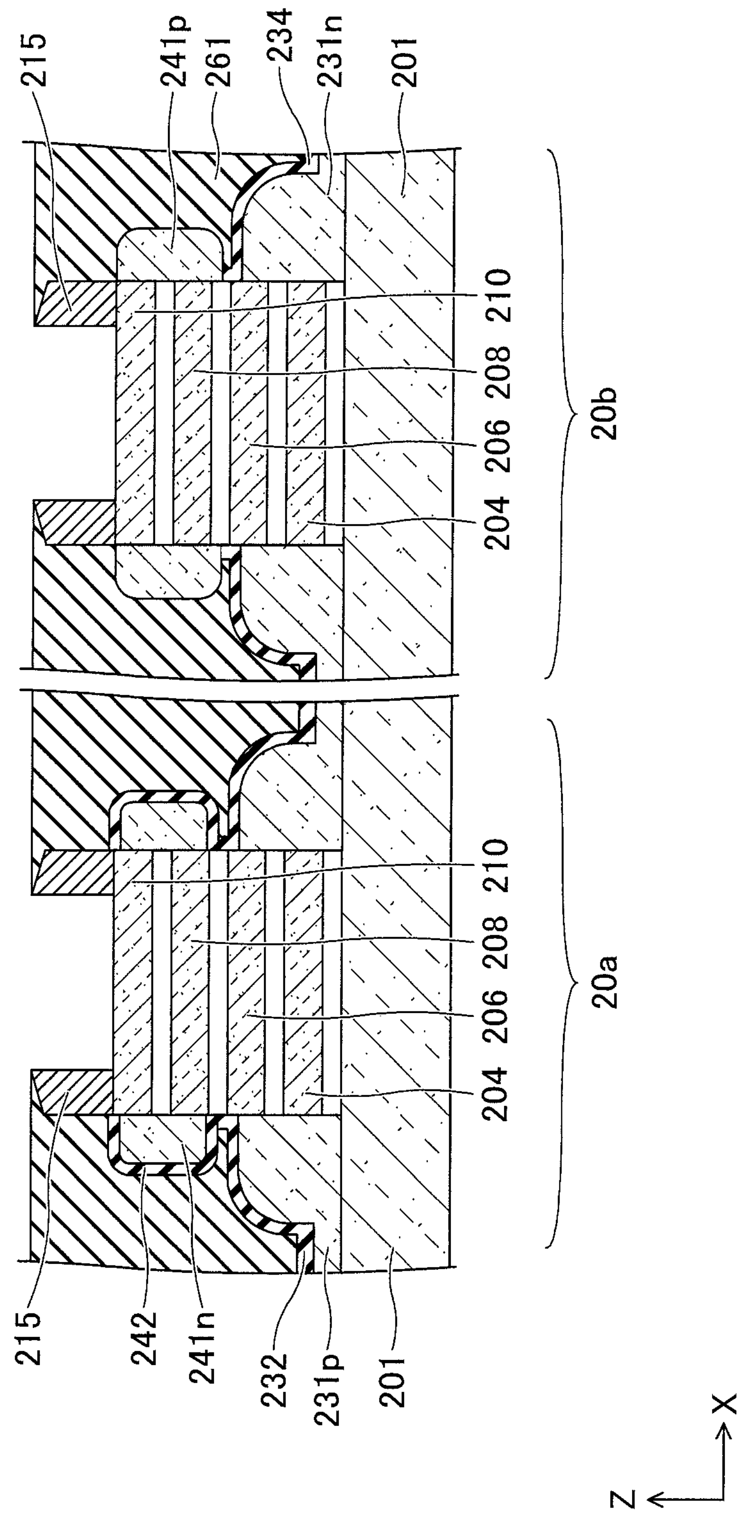
FIG. 28A is a cross sectional view (part 47) illustrating a method of producing a semiconductor device according to the second embodiment.
Figure 28B:
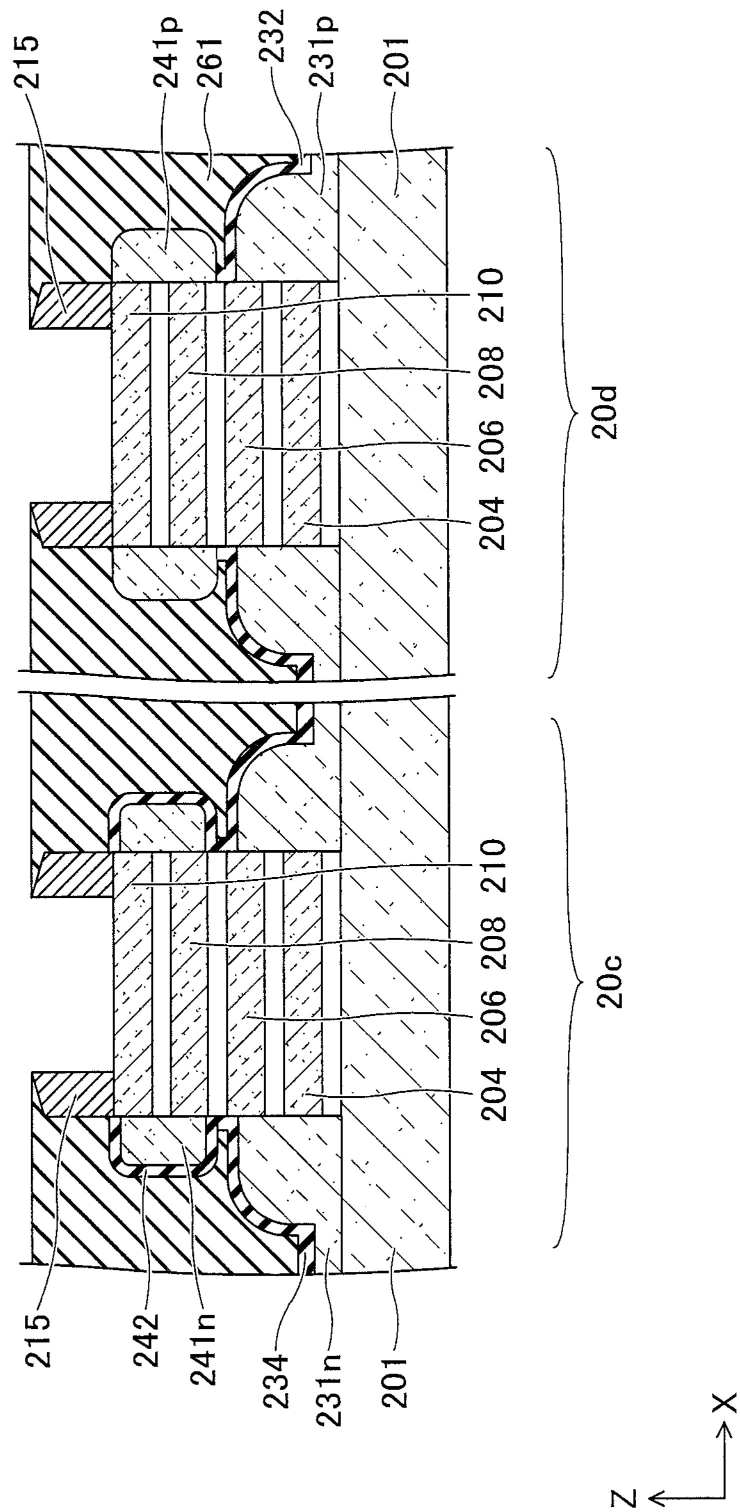
FIG. 28B is a cross sectional view (part 48) illustrating a method of producing a semiconductor device according to the second embodiment.

Next, as illustrated in FIGS. 28A and 28B, the SiGe films 203, 205, 207, and 209 are removed. As a result, spaces are formed around the Si films 204, 206, 208, and 210.

Figure 29A:
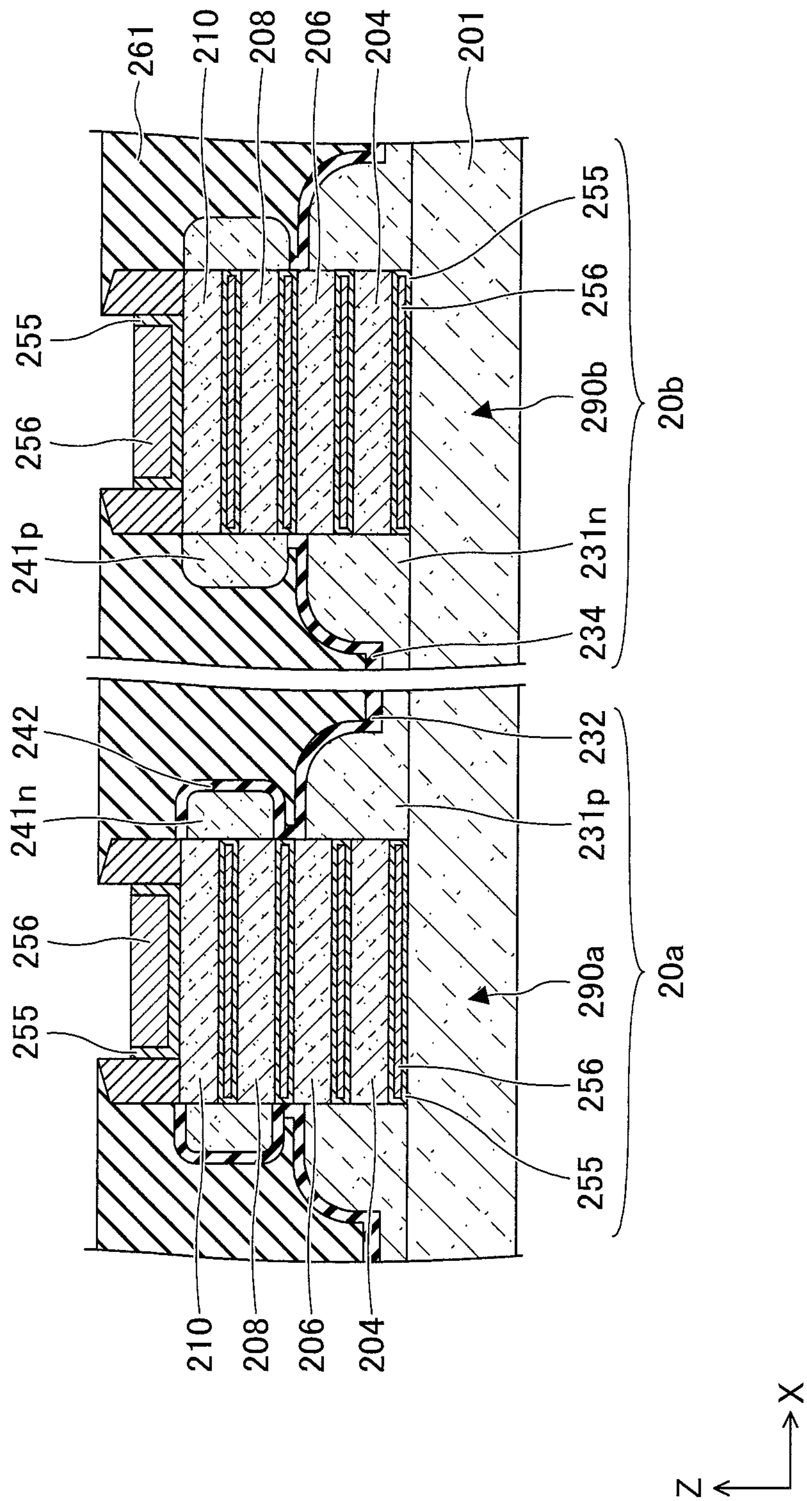
FIG. 29A is a cross sectional view (part 49) illustrating a method of producing a semiconductor device according to the second embodiment.
Figure 29B:
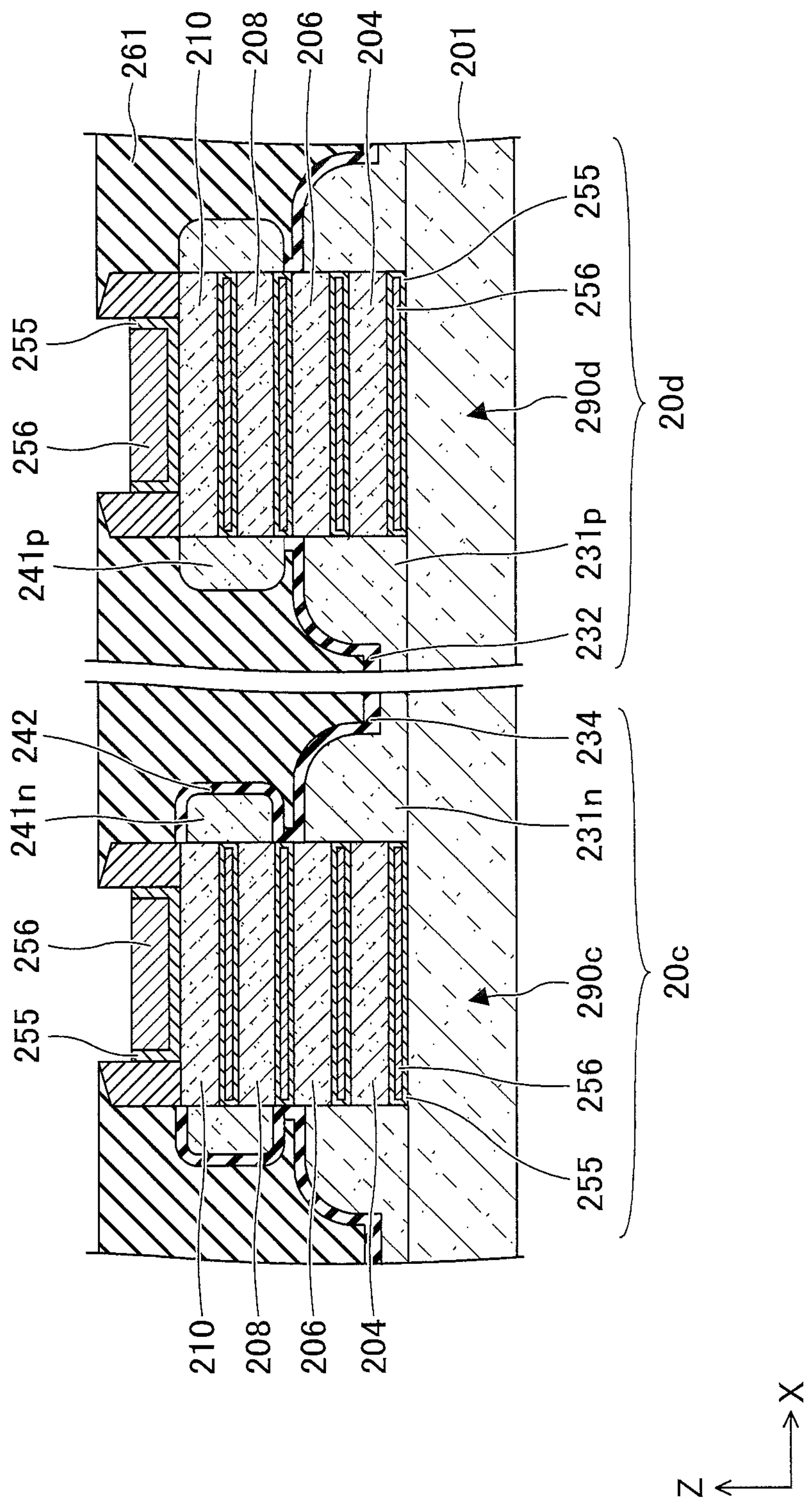
FIG. 29B is a cross sectional view (part 50) illustrating a method of producing a semiconductor device according to the second embodiment.

Thereafter, as illustrated in FIGS. 29A and 29B, gate insulation films 255 and gate electrodes 256 are formed around the Si films 204, 206, 208, and 210. In this way, the stacked transistor structures 290*a* to 290*d* are formed in the element active regions 20*a* to 20*d*, respectively. Also, the Si films 204, 206, 208, and 210 function as the nanowires 258.

Figure 30A:
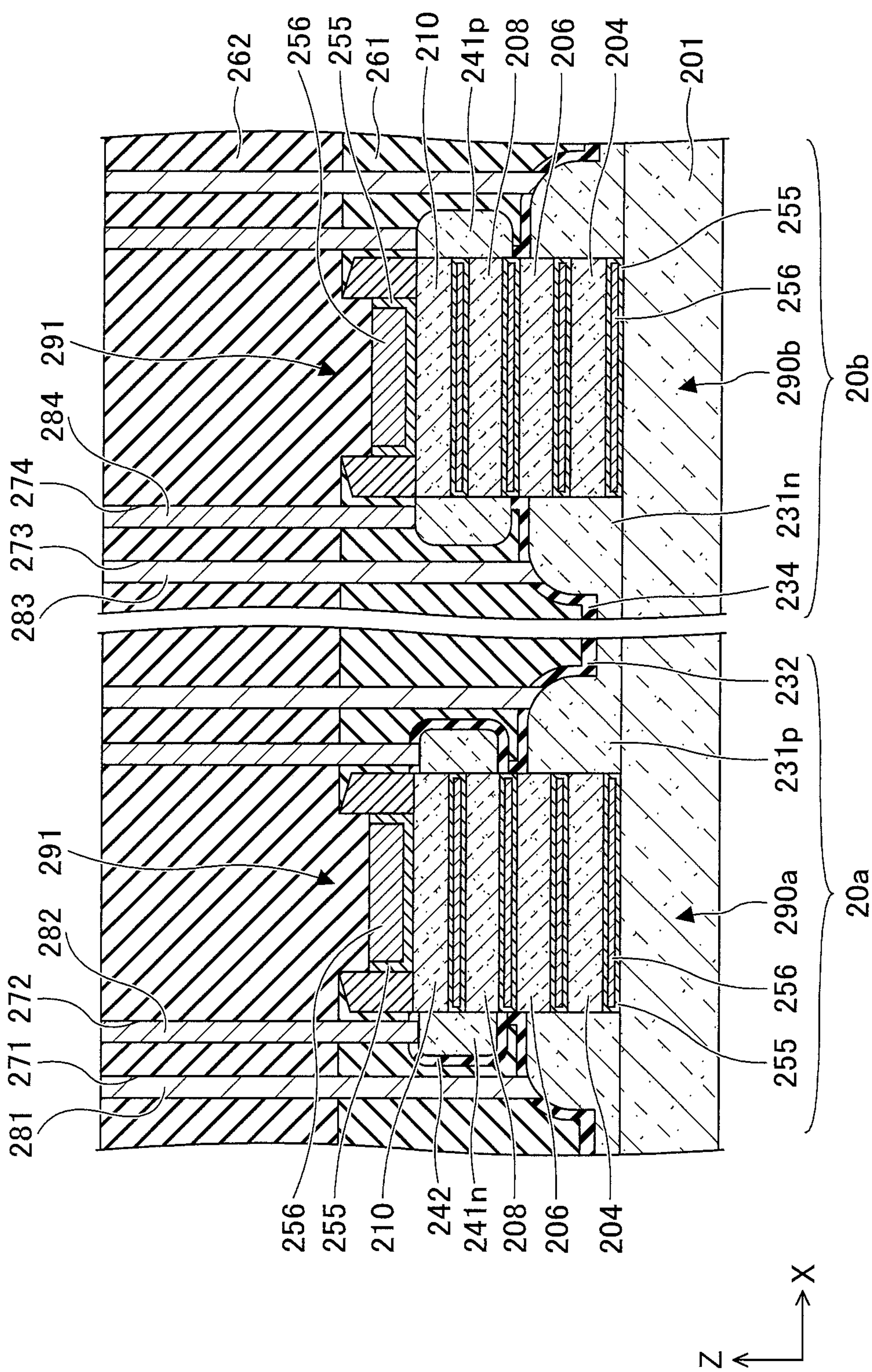
FIG. 30A is a cross sectional view (part 51) illustrating a method of producing a semiconductor device according to the second embodiment.
Figure 30B:
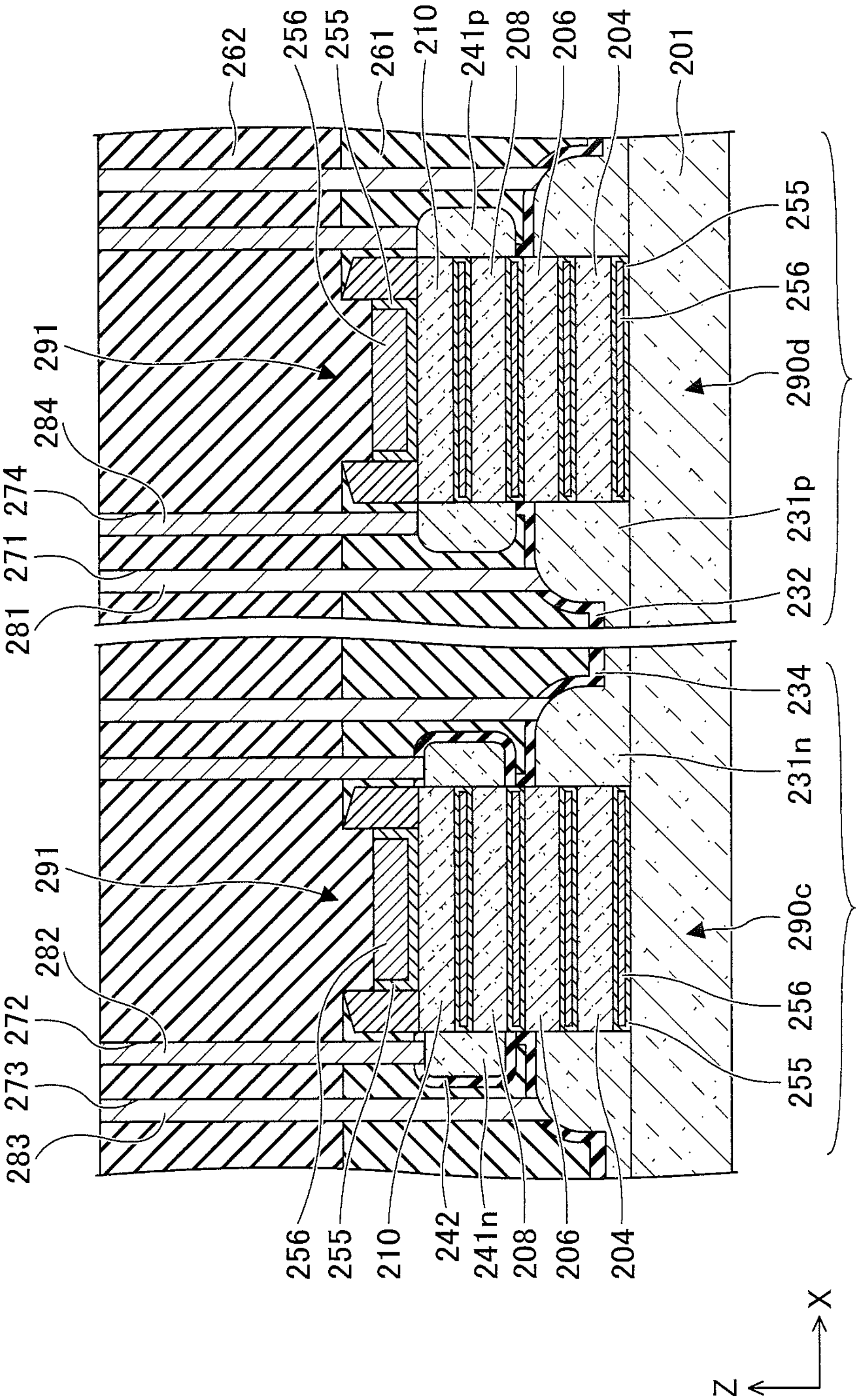
FIG. 30B is a cross sectional view (part 52) illustrating a method of producing a semiconductor device according to the second embodiment.
Figure 31:
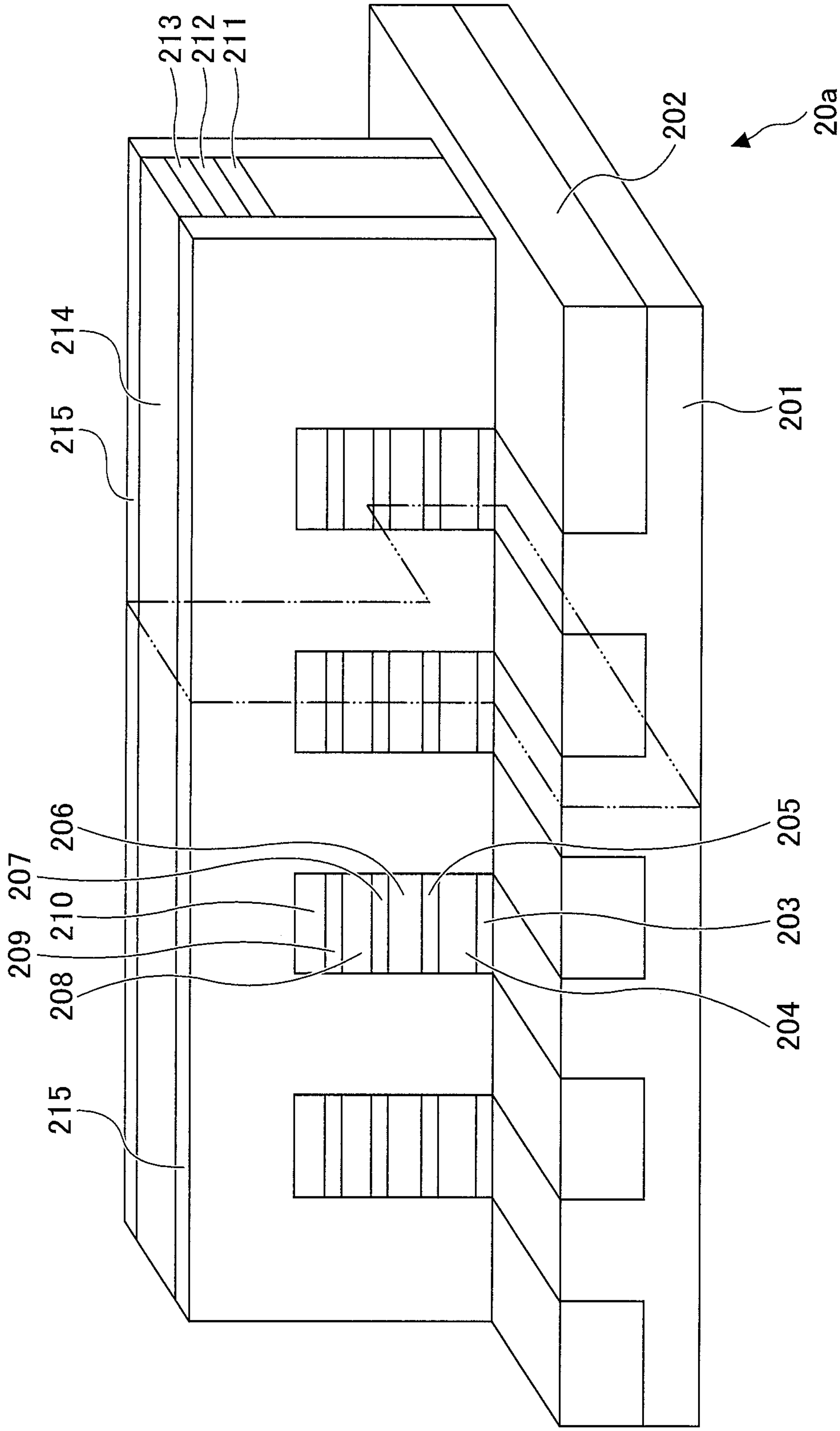
FIG. 31 is a perspective view illustrating a process during the course of producing a semiconductor device according to the second embodiment.

Next, as illustrated in FIGS. 30A and 30B, an interlayer insulation film 262 is formed over the interlayer insulation film 261, to cover the stacked transistor structures 290*a* to 290*d*, and a flattening process is applied to the interlayer insulation film 262. Next, openings 271 to 274 are formed in the interlayer insulation film 262, the interlayer insulation film 261, and the oxide films 232, 234, and 242. Then, conductive films 281 to 284 are formed in the openings 271 to 274, respectively.

Thereafter, upper-layer wires and the like are formed as necessary, to complete the semiconductor device.

According to such a production method, the stacked transistor structures 290*c* and 290*d* can be formed in parallel with the stacked transistor structures 290*a* and 290*b* as examples of CFETs.

Note that as in the first embodiment, spacers may be provided in addition to the gate insulation films 255, between the gate electrode 256 and the n-type Si layers or p-type SiGe layers.

Third Embodiment

Figure 32A:
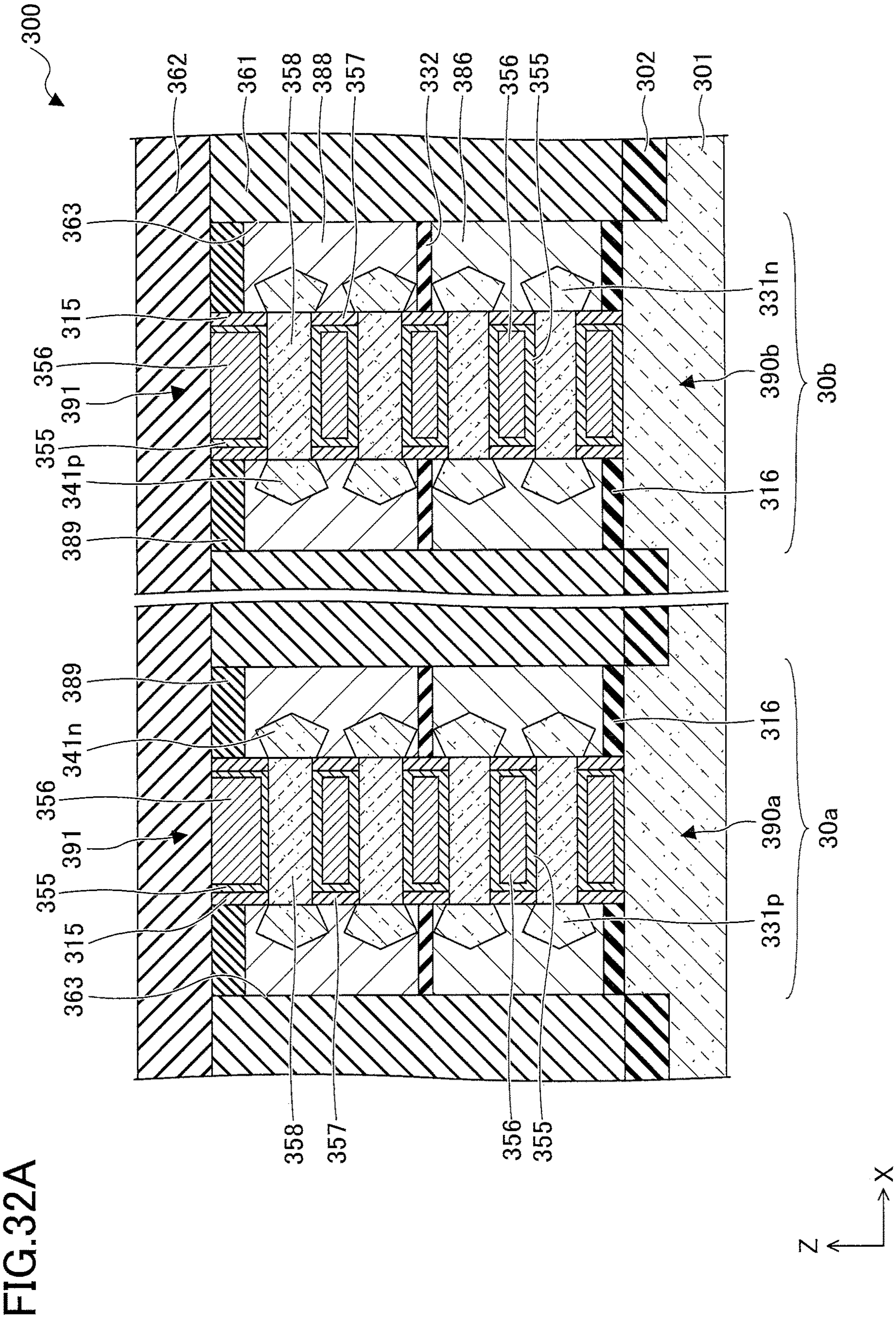
FIG. 32A is a cross sectional view (part 1) illustrating a configuration of a semiconductor device according to a third embodiment.
Figure 32B:
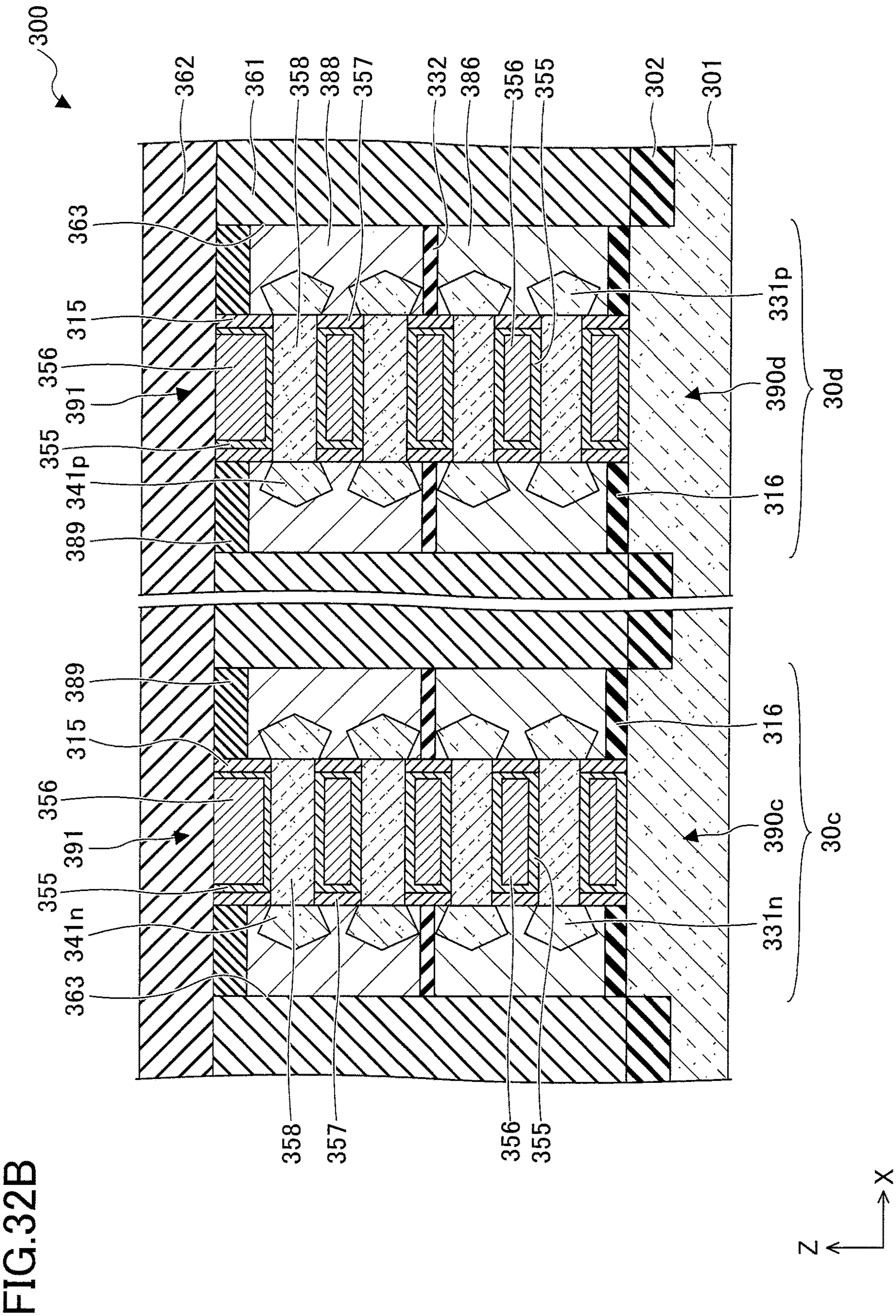
FIG. 32B is a cross sectional view (part 2) illustrating a configuration of a semiconductor device according to the third embodiment.

Next, a semiconductor device according to a third embodiment will be described. As in the first embodiment, the third embodiment includes an element active region in which an nFET is formed over a pFET, an element active region in which a pFET is formed over an nFET, an element active region in which an nFET is formed over an nFET, and an element active region in which a pFET is formed over a pFET. FIGS. 32A and 32B are cross sectional views illustrating a configuration of the semiconductor device according to the third embodiment.

As illustrated in FIGS. 32A and 32B, in the semiconductor device according to the third embodiment, element separating regions 302 are formed over the surface of a semiconductor substrate 301 such as a silicon (Si) substrate or the like, and the element separating regions 302 demarcate, for example, four element active regions 30*a*, 30*b*, 30*c*, and 30*d*.

In the element active region 30*a*, a stacked transistor structure 390*a* is formed over the semiconductor substrate 301. The stacked transistor structure 390*a* includes a gate structure 391 formed over the semiconductor substrate 301. The gate structure 391 includes a gate electrode 356, multiple nanowires 358, gate insulation films 355, spacers 357, and sidewalls 315. The gate electrode 356 extends in the Y direction and stands up in the Z direction. The nanowires 358 penetrate the gate electrode 356 in the X direction, and are arrayed in the Y direction and in the Z direction. The gate insulation films 355 are formed between the gate electrode 356 and the nanowires 358. In the X direction, the gate electrode 356 and the gate insulation films 355 are formed to be receded from both ends of the nanowires 358, and the spacers 357 are formed in the receded portions. The sidewalls 315 are formed on the side surfaces of the gate electrode 356 via the gate insulation films 355. On both sides of the semiconductor stacked structures 318, insulation films 316 are formed over the semiconductor substrate 301.

For example, for the gate electrode 356, titanium, titanium nitride, polycrystalline silicon, or the like may be used. For example, for the gate insulation films 355, a high dielectric constant material such as hafnium oxide, aluminum oxide, oxide of hafnium and aluminum, or the like may be used. For example, for the nanowires 358, silicon or the like may be used. For example, for the insulation films 316, the spacers 357, and the sidewalls 315, silicon oxide, silicon nitride, or the like may be used.

For example, the number of layers of the nanowires 358 arrayed in the Z-direction is four, and in the element active region 30*a*, p-type semiconductor layers 331*p* are formed at the ends of two layers of the nanowires 358 on the semiconductor substrate 301 side. Two local wires 386 that contact the p-type semiconductor layers 331*p* are formed so as to sandwich the gate structure 391 in-between in the X direction. Also, n-type semiconductor layers 341*n* are formed at the ends of two layers of the nanowires 358 on the side apart from the semiconductor substrate 301. Two local wires 388 that contact the n-type semiconductor layers 341*n* are formed so as to sandwich the gate structure 391 in-between in the X direction. Insulation films 332 are formed between the local wires 386 and the local wires 388. For example, the p-type semiconductor layer 331*p* is a p-type SiGe layer, and the n-type semiconductor layers 341*n* is an n-type Si layer. For example, for the insulation films 332, silicon oxide, silicon nitride, or the like may be used.

In this way, the stacked transistor structure 390*a* has a pFET that includes the gate electrode 356, the nanowires 358, the gate insulation films 355, and the p-type semiconductor layers 331*p*. In this pFET, one of the p-type semiconductor layers 331*p* functions as a source region, the other p-type semiconductor layer 331*p* functions as a drain region, and the nanowires 358 collectively function as a channel. The stacked transistor structure 390*a* also has an nFET that includes the gate electrode 356, the nanowires 358, the gate insulation films 355, and the n-type semiconductor layers 341*n*. In this nFET, one of the n-type semiconductor layers 341*n* functions as a source region, the other n-type semiconductor layer 341*n* functions as a drain region, and the nanowires 358 collectively function as a channel.

In the element active region 30*b*, a stacked transistor structure 390*b* is formed over the semiconductor substrate 301. The stacked transistor structure 390*b*, like the stacked transistor structure 390*a*, includes a gate structure 391. Also, in the element active region 30*b*, n-type semiconductor layers 331*n* are formed at the ends of two layers of the nanowires 358 on the semiconductor substrate 301 side. Two local wires 386 that contact the n-type semiconductor layers 331*n* are formed so as to sandwich the gate structure 391 in-between in the X direction. Also, p-type semiconductor layers 341*p* are formed at the ends of two layers of the nanowires 358 on the side apart from the semiconductor substrate 301. Two local wires 388 that contact the p-type semiconductor layers 341*p* are formed so as to sandwich the gate structure 391 in-between in the X direction. Insulation films 332 are formed between the local wires 386 and the local wires 388. For example, the n-type semiconductor layers 331*n* are n-type Si layers, and the p-type semiconductor layers 341*p* are p-type SiGe layers.

In this way, the stacked transistor structure 390*b* has an nFET that includes the gate electrode 356, the nanowires 358, the gate insulation films 355, and the n-type semiconductor layers 331*n*. In this nFET, one of the n-type semiconductor layers 331*n* functions as a source region, the other n-type semiconductor layer 331*n* functions as a drain region, and the nanowires 358 collectively function as a channel. The stacked transistor structure 390*b* also has a pFET that includes the gate electrode 356, the nanowires 358, the gate insulation films 355, and the p-type semiconductor layers 341*p*. In this pFET, one of the p-type semiconductor layers 341*p* functions as a source region, the other p-type semiconductor layer 341*p* functions as a drain region, and the nanowires 358 collectively function as a channel.

In the element active region 30*c*, a stacked transistor structure 390*c* is formed over the semiconductor substrate 301. The stacked transistor structure 390*c*, like the stacked transistor structure 390*a*, includes a gate structure 391. Also, in the element active region 30*c*, n-type semiconductor layers 331*n* are formed at the ends of two layers of the nanowires 358 on the semiconductor substrate 301 side. Two local wires 386 that contact the n-type semiconductor layers

331*n* are formed so as to sandwich the gate structure 391 in-between in the X direction. Also, n-type semiconductor layers 341*n* are formed at the ends of two layers of the nanowires 358 on the side apart from the semiconductor substrate 301. Two local wires 388 that contact the n-type semiconductor layers 341*n* are formed so as to sandwich the gate structure 391 in-between in the X direction. Insulation films 332 are formed between the local wires 386 and the local wires 388.

In this way, the stacked transistor structure 390*c* has an nFET that includes the gate electrode 356, the nanowires 358, the gate insulation films 355, and the n-type semiconductor layers 331*n*. In this nFET, one of the n-type semiconductor layers 331*n* functions as a source region, the other n-type semiconductor layer 331*n* functions as a drain region, and the nanowires 358 collectively function as a channel. The stacked transistor structure 390*c* also has an nFET that includes the gate electrode 356, the nanowires 358, the gate insulation films 355, and the n-type semiconductor layers 341*n*. In this nFET, one of the n-type semiconductor layers 341*n* functions as a source region, the other n-type semiconductor layer 341*n* functions as a drain region, and the nanowires 358 collectively function as a channel.

In the element active region 30*d*, a stacked transistor structure 390*d* is formed over the semiconductor substrate 301. The stacked transistor structure 390*d*, like the stacked transistor structure 390*a*, includes a gate structure 391. Also, in the element active region 30*d*, p-type semiconductor layers 331*p* are formed at the ends of two layers of the nanowires 358 on the semiconductor substrate 301 side. Two local wires 386 that contact the p-type semiconductor layers 331*p* are formed so as to sandwich the gate structure 391 in-between in the X direction. Also, p-type semiconductor layers 341*p* are formed at the ends of two layers of the nanowires 358 on the side apart from the semiconductor substrate 301. Two local wires 388 that contact the p-type semiconductor layers 341*p* are formed so as to sandwich the gate structure 391 in-between in the X direction. Insulation films 332 are formed between the local wires 386 and the local wires 388.

In this way, the stacked transistor structure 390*d* has a pFET that includes the gate electrode 356, the nanowires 358, the gate insulation films 355, and the p-type semiconductor layers 331*p*. In this pFET, one of the p-type semiconductor layers 331*p* functions as a source region, the other p-type semiconductor layer 331*p* functions as a drain region, and the nanowires 358 collectively function as a channel. The stacked transistor structure 390*d* also has a pFET that includes the gate electrode 356, the nanowires 358, the gate insulation films 355, and the p-type semiconductor layers 341*p*. In this pFET, one of the p-type semiconductor layers 341*p* functions as a source region, the other p-type semiconductor layer 341*p* functions as a drain region, and the nanowires 358 collectively function as a channel.

An interlayer insulation film 361 is formed between the stacked transistor structures 390*a* to 390*d*. Openings 363 are formed in the interlayer insulation film 361; and the local wires 386, the insulation films 332, and the local wires 388 are formed in the openings 363. Insulation films 389 are formed over the local wires 388 in the openings 363. Also, an interlayer insulation film 362 that covers the stacked transistor structures 390*a* to 390*d* is formed over the interlayer insulation film 361.

For example, for the interlayer insulation films 361 and 362, silicon oxide, silicon nitride, silicon carbide, silicon oxynitride, or the like may be used. For example, for the local wires 386 and 388, tungsten, cobalt, ruthenium, or the like may be used. In the case of using tungsten, it is favorable to form a conductive underlayer film, whereas in the case of using cobalt or ruthenium, it is not necessary to form an underlayer film.

In the semiconductor device according to the third embodiment, the stacked transistor structure 390*a* includes a pFET and an nFET thereover, and the stacked transistor structure 390*b* includes an nFET and a pFET thereover; these are examples of CFETs. Other than these CFETs, the semiconductor device according to the third embodiment includes the stacked transistor structure 390*c* that includes an nFET and an nFET thereover, and the stacked transistor structure 390*d* that includes a pFET and a pFET thereover. Therefore, according to the third embodiment, two transistors of the same conductivity type that have been conventionally provided at different positions in plan view, can be overlapped in plan view, and thereby, the semiconductor device can be made finer.

Further, in the third embodiment, in each of the stacked transistor structures 390*a* to 390*d*, the local wires 386 connected to the transistors positioned on the lower side can be overlapped with the local wires 388 connected to the transistors positioned on the upper side. Therefore, compared to the first and second embodiments, regions for connecting the upper-layer wires can be narrowed in the X direction, and thereby, the semiconductor device can be made further finer.

Next, a method of producing a semiconductor device according to the third embodiment will be described. FIGS. 33A and 33B to 46A and 46B are cross sectional views illustrating a method of producing a semiconductor device according to the third embodiment.

Figure 33A:
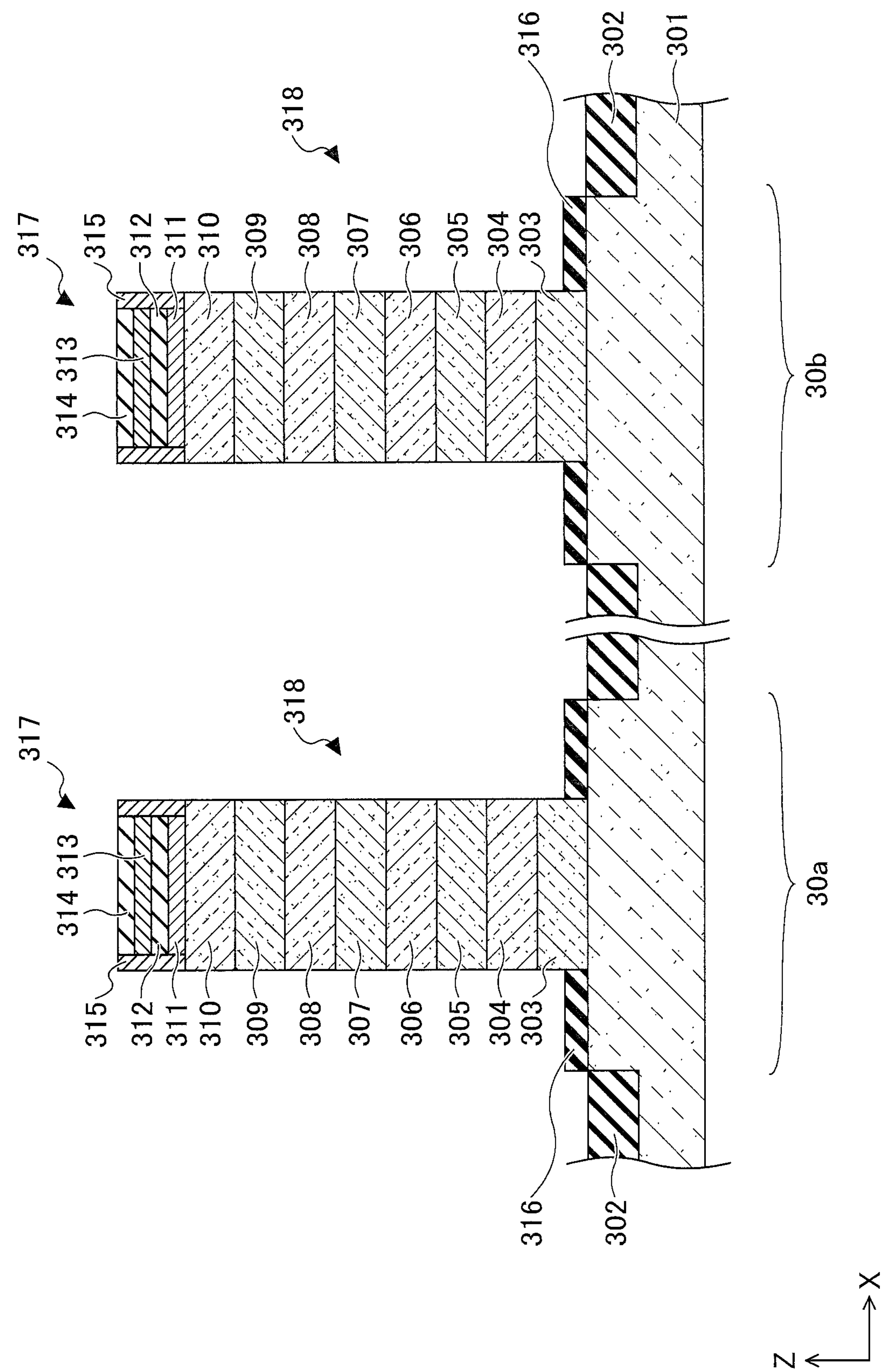
FIG. 33A is a cross sectional view (part 1) illustrating a method of producing a semiconductor device according to a third embodiment.
Figure 33B:
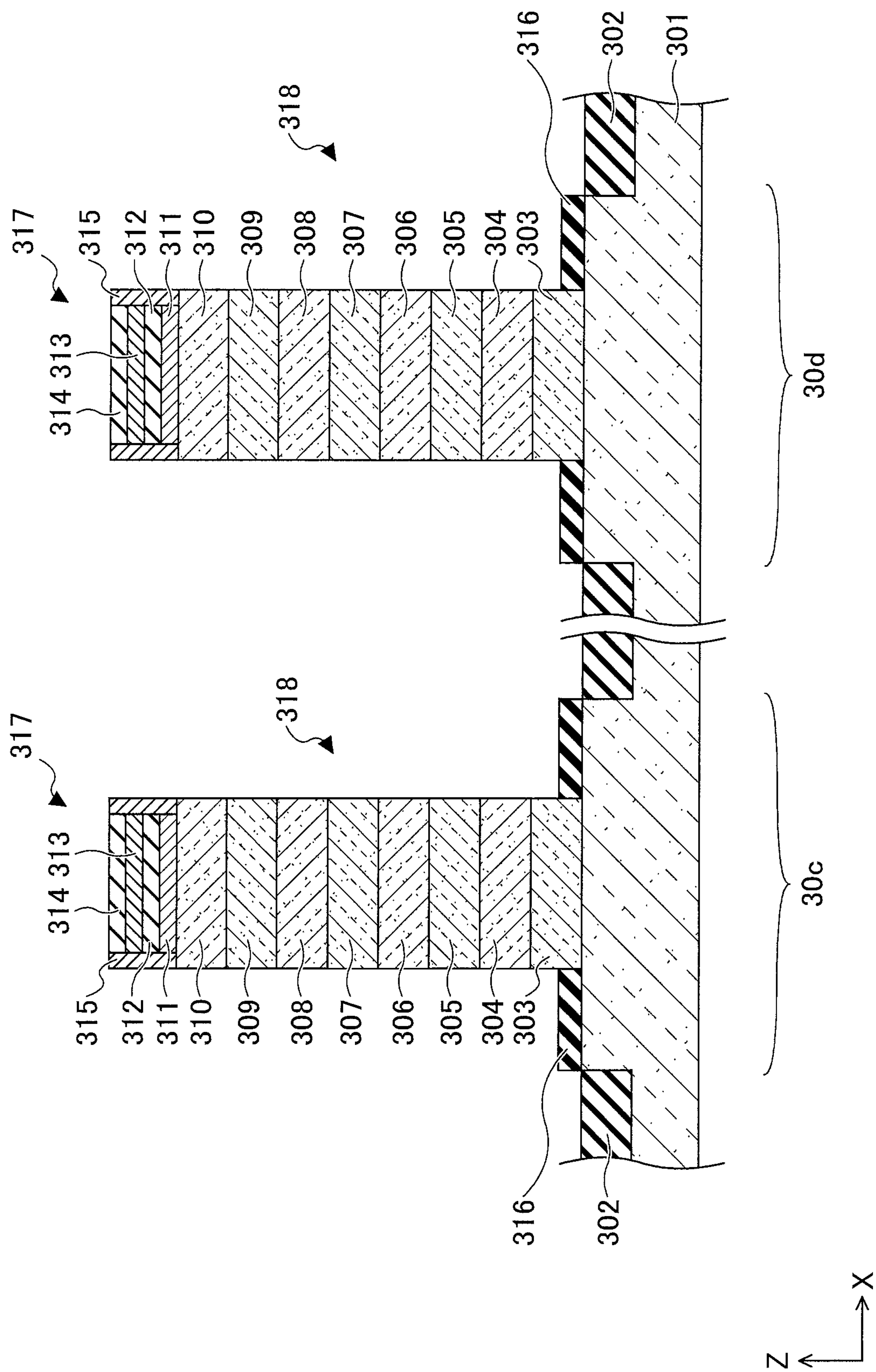
FIG. 33B is a cross sectional view (part 2) illustrating a method of producing a semiconductor device according to the third embodiment.

At the outset, element separating regions 302 are formed over a surface of a semiconductor substrate 301. Next, as illustrated in FIGS. 33A and 33B, as in the second embodiment, element separating regions 302 are formed over the surface of the semiconductor substrate 301, and dummy gate structures 317, sidewalls 315, and semiconductor stacked structures 318 are formed over the semiconductor substrate 301. Also, on both sides of the semiconductor stacked structures 318, insulation films 316 are formed over the semiconductor substrate 301. The dummy gate structure 317 includes a sacrifice film 311, a silicon oxide film 312, a silicon nitride film 313, and a silicon oxide film 314. The semiconductor stacked structure 318 includes an SiGe film 303, an Si film 304, an SiGe film 305, an Si film 306, an SiGe film 307, an Si film 308, an SiGe film 309, and an Si film 310.

Figure 34A:
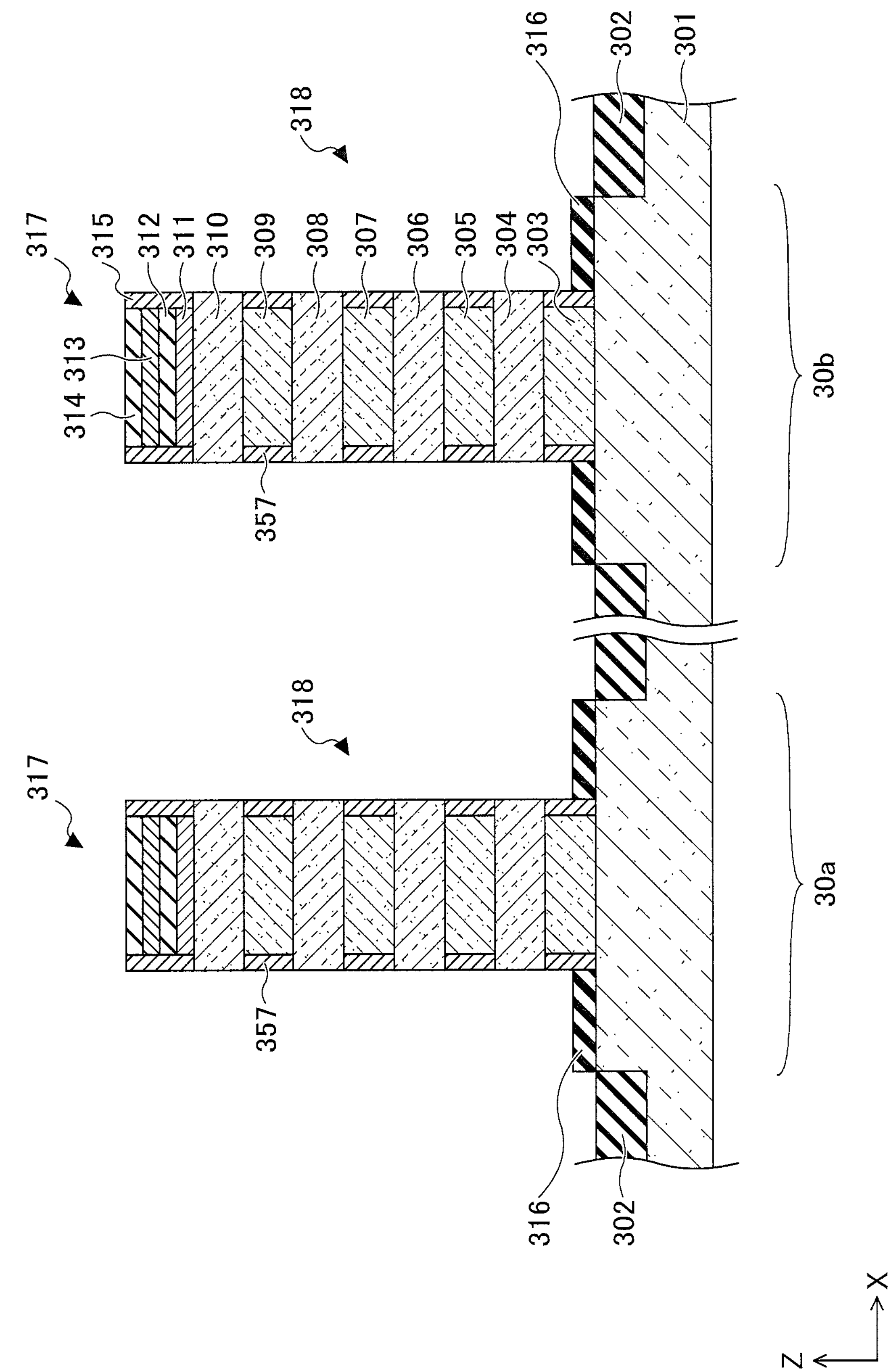
FIG. 34A is a cross sectional view (part 3) illustrating a method of producing a semiconductor device according to the third embodiment.
Figure 34B:
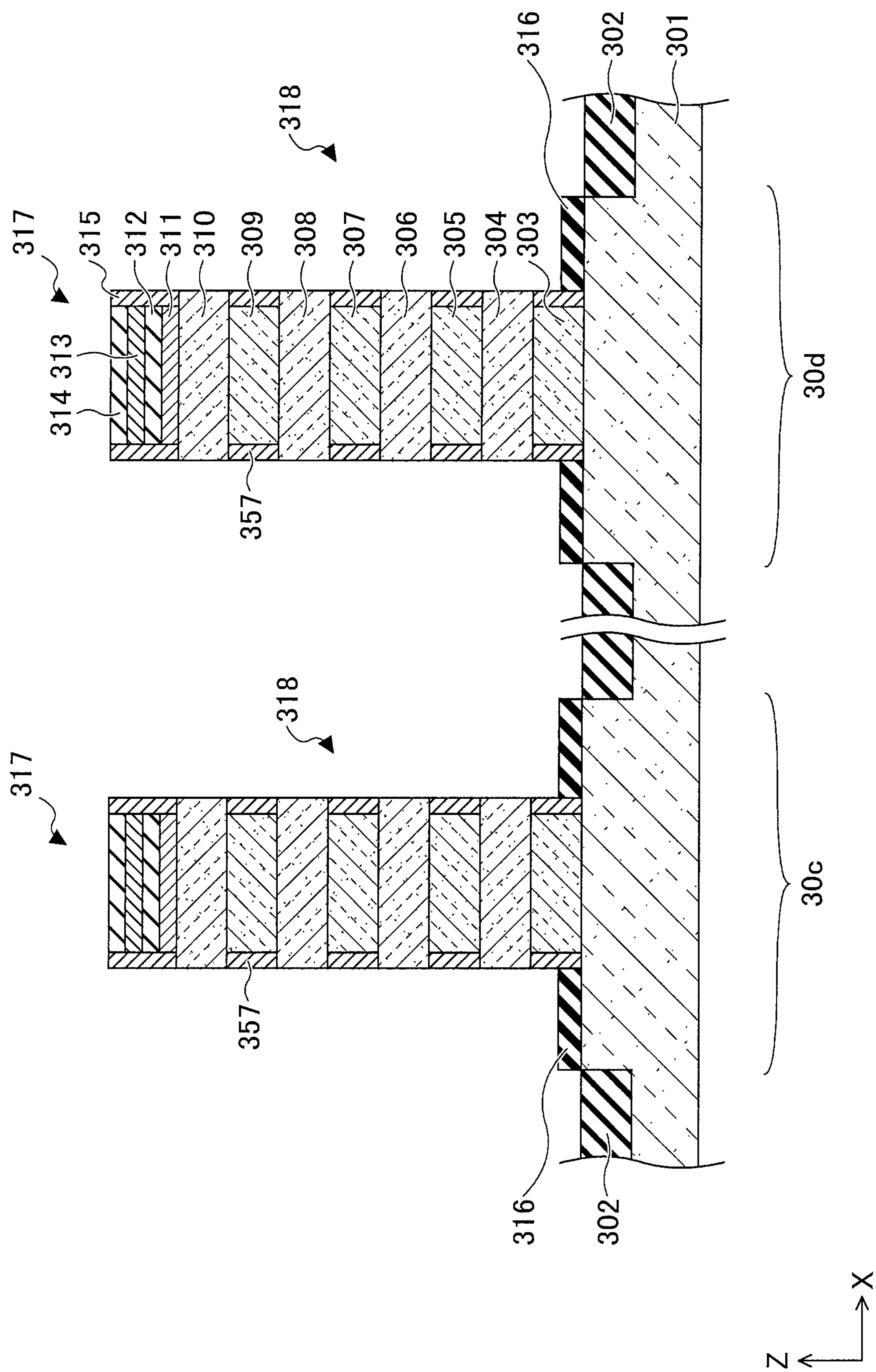
FIG. 34B is a cross sectional view (part 4) illustrating a method of producing a semiconductor device according to the third embodiment.

Thereafter, as illustrated in FIGS. 34A and 34B, by using isotropic etching, both ends of the SiGe films 309, 307, 305, and 303 are receded, to form spacers 357 in the receded portions. The spacers 357 can be formed, for example, by forming and anisotropically etching the silicon nitride films.

Figure 35A:
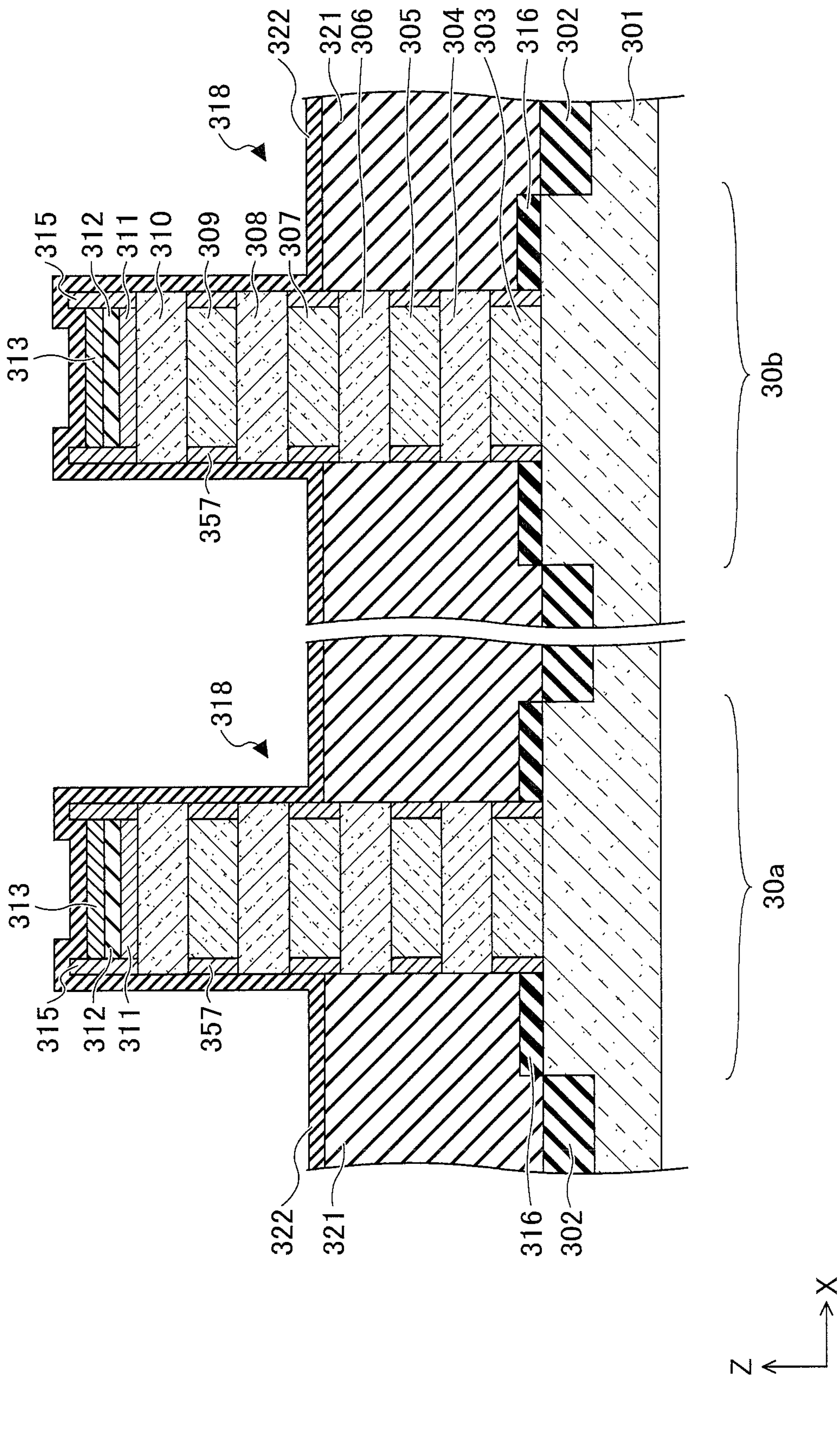
FIG. 35A is a cross sectional view (part 5) illustrating a method of producing a semiconductor device according to the third embodiment.
Figure 35B:
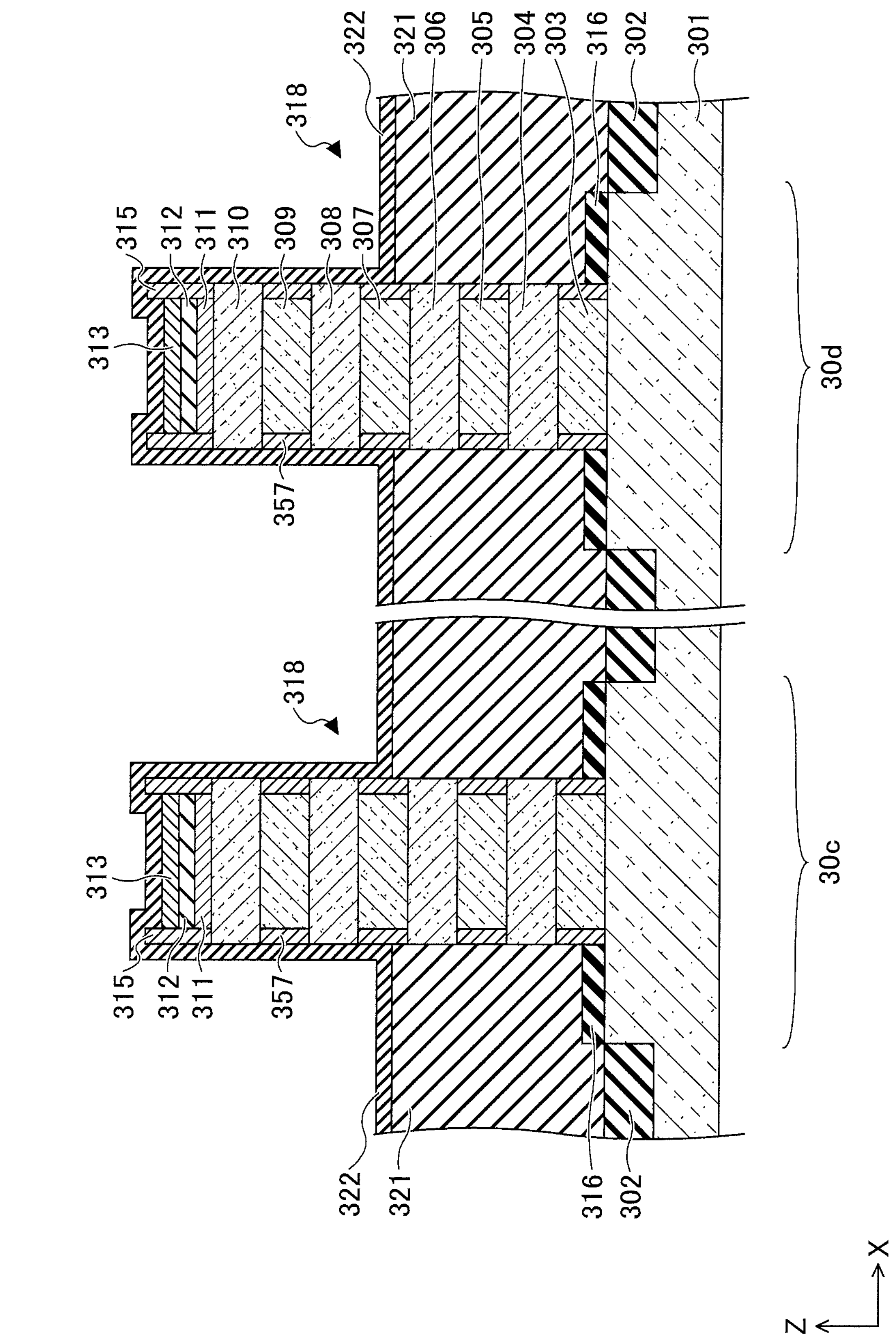
FIG. 35B is a cross sectional view (part 6) illustrating a method of producing a semiconductor device according to the third embodiment.

Next, as illustrated in FIGS. 35A and 35B, as in the second embodiment, a silicon oxide film 321 is formed to have the top surface positioned between the top surfaces and the bottom surfaces of the SiGe films 307. Next, a silicon nitride film 322 is formed on the top and side surfaces of the stacked structures and on the top surface of the silicon oxide film 321. The silicon nitride film 322 can be formed, for example, by CVD.

Figure 36A:
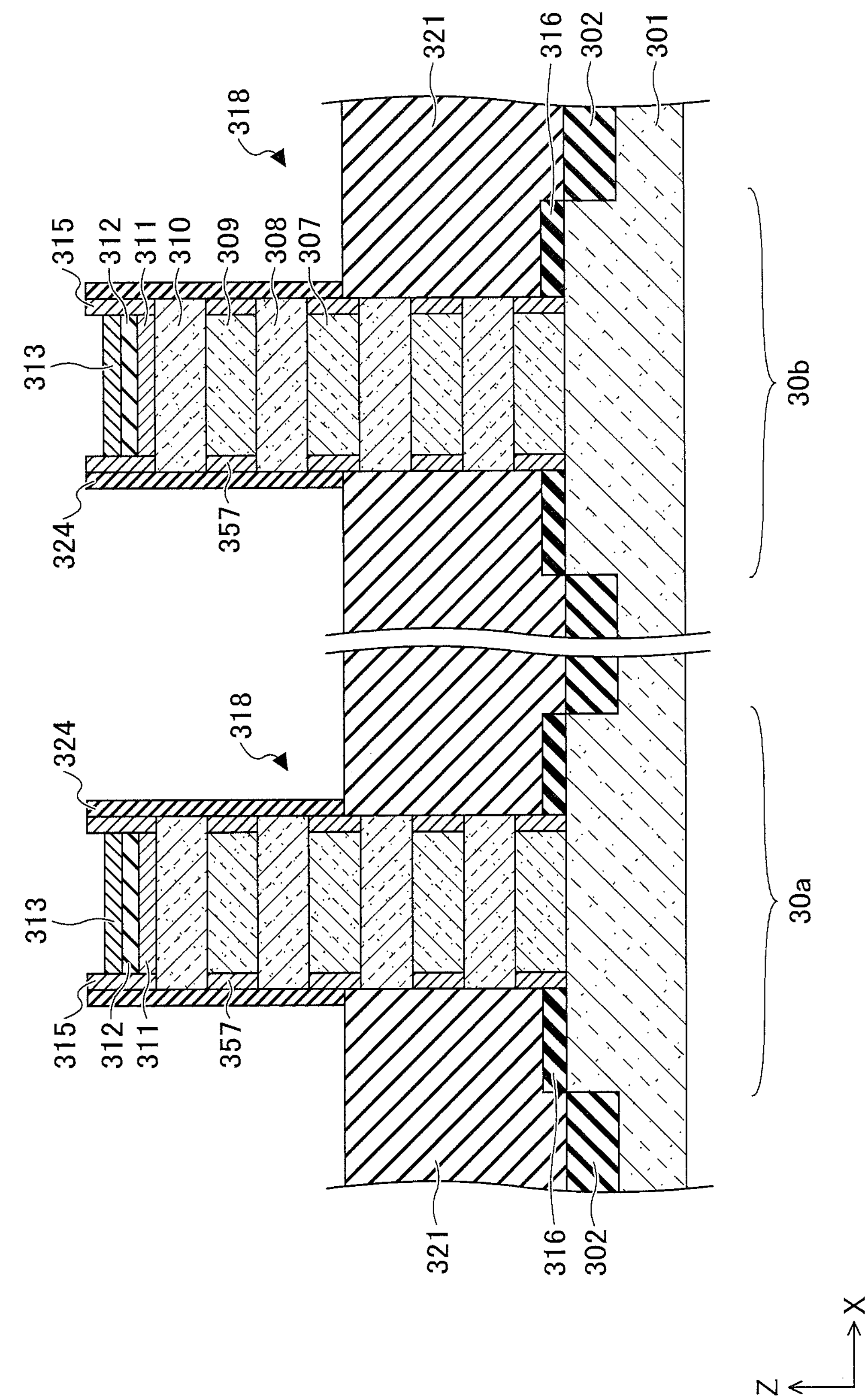
FIG. 36A is a cross sectional view (part 7) illustrating a method of producing a semiconductor device according to the third embodiment.
Figure 36B:
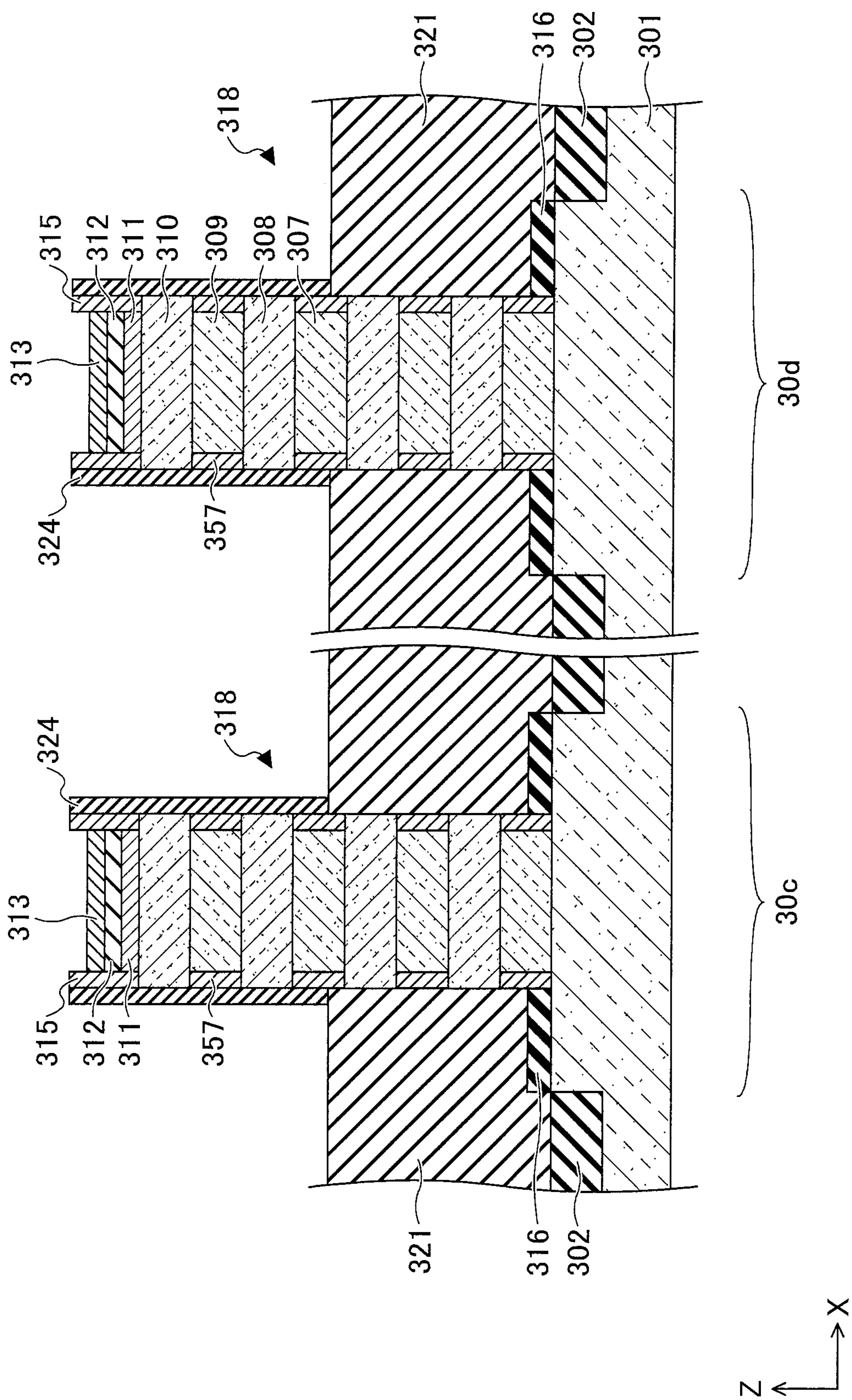
FIG. 36B is a cross sectional view (part 8) illustrating a method of producing a semiconductor device according to the third embodiment.

Thereafter, as illustrated in FIGS. 36A and 36B, around the element active regions 30*a* to 30*d*, the silicon nitride film 322 is etched back. As a result, sidewalls 324 are formed on the side surfaces of the stacked structures.

Figure 37A:
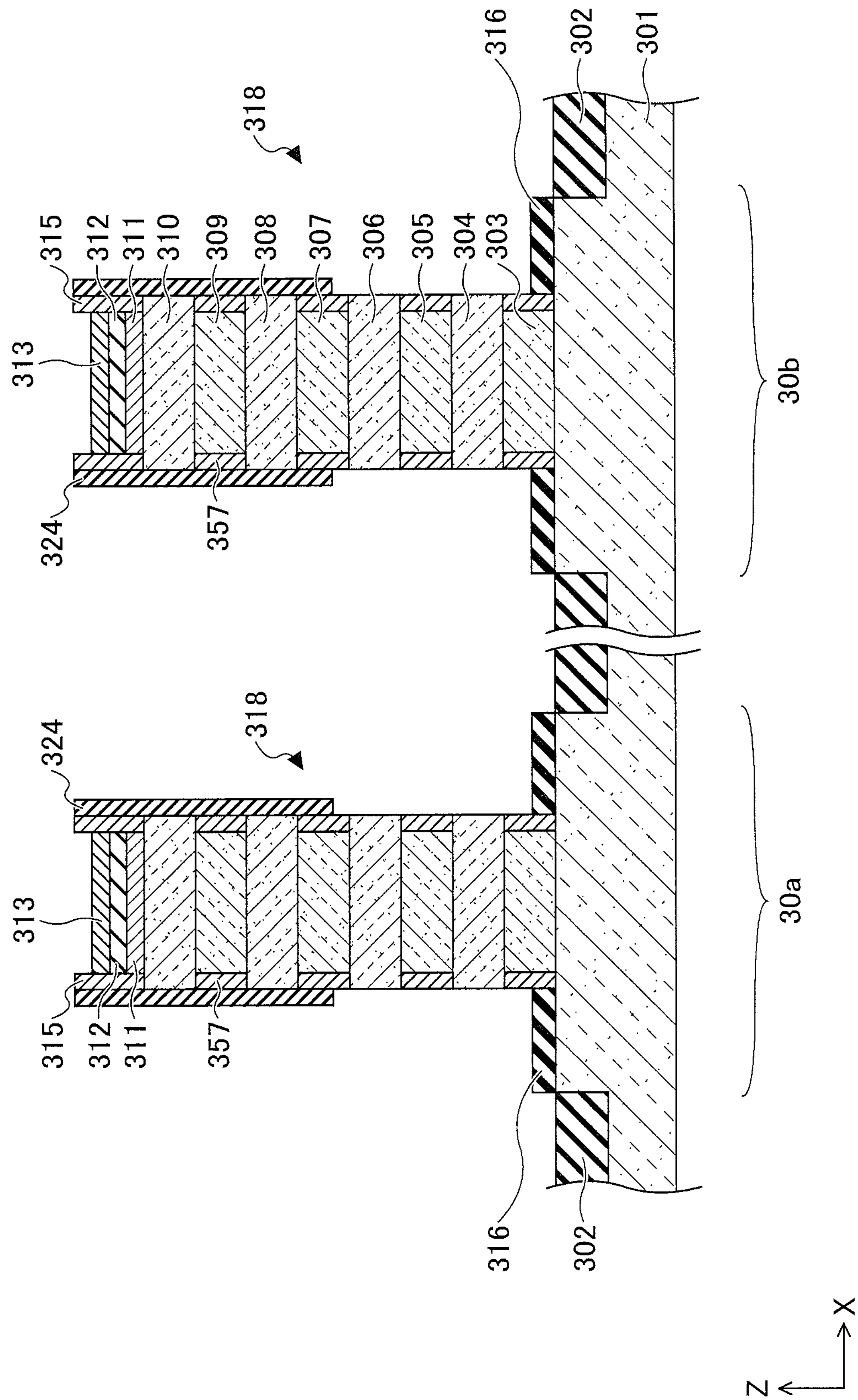
FIG. 37A is a cross sectional view (part 9) illustrating a method of producing a semiconductor device according to the third embodiment.
Figure 37B:
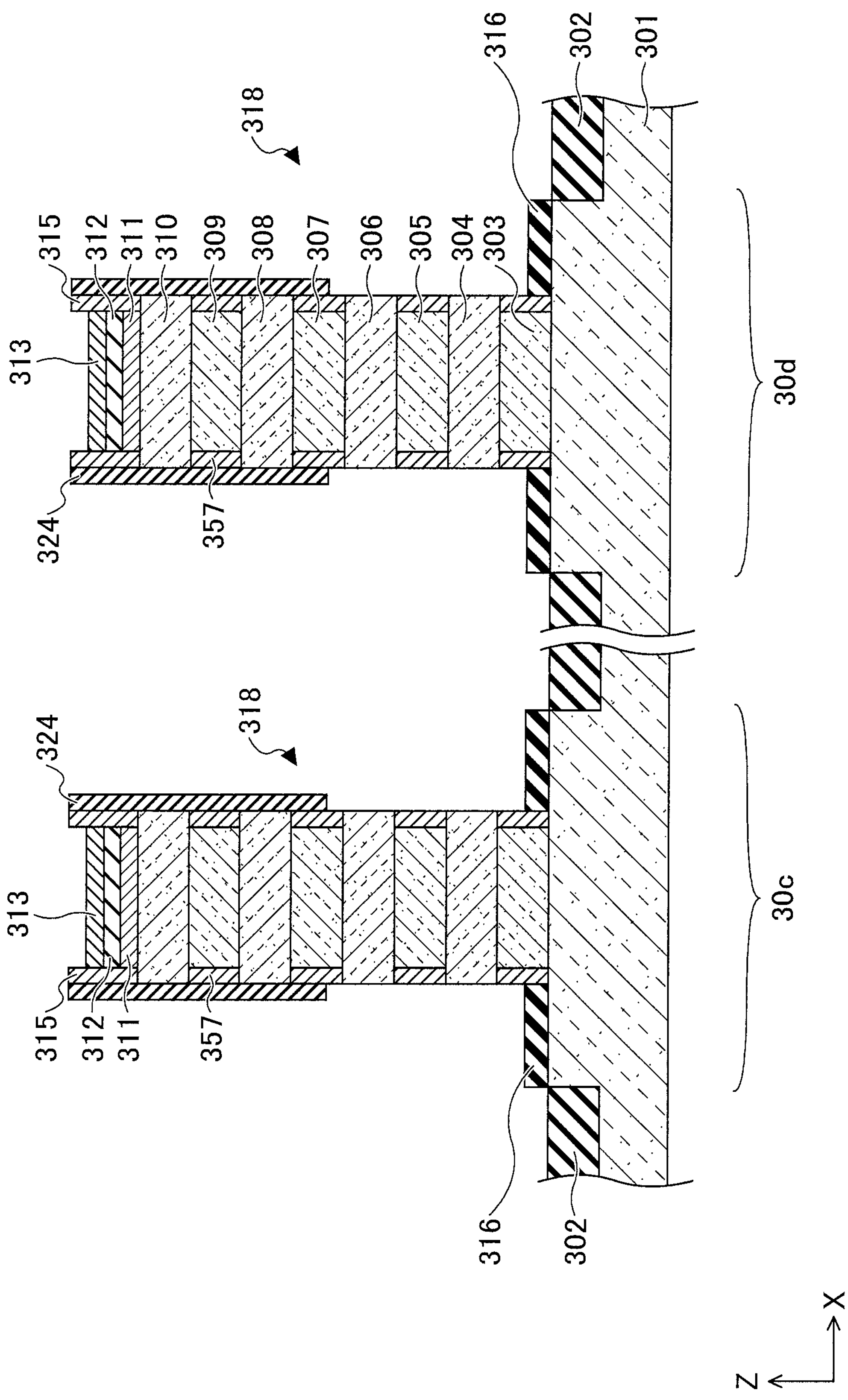
FIG. 37B is a cross sectional view (part 10) illustrating a method of producing a semiconductor device according to the third embodiment.

Next, as illustrated in FIGS. 37A and 37B, the silicon oxide film 321 is removed.

Figure 38A:
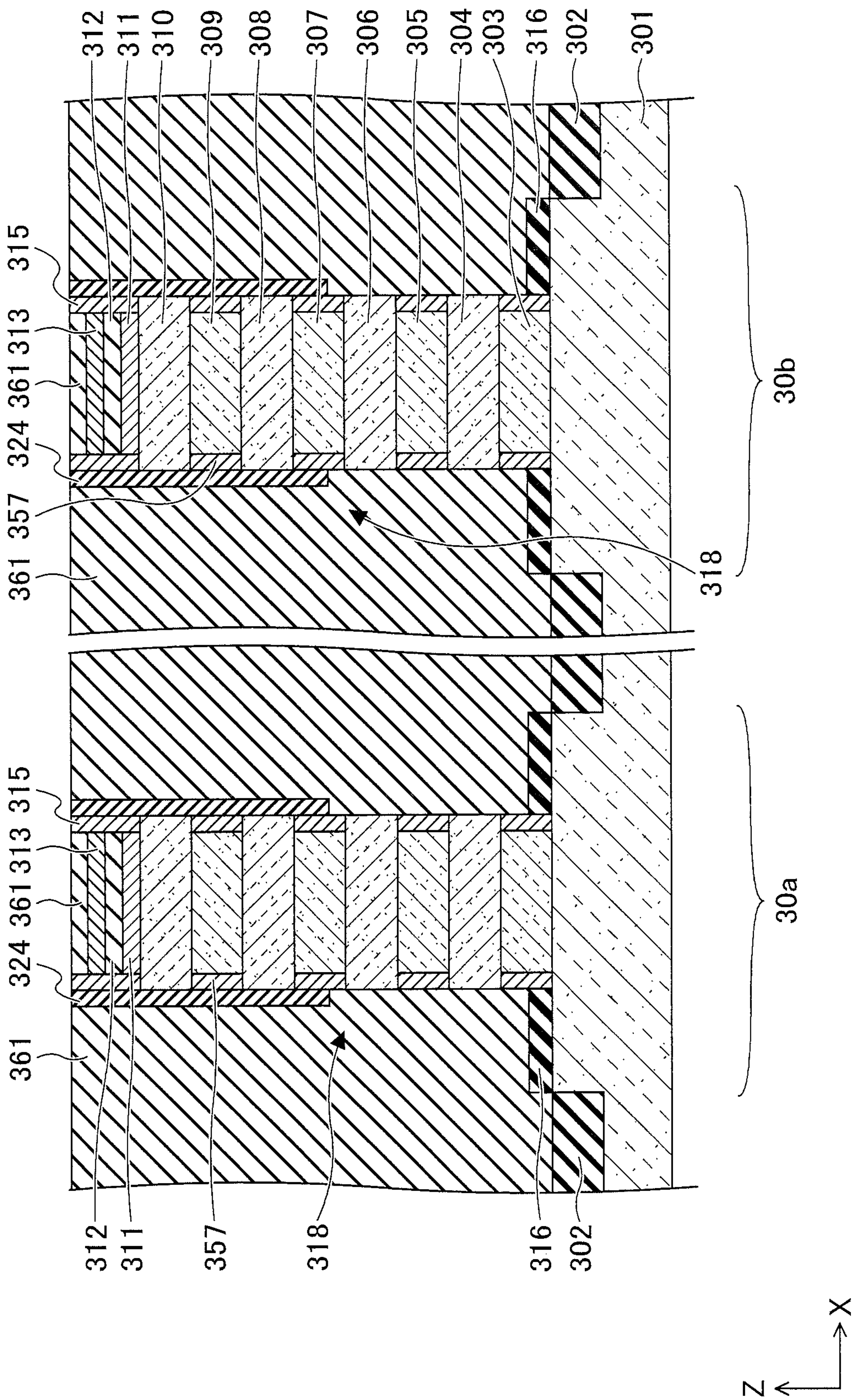
FIG. 38A is a cross sectional view (part 11) illustrating a method of producing a semiconductor device according to the third embodiment.
Figure 38B:
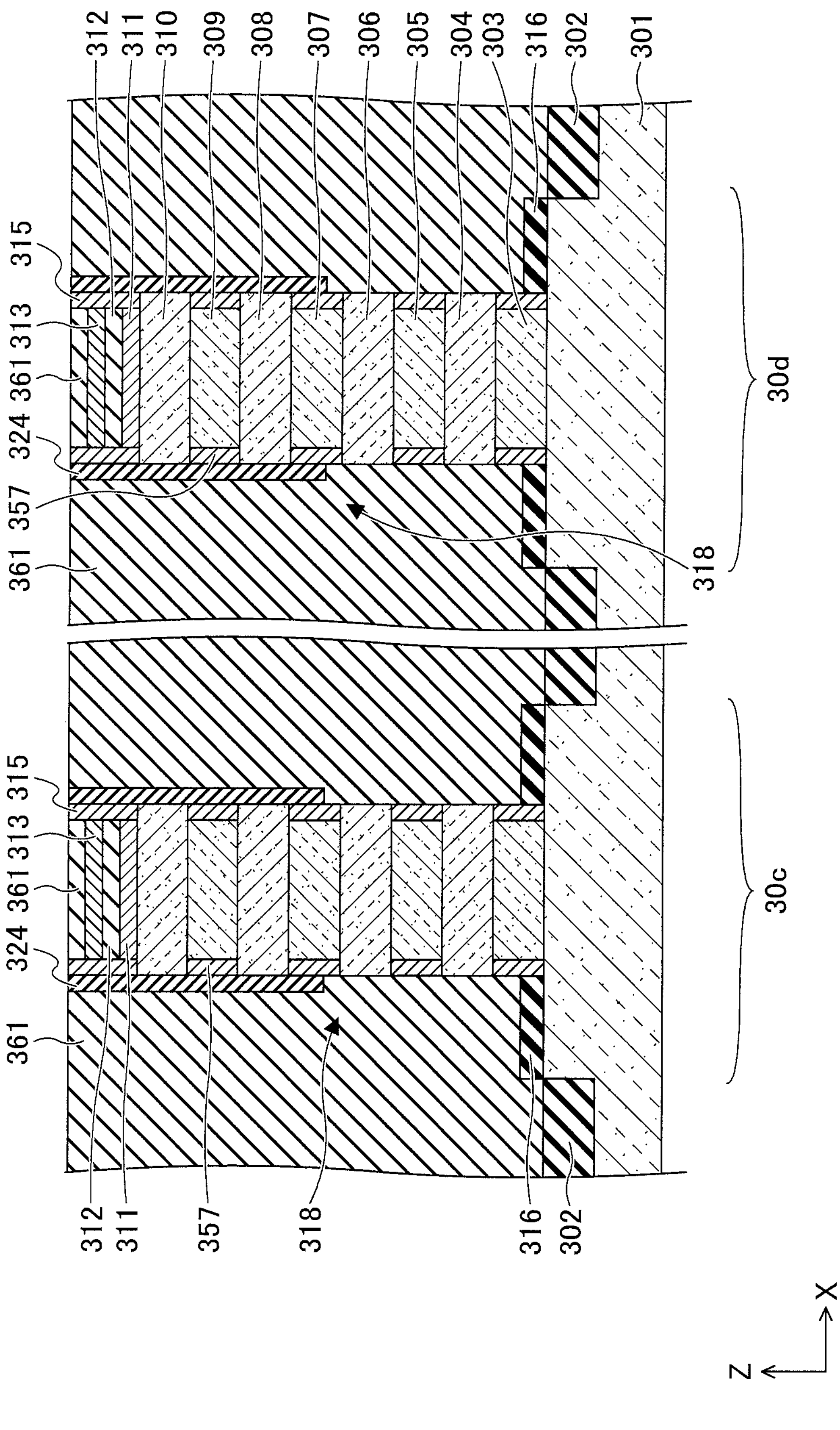
FIG. 38B is a cross sectional view (part 12) illustrating a method of producing a semiconductor device according to the third embodiment.

Next, an interlayer insulation film 361 is formed to cover the stacked structures illustrated in FIGS. 37A and 37B, and the interlayer insulation film 361 is polished, for example, by CMP, until the sidewalls 315 are exposed. As a result, as illustrated in FIGS. 38A and 38B, the flattened interlayer insulation film 361 fills the space between the stacked structures illustrated in FIGS. 37A and 37B. The interlayer insulation film 361 can be formed, for example, by CVD.

Figure 39A:
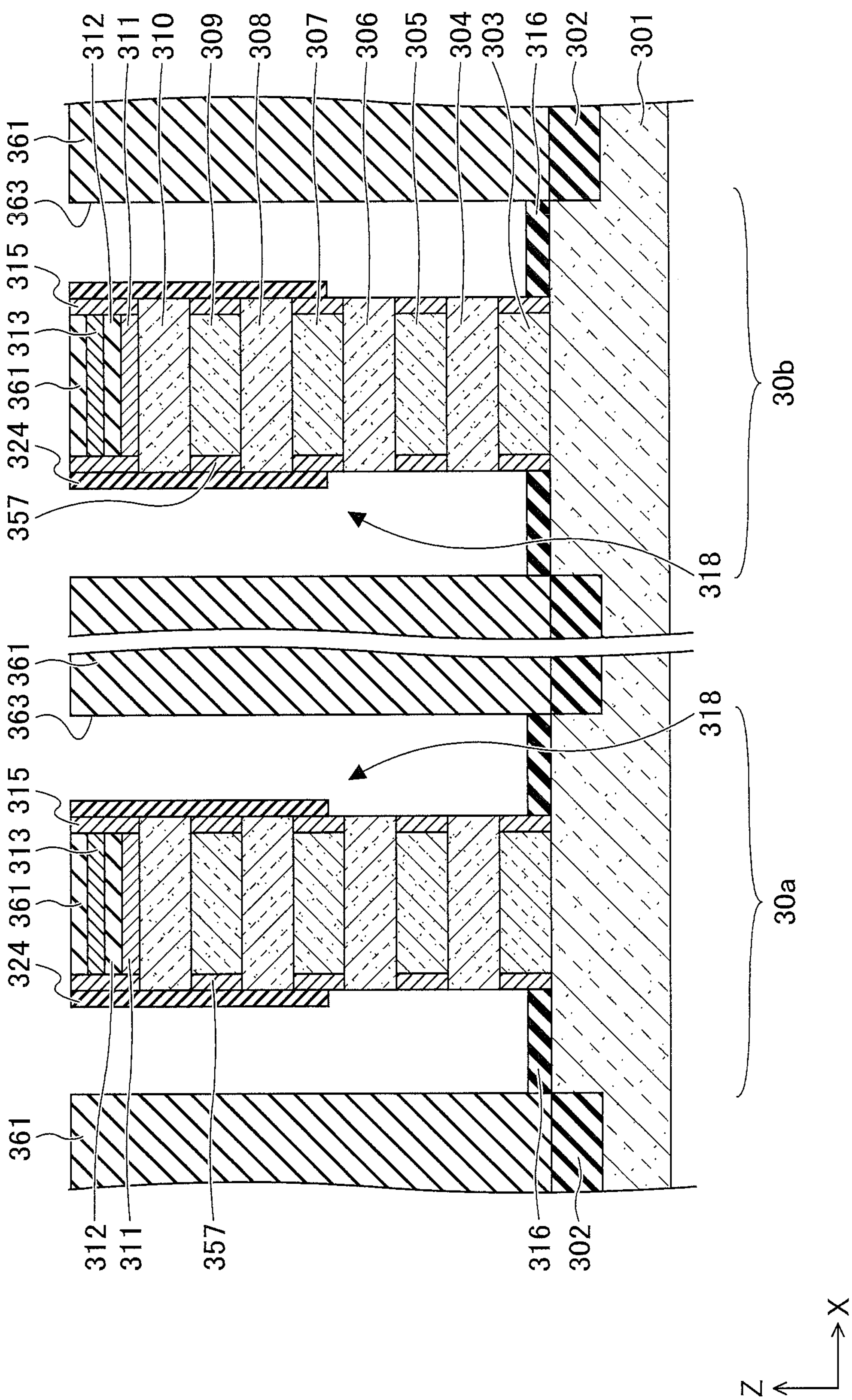
FIG. 39A is a cross sectional view (part 13) illustrating a method of producing a semiconductor device according to the third embodiment.
Figure 39B:
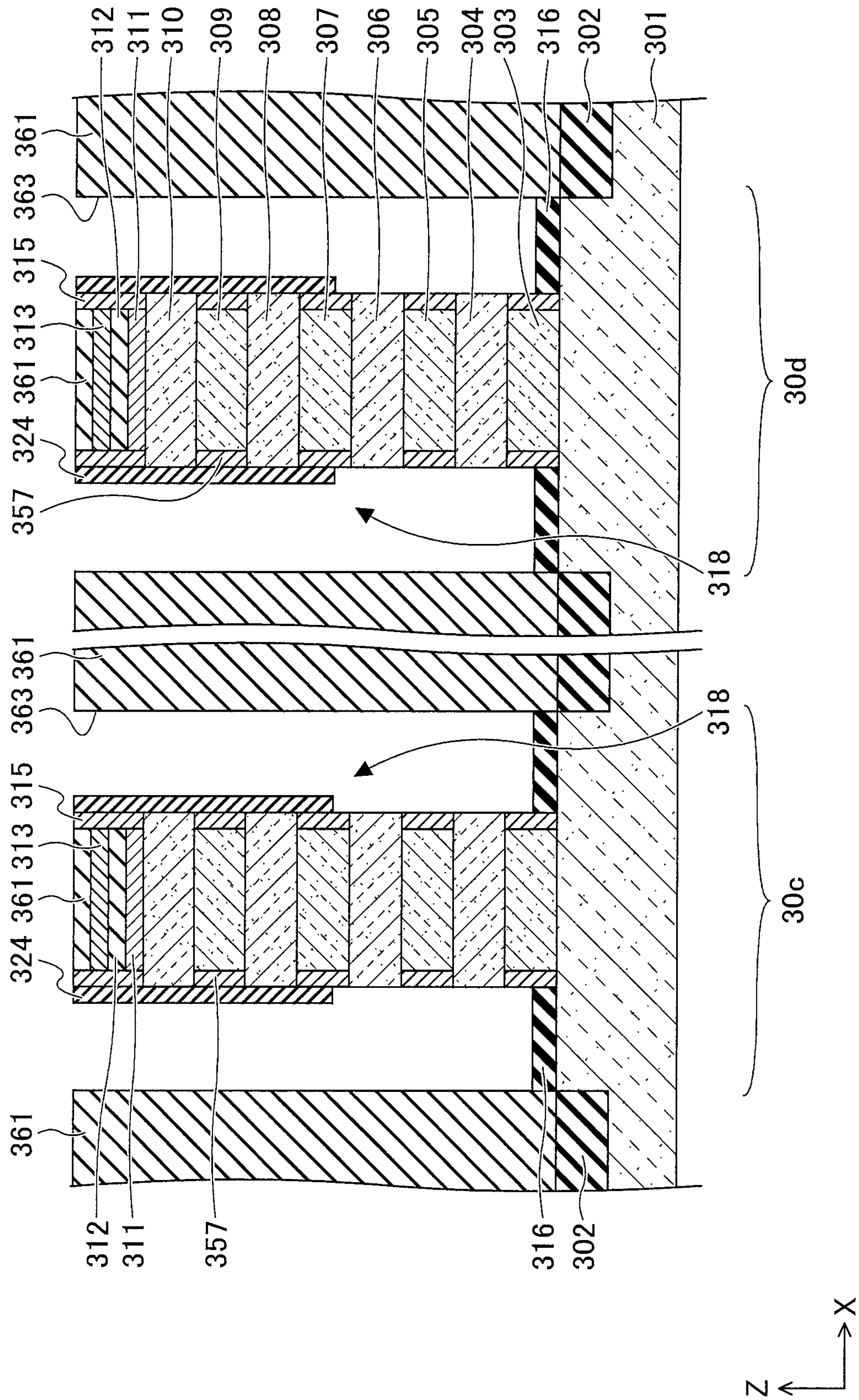
FIG. 39B is a cross sectional view (part 14) illustrating a method of producing a semiconductor device according to the third embodiment.

Thereafter, as illustrated in FIGS. 39A and 39B, openings 363 are formed in the interlayer insulation film 361 to expose both side surfaces of the stacked structures illustrated in FIGS. 37A and 37B.

Figure 40A:
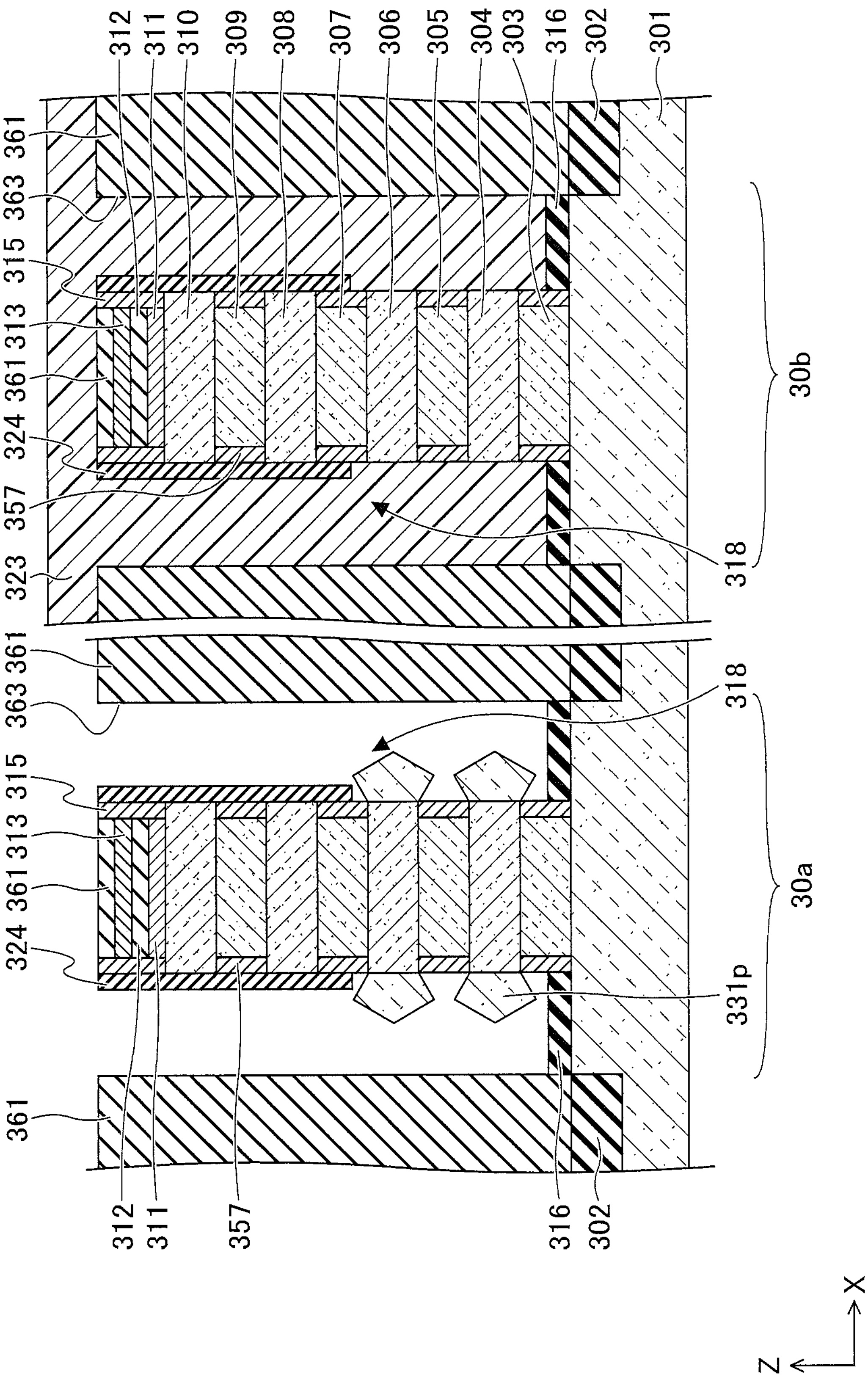
FIG. 40A is a cross sectional view (part 15) illustrating a method of producing a semiconductor device according to the third embodiment.
Figure 40B:
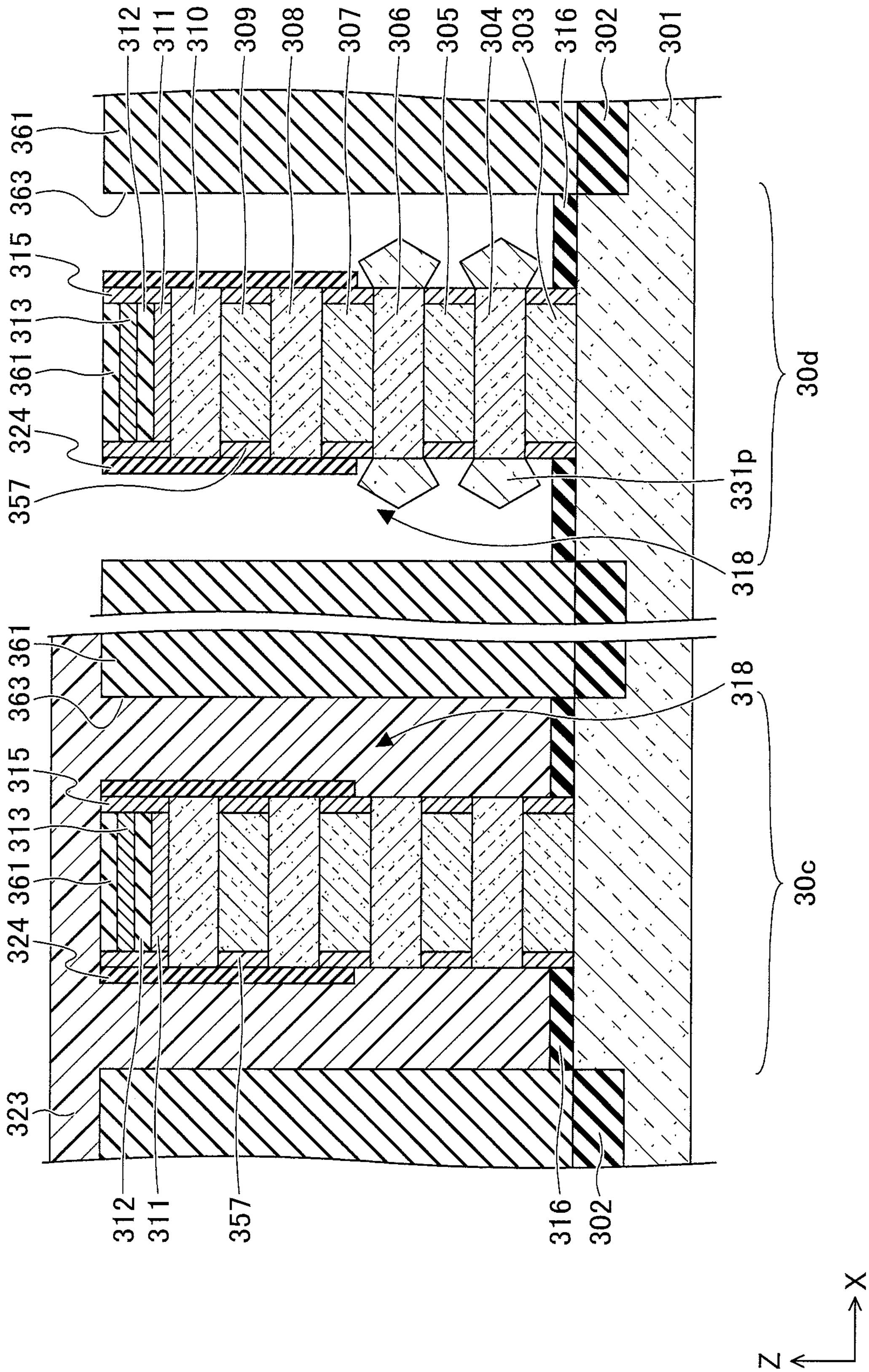
FIG. 40B is a cross sectional view (part 16) illustrating a method of producing a semiconductor device according to the third embodiment.

Next, as illustrated in FIGS. 40A and 40B, a resist mask 323 is formed on the element active regions 30*b* and 30*c*, and on the element active regions 30*a* and 30*d*, p-type semiconductor layers 331*p* are epitaxially grown on the side surfaces of the Si films 304 and 306.

Figure 41A:
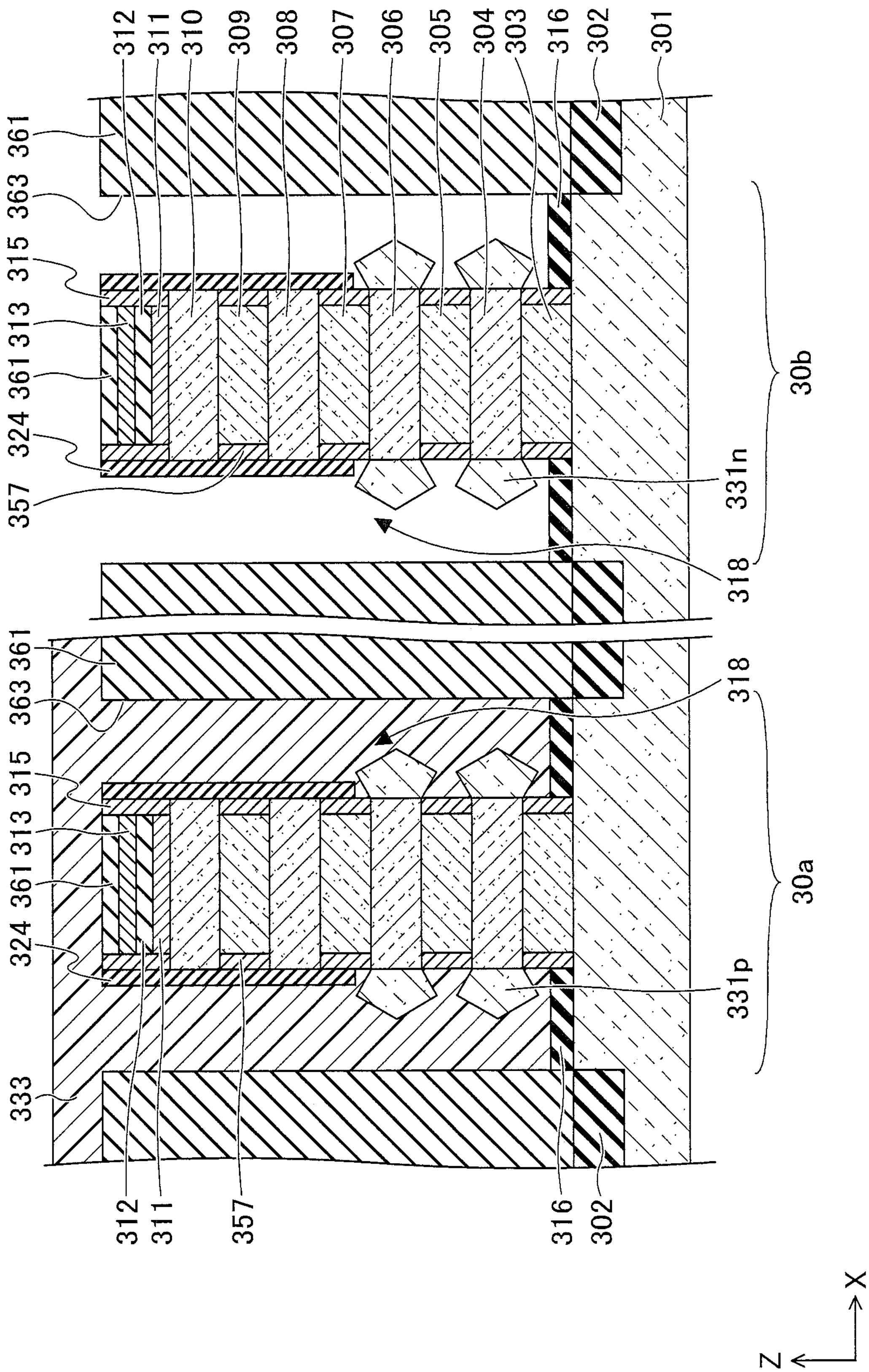
FIG. 41A is a cross sectional view (part 17) illustrating a method of producing a semiconductor device according to the third embodiment.
Figure 41B:
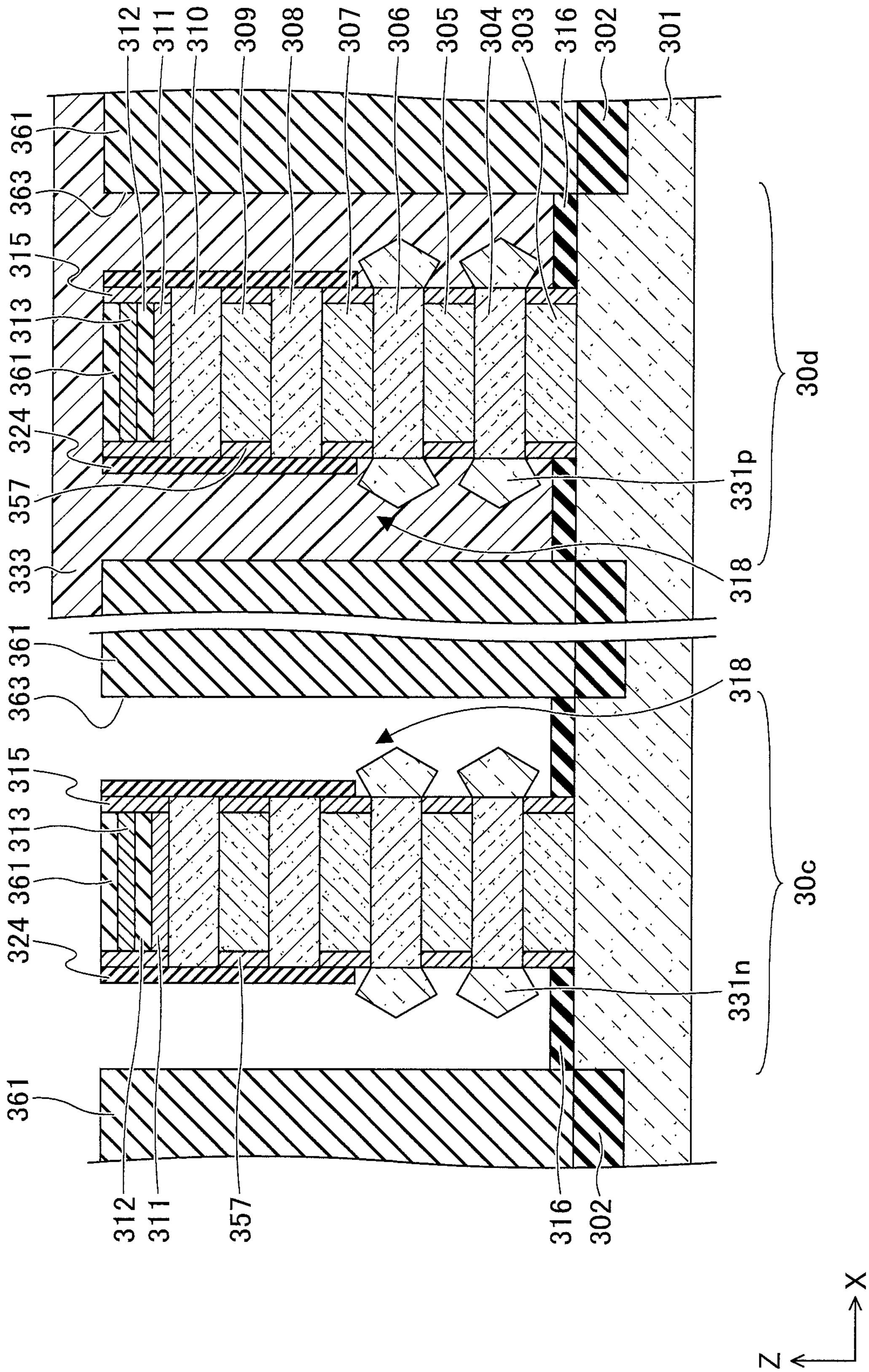
FIG. 41B is a cross sectional view (part 18) illustrating a method of producing a semiconductor device according to the third embodiment.

Next, as illustrated in FIGS. 41A and 41B, the resist mask 323 is removed, a resist mask 333 is formed on the element active regions 30*a* and 30*d*, and on the element active regions 30*b* and 30*c*, *n*-type semiconductor layers 331*n* are epitaxially grown on the side surfaces of the Si films 304 and 306.

Figure 42A:
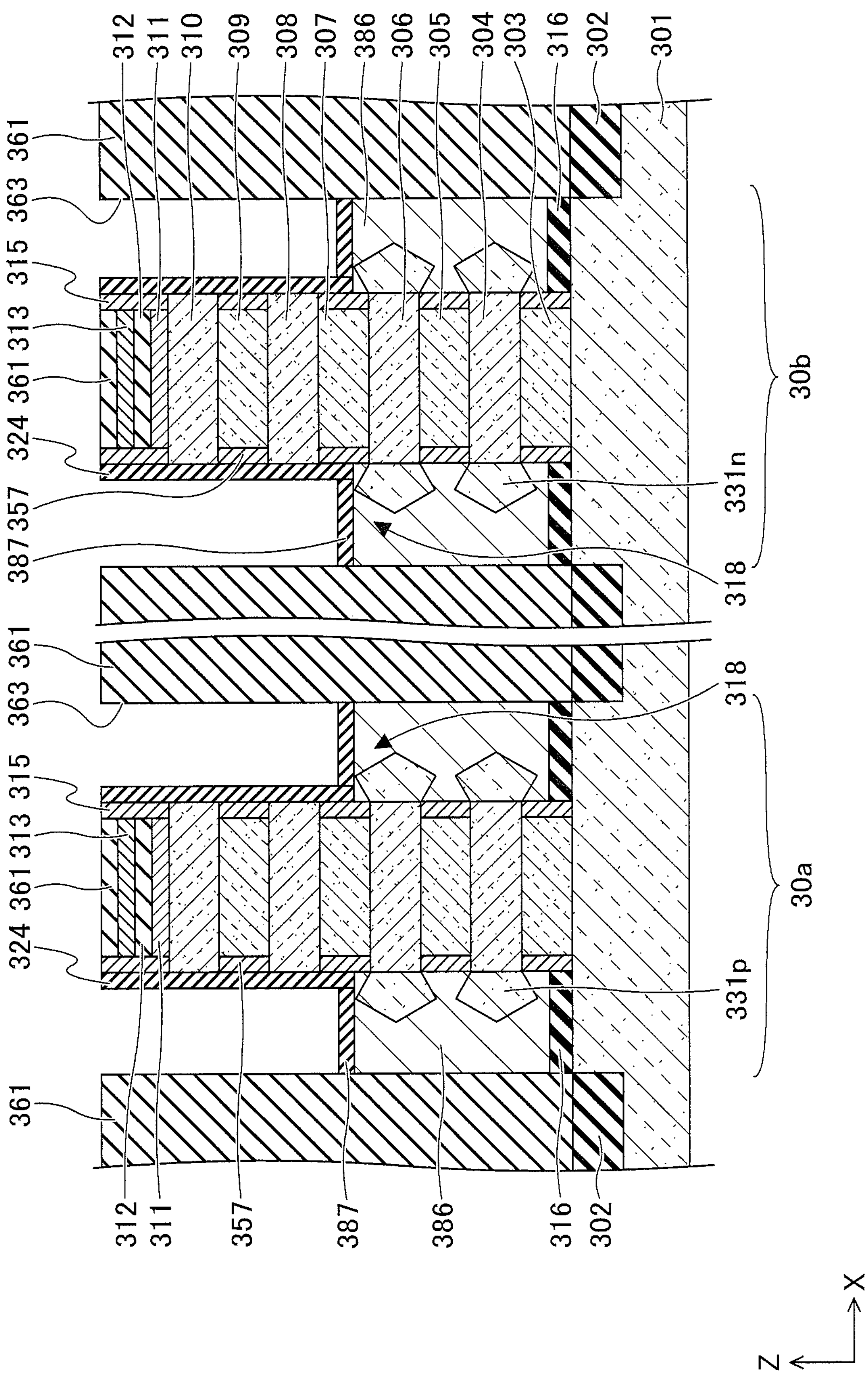
FIG. 42A is a cross sectional view (part 19) illustrating a method of producing a semiconductor device according to the third embodiment.
Figure 42B:
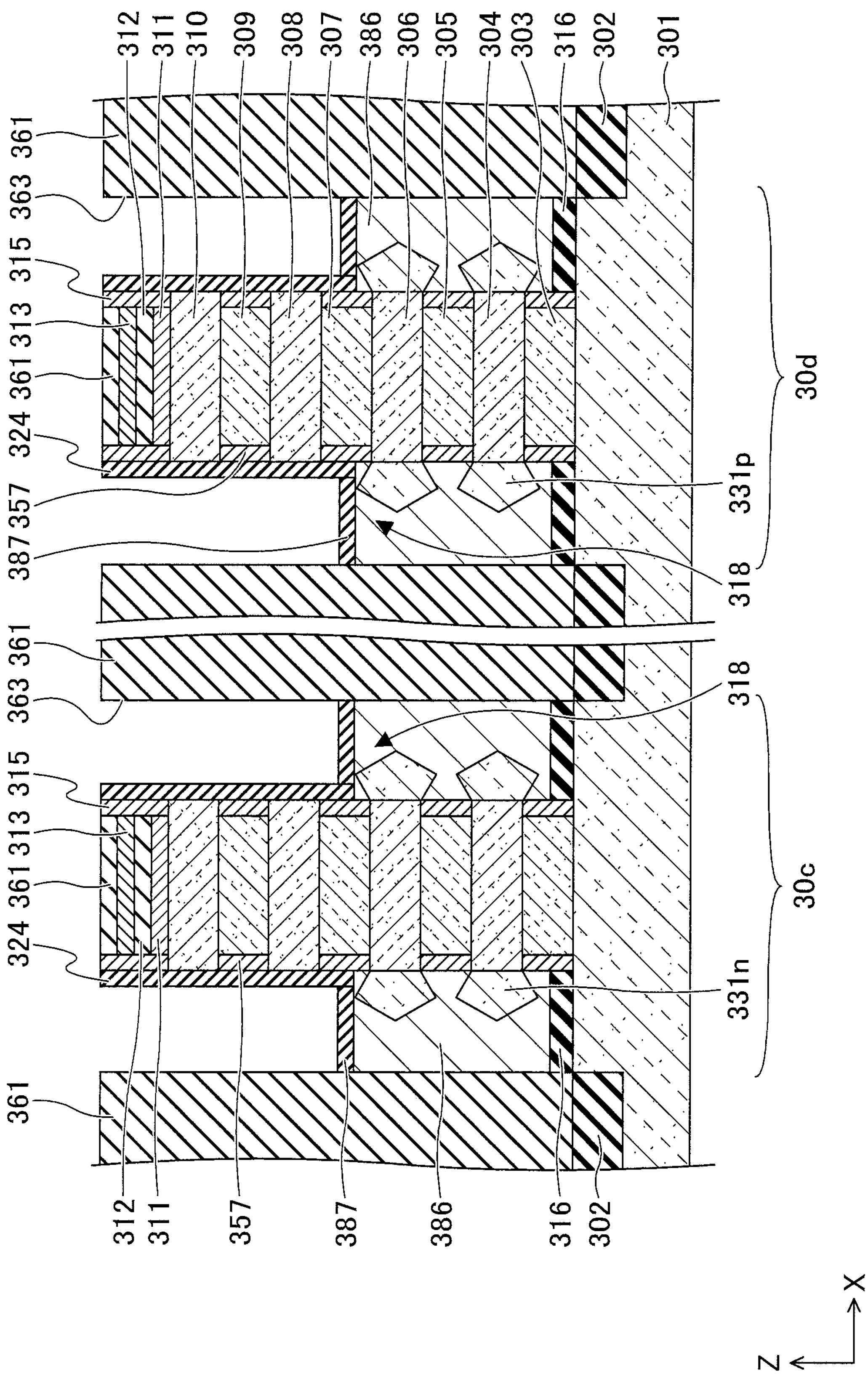
FIG. 42B is a cross sectional view (part 20) illustrating a method of producing a semiconductor device according to the third embodiment.

Thereafter, as illustrated in FIGS. 42A and 42B, the resist mask 333 is removed to form local wires 386 that contact the p-type semiconductor layers 331*p* or the n-type semiconductor layers 331*n* in each of the element active regions 30*a* to 30*d*. For example, the top surfaces of the local wires 386 are positioned between the top surfaces and the bottom surfaces of the SiGe films 307. The local wires 386 can be formed, for example, by embedding conductive films in the openings 363, flattening the conductive films, and etching back the conductive films. Next, insulation films 387 are formed over the local wires 386.

Figure 43A:
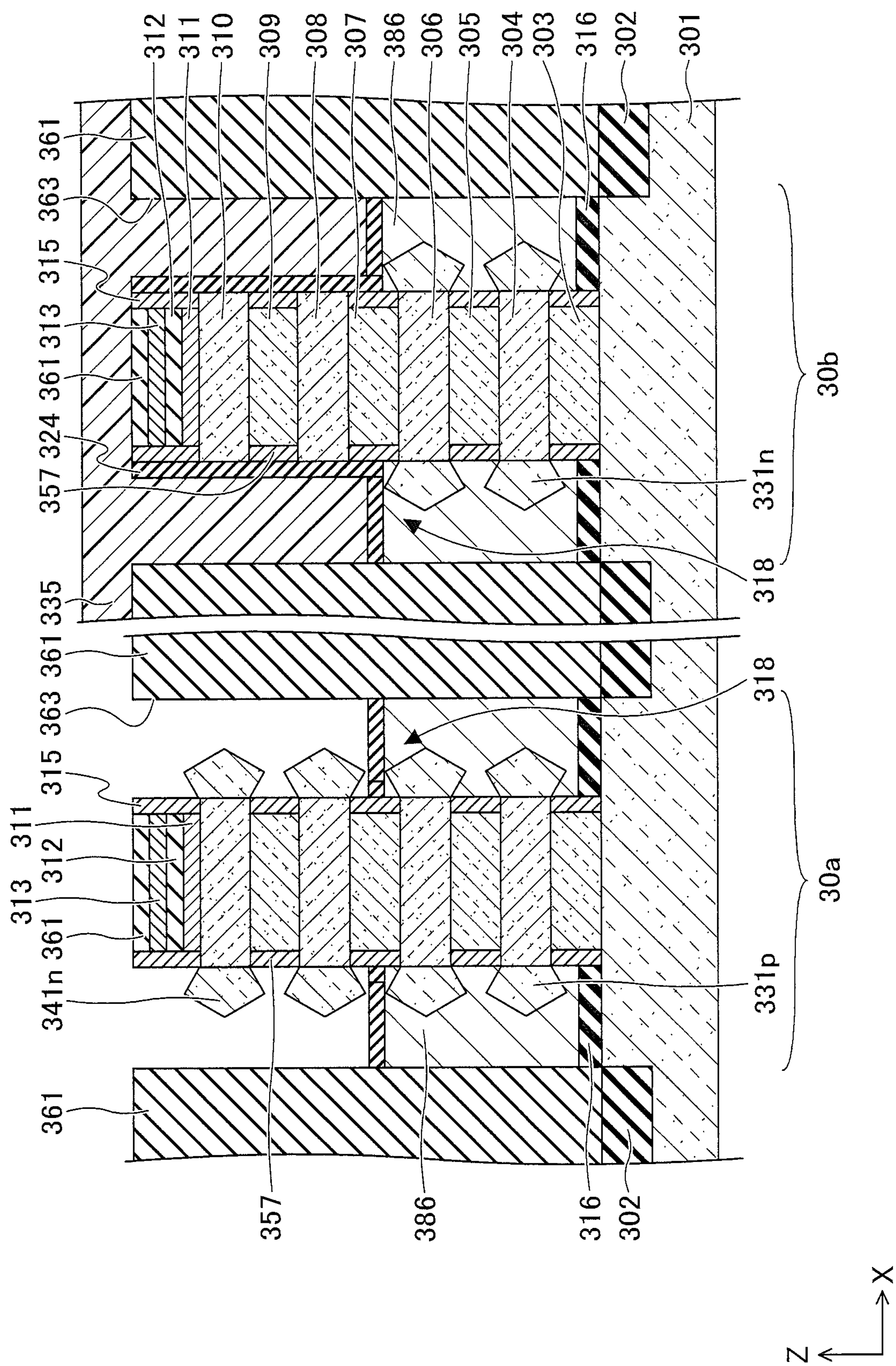
FIG. 43A is a cross sectional view (part 21) illustrating a method of producing a semiconductor device according to the third embodiment.
Figure 43B:
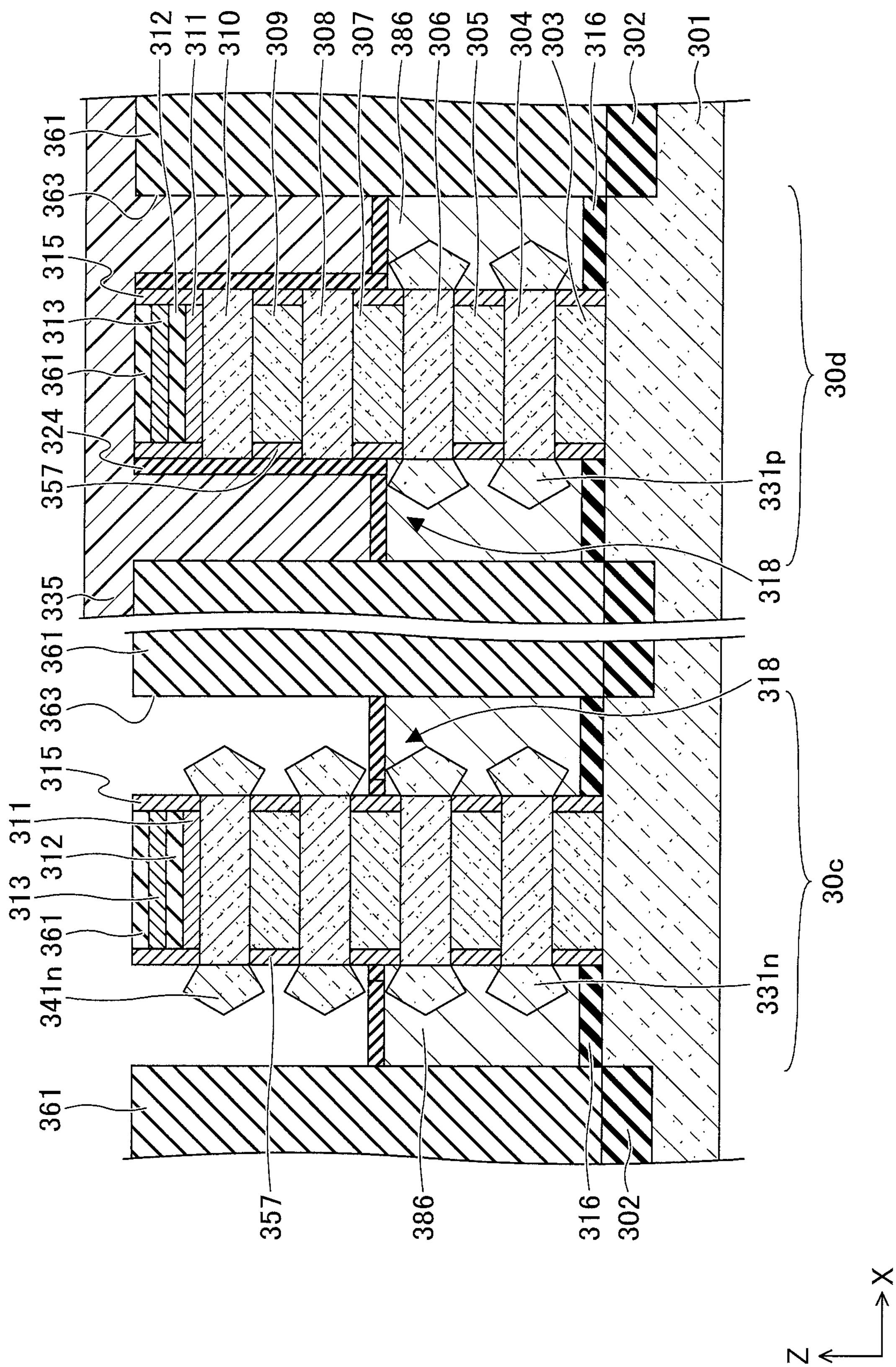
FIG. 43B is a cross sectional view (part 22) illustrating a method of producing a semiconductor device according to the third embodiment.

Next, as illustrated in FIGS. 43A and 43B, a resist mask 335 is formed on the element active regions 30*b* and 30*d*, and by etching, part of the sidewalls 324 around the element active region 30*a* and part of the sidewalls 324 around the element active region 30*c* are removed. Thereafter, on the element active regions 30*a* and 30*c*, n-type semiconductor layers 341*n* are epitaxially grown on the side surfaces of the Si films 308 and 310.

Figure 44A:
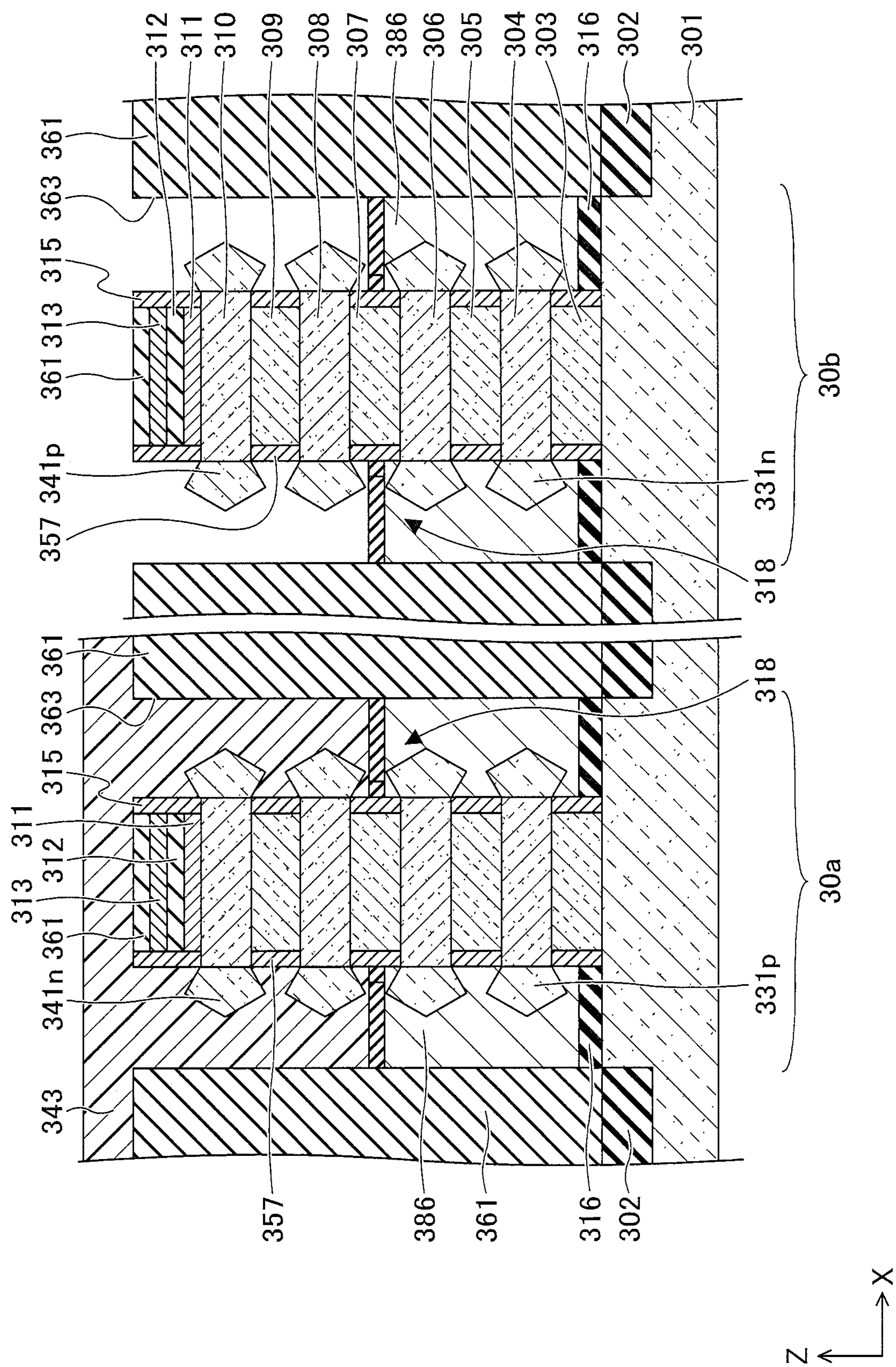
FIG. 44A is a cross sectional view (part 23) illustrating a method of producing a semiconductor device according to the third embodiment.
Figure 44B:
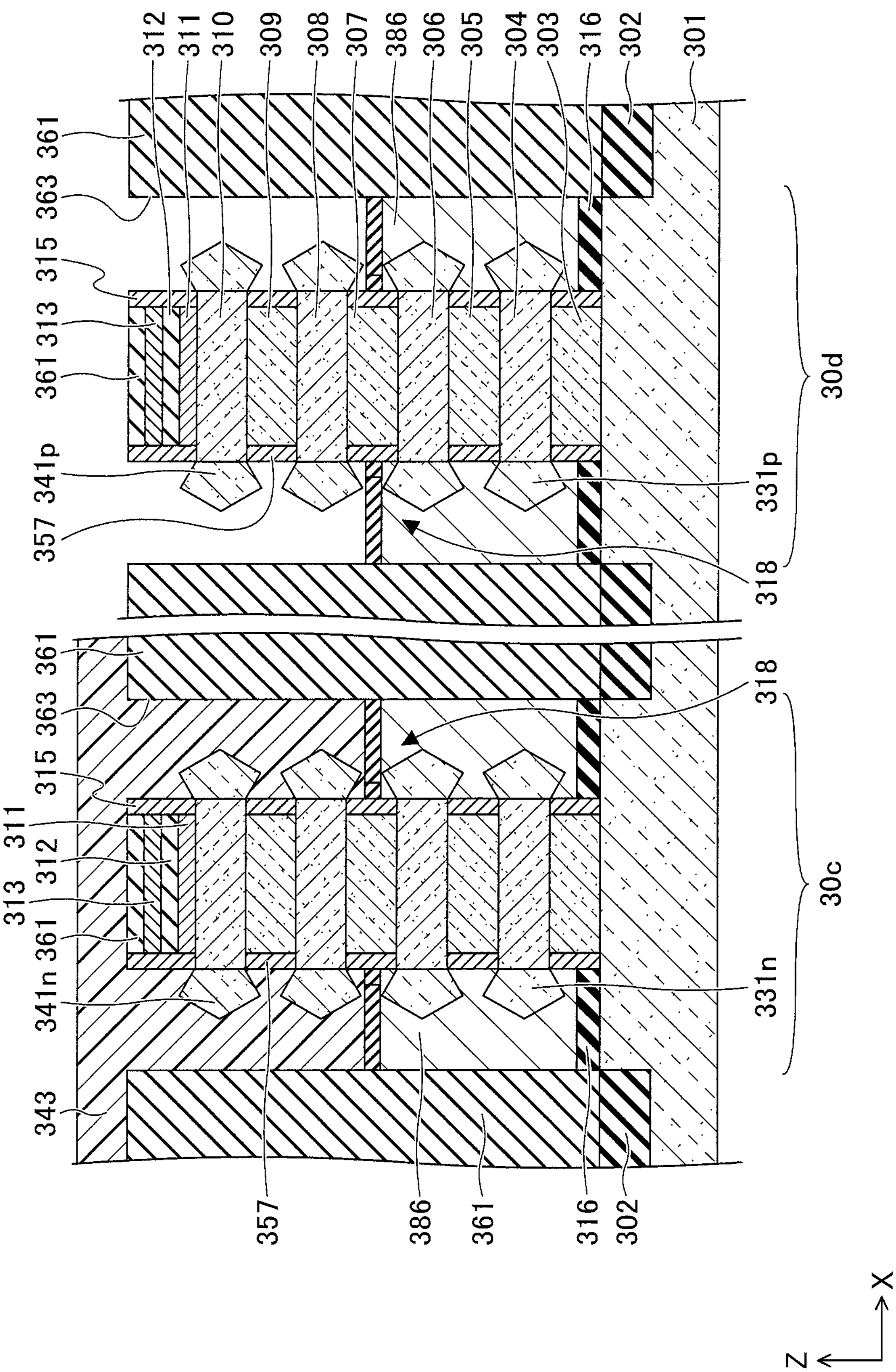
FIG. 44B is a cross sectional view (part 24) illustrating a method of producing a semiconductor device according to the third embodiment.

Next, as illustrated in FIGS. 44A and 44B, the resist mask 335 is removed, a resist mask 343 is formed on the element active regions 30*a* and 30*c*, and by etching, part of the sidewalls 324 around the element active region 30*b* and part of the sidewalls 324 around the element active region 30*d* are removed. Next, in the element active regions 30*b* and 30*d*, p-type semiconductor layers 341*p* are epitaxially grown on the side surfaces of the Si films 308 and 310.

Figure 45A:
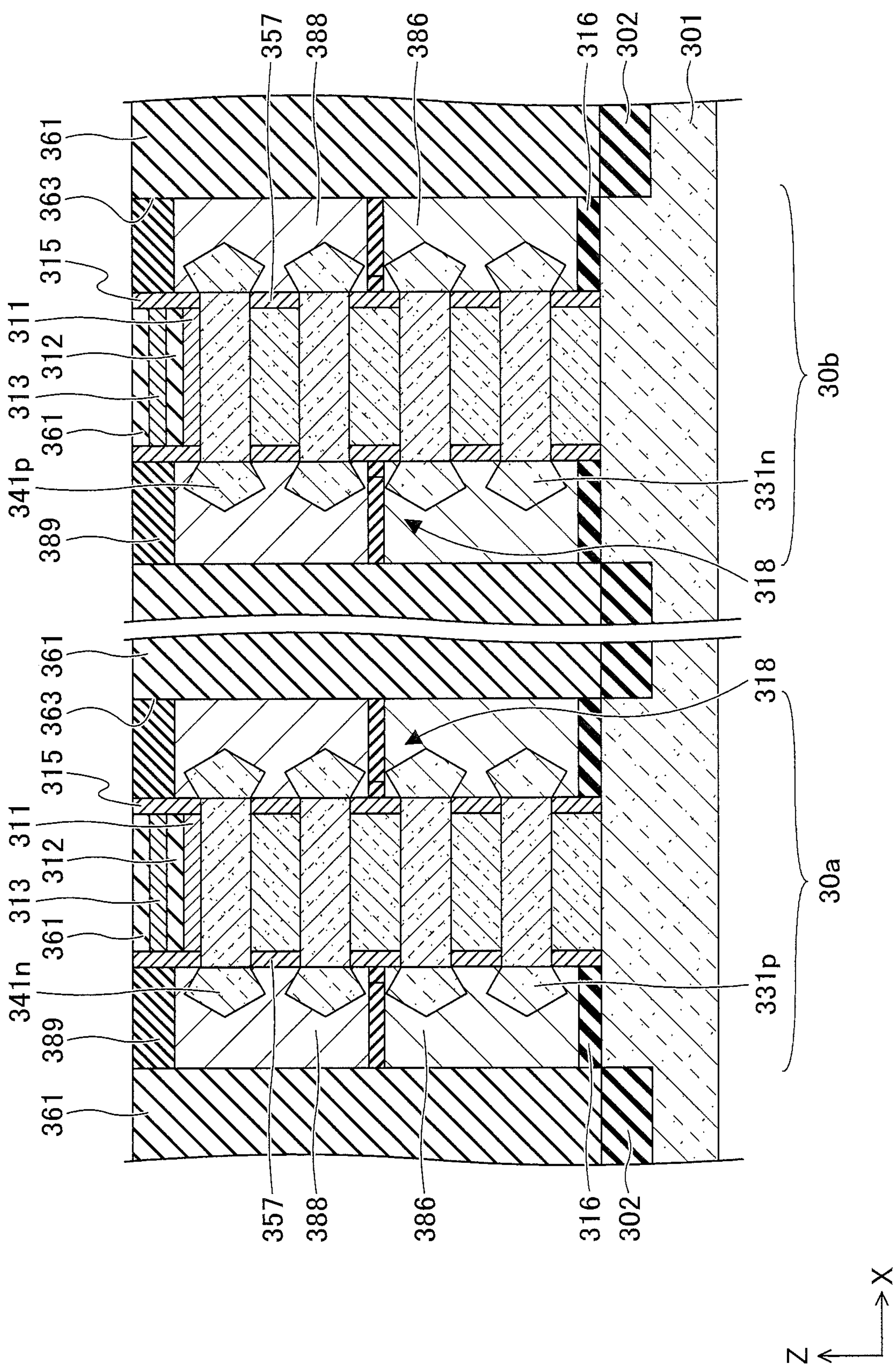
FIG. 45A is a cross sectional view (part 25) illustrating a method of producing a semiconductor device according to the third embodiment.
Figure 45B:
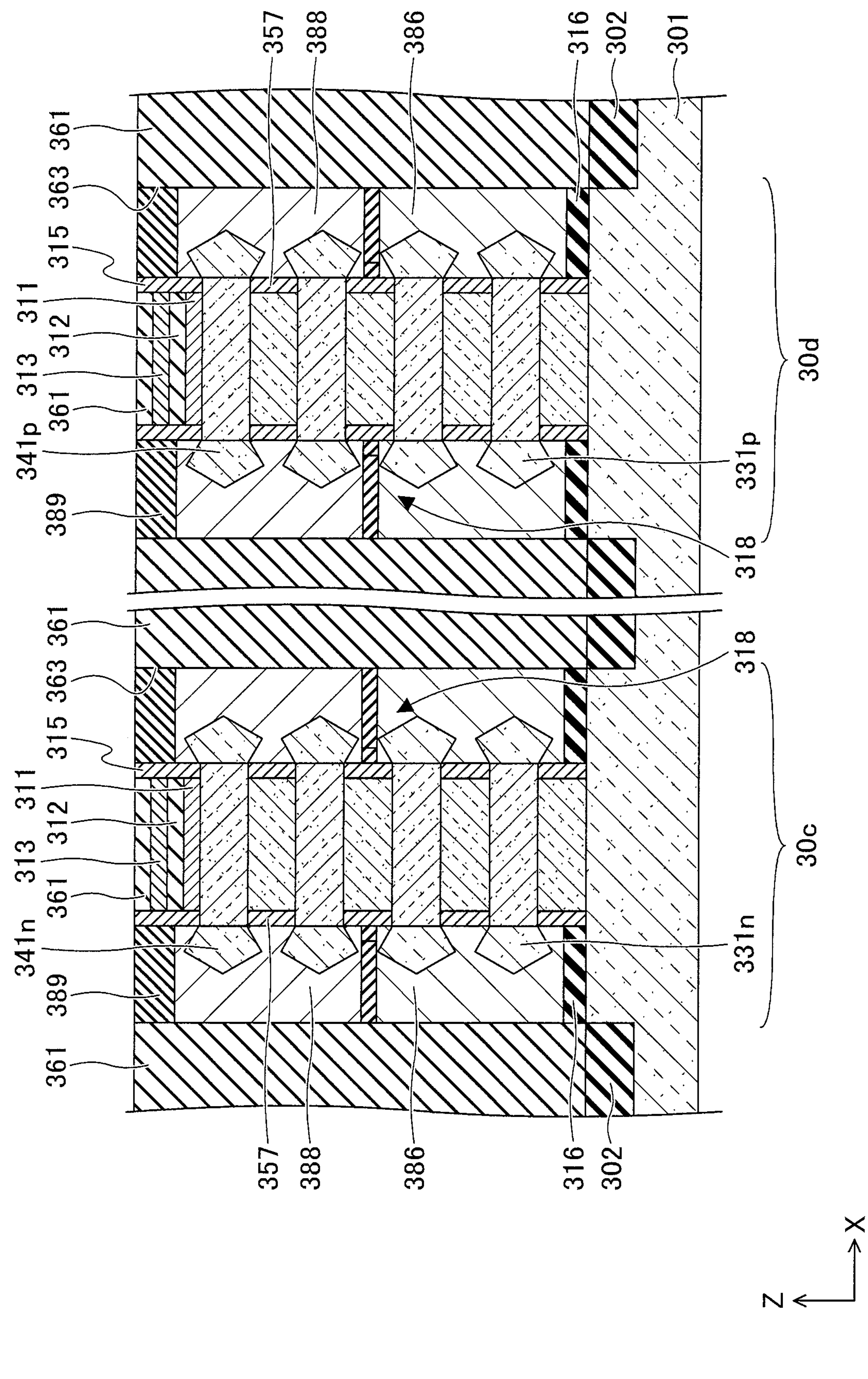
FIG. 45B is a cross sectional view (part 26) illustrating a method of producing a semiconductor device according to the third embodiment.

Thereafter, as illustrated in FIGS. 45A and 45B, the resist mask 343 is removed to form local wires 388 that contact the p-type semiconductor layers 341*p* or the n-type semiconductor layers 341*n* in each of the element active regions 30*a* to 30*d*. For example, the top surfaces of the local wires 388 are positioned between the top surfaces and the bottom surfaces of the dummy gate structure 317. The local wires 388 can be formed, for example, by embedding conductive films in the openings 363, flattening the conductive films, and etching back the conductive films. Next, insulation films 389 are formed over the local wires 388, and a flattening process is applied to the insulation films 389.

Figure 46A:
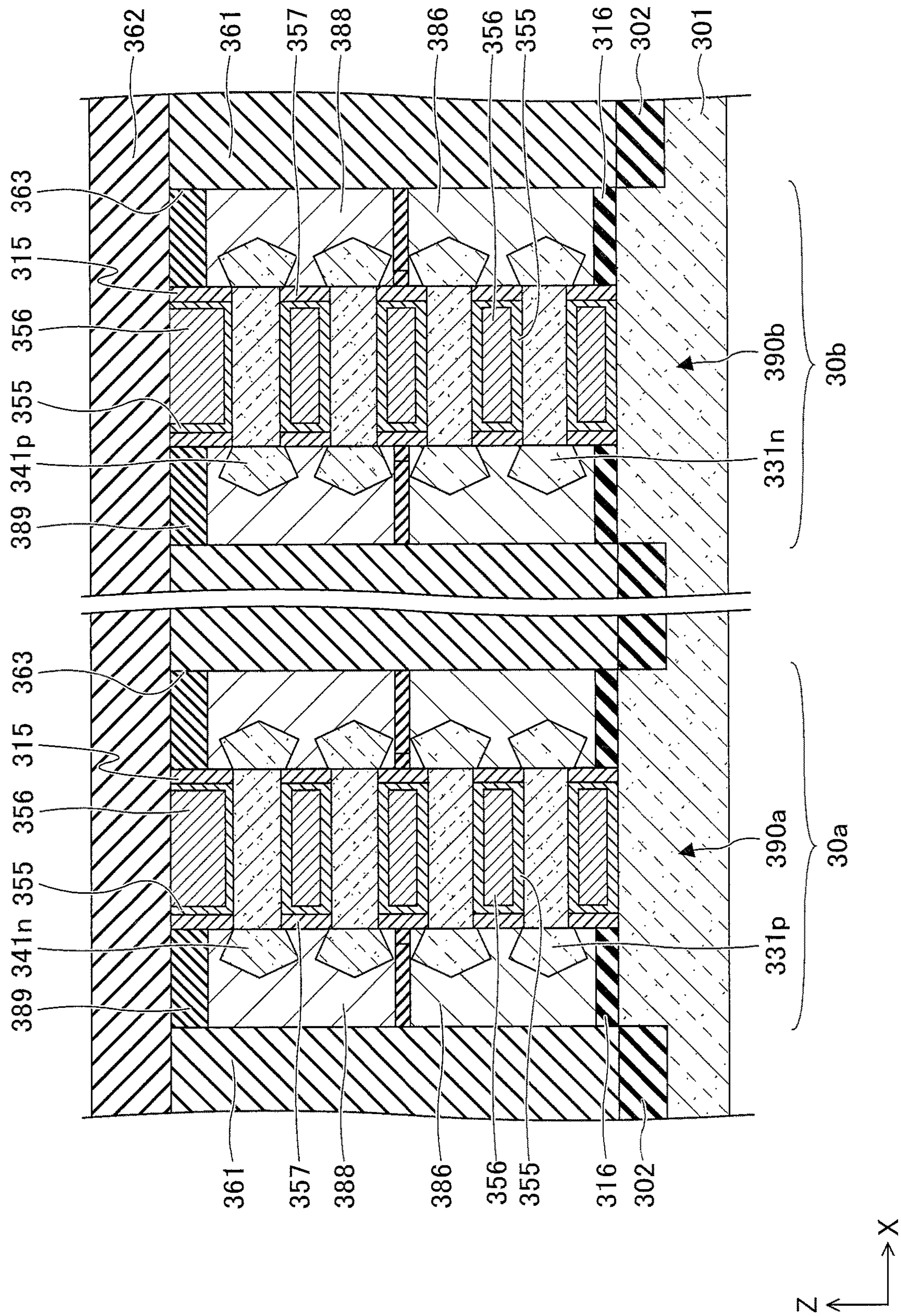
FIG. 46A is a cross sectional view (part 27) illustrating a method of producing a semiconductor device according to the third embodiment.
Figure 46B:
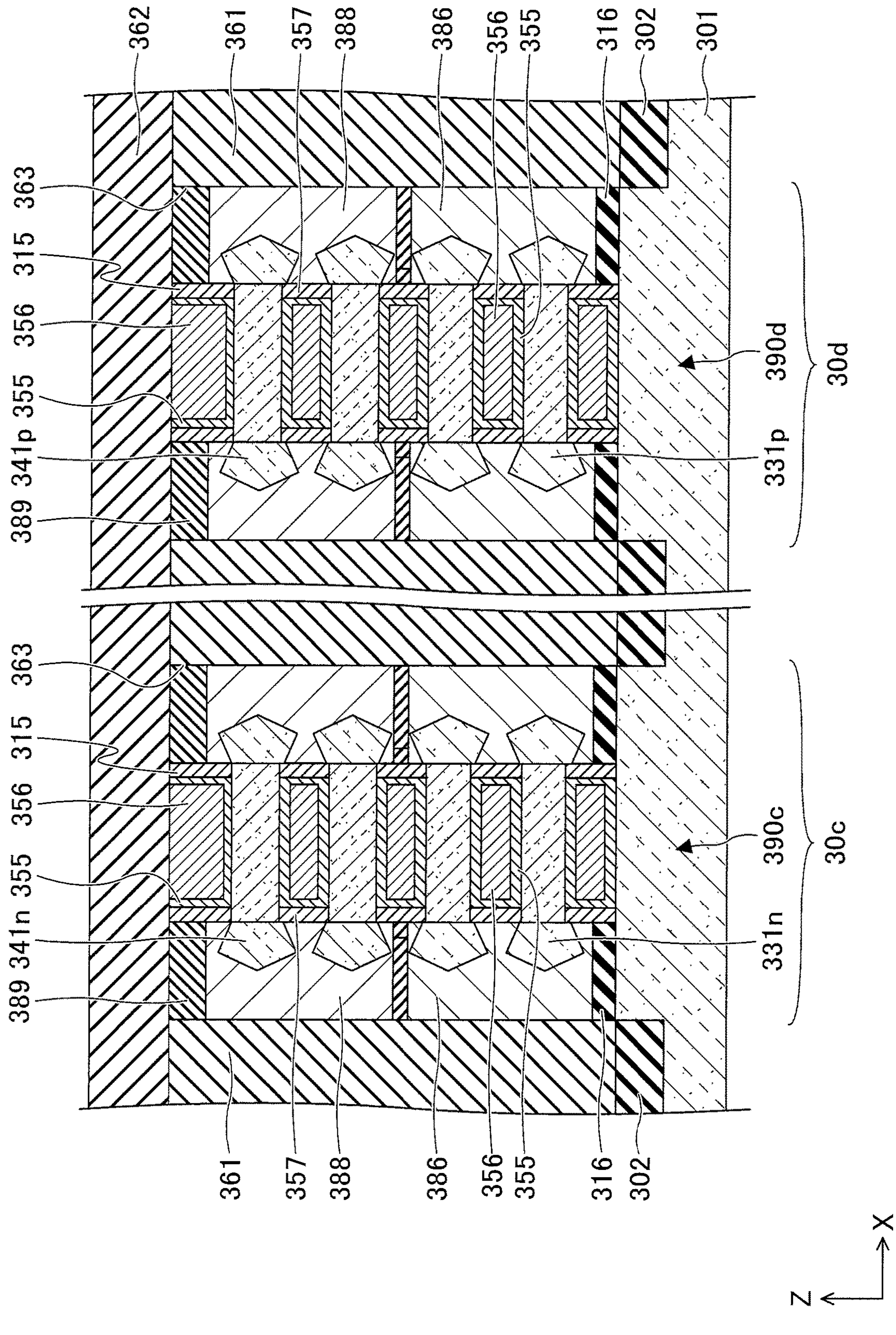
FIG. 46B is a cross sectional view (part 28) illustrating a method of producing a semiconductor device according to the third embodiment.

Next, as illustrated in FIGS. 46A and 46B, the silicon nitride films 313, the silicon oxide films 312, and the sacrifice films 311 are removed. As a result, in the element active regions 30*a* to 30*d*, the sidewalls orthogonal to the Y direction of the semiconductor stacked structures 318 are exposed. Further, the SiGe films 303, 305, 307, and 309 are removed. As a result, spaces are formed around the Si films 304, 306, 308, and 310. Thereafter, as in the second embodiment, gate insulation films 355 and gate electrodes 356 are formed around the Si films 304, 306, 308, and 310. In this way, the stacked transistor structures 390*a* to 390*d* are formed in the element active regions 30*a* to 30*d*, respectively. Also, the Si films 304, 306, 308, and 310 function as the nanowires 358.

Next, an interlayer insulation film 362 is formed over the interlayer insulation films 361, to cover the stacked transistor structures 390*a* to 390*d*.

Thereafter, upper-layer wires and the like are formed as necessary, to complete the semiconductor device.

Note that the insulation films 316 on the semiconductor substrate 301 may or may not be provided. If not provided, one of or both of the p-type semiconductor layers 331*p* and the n-type semiconductor layers 331*n* may be grown on the semiconductor substrate 301. Also, the order of formation of the p-type semiconductor layers 331*p* and the n-type semiconductor layers 331*n* may be determined appropriately, whichever is formed first. Similarly, the order of formation of the p-type semiconductor layers 341*p* and the n-type semiconductor layers 341*n* may be determined appropriately, whichever is formed first.

Fourth Embodiment

Figure 47:
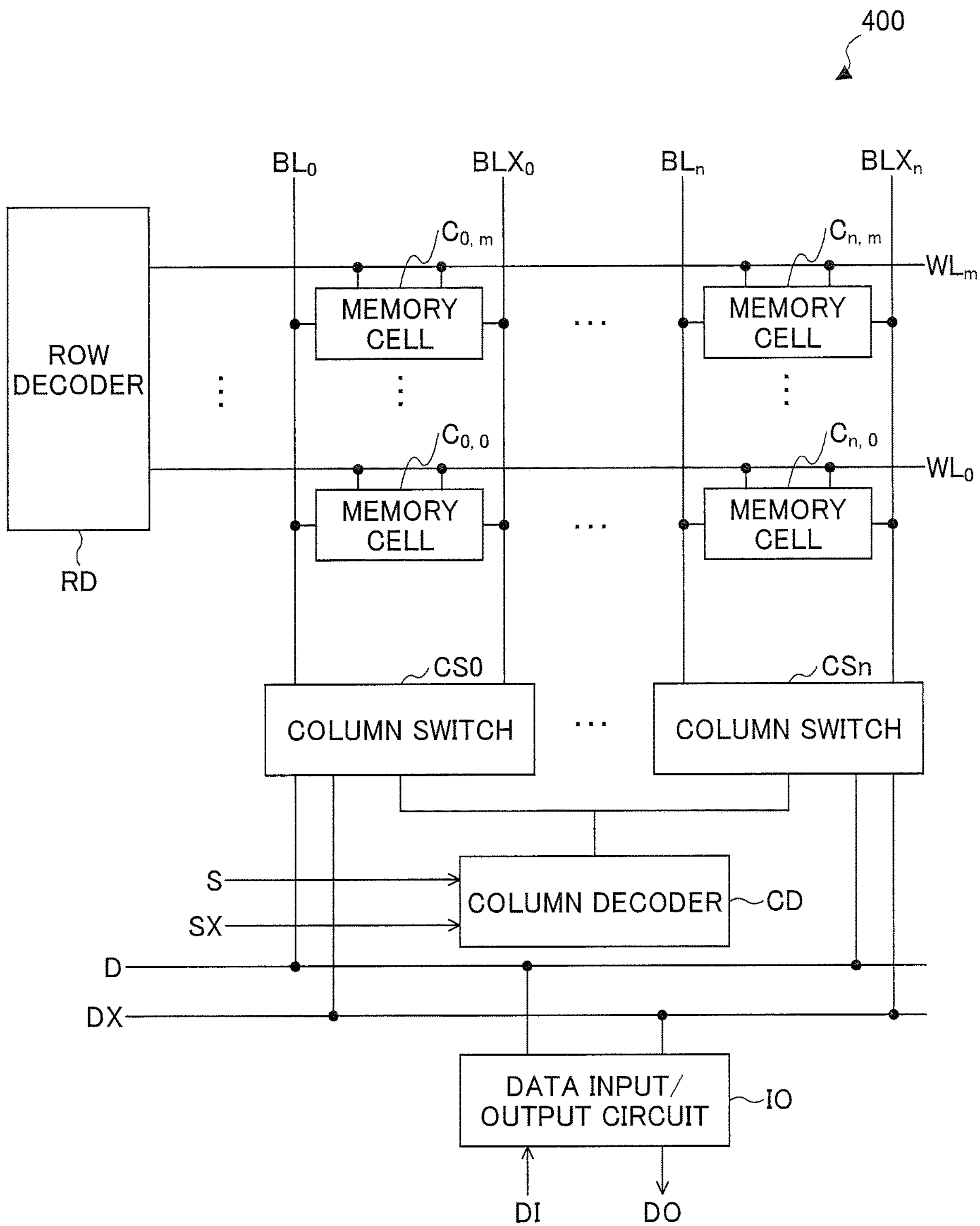
FIG. 47 is a circuit diagram illustrating a typical configuration of an SRAM.

Next, a fourth embodiment will be described. The fourth embodiment relates to a static random access memory (SRAM) that includes stacked transistor structures substantially the same as the stacked transistor structures included in the first embodiment, in its column switches and column decoder. FIG. 47 is a circuit diagram illustrating a typical configuration of an SRAM.

As illustrated in FIG. 47, an SRAM 400 according to the fourth embodiment includes (m+1) word lines $WL_0$ to $WL_n$, (n+1) pairs of bit-lines $BL_0$ and $BLX_0$ to $BL_n$ and $BLX_n$, and (m+1)×(n+1) static memory cells $C_{0,0}$ to $C_{n,m}$. Note that m and n are any natural numbers. The word lines $WL_0$ to $WL_m$ extend parallel in a first direction (a horizontal direction), pairs of bit-lines $BL_0$ and $BLX_0$ to $BL_n$ and $BLX_n$ extend in a second direction (a vertical direction) intersecting the first direction, and the memory cells $C_{0,0}$ to $C_{n,m}$ are placed at the intersections. The SRAM 400 includes a row decoder RD, column switch circuits CS0 to CSn, and a column decoder CD. The row decoder RD is connected to the word lines $WL_0$ to $WL_m$. The column switch circuits CS0 to CSn are connected to the pairs of bit lines $BL_0$ and $BLX_0$ to $BL_n$ and $BLX_n$, respectively. The column decoder CD is connected to the column switch circuits CS0 to CSn. The SRAM 400 includes pairs of data lines D and DX connected to the column switch circuits CS0 to CSn, and a data input/output circuit IO connected to the pair of data lines D and DX. A pair of address signals S and SX specifying one of the memory cells $C_{0,0}$ to $C_{n,m}$ are input into the column decoder CD. Data DI to be stored in one of the memory cells $C_{0,0}$ to $C_{n,m}$ is input into the data input/output circuit IO, and data DO being stored in one of the memory cells $C_{0,0}$ to $C_{n,m}$, is output from the data input/output circuit IO. Signals flowing through the bit lines $BLX_0$ to $BLX_n$ are inverted signals of those flowing through the bit lines $BL_0$ to $BL_n$, respectively. A signal flowing through the data line DX is the inverted signal of that flowing through the data line D. The address signal SX is the inverted signal of the address signal S.

Figure 48:
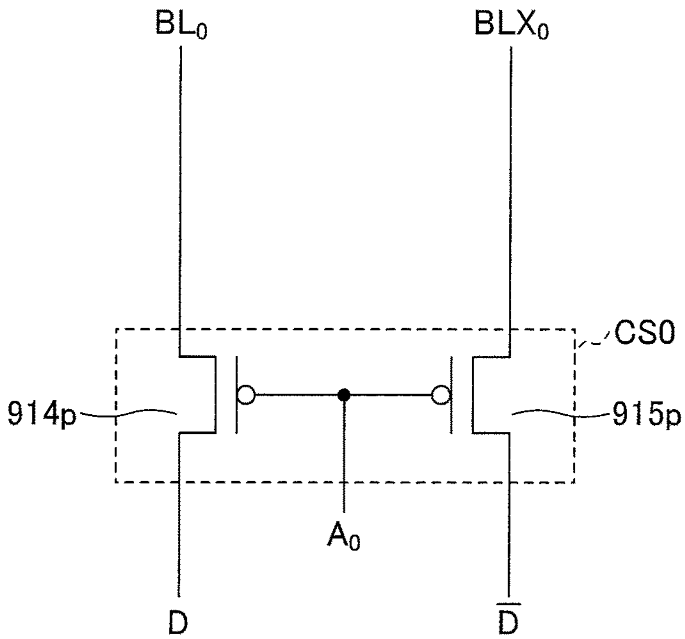
FIG. 48 is a circuit diagram illustrating a circuit configuration of a column switch circuit.

Next, a circuit configuration of the column switch circuit will be described. FIG. 48 is a circuit diagram illustrating a circuit configuration of the column switch circuit CS0 corresponding to the pairs of bit lines $BL_0$ and $BLX_0$.

As illustrated in FIG. 48, the column switch circuit CS0 includes two transistors 914*p* and 915*p* whose gates are connected to each other. The transistors 914*p* and 915*p* are pFETs. The transistor 914*p* is connected between the bit line $BL_0$ and the data line D, the transistor 915*p* is connected between the bit line $BLX_0$ and the data line DX, and a control signal $A_0$ is input from the column decoder CD to the gates of the transistors 914*p* and 915*p*.

Figure 49:
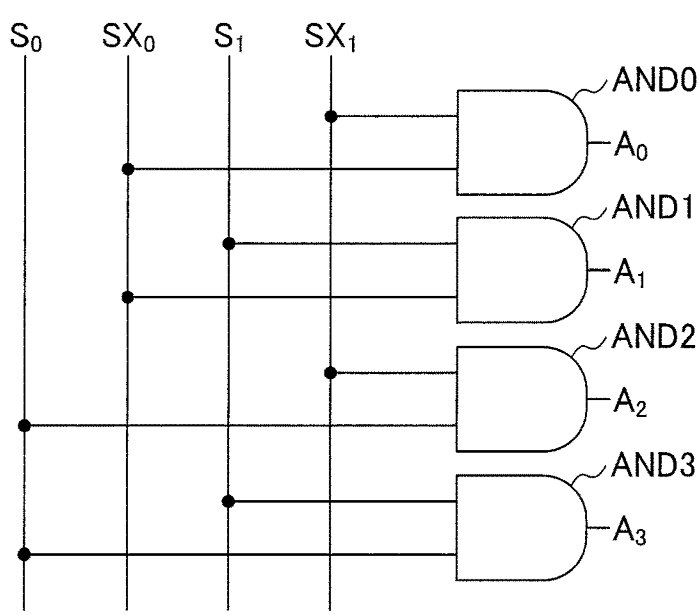
FIG. 49 is a circuit diagram illustrating a circuit configuration of part of a column decoder corresponding to four pairs of bit lines.
Figure 50:
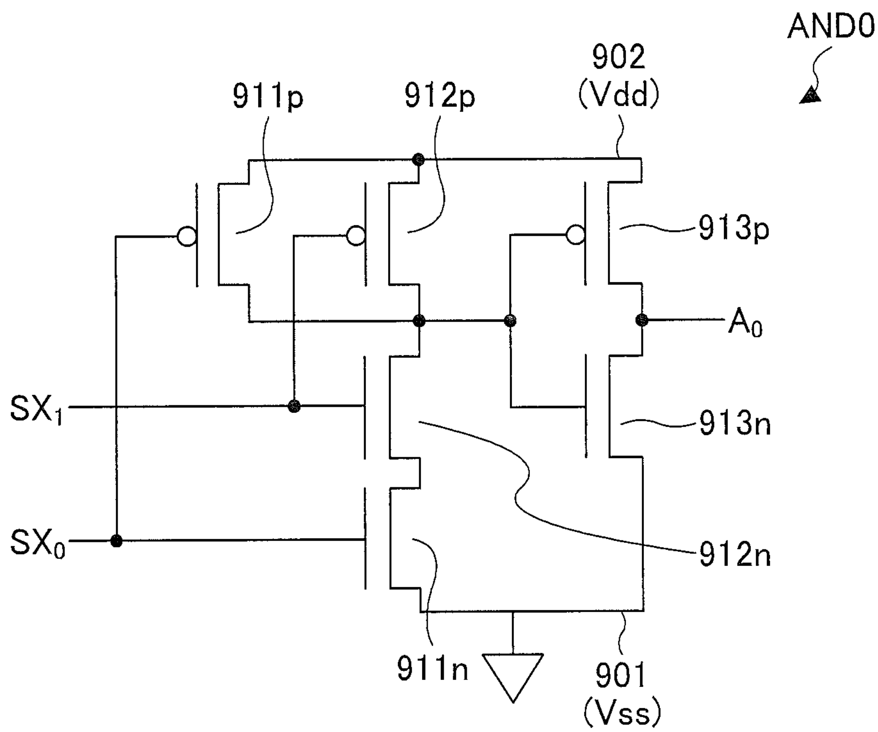
FIG. 50 is a circuit diagram illustrating a circuit configuration of an AND circuit.

Next, a circuit configuration of the column decoder will be described. FIG. 49 is a circuit diagram illustrating a circuit configuration of part of the column decoder CD corresponding to four pairs of bit lines $BL_0$ and $BLX_0$ to $BL_3$ and $BLX_3$. FIG. 50 is a circuit diagram illustrating a circuit configuration of an AND circuit that outputs the control signal $A_0$.

As illustrated in FIG. 49, in the part of the column decoder CD corresponding to the four pairs of bit lines $BL_0$ and $BLX_0$ to $BL_3$ and $BLX_3$, four AND circuits AND0 to AND3 are provided. Address signals $SX_0$ and $SX_1$ are input into the AND circuit AND0, and the AND circuit AND0 outputs the control signal $A_0$ to the column switch circuit CS0. Address signals $SX_0$ and Si are input into the AND circuit AND1, and the AND circuit AND1 outputs the control signal $A_1$ to the column switch circuit CS1. Address signals $S_0$ and $SX_1$ are input into the AND circuit AND2, and the AND circuit AND2 outputs the control signal $A_2$ to the column switch circuit CS2. Address signals $S_0$ and $S_1$ are input into the AND circuit AND3, and the AND circuit AND3 outputs the control signal $A_3$ to the column switch circuit CS3.

As illustrated in FIG. 50, the AND circuit AND0 includes six transistors 911*p*, 912*p*, 913*p*, 911*n*, 912*n*, and 913*n*. The transistors 911*p*, 912*p*, and 913*p* are pFETs, and the transistors 911*n*, 912*n*, and 913*n* are nFETs. The sources of the transistors 911*p*, 912*p*, and 913*p* are connected to a power line 902 to which a power source potential Vdd is supplied. The sources of the transistors 911*n* and 913*n* are connected to a power line 901 to which a ground potential Vss is supplied. The source of the transistor 912*n* is connected to the drain of the transistor 911*n*. The address signal $SX_0$ is input into the gates of the transistors 911*p* and 911*n*, and the address signal $SX_1$ is input into the gates of the transistors 912*p* and 912*n*. The gates of the transistors 913*p* and 913*n* are connected to the drains of the transistors 911*p*, 912*p*, and 912*n*. The control signal $A_0$ is output from the drains of the transistors 913*p* and 913*n*.

Although the input signals and the output signals are different, the AND circuits AND1 to ANDS have substantially the same configuration as the AND circuit AND0.

Figure 51:
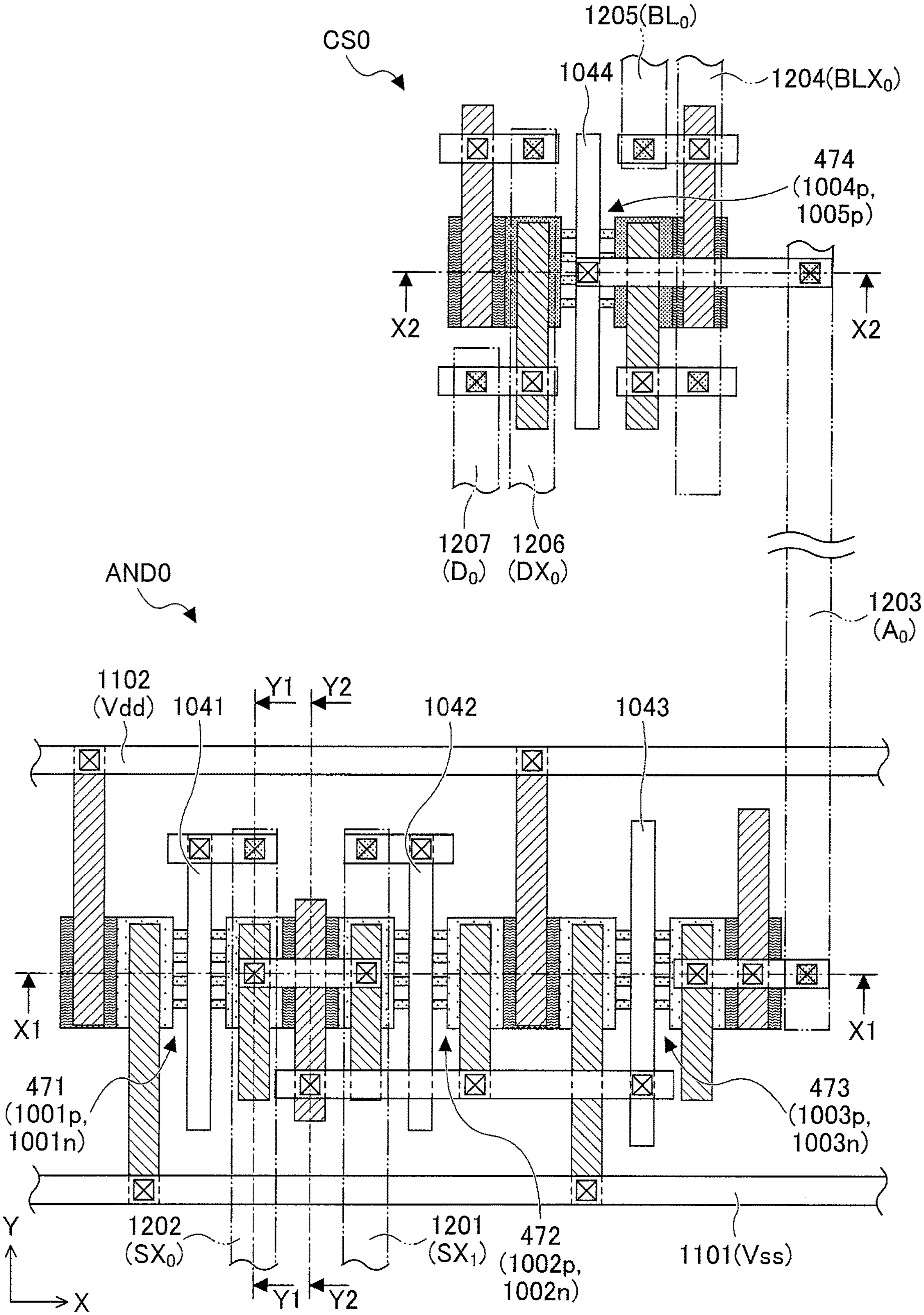
FIG. 51 is a diagram (part 1) illustrating a planar configuration of the AND circuit and the column switch circuit in a fourth embodiment.
Figure 52:
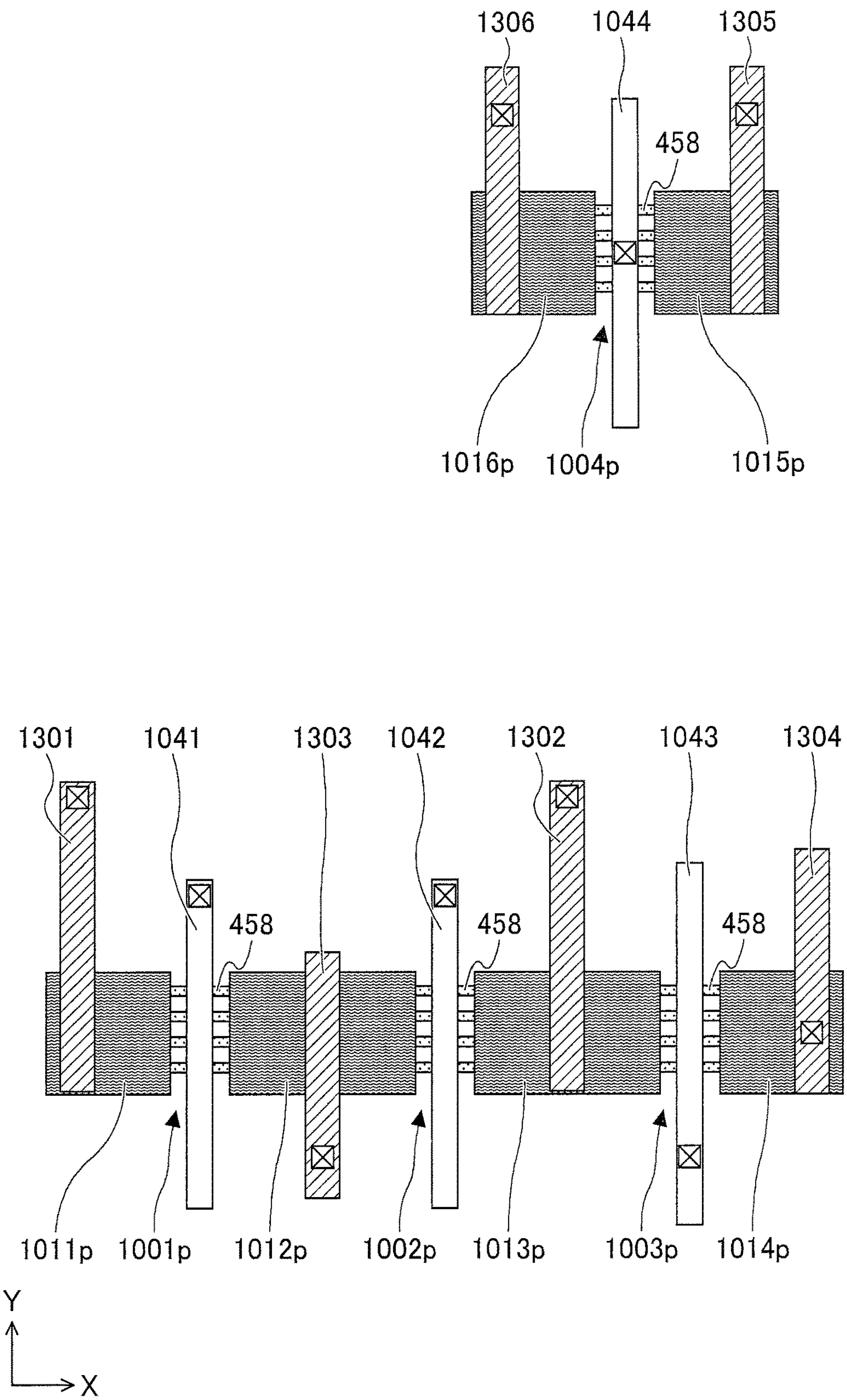
FIG. 52 is a diagram (part 2) illustrating a planar configuration of the AND circuit and the column switch circuit in the fourth embodiment.
Figure 53:
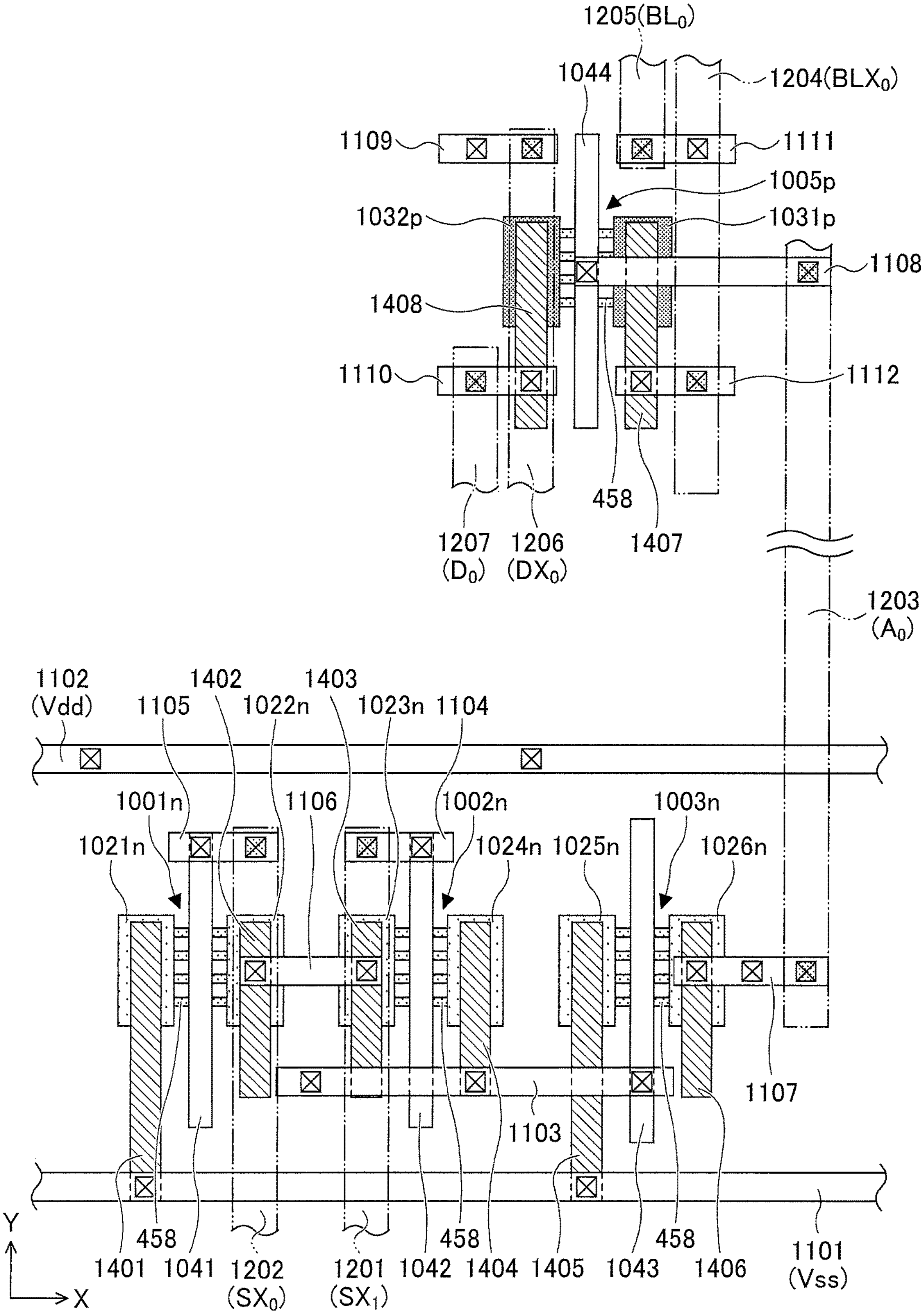
FIG. 53 is a diagram (part 3) illustrating a planar configuration of the AND circuit and the column switch circuit in the fourth embodiment.
Figure 54:
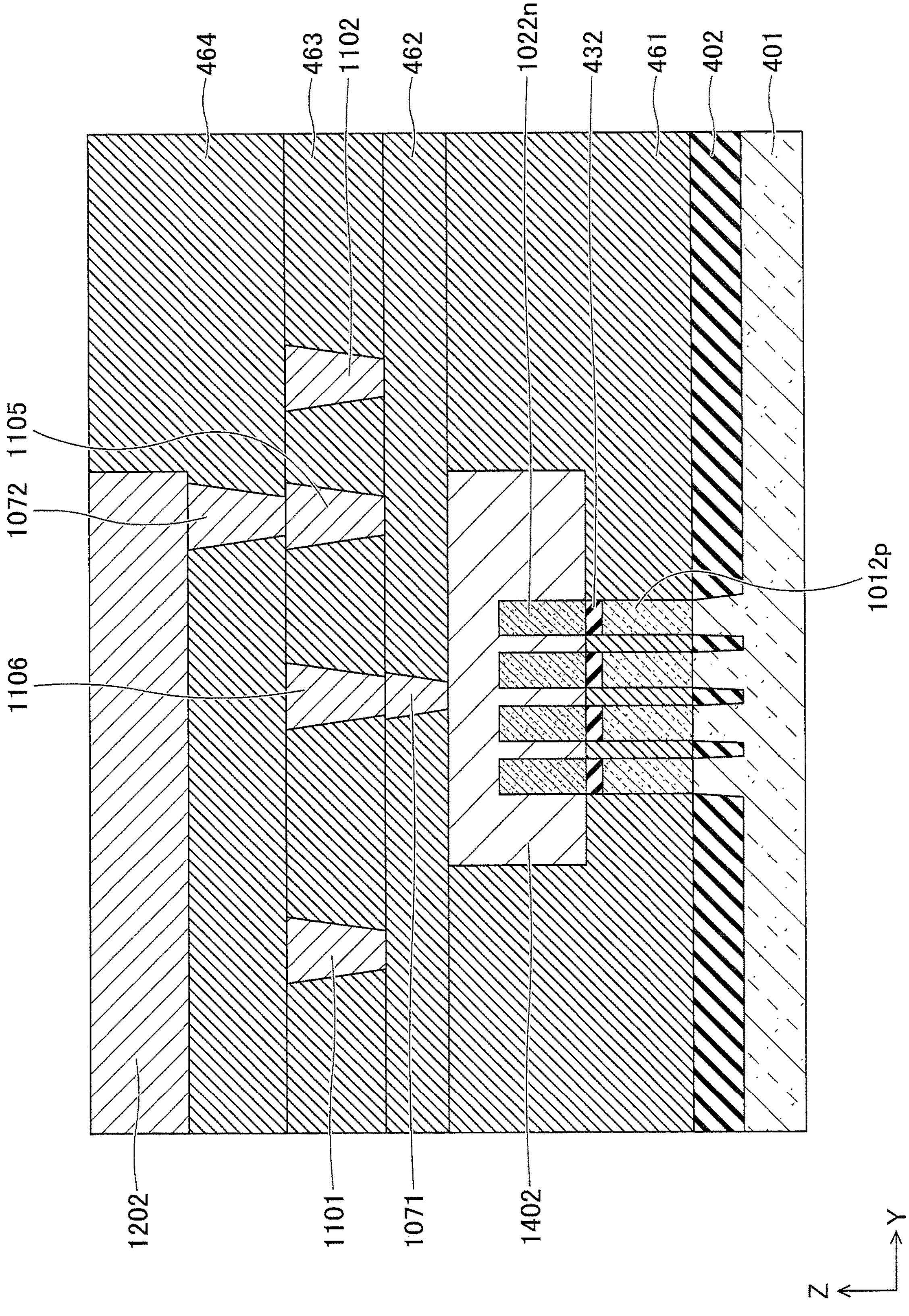
FIG. 54 is a cross sectional view (part 1) illustrating an AND circuit and a column switch circuit in the fourth embodiment.
Figure 55:
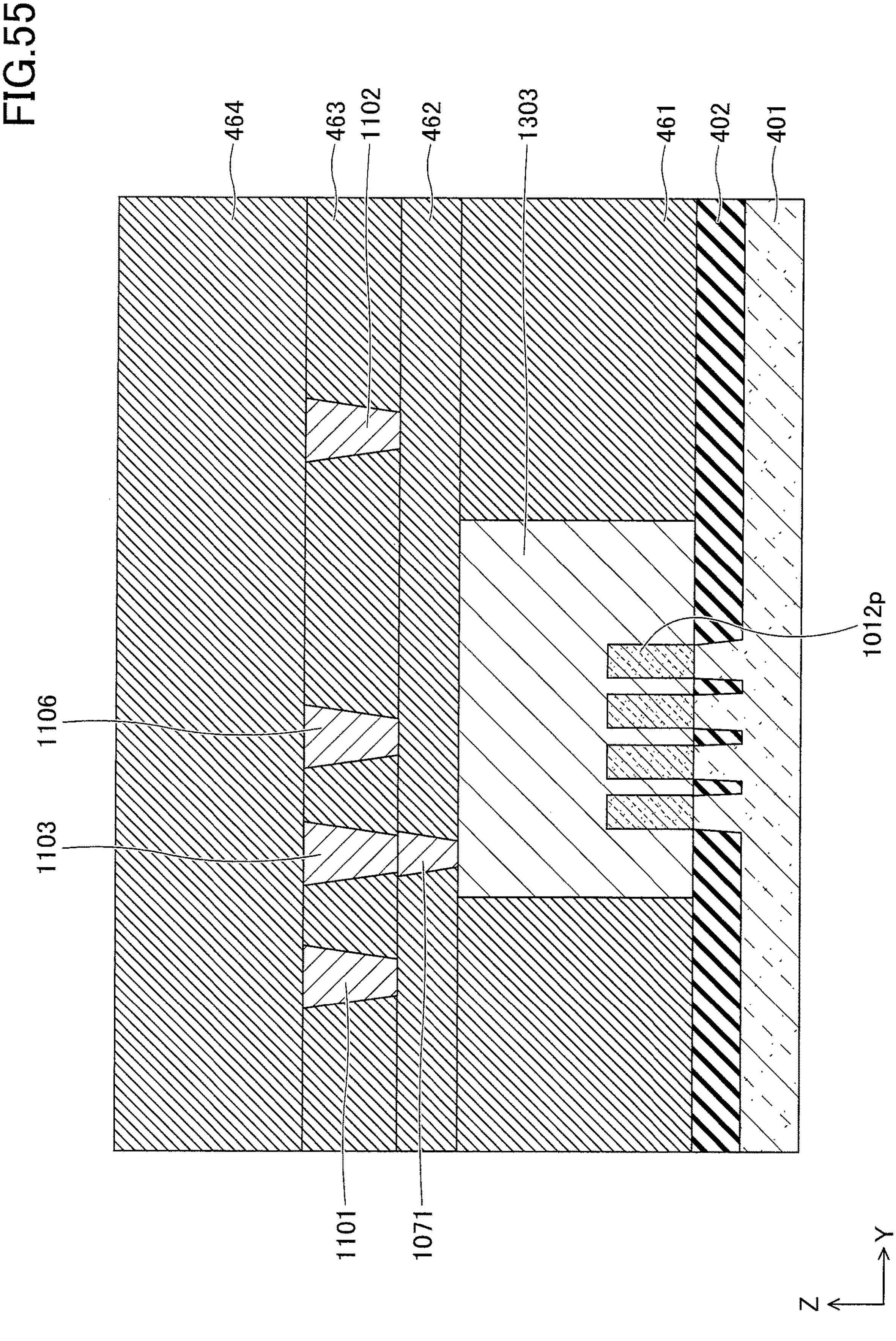
FIG. 55 is a cross sectional view (part 2) illustrating an AND circuit and a column switch circuit in the fourth embodiment.
Figure 56:
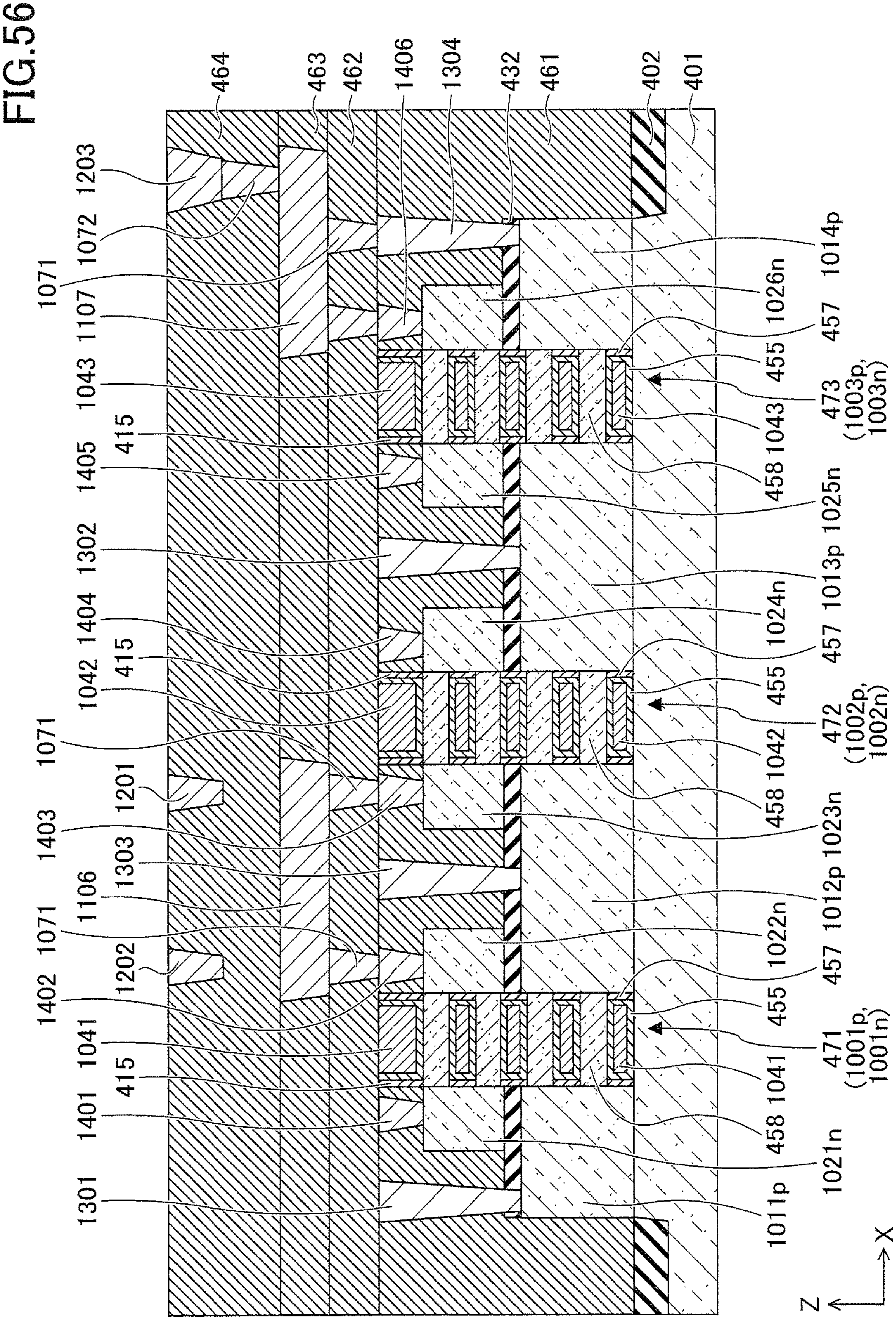
FIG. 56 is a cross sectional view (part 3) illustrating an AND circuit and a column switch circuit in the fourth embodiment.
Figure 57:
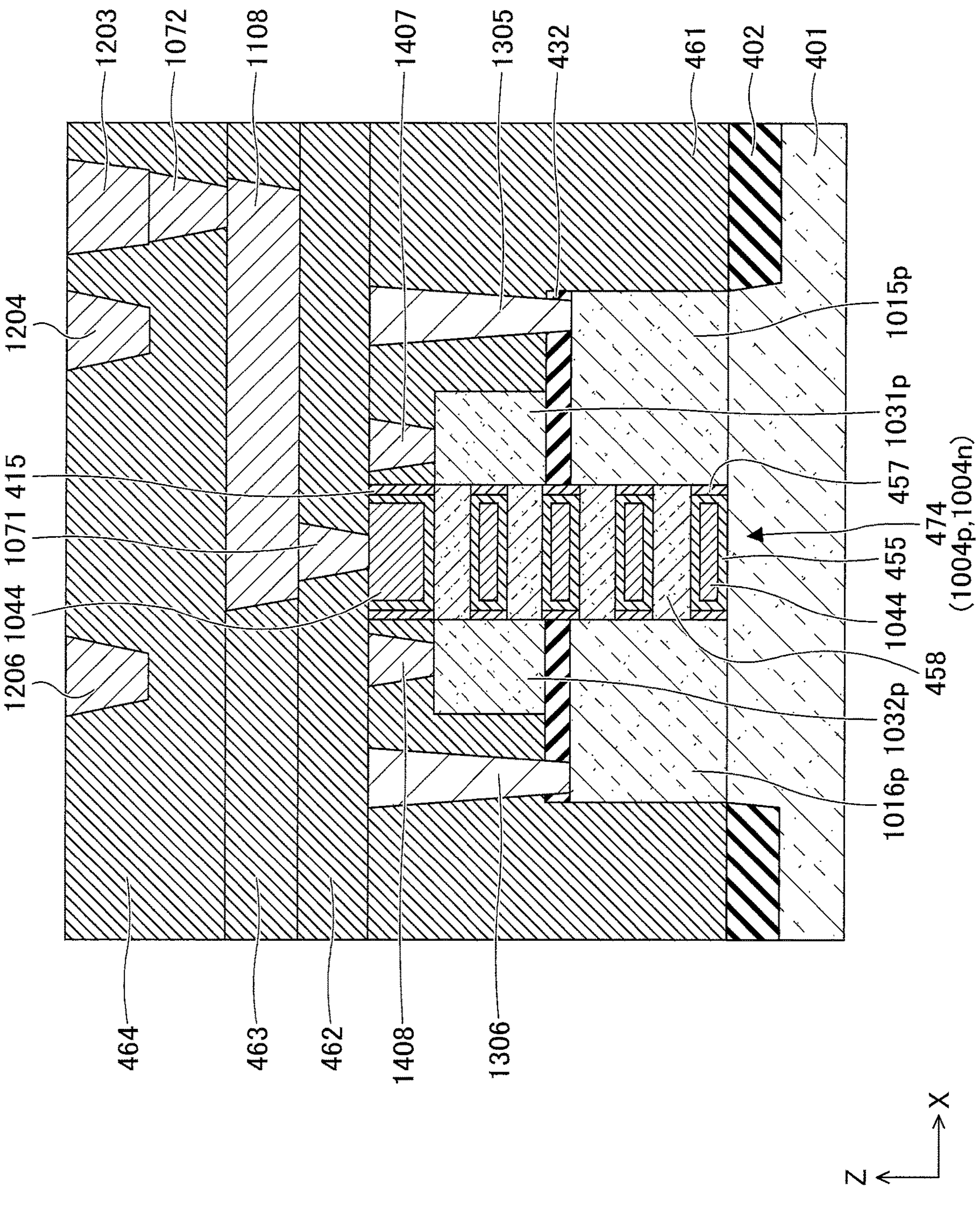
FIG. 57 is a cross sectional view (part 4) illustrating an AND circuit and a column switch circuit in the fourth embodiment.

Next, layouts of nanowires, gates, wires, and semiconductor layers that constitute the AND circuit AND0 and the column switch circuit CS0 will be described. FIGS. 51 to 53 are diagrams illustrating planar configurations of the AND circuit AND0 and the column switch circuit CS0 in the fourth embodiment. FIG. 51 mainly illustrates a layout of the nanowires, the wires, and the semiconductor layers. FIG. 52 mainly illustrates a layout of semiconductor layers on the semiconductor substrate side of stacked transistor structures in FIG. 51. FIG. 53 mainly illustrates a layout of semiconductor layers on the side apart from the semiconductor substrate of stacked transistor structures in FIG. 51. Vias and the like are also illustrated in FIGS. 51 to 53. FIGS. 54 to 57 are cross sectional views illustrating the AND circuit AND0 and the column switch circuit CS0. FIG. 54 corresponds to a cross sectional view along a line Y1-Y1 in FIG. 51; FIG. 55 corresponds to a cross sectional view along a line Y2-Y2 in FIG. 51; FIG. 56 corresponds to a cross sectional view along a line X1-X1 in FIG. 51; and FIG. 57 corresponds to a cross sectional view along a line X2-X2 in FIG. 51.

As illustrated in FIGS. 51 to 57, element separating regions 402 are formed over the surface of a semiconductor substrate 401. Interlayer insulation films 461, 462, 463, and 464 are formed over the semiconductor substrate 401. Four stacked transistor structures 471, 472, 473, and 474 are formed in the interlayer insulation film 461. The stacked transistor structures 471, 472, and 473 are included in the AND circuit AND0, and the stacked transistor structure 474 is included in the column switch circuit CS0.

The stacked transistor structures 471, 472, and 473 are arranged in the X direction in this order. Also, power lines 1101 and 1102 that extend in the X direction are formed in the interlayer insulation film 463. The ground potential Vss is supplied to the power line 1101, and the power source potential Vdd is supplied to the power line 1102. The stacked transistor structures 471, 472, and 473 are provided between the power lines 1101 and 1102 in the Y direction.

The stacked transistor structure 471 includes a gate electrode 1041, multiple nanowires 458, gate insulation films 455, spacers 457, and sidewalls 415. The stacked transistor structure 471 further includes p-type semiconductor layers 1011*p* and 1012*p*, n-type semiconductor layers 1021*n* and 1022*n*, and an insulation film 432. A gate electrode 1041, multiple nanowires 458, gate insulation films 455, spacers 457, and sidewalls 415 are laid out in substantially the same way as the gate electrode 156, the multiple nanowires 158, gate insulation films 155, spacers 157, and sidewalls 115 in the first embodiment. Also, the p-type semiconductor layers 1011*p* and 1012*p*, the n-type semiconductor layers 1021*n* and 1022*n*, and the insulation film 432 are laid out in substantially the same way as the p-type semiconductor layers 131*p*, the n-type semiconductor layers 141*n*, and the insulation film 132 in the first embodiment. A local wire 1301 is connected to the p-type semiconductor layer 1011*p*; a local wire 1303 is connected to the p-type semiconductor layer 1012*p*; a local wire 1401 is connected to the n-type semiconductor layer 1021*n*; and a local wire 1402 is connected to the n-type semiconductor layer 1022*n*.

In this way, the stacked transistor structure 471 has a p-channel transistor 1001*p* that includes the gate electrode 1041, the nanowires 458, the gate insulation films 455, the p-type semiconductor layer 1011*p*, and the p-type semiconductor layer 1012*p*. The transistor 1001*p* corresponds to the transistor 911*p*; the p-type semiconductor layer 1011*p* functions as a source region; the p-type semiconductor layer 1012*p* functions as a drain region; and the nanowires 458 collectively function as a channel.

Also, the stacked transistor structure 471 has an n-channel transistor 1001*n* that includes the gate electrode 1041, the nanowires 458, the gate insulation films 455, the n-type semiconductor layer 1021*n*, and the n-type semiconductor layer 1022*n*. The transistor 1001*n* corresponds to the transistor 911*n*; the n-type semiconductor layer 1021*n* functions as a source region; the n-type semiconductor layer 1022*n* functions as a drain region; and the nanowires 458 collectively function as a channel.

The stacked transistor structure 472 includes a gate electrode 1042, multiple nanowires 458, gate insulation films 455, spacers 457, and sidewalls 415. The stacked transistor structure 472 further includes p-type semiconductor layers 1012*p* and 1013*p*, n-type semiconductor layers 1023*n* and 1024*n*, and an insulation film 432. A gate electrode 1042, multiple nanowires 458, gate insulation films 455, spacers 457, and sidewalls 415 are laid out in substantially the same way as the gate electrode 156, the multiple nanowires 158, gate insulation films 155, spacers 157, and sidewalls 115 in the first embodiment. Also, the p-type semiconductor layers 1012*p* and 1013*p*, the n-type semiconductor layers 1023*n* and 1024*n*, and the insulation film 432 are laid out in substantially the same way as the p-type semiconductor layers 131*p*, the n-type semiconductor layers 141*n*, and the insulation film 132 in the first embodiment. A local wire 1303 is connected to the p-type semiconductor layer 1012*p*; a local wire 1302 is connected to the p-type semiconductor layer 1013*p*; a local wire 1403 is connected to the n-type semiconductor layer 1023*n*; and a local wire 1404 is connected to the n-type semiconductor layer 1024*n*.

In this way, the stacked transistor structure 472 has a p-channel transistor 1002*p* that includes the gate electrode 1042, the nanowires 458, the gate insulation films 455, the p-type semiconductor layer 1012*p*, and the p-type semiconductor layer 1013*p*. The transistor 1002*p* corresponds to the transistor 912*p*; the p-type semiconductor layer 1013*p* functions as a source region; the p-type semiconductor layer 1012*p* functions as a drain region; and the nanowires 458 collectively function as a channel.

Also, the stacked transistor structure 472 has an n-channel transistor 1002*n* that includes the gate electrode 1042, the nanowires 458, the gate insulation films 455, the n-type semiconductor layer 1023*n*, and the n-type semiconductor layer 1024*n*. The transistor 1002*n* corresponds to the transistor 912*n*; the n-type semiconductor layer 1023*n* functions as a source region; the n-type semiconductor layer 1024*n* functions as a drain region; and the nanowires 458 collectively function as a channel.

Note that the p-type semiconductor layer 1012*p* and the local wire 1303 are shared by the transistors 1001*p* and 1002*p*.

The stacked transistor structure 473 includes a gate electrode 1043, multiple nanowires 458, gate insulation films 455, spacers 457, and sidewalls 415. The stacked transistor structure 473 further includes p-type semiconductor layers 1013*p* and 1014*p*, n-type semiconductor layers 1025*n* and 1026*n*, and an insulation film 432. A gate electrode 1043, multiple nanowires 458, gate insulation films 455, spacers 457, and sidewalls 415 are laid out in substantially the same way as the gate electrode 156, the multiple nanowires 158, gate insulation films 155, spacers 157, and sidewalls 115 in the first embodiment. Also, the p-type semiconductor layers 1013*p* and 1014*p*, the n-type semiconductor layers 1025*n* and 1026*n*, and the insulation film 432 are laid out in substantially the same way as the p-type semiconductor layers 131*p*, the n-type semiconductor layers 141*n*, and the insulation film 132 in the first embodiment. A local wire 1302 is connected to the p-type semiconductor layer 1013*p*; a local wire 1304 is connected to the p-type semiconductor layer 1014*p*; a local wire 1405 is connected to the n-type semiconductor layer 1025*n*; and a local wire 1406 is connected to the n-type semiconductor layer 1026*n*.

In this way, the stacked transistor structure 473 has a p-channel transistor 1003*p* that includes the gate electrode 1043, the nanowires 458, the gate insulation films 455, the p-type semiconductor layer 1013*p*, and the p-type semiconductor layer 1014*p*. The transistor 1003*p* corresponds to the transistor 913*p*; the p-type semiconductor layer 1013*p* functions as a source region; the p-type semiconductor layer 1014*p* functions as a drain region; and the nanowires 458 collectively function as a channel.

Also, the stacked transistor structure 473 has an n-channel transistor 1003*n* that includes the gate electrode 1043, the nanowires 458, the gate insulation films 455, the n-type semiconductor layer 1025*n*, and the n-type semiconductor layer 1026*n*. The transistor 1003*n* corresponds to the transistor 913*n*; the n-type semiconductor layer 1025*n* functions as a source region; the n-type semiconductor layer 1026*n* functions as a drain region; and the nanowires 458 collectively function as a channel.

Note that the p-type semiconductor layer 1013*p* and the local wire 1302 are shared by the transistors 1002*p* and 1003*p*.

Each of the local wires 1301 and 1302 is connected to the power line 1102 through a via 1071, and each of the local wires 1401 and 1405 is connected to the power line 1101 through a via 1071. The gate electrode 1041 is connected to the wire 1105 through a via 1071; the gate electrode 1042 is connected to the wire 1104 through a via 1071; and the gate electrode 1043 is connected to the wire 1103 through a via 1071. Each of the local wires 1402 and 1403 is connected to the wire 1106 through a via 1071, and each of the local wires 1304 and 1406 is connected to the wire 1107 through a via 1071. The wires 1103 to 1107, like the power lines 1101 and 1102, are formed in the interlayer insulation film 463 and extend in the X direction. The multiple vias 1071 are formed in the interlayer insulation film 462. The vias 1071 connect the wires formed in the interlayer insulation film 463 with the gate electrodes or the local wires.

The wire 1104 is connected to a wire 1201 through a via 1072; the wire 1105 is connected to a wire 1202 through a via 1072; and the wire 1107 is connected to a wire 1203 through a via 1072. The wires 1201 to 1203 are formed in the interlayer insulation film 464 and extend in the Y direction. The multiple vias 1072 are also formed in the interlayer insulation film 464. The vias 1072 connect the wires formed in the interlayer insulation film 464 with the wires formed in the interlayer insulation film 463. The address signal $SX_1$ is input from the wire 1201; the address signal $SX_0$ is input from the wire 1202; and the control signal $A_0$ is output to the wire 1203.

The stacked transistor structure 474 includes a gate electrode 1044, multiple nanowires 458, gate insulation films 455, spacers 457, and sidewalls 415. The stacked transistor structure 474 further includes p-type semiconductor layers 1015*p* and 1016*p*, p-type semiconductor layers 1031*p* and 1032*p*, and an insulation film 432. A gate electrode 1044, multiple nanowires 458, gate insulation films 455, spacers 457, and sidewalls 415 are laid out in substantially the same way as the gate electrode 156, the multiple nanowires 158, gate insulation films 155, spacers 157, and sidewalls 115 in the first embodiment. Also, the p-type semiconductor layers 1015*p* and 1016*p*, the p-type semiconductor layers 1031*p* and 1032*p*, and the insulation film 432 are laid out in substantially the same way as the p-type semiconductor layers 131*p*, the p-type semiconductor layers 141*p*, and the insulation film 132 in the first embodiment. A local wire 1305 is connected to the p-type semiconductor layer 1015*p*; a local wire 1306 is connected to the p-type semiconductor layer 1016*p*; a local wire 1407 is connected to the p-type semiconductor layer 1031*p*; and a local wire 1408 is connected to the p-type semiconductor layer 1032*p*.

In this way, the stacked transistor structure 474 has a p-channel transistor 1004*p* that includes the gate electrode 1044, the nanowires 458, the gate insulation films 455, the p-type semiconductor layer 1015*p*, and the p-type semiconductor layer 1016*p*. The transistor 1004*p* corresponds to the transistor 915*p*; the p-type semiconductor layers 1015*p* and 1016*p* function as a source region or a drain region; and the nanowires 458 collectively function as a channel.

Also, the stacked transistor structure 474 has a p-channel transistor 1005*p* that includes the gate electrode 1044, the nanowires 458, the gate insulation films 455, the p-type semiconductor layer 1031*p*, and the p-type semiconductor layer 1032*p*. The transistor 1005*p* corresponds to the transistor 914*p*; the p-type semiconductor layers 1031*p* and 1032*p* function as a source region or a drain region; and the nanowires 458 collectively function as a channel.

The gate electrode 1044 is connected to a wire 1105 through a via 1071. The local wire 1305 is connected to a wire 1108 through a via 1071, and the local wire 1306 is connected to a wire 1109 through a via 1071. The local wire 1407 is connected to a wire 1112 through a via 1071, and the local wire 1408 is connected to a wire 1110 through a via 1071. The wires 1108 to 1112, like the power lines 1101 and 1102, are formed in the interlayer insulation film 463 and extend in the X direction.

The wire 1108 is connected to the wire 1203 through a via 1072. The wire 1109 is connected to a wire 1206 through a via 1072; and the wire 1111 is connected to a wire 1205 through a via 1072. The wire 1110 is connected to a wire 1207 through a via 1072; and the wire 1112 is connected to a wire 1204 through a via 1072. The wires 1204 to 1207, like the wires 1201 to 1203, are formed in the interlayer insulation film 464 and extend in the Y direction. The wire 1204 corresponds to the bit line $BL_0$; the wire 1205 corresponds to the bit line $BLX_0$; the wire 1207 corresponds to the data line $D_0$; and the wire 1206 corresponds to the data line $DX_0$.

In this way, the AND circuit AND0 and the column switch circuit CS0 are connected to each other via the wire 1203 that extends in the Y direction.

For example, for the interlayer insulation films 461 to 464, silicon oxide, silicon nitride, silicon carbide, silicon oxynitride, or the like may be used. For example, for the local wires 1301 to 1306 and 1401 to 1408, tungsten, cobalt, ruthenium, or the like may be used. In the case of using tungsten, it is favorable to form a conductive underlayer film, whereas in the case of using cobalt or ruthenium, it is not necessary to form an underlayer film.

For example, for the gate electrodes 1041 to 1044, titanium, titanium nitride, polycrystalline silicon, or the like may be used. For example, for the gate insulation films 455, a high dielectric constant material such as hafnium oxide, aluminum oxide, oxide of hafnium and aluminum, or the like may be used. For example, for the nanowires 458, silicon or the like may be used. For example, for the insulation films 432, the spacers 457, and the sidewalls 415, silicon oxide, silicon nitride, or the like may be used.

For example, for the vias 1071, tungsten, cobalt, ruthenium, or the like may be used. In the case of using tungsten, it is favorable to form a conductive underlayer film, whereas in the case of using cobalt or ruthenium, it is not necessary to form an underlayer film.

For example, for the power lines 1101 to 1102, the wires 1103 to 1112, the vias 1072, and the wires 1201 to 1207, tungsten, cobalt, ruthenium, or the like may be used. In the case of using tungsten, it is favorable to form a conductive underlayer film, whereas in the case of using cobalt or ruthenium, it is not necessary to form an underlayer film. Each of the wires 1201 to 1207 and the via 1072 may be integrally formed by a dual damascene process or the like.

Figure 58:
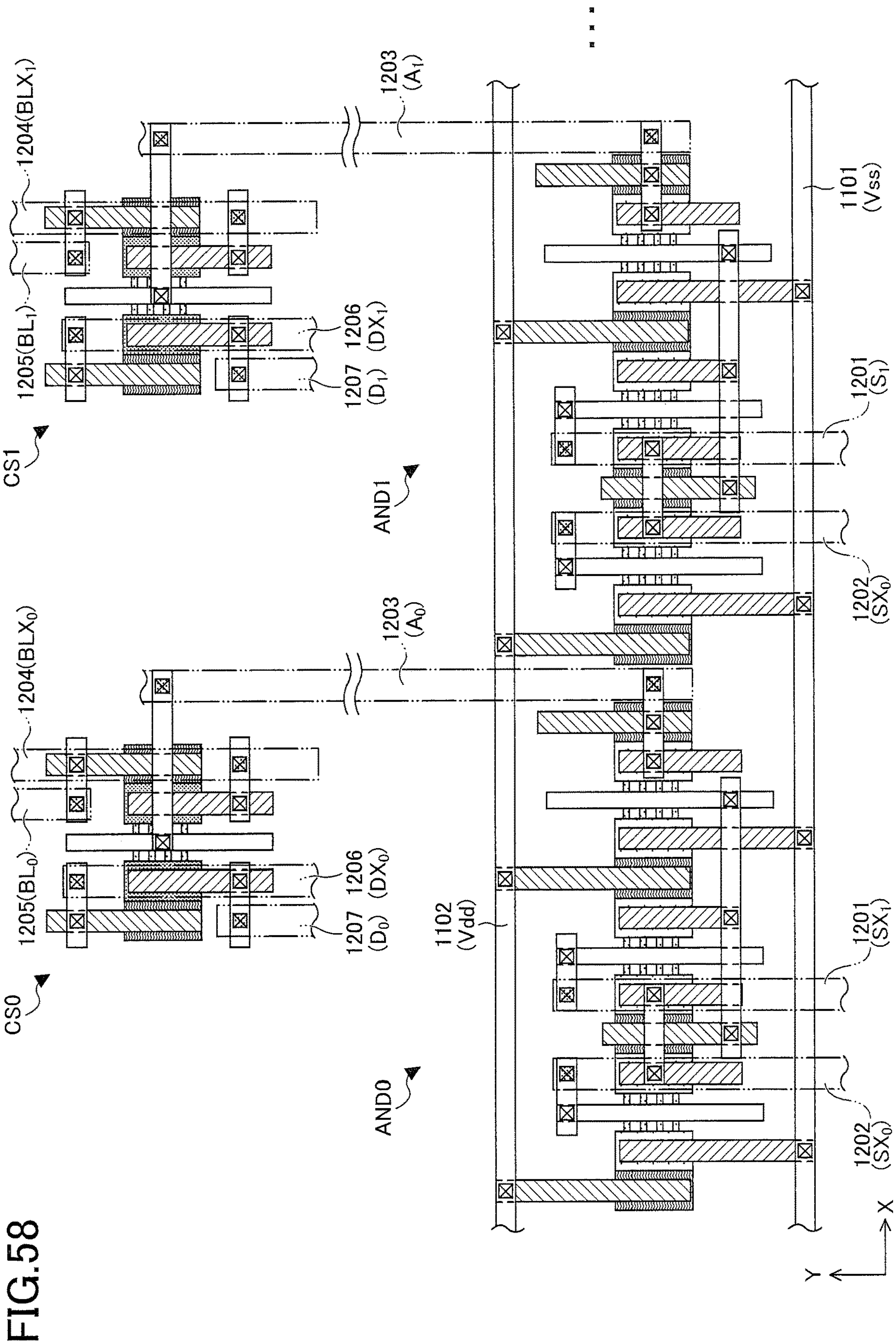
FIG. 58 is a diagram (part 1) illustrating a planar configuration of multiple AND circuits and column switch circuits in the fourth embodiment.
Figure 59:
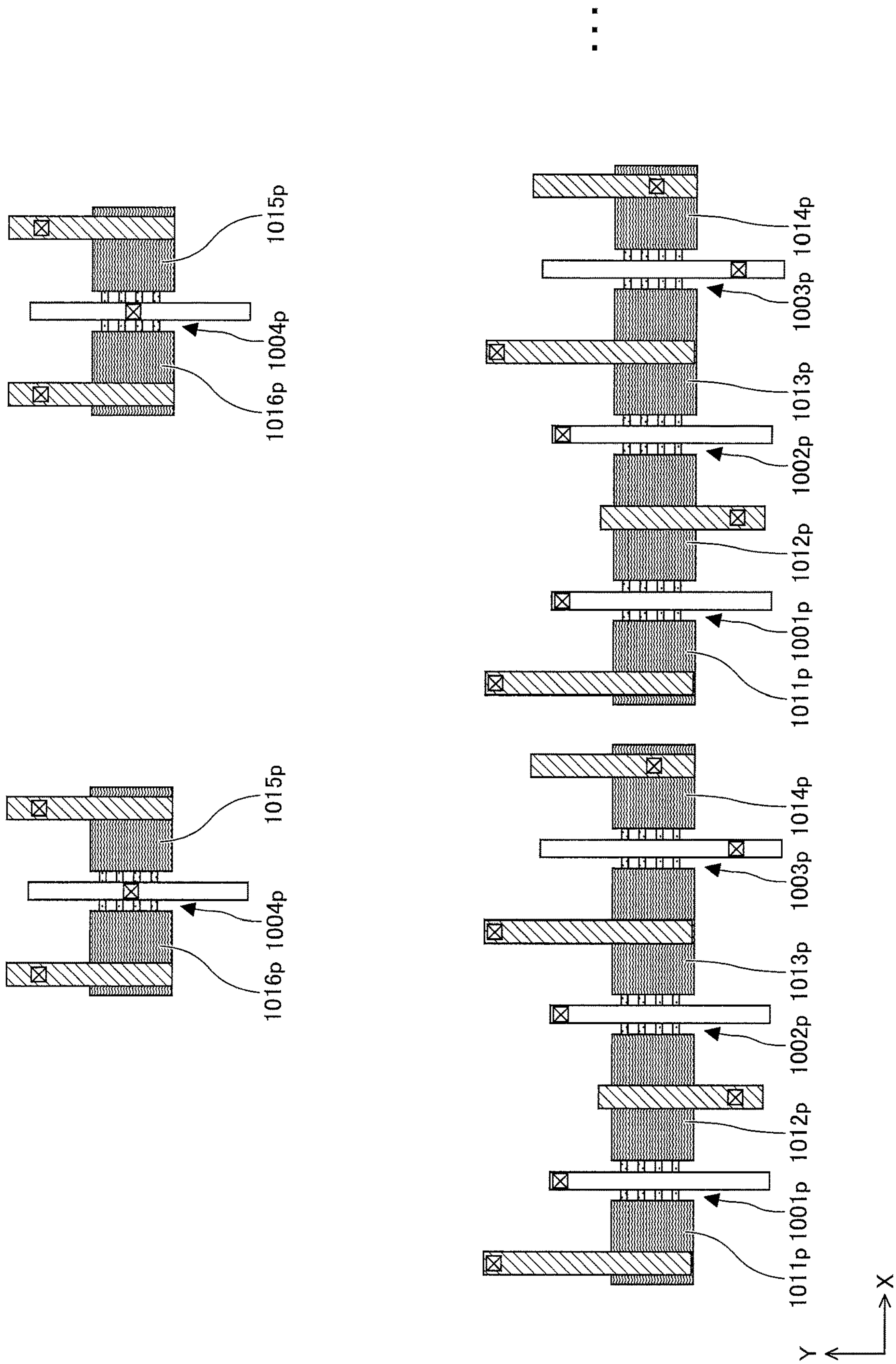
FIG. 59 is a diagram (part 2) illustrating a planar configuration of multiple AND circuits and column switch circuits in the fourth embodiment.
Figure 60:
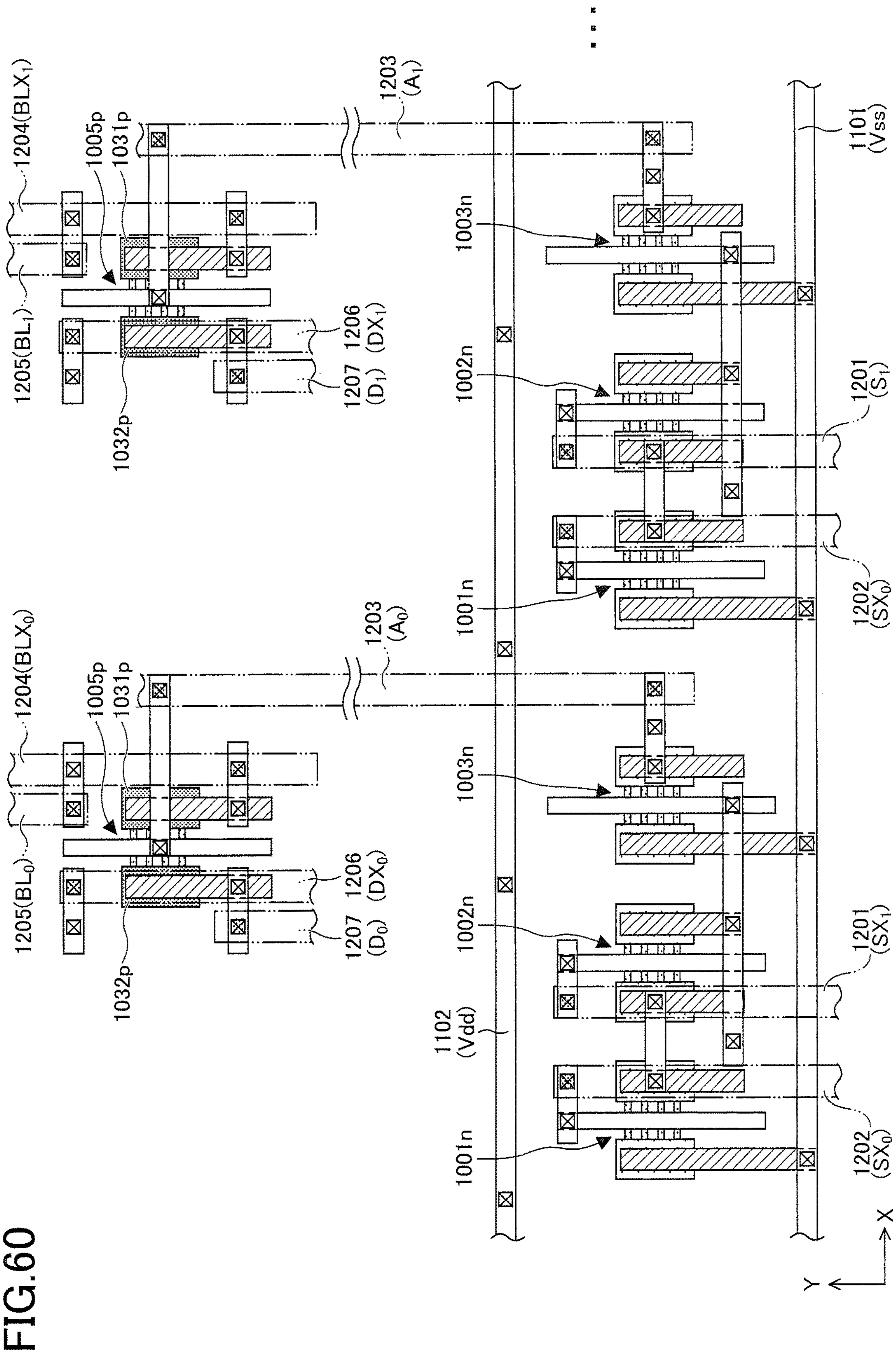
FIG. 60 is a diagram (part 3) illustrating a planar configuration of multiple AND circuits and column switch circuits in the fourth embodiment.

FIGS. 58 to 60 illustrate planar configurations of the multiple AND circuits and the column switch circuits in the fourth embodiment. FIG. 58 mainly illustrates a layout of the nanowires, the wires, and the semiconductor layers. FIG. 59 mainly illustrates a layout of semiconductor layers on the semiconductor substrate side of stacked transistor structures in FIG. 58. FIG. 60 mainly illustrates a layout of semiconductor layers on the side apart from the semiconductor substrate of stacked transistor structures in FIG. 58. Vias and the like are also illustrated in FIGS. 58 to 60.

As illustrated in FIGS. 58 to 60, the multiple AND circuits AND0, AND1, . . . , and ANDn are arrayed in the X direction, and the power lines 1101 and 1102 are shared among the AND circuits AND0, AND1, . . . , and ANDN. Also, multiple column switch circuits CS0, CS1, . . . , and CSn are arrayed in the X direction. The column switch circuits CS0 to CSn are connected to the AND circuits AND0 to ANDn, respectively, through the wires 1203 that extend in the Y direction.

In the semiconductor device according to the fourth embodiment, the stacked transistor structures 471 to 473 are examples of CFETs. The semiconductor device according to the fourth embodiment includes these CFETs in the AND circuits AND0 to ANDn, and includes the stacked transistor structure 474 that includes the p-channel transistors 1004*p* and 1005*p* in the column switch circuits CS0 to CSn. Therefore, according to the fourth embodiment, two transistors 1004*p* and 1005*p* of the same conductivity type can be overlapped in plan view, to make the semiconductor devices further finer. Note that although the present embodiment includes a stacked transistor structure that is constituted with two p-channel transistors, the stacked transistor structure may be constituted with two n-channel transistors. Also, alternatively, a stacked transistor structure constituted with an re-channel transistor may be laid out over the semiconductor substrate 501, over which a p-channel transistor is laid out.

For example, although the power lines 1101 to 1102 and the wires 1103 to 1112 extend in the X direction, and the local wires 1301 to 1306 and 1401 to 1408 and the wires 1201 to 1207 extend in the Y direction, these are not limited as such.

Also, for example, although the top surfaces of the local wires 1301 to 1306 and the top surfaces of the local wires 1401 to 1408 are flush with the top surface of the interlayer insulation film 461, these are not limited as such.

Also, in the example illustrated in FIGS. 58 to 60, in each column switch circuit, although the pairs of bit lines are positioned on the same side in the X direction as viewed from the gate electrode 1044, the gate electrode 1044 may be positioned between the pairs of bit lines. This makes it easier to set a distance between the pairs of bit lines.

Fifth Embodiment

Next, a fifth embodiment will be described. The fifth embodiment relates to an SRAM that includes stacked transistor structures substantially the same as the stacked transistor structures included in the third embodiment, in its column switches and column decoder.

Figure 61:
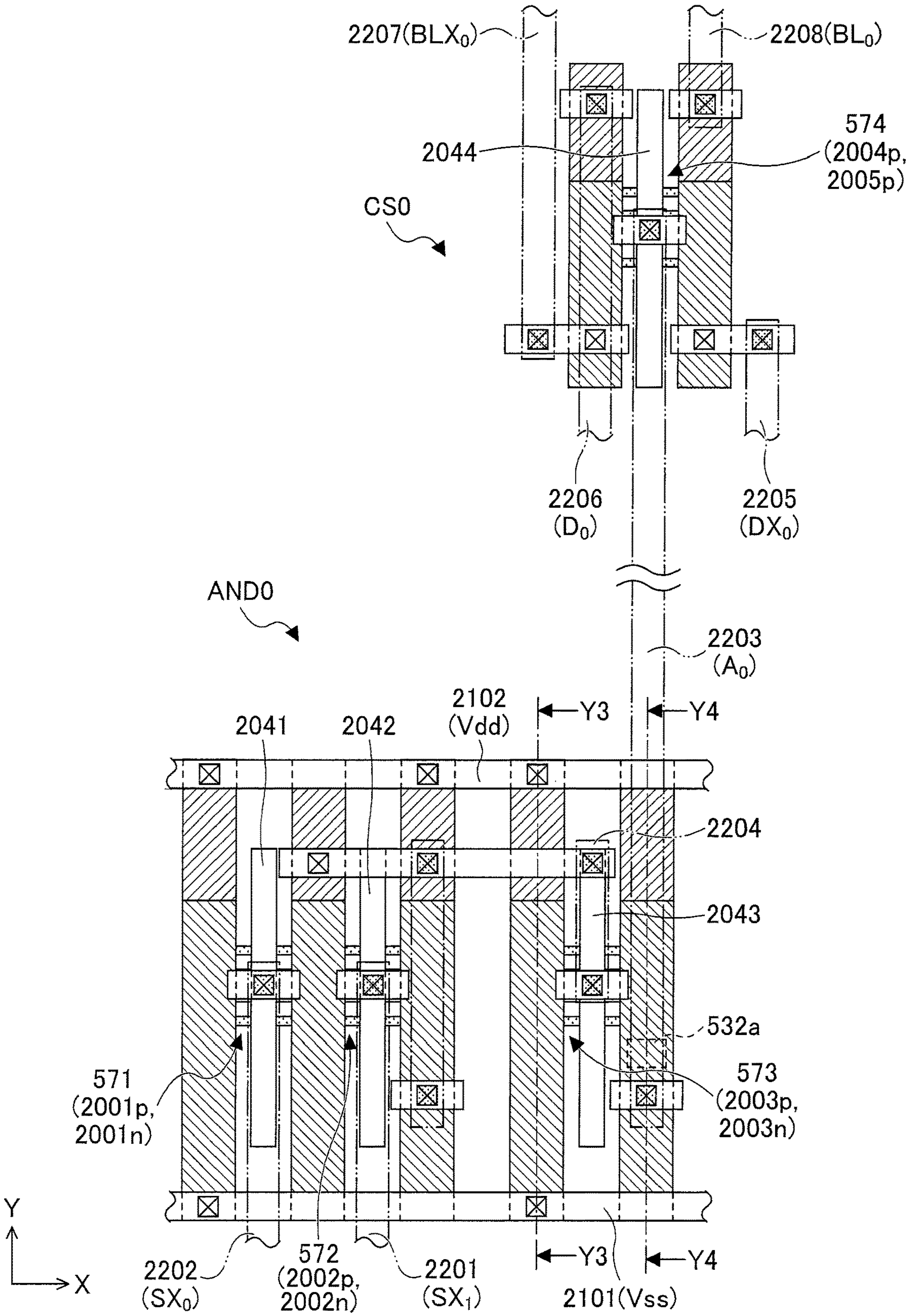
FIG. 61 is a diagram (part 1) illustrating a planar configuration of the AND circuit and the column switch circuit in a fifth embodiment.
Figure 62:
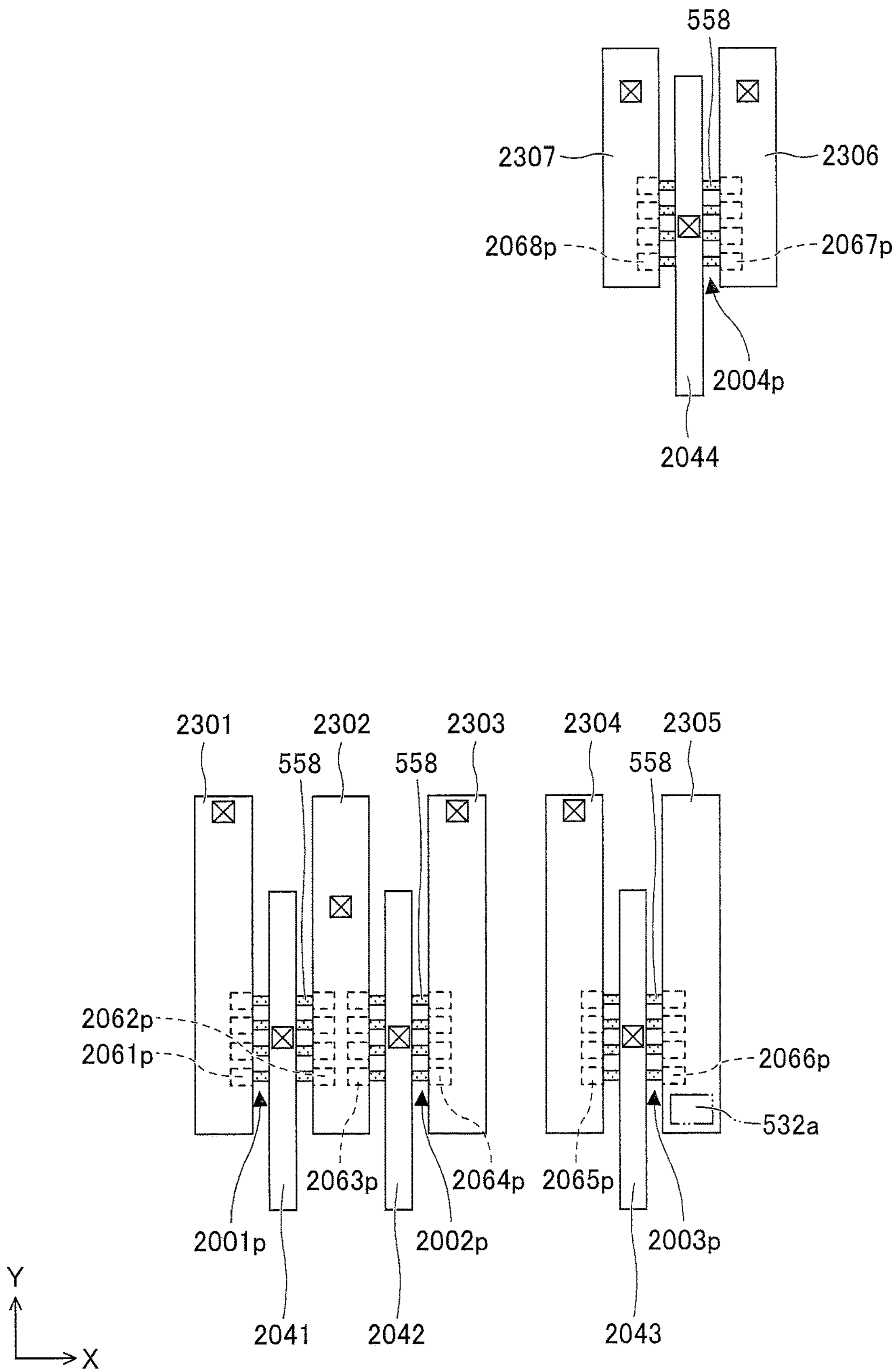
FIG. 62 is a diagram (part 2) illustrating a planar configuration of the AND circuit and the column switch circuit in the fifth embodiment.
Figure 63:
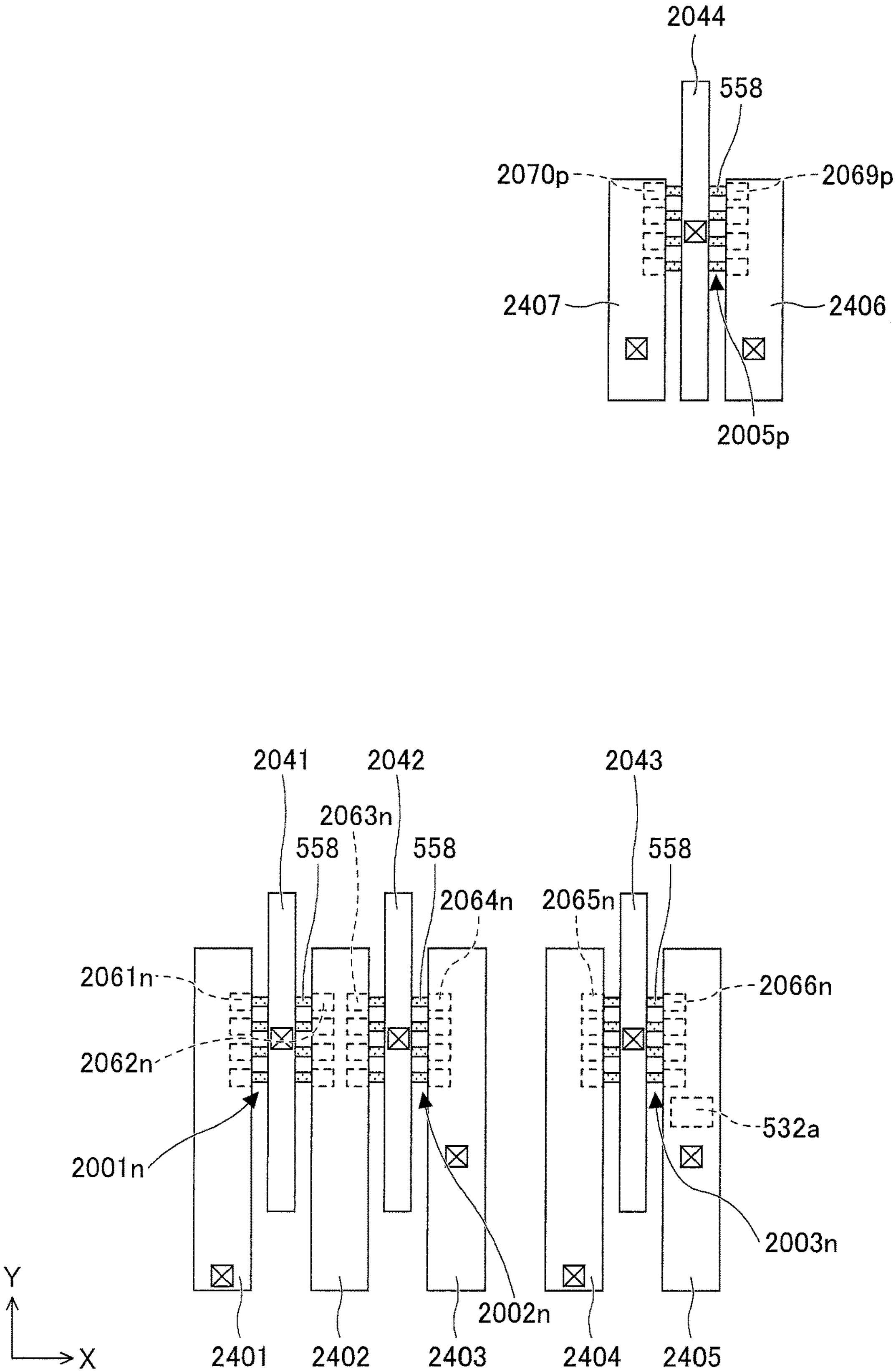
FIG. 63 is a diagram (part 3) illustrating a planar configuration of the AND circuit and the column switch circuit in the fifth embodiment.
Figure 64:
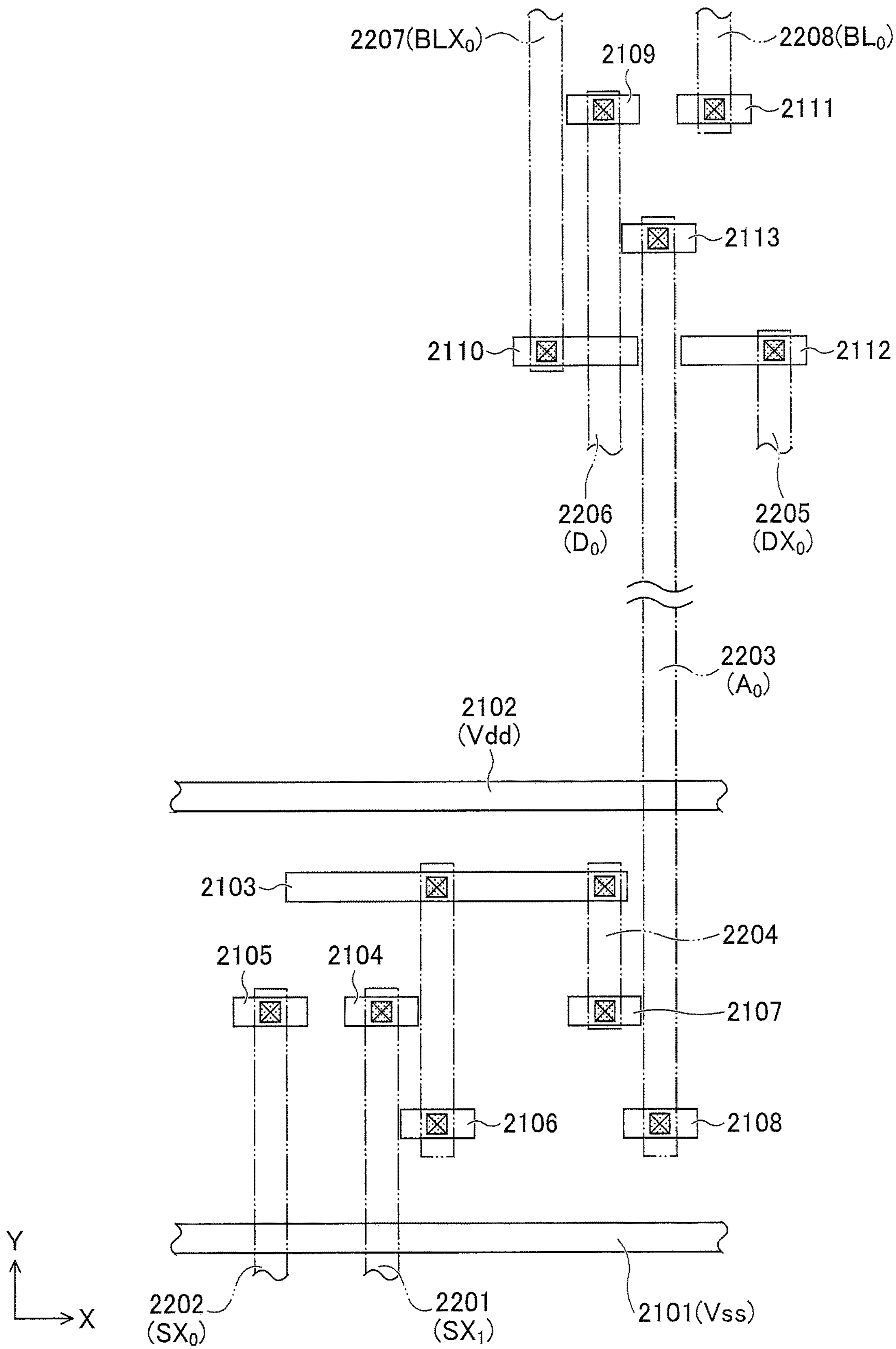
FIG. 64 is a diagram (part 4) illustrating a planar configuration of the AND circuit and the column switch circuit in the fifth embodiment.
Figure 65:
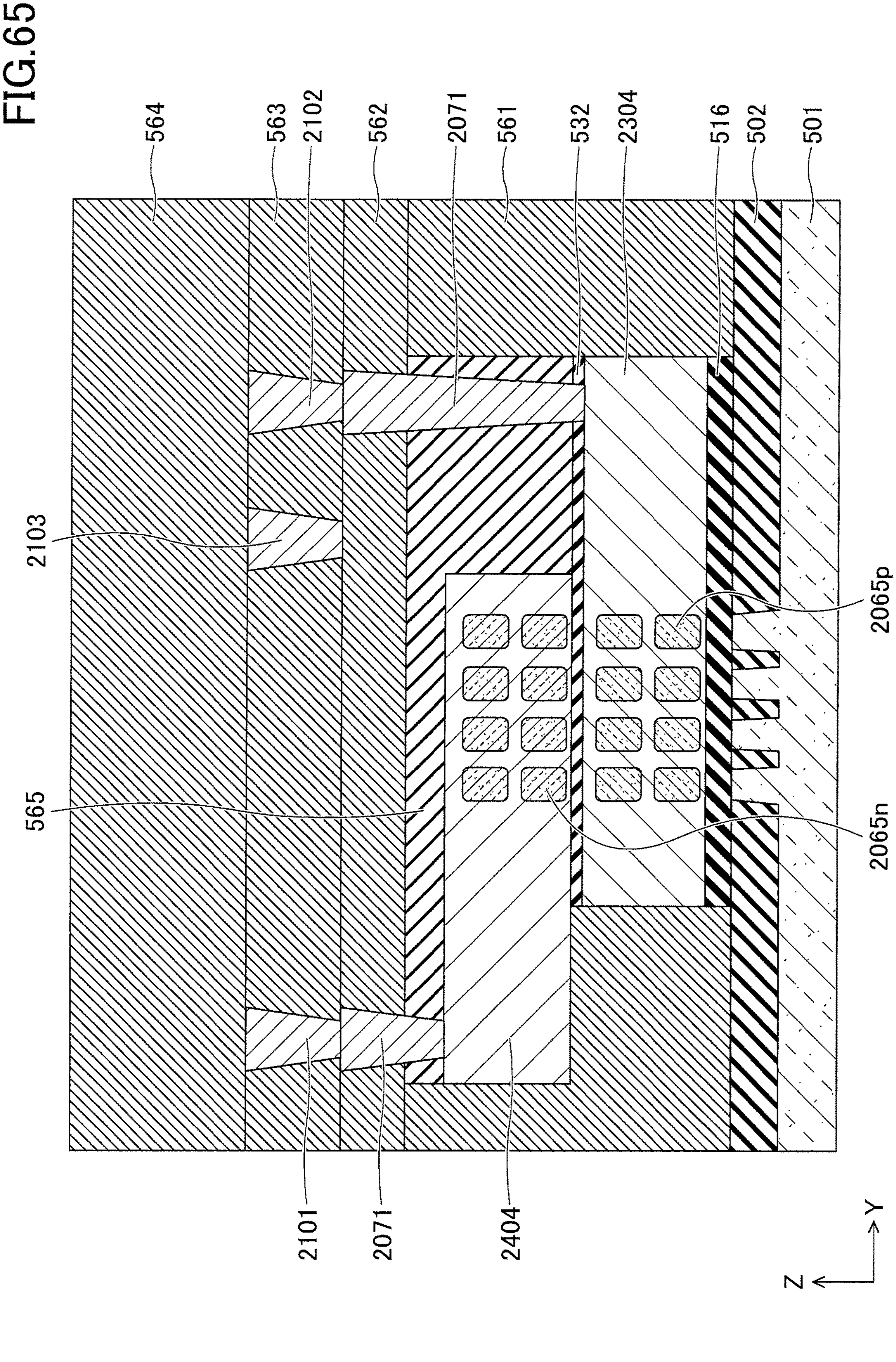
FIG. 65 is a cross sectional view (part 1) illustrating an AND circuit and a column switch circuit in the fifth embodiment.
Figure 66:
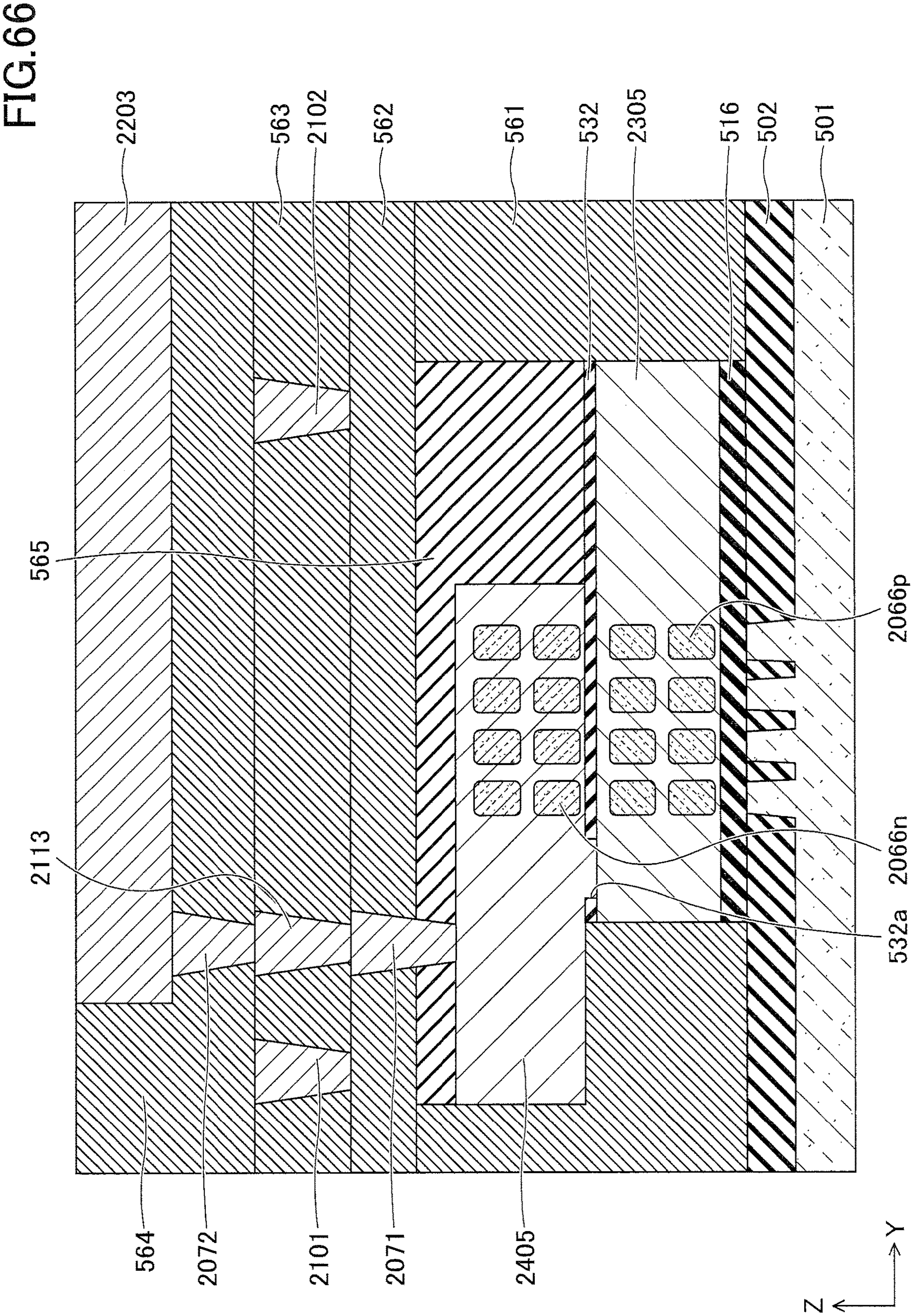
FIG. 66 is a cross sectional view (part 2) illustrating an AND circuit and a column switch circuit in the fifth embodiment.

As the circuit configuration of the SRAM is substantially the same as that in the fourth embodiment, a layout of the nanowires, gates, wires, and the semiconductor layers that constitute the AND circuit and the column switch circuit will be described. FIGS. 61 to 64 are diagrams illustrating planar configurations of the AND circuit AND0 and the column switch circuit CS0 in the fifth embodiment. FIG. 61 mainly illustrates a layout of the nanowires, the wires, and the semiconductor layers. FIG. 62 mainly illustrates a layout of semiconductor layers on the semiconductor substrate side of stacked transistor structures in FIG. 61. FIG. 63 mainly illustrates a layout of semiconductor layers on the side apart from the semiconductor substrate of the stacked transistor structure in FIG. 61. FIG. 64 mainly illustrates a layout of the wires in FIG. 61. Vias and the like are also illustrated in FIGS. 61 to 64. FIGS. 65 to 66 are cross sectional views illustrating the AND circuit AND0 and the column switch circuit CS0. FIG. 65 corresponds to a cross sectional view along a line Y3-Y3 in FIG. 61, and FIG. 66 corresponds to a cross sectional view along a line Y4-Y4 in FIG. 61.

As illustrated in FIGS. 61 to 66, element separating regions 502 are formed over a surface of a semiconductor substrate 501. Interlayer insulation films 561, 562, 563, and 564 are formed over the semiconductor substrate 501. Four stacked transistor structures 571, 572, 573, and 574 are formed in an interlayer insulation film 561. The stacked transistor structures 571, 572, and 573 are included in the AND circuit AND0, and the stacked transistor structure 574 is included in the column switch circuit CS0. Note that each of the interlayer insulation films 561, 562, 563, and 564 may be formed by layering multiple insulation films.

The stacked transistor structures 571, 572, and 573 are arranged in the X direction in this order. Also, power lines 2101 and 2102 that extend in the X direction are formed in the interlayer insulation film 563. The ground potential Vss is supplied to the power line 2101, and the power source potential Vdd is supplied to the power line 2102. The stacked transistor structures 571, 572, and 573 are provided between the power lines 2101 and 2102 in the Y direction.

The stacked transistor structure 571 includes a gate electrode 2041, multiple nanowires 558, gate insulation films, spacers, and sidewalls. The stacked transistor structure 571 further includes p-type semiconductor layers 2061*p* and 2062*p*, n-type semiconductor layers 2061*n* and 2062*n*, and an insulation film 532. On both sides of the stacked transistor structure 571, insulation films 516 are formed over the semiconductor substrate 501. The gate electrode 2041, the multiple nanowires 558, insulation films 516, gate insulation films, spacers, and sidewalls are laid out substantially the same way as the gate electrode 356, the multiple nanowires 358, insulation films 316, gate insulation films 355, spacers 357, and sidewalls 315 in the third embodiment. Also, the p-type semiconductor layers 2061*p* and 2062*p*, the n-type semiconductor layers 2061*n* and 2062*n*, and the insulation film 532 are laid out in substantially the same way as the p-type semiconductor layers 331*p*, the n-type semiconductor layers 341*n*, and the insulation film 332 in the third embodiment. A local wire 2301 is connected to the p-type semiconductor layer 2061*p*; a local wire 2302 is connected to the p-type semiconductor layer 2062*p*; a local wire 2401 is connected to the n-type semiconductor layer 2061*n*; and a local wire 2402 is connected to the n-type semiconductor layer 2062*n*. The local wire 2301 and the local wire 2401 are laid out to be offset from each other in the Y direction in plan view, and the local wire 2302 and the local wire 2402 are laid out to be offset from each other in the Y direction in plan view.

In this way, the stacked transistor structure 571 has a p-channel transistor 2001*p* that includes the gate electrode 2041, the nanowires 558, the gate insulation films, the p-type semiconductor layer 2061*p*, and the p-type semiconductor layer 2062*p*. The transistor 2001*p* corresponds to the transistor 911*p*; the p-type semiconductor layer 2061*p* functions as a source region; the p-type semiconductor layer 2062*p* functions as a drain region; and the nanowires 558 collectively function as a channel.

Also, the stacked transistor structure 571 includes an n-channel transistor 2001*n* that includes the gate electrode 2041, the nanowires 558, the gate insulation films, the n-type semiconductor layer 2061*n*, and the n-type semiconductor layer 2062*n*. The transistor 2001*n* corresponds to the transistor 911*n*; the n-type semiconductor layer 2061*n* functions as a source region; the n-type semiconductor layer 2062*n* functions as a drain region; and the nanowires 558 collectively function as a channel.

The stacked transistor structure 572 includes a gate electrode 2042, multiple nanowires 558, gate insulation films, spacers, and sidewalls. The stacked transistor structure 572 further includes p-type semiconductor layers 2063*p* and 2064*p*, n-type semiconductor layers 2063*n* and 2064*n*, and an insulation film 532. The gate electrode 2042, the multiple nanowires 558, gate insulation films, spacers, and sidewalls are laid out substantially the same way as the gate electrode 356, the multiple nanowires 358, gate insulation films 355, spacers 357, and sidewalls 315 in the third embodiment. Also, the p-type semiconductor layers 2063*p* and 2064*p*, the n-type semiconductor layers 2063*n* and 2064*n*, and the insulation film 532 are laid out in substantially the same way as the p-type semiconductor layers 331*p*, the n-type semiconductor layers 341*n*, and the insulation film 332 in the third embodiment. A local wire 2302 is connected to the p-type semiconductor layer 2063*p*; a local wire 2303 is connected to the p-type semiconductor layer 2064*p*; a local wire 2402 is connected to the n-type semiconductor layer 2063*n*; and a local wire 2403 is connected to the n-type semiconductor layer 2064*n*. The local wire 2303 and the local wire 2403 are laid out to be offset from each other in the Y direction in plan view.

In this way, the stacked transistor structure 572 includes a p-channel transistor 2002*p* that includes the gate electrode 2042, the nanowires 558, the gate insulation films, the p-type semiconductor layer 2063*p*, and the p-type semiconductor layer 2064*p*. The transistor 2002*p* corresponds to the transistor 912*p*; the p-type semiconductor layer 2064*p* functions as a source region; the p-type semiconductor layer 2063*p* functions as a drain region; and the nanowires 558 collectively function as a channel.

Also, the stacked transistor structure 572 includes an n-channel transistor 2002*n* that includes the gate electrode 2042, the nanowires 558, the gate insulation films, the n-type semiconductor layer 2063*n*, and the n-type semiconductor layer 2064*n*. The transistor 2002*n* corresponds to the transistor 912*n*; the n-type semiconductor layer 2063*n* functions as a source region; the n-type semiconductor layer 2064*n* functions as a drain region; and the nanowires 558 collectively function as a channel.

Note that the local wire 2302 is shared by the transistors 2001*p* and 2002*p*. Also, the local wire 2402 is shared by the transistors 2001*n* and 2002*n*. However, the transistors 2001*p* and 2002*p* may have respective local wires formed, to be electrically connected through wires, vias, and the like. Also, the transistors 2001*n* and 2002*n* may have respective local wires formed, to be electrically connected through wires, vias, and the like.

The stacked transistor structure 573 includes a gate electrode 2043, multiple nanowires 558, gate insulation films, spacers, and sidewalls. The stacked transistor structure 573 further includes p-type semiconductor layers 2065*p* and 2066*p*, n-type semiconductor layers 2065*n* and 2066*n*, and an insulation film 532. The gate electrode 2043, the multiple nanowires 558, gate insulation films, spacers, and sidewalls are laid out substantially the same way as the gate electrode 356, the multiple nanowires 358, gate insulation films 355, spacers 357, and sidewalls 315 in the third embodiment. Also, the p-type semiconductor layers 2065*p* and 2066*p*, the n-type semiconductor layers 2065*n* and 2066*n*, and the insulation film 532 are laid out in substantially the same way as the p-type semiconductor layers 331$p$, the n-type semiconductor layers 341$n$, and the insulation film 332 in the third embodiment. A local wire 2304 is connected to the p-type semiconductor layer 2065$p$; a local wire 2305 is connected to the p-type semiconductor layer 2066$p$; a local wire 2404 is connected to the n-type semiconductor layer 2065$n$; and a local wire 2405 is connected to the n-type semiconductor layer 2066$n$. The local wire 2304 and the local wire 2404 are laid out to be offset from each other in the Y direction in plan view, and the local wire 2305 and the local wire 2405 are laid out to be offset from each other in the Y direction in plan view.

In this way, the stacked transistor structure 573 includes a p-channel transistor 2003$p$ that includes the gate electrode 2043, the nanowires 558, the gate insulation films, the p-type semiconductor layer 2065$p$, and the p-type semiconductor layer 2066$p$. The transistor 2003$p$ corresponds to the transistor 913$p$; the p-type semiconductor layer 2065$p$ functions as a source region; the p-type semiconductor layer 2066$p$ functions as a drain region; and the nanowires 558 collectively function as a channel.

Also, the stacked transistor structure 573 includes an n-channel transistor 2003$n$ that includes the gate electrode 2043, the nanowires 558, the gate insulation films, the n-type semiconductor layer 2065$n$, and the n-type semiconductor layer 2066$n$. The transistor 2003$n$ corresponds to the transistor 913$n$; the n-type semiconductor layer 2065$n$ functions as a source region; the n-type semiconductor layer 2066$n$ functions as a drain region; and the nanowires 558 collectively function as a channel.

Each of the local wires 2301, 2303, and 2304 is connected to the power line 2102 through a via 2071; and each of the local wires 2401 and 2404 is connected to the power line 2101 through a via 2071. The gate electrode 2041 is connected to the wire 2105 through a via 2071; the gate electrode 2042 is connected to the wire 2104 through a via 2071; and the gate electrode 2043 is connected to the wire 2107 through a via 2071. The local wire 2302 is connected to the wire 2103 through a via 2071; the local wire 2403 is connected to the wire 2106 through a via 2071; and the local wire 2403 is connected to the wire 2108 through a via 2071. The local wires 2305 and 2405 are connected to each other via an opening 532$a$ formed in the insulation film 532 between the local wires 2305 and 2405. Note that although the opening 532$a$ is laid out to be offset from the p-type semiconductor layer 2066$p$ and the n-type semiconductor layer 2066$n$ in plan view, the layout position of the opening 532$a$ is not limited as such. The wires 2103 to 2108, like the power lines 2101 and 2102, are formed in the interlayer insulation film 563 and extend in the X direction. The multiple vias 2071 are formed in the interlayer insulation film 562. The vias 2071 connect the wires formed in the interlayer insulation film 563 with the local wires, and also connect the wires formed in the interlayer insulation film 563 with the gate electrodes. Note that in the case where the vias 2071 are formed on local wires on the semiconductor substrate 501 side, part of the vias 2071 may be positioned at the same height as the local wires on the side apart from the substrate.

The wire 2104 is connected to the wire 2201 through a via 2072, and the wire 2105 is connected to the wire 2202 through a via 2072. Each of the wires 2103 and 2107 is connected to the wire 2204 through a via 2072, and the wire 2108 is connected to the wire 2203 through a via 2072. The wires 2201 to 2204 are formed in the interlayer insulation film 564 and extend in the Y direction. The multiple vias 2072 are also formed in the interlayer insulation film 564. The vias 2072 connect the wires formed in the interlayer insulation film 563 with the wires formed in the interlayer insulation film 564. The address signal $SX_1$ is input from the wire 2201; the address signal $SX_0$ is input from the wire 2202; and the control signal $A_0$ is output to the wire 2203.

The stacked transistor structure 574 includes a gate electrode 2044, multiple nanowires 558, gate insulation films, spacers, and sidewalls. The stacked transistor structure 574 further includes p-type semiconductor layers 2067$p$ and 2068$p$, p-type semiconductor layers 2069$p$ and 2070$p$, and an insulation film 532. The gate electrode 2044, the multiple nanowires 558, gate insulation films, spacers, and sidewalls are laid out substantially the same way as the gate electrode 356, the multiple nanowires 358, gate insulation films 355, spacers 357, and sidewalls 315 in the third embodiment. Also, the p-type semiconductor layers 2067$p$ and 2068$p$, the p-type semiconductor layers 2069$p$ and 2070$p$, and the insulation film 532 are laid out in substantially the same way as the p-type semiconductor layers 331$p$, the p-type semiconductor layers 341$p$, and the insulation film 332 in the third embodiment. A local wire 2306 is connected to the p-type semiconductor layer 2067$p$; a local wire 2307 is connected to the p-type semiconductor layer 2068$p$; a local wire 2406 is connected to the p-type semiconductor layer 2069$p$; and a local wire 2407 is connected to the p-type semiconductor layer 2070$p$.

In this way, the stacked transistor structure 574 includes a p-channel transistor 2004$p$ that includes the gate electrode 2044, the nanowires 558, the gate insulation films, the p-type semiconductor layer 2067$p$, and the p-type semiconductor layer 2068$p$. The transistor 2004$p$ corresponds to the transistor 914$p$; the p-type semiconductor layers 2067$p$ and 2068$p$ function as a source region or a drain region; and the nanowires 558 collectively function as a channel.

Also, the stacked transistor structure 574 includes a p-channel transistor 2005$p$ that includes the gate electrode 2044, the nanowires 558, the gate insulation films, the p-type semiconductor layer 2069$p$, and the p-type semiconductor layer 2070$p$. The transistor 2005$p$ corresponds to the transistor 915$p$; the p-type semiconductor layers 2069$p$ and 2070$p$ function as a source region or a drain region; and the nanowires 558 collectively function as a channel.

The gate electrode 2044 is connected to the wire 2113 through a via 2071. The local wire 2306 is connected to a wire 2111 through a via 2071, and the local wire 2307 is connected to a wire 2109 through a via 2071. The local wire 2406 is connected to a wire 2112 through a via 2071, and the local wire 2407 is connected to a wire 2110 through a via 2071. The wires 2109 to 2113, like the power lines 2101 and 2102, are formed in the interlayer insulation film 563 and extend in the X direction. The vias 2071 are formed in the interlayer insulation film 562.

The wire 2113 is connected to the wire 2203 through a via 2072. The wire 2111 is connected to the wire 2208 through a via 2072, and the wire 2109 is connected to the wire 2206 through a via 2072. The wire 2112 is connected to the wire 2205 through a via 2072, and the wire 2110 is connected to the wire 2207 through a via 2072. The wires 2205 to 2208, like the wires 2201 to 2204, are formed in the interlayer insulation film 564 and extend in the Y direction. The vias 2072 are also formed in the interlayer insulation film 564. The wire 2208 corresponds to the bit line $BL_0$; the wire 2207 corresponds to the bit line $BLX_0$; the wire 2206 corresponds to the data line Do; and the wire 2205 corresponds to the data line $DX_0$.

In this way, the AND circuit AND0 and the column switch circuit CS0 are connected to each other via the wire 2203 that extends in the Y direction.

For example, for the interlayer insulation films 561 to 564, silicon oxide, silicon nitride, silicon carbide, silicon oxynitride, or the like may be used. For example, for the local wires 2301 to 2307 and 2401 to 2407, tungsten, cobalt, ruthenium, or the like may be used. In the case of using tungsten, it is favorable to form a conductive underlayer film, whereas in the case of using cobalt or ruthenium, it is not necessary to form an underlayer film.

For example, for the gate electrodes 2041 to 2044, titanium, titanium nitride, polycrystalline silicon, or the like may be used. For example, for the gate insulation films, a high dielectric constant material such as hafnium oxide, aluminum oxide, oxide of hafnium and aluminum, or the like may be used. For example, for the nanowires 558, silicon or the like may be used. For example, for the insulation films 516, the insulation films 532, the spacers, and the sidewalls, silicon oxide, silicon nitride, or the like may be used.

For example, for the vias 2071, tungsten, cobalt, ruthenium, or the like may be used. In the case of using tungsten, it is favorable to form a conductive underlayer film, whereas in the case of using cobalt or ruthenium, it is not necessary to form an underlayer film.

For example, for the power lines 2101 to 2102, the wires 2103 to 2113, the vias 2072, and the wires 2201 to 2208, tungsten, cobalt, ruthenium, or the like may be used. In the case of using tungsten, it is favorable to form a conductive underlayer film, whereas in the case of using cobalt or ruthenium, it is not necessary to form an underlayer film. Each of the wires 2201 to 2208 and the via 2072 may be integrally formed by a dual damascene process or the like.

Figure 67:
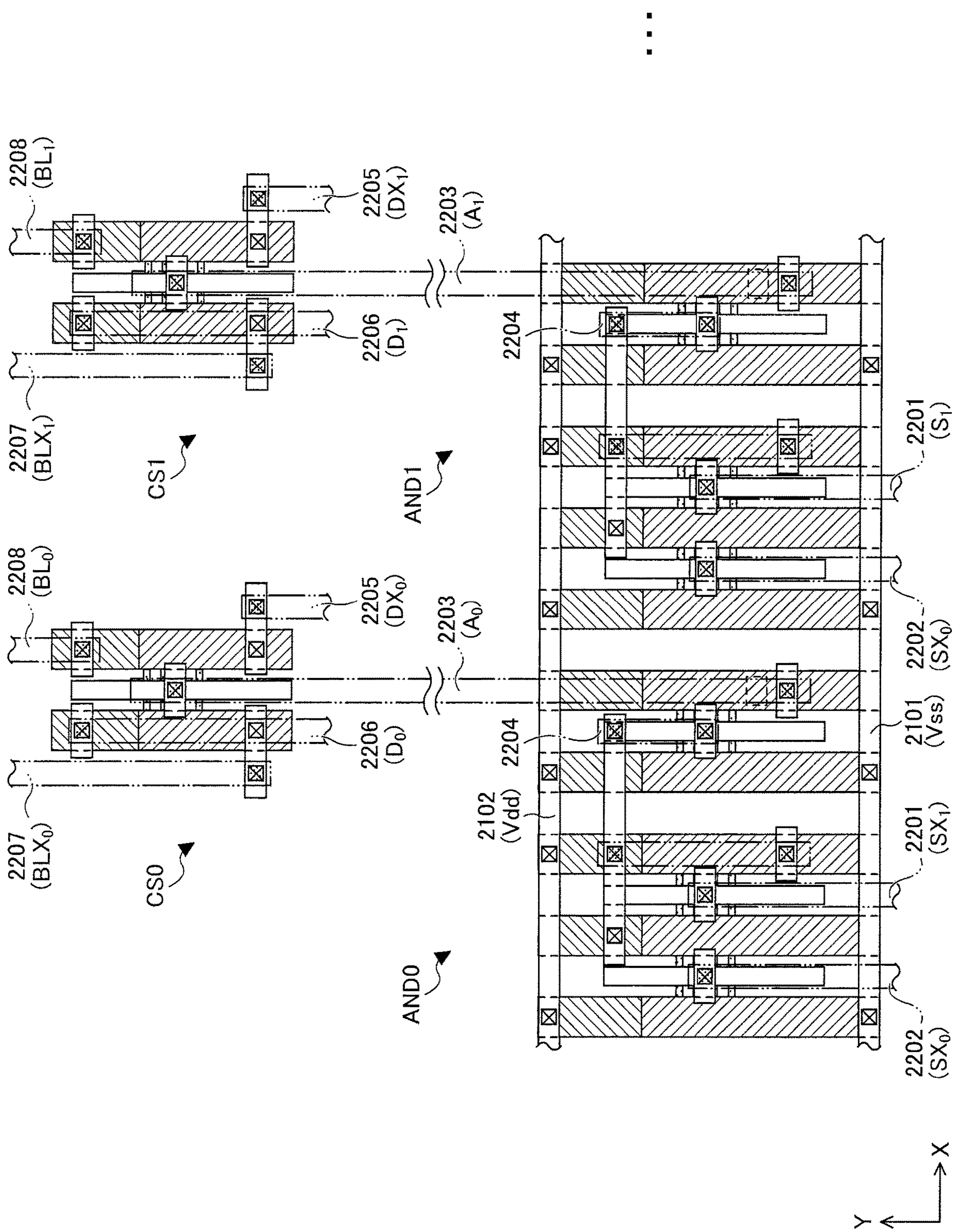
FIG. 67 is a diagram (part 1) illustrating a planar configuration of multiple AND circuits and column switch circuits in the fifth embodiment.
Figure 68:
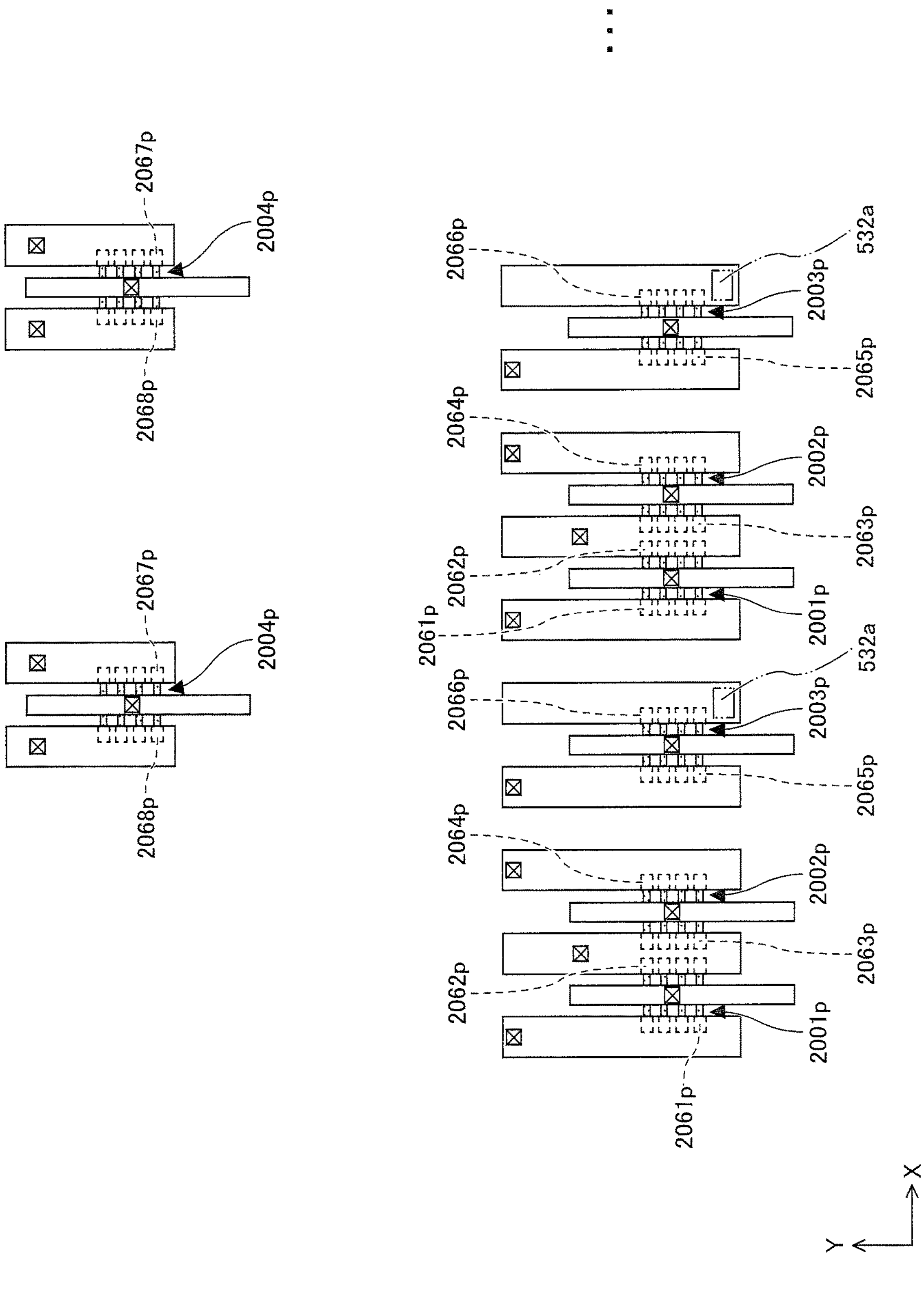
FIG. 68 is a diagram (part 2) illustrating a planar configuration of multiple AND circuits and column switch circuits in the fifth embodiment.
Figure 69:
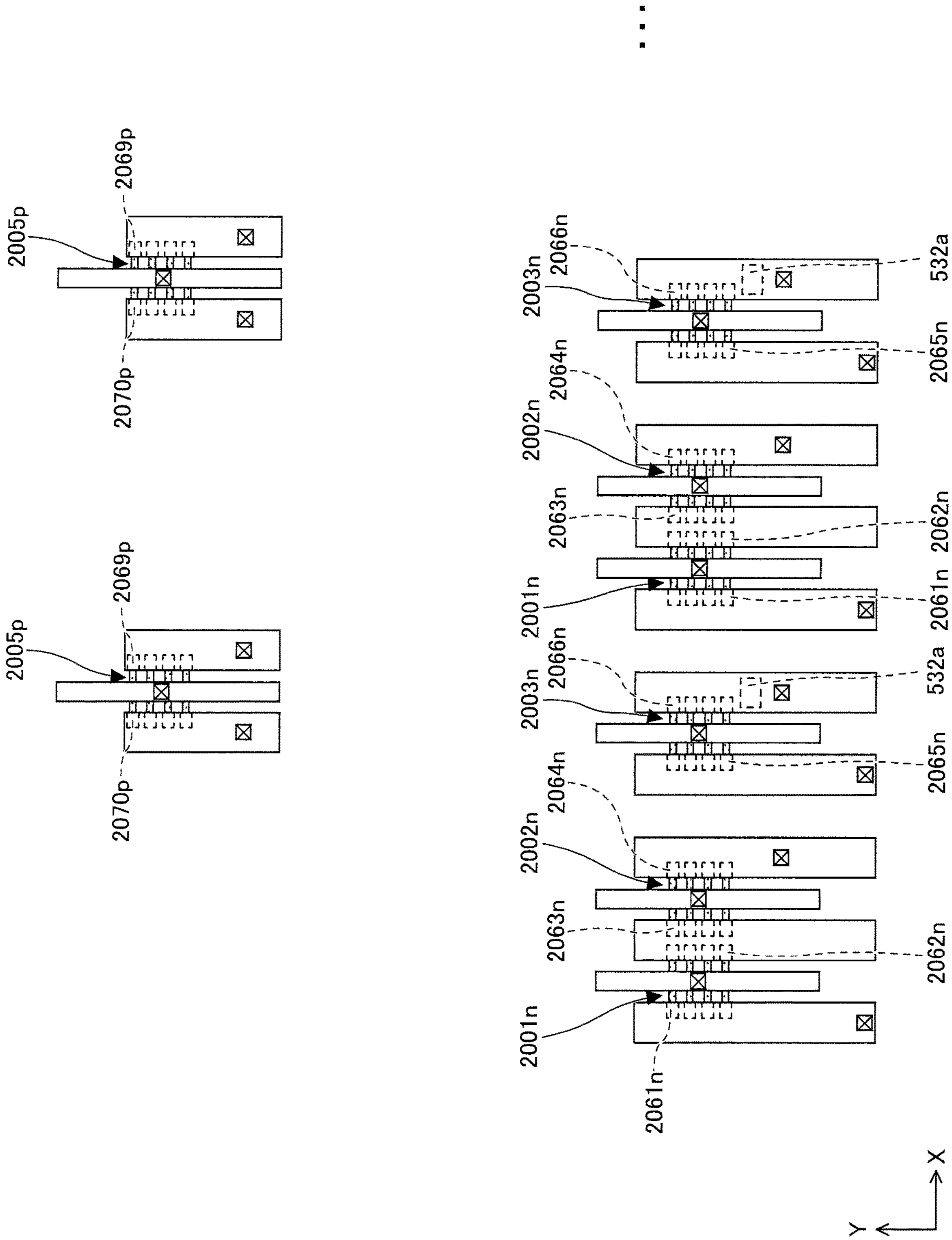
FIG. 69 is a diagram (part 3) illustrating a planar configuration of multiple AND circuits and column switch circuits in the fifth embodiment.
Figure 70:
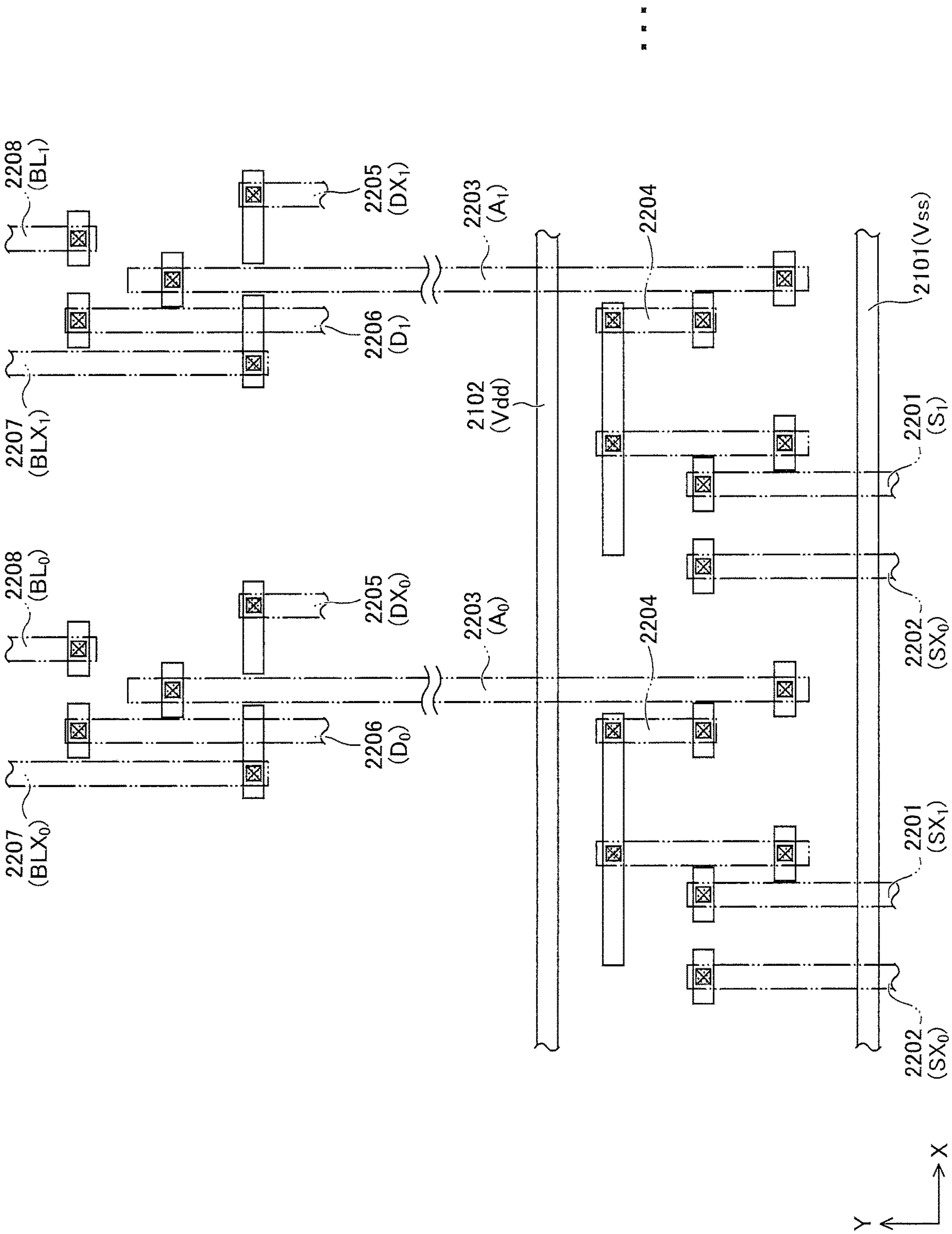
FIG. 70 is a diagram (part 4) illustrating a planar configuration of multiple AND circuits and column switch circuits in the fifth embodiment.

FIGS. 67 to 70 illustrate planar configurations of the multiple AND circuits and the column switch circuits in the fifth embodiment. FIG. 67 illustrates a layout of the nanowires, the wires, and the semiconductor layers. FIG. 68 mainly illustrates a layout of semiconductor layers on the semiconductor substrate side of stacked transistor structures in FIG. 67. FIG. 69 mainly illustrates a layout of semiconductor layers on the side apart from the semiconductor substrate of stacked transistor structures in FIG. 67. FIG. 70 mainly illustrates a layout of the wires in FIG. 67. Vias and the like are also illustrated in FIGS. 67 to 70.

As illustrated in FIGS. 67 to 70, the multiple AND circuits AND0, AND1, . . . , and ANDn are arrayed in the X direction, and the power lines 2101 and 2102 are shared among the AND circuits AND0, AND1, . . . , and ANDN. Also, multiple column switch circuits CS0, CS1, . . . , and CSn are arrayed in the X direction. The column switch circuits CS0 to CSn are connected to the AND circuits AND0 to ANDn, respectively, through the wires 2203 that extend in the Y direction.

In the semiconductor device according to the fifth embodiment, the stacked transistor structures 571 to 573 are examples of CFETs. The semiconductor device according to the fifth embodiment includes these CFETs in the AND circuits AND0 to ANDn, and includes the stacked transistor structure 574 that includes the p-channel transistors 2004*p* and 2005*p* in the column switch circuits CS0 to CSn. Therefore, according to the fifth embodiment, two transistors 2004*p* and 2005*p* of the same conductivity type can be overlapped in plan view, to make the semiconductor devices further finer. Note that although the present embodiment includes a stacked transistor structure that is constituted with two p-channel transistors, the stacked transistor structure may be constituted with two n-channel transistors. Also, alternatively, a stacked transistor structure constituted with an re-channel transistor may be laid out over the semiconductor substrate 501, over which a p-channel transistor is laid out. Also, not limited to the column switch circuit in the present embodiment, in a circuit that has multiple transistors of the same conductivity type, and has the gate electrodes electrically connected to each other, a stacked transistor structure that has the transistors of the same conductivity type stacked may be laid out.

Also, in the fifth embodiment, the positions of both ends of the local wires 2301 to 2305 in the Y direction are all the same. Therefore, a mask used for forming these can be easily formed with high precision, and the local wires 2301 to 2305 can be formed with high precision. Also, the positions of both ends of the local wires 2401 to 2405 in the Y direction are all the same. Therefore, a mask used for forming these can be easily formed with high precision, and the local wires 2401 to 2405 can be formed with high precision. Note that in the present disclosure, "the same" does not mean "completely the same", but permits misalignment of positions due to process variation and the like. Note that the positions of one of or both of the ends of the local wires 2301 to 2305 in the Y direction may be different from each other, and the positions of one of or both of the ends of the local wire 2401 to 2405 in the Y direction may be different from each other.

Sixth Embodiment

Figure 71:
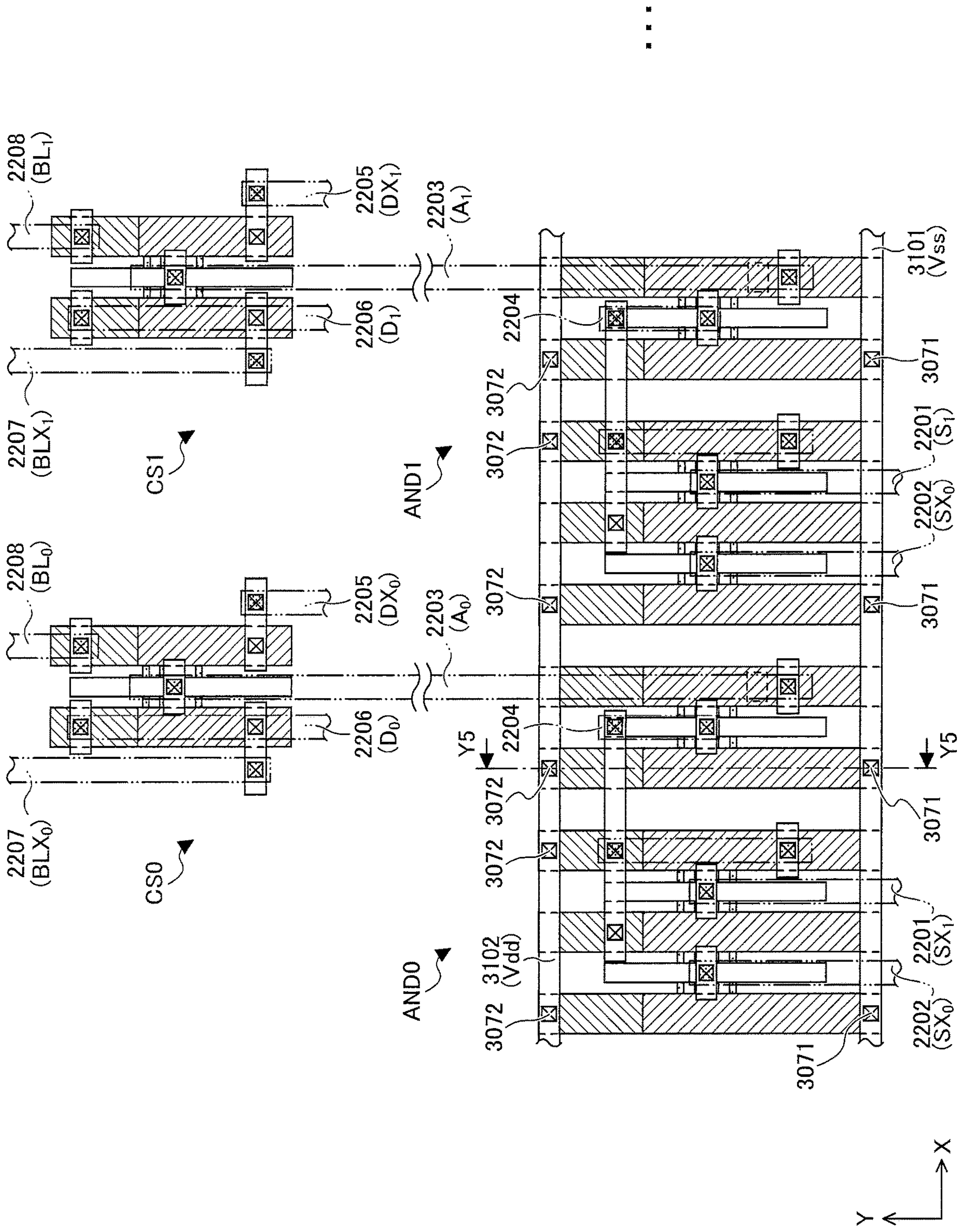
FIG. 71 is a circuit diagram illustrating a planar configuration of an AND circuit and a column switch circuit in a sixth embodiment.
Figure 72:
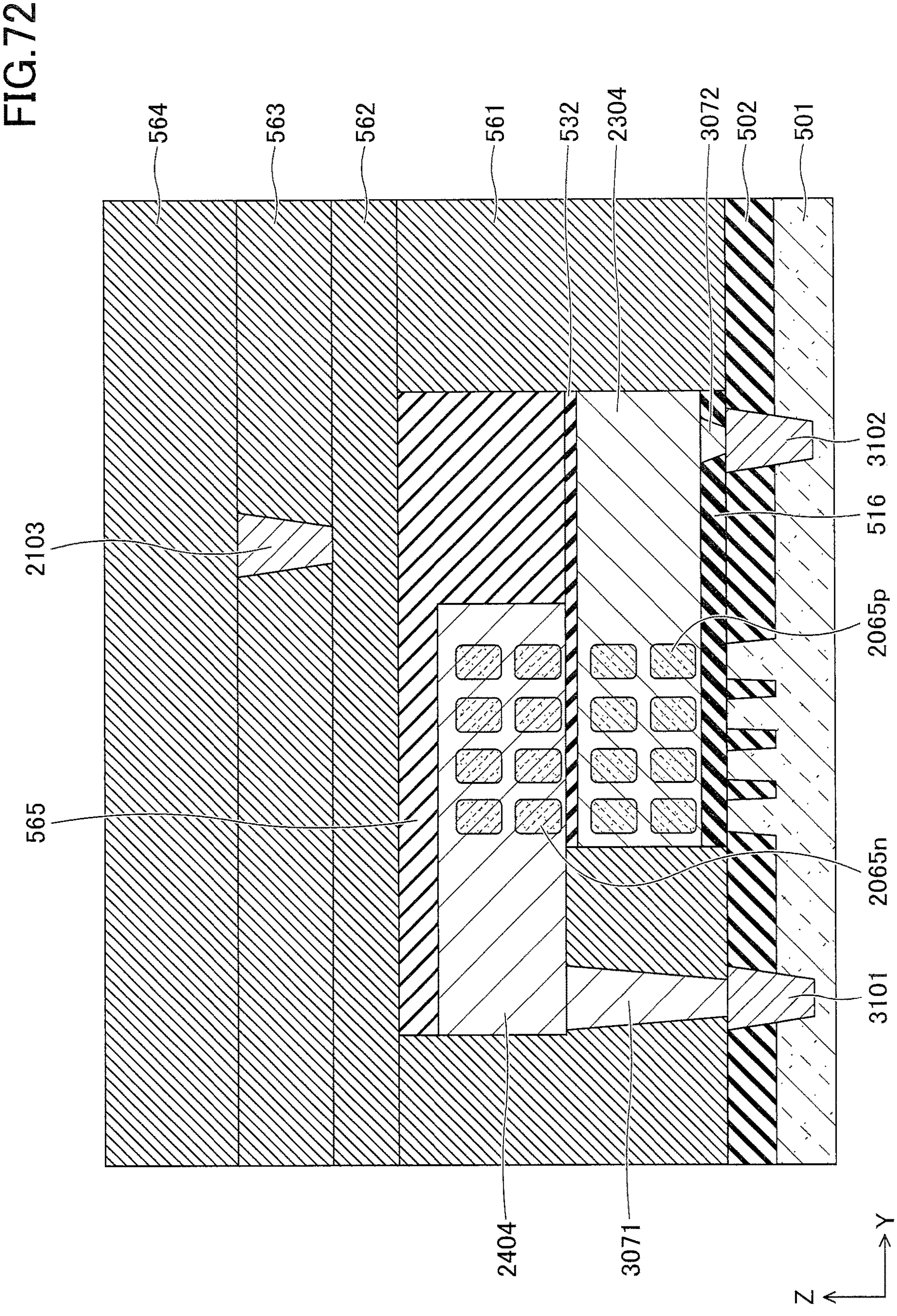
FIG. 72 is a cross sectional view illustrating an AND circuit and a column switch circuit.

Next, a sixth embodiment will be described. The sixth embodiment differs from the fifth embodiment, primarily with respect to the positions of the power lines in the thickness direction of the semiconductor substrate. FIG. 71 is a circuit diagram illustrating a planar configuration of an AND circuit and a column switch circuit in the sixth embodiment. FIG. 71 mainly illustrates a layout of nanowires, wires, and semiconductor layers that constitute multiple AND circuits and column switch circuits. FIG. 72 is a cross sectional view illustrating an AND circuit AND0 and a column switch circuit CS0. FIG. 72 corresponds to a cross sectional view along a line Y5-Y5 in FIG. 71.

As illustrated in FIGS. 71 and 72, a semiconductor device according to the sixth embodiment includes a power line 3101 instead of a power line 2101, and a power line 3102 instead of a power line 2102. Each of the power lines 3101 and 3102 includes an insulating underlayer film formed in a groove formed in a semiconductor substrate 501 and an element separating region 502, and a conductive film over the underlayer film. For example, for the underlayer film, silicon oxide can be used, and for the conductive film, tungsten, cobalt, ruthenium, or the like may be used. An insulation film may be formed on the surface of the conductive film. The ground potential Vss is supplied to the power line 3101, and the power source potential Vdd is supplied to the power line 3102. The power line 3101 and each of the local wires 2401 and 2404 are connected to each other through a via 3071 formed in the interlayer insulation film 561. Also, the power line 3102 and each of the local wires 2301, 2303, and 2404 are connected to each other through a via 3072 formed in the insulation film 516. For the vias 3071 to 3072, tungsten, cobalt, ruthenium, or the like may be used. In the case of using tungsten, it is favorable to form a conductive underlayer film, whereas in the case of using cobalt or ruthenium, it is not necessary to form an underlayer film. Each of the local wires 2401 and 2404, and the via 3071 may be integrally formed by a dual damascene process or the like, and each of the local wires 2301, 2303, and 2404, and the via 3072 may be integrally formed by a dual damascene process or the like.

As above, the present disclosure has been described according to the embodiments; note that the present disclosure is not limited to the requirements set forth in the embodiments described above. These requirements can be changed within a scope not to impair the gist of the present disclosure, and can be suitably defined according to applications.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
- a substrate;
- a first transistor formed over the substrate;
- a second transistor formed over the first transistor;
- a third transistor formed over the substrate; and
- a fourth transistor formed over the third transistor,
- wherein the first transistor includes:
  - a first gate electrode,
  - a first source region of a first conductivity type, and
  - a first drain region of the first conductivity type,
- wherein the second transistor includes:
  - a second gate electrode,
  - a second source region of a second conductivity type, and
  - a second drain region of the second conductivity type,
- wherein the third transistor includes:
  - a third gate electrode,
  - a third source region of a third conductivity type, and
  - a third drain region of the third conductivity type,
- wherein the fourth transistor includes:
  - a fourth gate electrode,
  - a fourth source region of a fourth conductivity type, and
  - a fourth drain region of the fourth conductivity type,
- wherein the first conductivity type is different from the second conductivity type,
- wherein the third conductivity type is the same as the fourth conductivity type,
- wherein the first gate electrode is integrated with the second gate electrode,
- wherein the third gate electrode is integrated with the fourth gate electrode, and
- wherein the first transistor is formed at a same height as the third transistor, and the second transistor is formed at a same height as the fourth transistor.

2. The semiconductor device as claimed in claim 1, wherein the first transistor includes a first channel of a first nanowire between the first source region and the first drain region,
- wherein the second transistor includes a second channel of a second nanowire between the second source region and the second drain region,
- wherein the third transistor includes a third channel of a third nanowire between the third source region and the third drain region, and
- wherein the fourth transistor includes a fourth channel of a fourth nanowire between the fourth source region and the fourth drain region.

3. The semiconductor device as claimed in claim 2, further comprising:
- a first source-side local wire contacting the first source region;
- a first drain-side local wire contacting the first drain region;
- a second source-side local wire contacting the second source region;
- a second drain-side local wire contacting the second drain region;
- a third source-side local wire contacting the third source region;
- a third drain-side local wire contacting the third drain region;
- a fourth source-side local wire contacting the fourth source region; and
- a fourth drain-side local wire contacting the fourth drain region,
- wherein at least part of the first source-side local wire overlaps at least part of one of the second source-side local wire or the second drain-side local wire, in plan view,
- wherein at least part of the first drain-side local wire overlaps at least part of another of the second source-side local wire or the second drain-side local wire, in plan view,
- wherein at least part of the third source-side local wire overlaps at least part of one of the fourth source-side local wire or the fourth drain-side local wire, in plan view, and
- wherein at least part of the third drain-side local wire overlaps at least part of another of the fourth source-side local wire or the fourth drain-side local wire, in plan view.

4. The semiconductor device as claimed in claim 3, wherein the first source-side local wire includes a part that does not overlap the one of the second source-side local wire or the second drain-side local wire, in plan view,
- wherein the first drain-side local wire includes a part that does not overlap said another of the second source-side local wire or the second drain-side local wire, in plan view,
- wherein the third source-side local wire includes a part that does not overlap the one of the fourth source-side local wire or the fourth drain-side local wire, in plan view, and
- wherein the third drain-side local wire includes a part that does not overlap said another of the fourth source-side local wire or the fourth drain-side local wire, in plan view.

5. The semiconductor device as claimed in claim 1, wherein the first conductivity type is of p-type,
- wherein the second conductivity type is of n-type, and
- wherein the third conductivity type and the fourth conductivity type are of p-type or n-type.

6. The semiconductor device as claimed in claim 1, wherein output signals of the first transistor and the second transistor are input into the third gate electrode and the fourth gate electrode.

7. The semiconductor device as claimed in claim 1, further comprising:
- a plurality of memory cells;
- a pair of bit lines connected to the plurality of memory cells;

a column switch circuit connected to the pair of bit lines; and a column decoder configured to control the column switch circuit, wherein the column decoder includes the first transistor and the second transistor, and wherein the column switch circuit includes the third transistor and the fourth transistor.

8. The semiconductor device as claimed in claim 7, wherein the column decoder includes a plurality of instances of the first transistor and a plurality of instances of the second transistor, wherein two instances of the first transistor adjacent to each other have one local wire in-between shared with each other, and wherein two instances of the second transistor adjacent to each other over the two instances of the first transistor adjacent to each other have one local wire in-between shared with each other.

9. A method of producing a semiconductor device, the method comprising:

forming a first transistor over a substrate;

forming a second transistor over the first transistor;

forming a third transistor over the substrate; and forming a fourth transistor over the third transistor, wherein the first transistor includes:

a first gate electrode, a first source region of a first conductivity type, and a first drain region of the first conductivity type, wherein the second transistor includes:

a second gate electrode, a second source region of a second conductivity type, and a second drain region of the second conductivity type, wherein the third transistor includes:

a third gate electrode, a third source region of a third conductivity type, and a third drain region of the third conductivity type, wherein the fourth transistor includes:

a fourth gate electrode, a fourth source region of a fourth conductivity type, and a fourth drain region of the fourth conductivity type, wherein the first conductivity type and the second conductivity type are different from each other, wherein the third conductivity type is the same as the fourth conductivity type, and wherein the method further includes:

integrally forming the first gate electrode and the second gate electrode, integrally forming the third gate electrode and the fourth gate electrode, and forming the first source region and the first drain region in parallel with the third source region and the third drain region, or forming the second source region and the second drain region in parallel with the fourth source region and the fourth drain region, and wherein the first transistor is formed at a same height as the third transistor, and the second transistor is formed at a same height as the fourth transistor.

10. The method of producing the semiconductor device as claimed in claim 9, wherein the first transistor includes a first channel of a first nanowire between the first source region and the first drain region, wherein the second transistor includes a second channel of a second nanowire between the second source region and the second drain region, wherein the third transistor includes a third channel of a third nanowire between the third source region and the third drain region, wherein the fourth transistor includes a fourth channel of a fourth nanowire between the fourth source region and the fourth drain region, wherein the first source region and the first drain region are formed by epitaxial growth from the first nanowire, wherein the second source region and the second drain region are formed by epitaxial growth from the second nanowire, wherein the third source region and the third drain region are formed by epitaxial growth from the third nanowire, and wherein the fourth source region and the fourth drain region are formed by epitaxial growth from the fourth nanowire.

* * * * *